United States Patent
Chen et al.

(10) Patent No.: US 10,673,654 B2
(45) Date of Patent: Jun. 2, 2020

(54) CODING METHOD, CODING APPARATUS, AND COMMUNICATIONS APPARATUS

(71) Applicant: HUAWEI TECHNOLOGIES CO., LTD., Shenzhen (CN)

(72) Inventors: Ying Chen, Hangzhou (CN); Gongzheng Zhang, Hangzhou (CN); Huazi Zhang, Hangzhou (CN); Hejia Luo, Hangzhou (CN); Rong Li, Hangzhou (CN); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/523,954

(22) Filed: Jul. 26, 2019

(65) Prior Publication Data
US 2019/0349220 A1    Nov. 14, 2019

Related U.S. Application Data

(63) Continuation of application No. PCT/CN2018/073435, filed on Jan. 19, 2018.

(30) Foreign Application Priority Data

Jan. 26, 2017   (CN) .......................... 2017 1 0061840

(51) Int. Cl.
*H04L 25/02*  (2006.01)
*H04L 25/03*  (2006.01)
*H04L 1/00*   (2006.01)

(52) U.S. Cl.
CPC .... *H04L 25/0204* (2013.01); *H04L 25/03178* (2013.01); *H04L 1/0043* (2013.01)

(58) Field of Classification Search
CPC .......... H04L 25/0204; H04L 25/03178; H04L 1/0043
(Continued)

(56) References Cited

U.S. PATENT DOCUMENTS

2013/0163988 A1    6/2013  Krongold et al.
2016/0013810 A1*   1/2016  Gross .................... H03M 13/09
                                                              714/776
(Continued)

FOREIGN PATENT DOCUMENTS

| CN | 102164025 A | 8/2011 |
| CN | 103023618 A | 4/2013 |
| CN | 104219019 A | 12/2014 |

OTHER PUBLICATIONS

Mediatek Inc: "Examination of NR Coding Candidates for Low-Rate Applications", 3GPP Draft R1-167871, 3GPP TSG RAN WG1 Meeting #86, Gothenburg, Sweden, Aug. 22-26, 2016. XP051142643, total 16 pages.
(Continued)

*Primary Examiner* — Michael R Neff
(74) *Attorney, Agent, or Firm* — Kilpatrick Townsend & Stockton LLP

(57) ABSTRACT

Embodiments can provide a coding method, a coding apparatus, and a communications apparatus. The method includes: determining N to-be-coded bits, where N is a positive integer; obtaining a first sequence that includes N polar channel sequence numbers; determining a location of an information bit in the N to-be-coded bits based on the first sequence; and performing polar coding on the N to-be-coded bits to obtain coded bits. The location of the information bit in the to-be-coded bits is determined based on the obtained first sequence that includes N polar channel sequence numbers, so that performance of a polar code can be improved.

18 Claims, 8 Drawing Sheets

(58) Field of Classification Search
USPC .......................................................... 375/296
See application file for complete search history.

(56) References Cited

U.S. PATENT DOCUMENTS

2016/0079999 A1    3/2016  Shen et al.
2017/0047947 A1*   2/2017  Hong ................ H03M 13/2906

OTHER PUBLICATIONS

Huawei et al.,"Details of the Polar code design",3GPP TSG RAN WG1 Meeting #87 R1-1611254,Reno, USA, Nov. 10-14, 2016,total 15 pages.
Ji Chen et al.,"Low-Complexity List Successive-Cancellation Decoding of Polar Codes Using List Pruning",2016 IEEE Global Communications Conference (GLOBECOM),total 6 pages.

* cited by examiner

CODING METHOD, CODING APPARATUS, AND COMMUNICATIONS APPARATUS

CROSS-REFERENCE TO RELATED APPLICATIONS

This application is a continuation of International Application No. PCT/CN2018/073435 filed on Jan. 19, 2018, which claims priority to Chinese Patent Application No. 201710061840.2, filed on Jan. 26, 2017. The disclosures of the aforementioned applications are hereby incorporated by reference in their entireties.

TECHNICAL FIELD

Embodiments of the present invention relate to the communications field, and more specifically, to a coding method, a coding apparatus, and a communications apparatus.

BACKGROUND

In a communications system, channel coding is usually used to improve data transmission reliability and ensure communication quality. A polar code (Polar codes) proposed by the Turkish professor Arikan is the first code with high performance that is proved in theory to be capable of achieving a Shannon capacity and has low coding-decoding complexity. The polar code is a linear block code, and a coding matrix of the polar code is $G_N$. For example, a coding process is $x_1^N = u_1^N G_N$, where $u_1^N = (u_1, u_2, \ldots, u_N)$ is a binary row vector whose length is N (namely, a mother code length), $G_N$ is an N×N matrix, and $G_N = F_2^{\otimes(\log_2(N))}$ is defined as a Kronecker (Kronecker) product of $\log_2 N$ matrices $F_2$.

The matrix $$F_2 = \begin{bmatrix} 1 & 0 \\ 1 & 1 \end{bmatrix}.$$

In a polar code coding process, some bits in $u_1^N$ are used to carry information and are referred to as information bits, and an index set of these bits is denoted by A. The other bits are set to fixed values agreed on by a transmit end and a receive end in advance and are referred to as fixed bits or frozen bits (frozen bits), and an index set of these bits is denoted by a complementary set $A^c$ of A. The polar code coding process is equivalent to $x_1^N = u_A G_N(A) \oplus u_{A^c} G_N(A^c)$. Herein $G_N(A)$ is a submatrix of rows corresponding to indexes in the set A in $G_N$, $G_N(A^c)$ is a submatrix of rows corresponding to indexes in the set $A^C$ in $G_N$. $u_A$ is an information bit set in $u_1^N$, and a quantity of information bits is K. $u_{A^c}$ is a fixed-bit set $u_1^N$, a quantity of fixed bits is (N−K), and the fixed bits are known bits. The fixed bits are usually set to 0. However, the fixed bits may be randomly set provided that the transmit end and the receive end agree in advance. When the fixed bits are set to 0, polar code coding output may be simplified as: $x_1^N = u_A G_N(A)$, where $x_1^N = u_A G_N(A)$ is a K×N matrix.

A polar code construction process is a process of selecting the set A, and determines performance of the polar code. The polar code construction process is usually as follows: determining, based on a mother code length N, that there are N polar channels in total, where the N polar channels respectively correspond to N rows of the coding matrix; calculating reliability of the polar channels; and using indexes of first K polar channels with relatively high reliability as elements of the set A, and using indexes corresponding to remaining (N−K) polar channels as elements of the index set $A^c$ of the fixed bits. The set A determines a location of the information bit, and the set $A^c$ determines a location of the fixed bit.

It can be learned from the coding matrix that a code length of an original polar code (mother code) is an integral power of 2, and a polar code of any code length usually needs to be implemented through rate matching in actual application. Usually, the rate matching may be implemented through puncturing (puncture) or shortening (shorten).

Common polar channel reliability measurements include an error probability, a channel capacity, a polarization weight, and the like. In the prior art, there are three polar channel reliability estimation methods. One method is: calculating a Bhattacharyya (Bhattacharyya) parameter of each polar channel, where the parameter indicates an error probability of the polar channel. Then, polar channels corresponding to K minimum Bhattacharyya parameters are selected, and information bits are placed on the polar channels. However, this method is applicable to only a binary erasure channel, and cannot be used to accurately estimate reliability of other channels. Therefore, this method has low performance. The other two methods are separately a density evolution (Density evolution, DE for short) method and a Gaussian approximation (Gaussian approximation, GA for short) method. The DE method and the GA method have relatively high calculation complexity, and are not applicable to online calculation. For offline storage, reliability calculation in the DE method and the GA method is performed based on parameters of an actual channel: a rate matching manner, a code rate, and a modulation scheme. When any one of the foregoing parameters changes, a polar channel reliability estimation result changes, and a corresponding location of the information bit also changes, resulting in excessively large storage overheads.

SUMMARY

Embodiments of this application provide a coding method, a coding apparatus, and a communications apparatus, to reduce storage complexity of polar code coding and improve performance of a polar code.

According to a first aspect, a coding method is provided, and includes:

determining N to-be-coded bits, where N is a positive integer;

obtaining a first sequence that includes N polar channel sequence numbers;

determining a location of an information bit in the N to-be-coded bits based on the first sequence; and performing polar coding on the N to-be-coded bits to obtain coded bits.

With reference to the first aspect, in a first possible implementation of the first aspect, the determining N to-be-coded bits includes:

determining N based on M, where N=M, M is an output target code length of a polar code, M is equal to a positive integral power of 2, and M is a positive integer.

With reference to the first possible implementation of the first aspect, in a second possible implementation of the first aspect, the obtaining a first sequence that includes N polar channel sequence numbers includes:

obtaining, from a sequence in Table 1 in the appendix or an equivalent replacement sequence of a sequence in Table 1, the first sequence that includes N polar channel sequences.

With reference to the first aspect, in a third possible implementation of the first aspect, the determining N to-be-coded bits includes:

determining N based on M, where $N=2^{\lfloor log_2(M-1) \rfloor+1}$, the symbol $\lfloor \; \rfloor$ represents rounding down, M is an output target code length of a polar code, M is not equal to a positive integral power of 2, and M is a positive integer.

With reference to the third possible implementation of the first aspect, in a fourth possible implementation of the first aspect, the N to-be-coded bits correspond to a mother code whose code length is N; and the obtaining a first sequence that includes N polar channel sequence numbers includes:

determining, based on a maximum first sequence $S_{max}$ corresponding to a maximum mother code length $N_{max}$ supported by a communications system, a first sequence corresponding to the mother code length N, where the first sequence corresponding to the mother code length N is the first sequence that includes N polar channel sequence numbers.

With reference to the fourth possible implementation of the first aspect, in a fifth possible implementation of the first aspect, the maximum first sequence $S_{max}$ is a sequence in Table 1 in the appendix or an equivalent replacement sequence of a sequence in Table 1, and the N to-be-coded bits correspond to N coded bits; and the obtaining a first sequence that includes N polar channel sequence numbers includes:

determining locations of N−M to-be-deleted bits in the N coded bits;

sequentially reading polar channel sequence numbers in the maximum first sequence $S_{max}$, and sequentially reading polar channel sequence numbers in the maximum first sequence $S_{max}$ that do not correspond to the locations of the N−M bits and that are not greater than N; and when N polar channel sequence numbers are read, determining that a sequence including the N read polar channel sequence numbers is the first sequence corresponding to the mother code length N.

With reference to the third possible implementation of the first aspect, in a sixth possible implementation of the first aspect, the N to-be-coded bits correspond to a mother code whose code length is N; and the obtaining a first sequence that includes N polar channel sequence numbers includes:

determining, based on a fourth sequence that corresponds to the mother code length N when rate matching does not need to be performed, a first sequence that corresponds to the mother code length N when rate matching needs to be performed, where the first sequence corresponding to the mother code length N is the first sequence that includes N polar channel sequence numbers.

With reference to the sixth possible implementation of the first aspect, in a seventh possible implementation of the first aspect, the fourth sequence is a sequence in Table 1 in the appendix or an equivalent replacement sequence of a sequence in Table 1, and the N to-be-coded bits correspond to N coded bits; and the determining, based on a fourth sequence that corresponds to the mother code length N when rate matching does not need to be performed, a first sequence corresponding to the mother code length N includes:

determining locations of N−M to-be-deleted bits in the N coded bits;

sequentially reading polar channel sequence numbers in the fourth sequence, and sequentially reading polar channel sequence numbers in the fourth sequence that do not correspond to the locations of the N−M bits; and when N polar channel sequence numbers are read, determining that a sequence including the N read polar channel sequence numbers is the first sequence that corresponds to the mother code length N when rate matching needs to be performed.

With reference to the third possible implementation of the first aspect, in an eighth possible implementation of the first aspect, the obtaining a first sequence that includes N polar channel sequence numbers includes:

obtaining, from a sequence in Table 2, Table 3, or Table 4 in the appendix or an equivalent replacement sequence of a sequence in Table 2, Table 3, or Table 4, the first sequence that includes N polar channel sequences.

With reference to the first aspect and the foregoing implementations of the first aspect, in a ninth possible implementation of the first aspect, the obtaining a first sequence that includes N polar channel sequence numbers includes:

determining a first sequence S'N based on N second sequences $S_1, S_2, \ldots,$ and $S_N$, where the second sequence $S_i$ includes i polar channel sequence numbers, 1≤i≤N, and i is a positive integer.

With reference to the ninth possible implementation of the first aspect, in a tenth possible implementation of the first aspect, the determining a first sequence $S'_N$ based on N second sequences $S_1, S_2, \ldots,$ and $S_N$ includes:

determining the N second sequences $S_1, S_2, \ldots,$ and $S_N$;

initializing a first sequence $S'_1$ to $S_1$; and setting j to traverse from 2 to N, and calculating the first sequence $S'_N$ according to the following formula:

$S'_j = S'_{j-1} + (S'_{j-1} \backslash S_j)$, where

2≤j≤N, j is a positive integer, "\" represents calculating a difference set of two sequences, and "+" represents connecting two sequences before and after "+" to form one sequence.

According to a second aspect, a coding apparatus is provided, and includes:

a determining module, configured to determine N to-be-coded bits, where N is a positive integer;

an obtaining module, configured to obtain a first sequence that includes N polar channel sequence numbers, where the determining module is further configured to determine a location of an information bit in the N to-be-coded bits based on the first sequence; and the coding module, configured to perform polar coding on the N to-be-coded bits to obtain coded bits.

With reference to the second aspect, in a first possible implementation of the second aspect, the determining module is specifically configured to:

determine N based on M, where N=M, M is an output target code length of a polar code, M is equal to a positive integral power of 2, and M is a positive integer.

With reference to the first possible implementation of the second aspect, in a second possible implementation of the second aspect, the obtaining module is specifically configured to:

obtain, from a sequence in Table 1 in the appendix or an equivalent replacement sequence of a sequence in Table 1, the first sequence that includes N polar channel sequences.

With reference to the second aspect, in a third possible implementation of the second aspect, the determining module is specifically configured to:

determine N based on M, where $N=2^{\lfloor log_2(M-1) \rfloor+1}$, the symbol $\lfloor \; \rfloor$ represents rounding down, M is an output target code length of a polar code, M is not equal to a positive integral power of 2, and M is a positive integer.

With reference to the third possible implementation of the second aspect, in a fourth possible implementation of the second aspect, the N to-be-coded bits correspond to a mother code whose code length is N; and the obtaining module is specifically configured to:

determine, based on a maximum first sequence $S_{max}$ corresponding to a maximum mother code length $N_{max}$ supported by a communications system, a first sequence corresponding to the mother code length N, where the first sequence corresponding to the mother code length N is the first sequence that includes N polar channel sequence numbers.

With reference to the fourth possible implementation of the second aspect, in a fifth possible implementation of the second aspect, the maximum first sequence $S_{max}$ is a sequence in Table 1 in the appendix or an equivalent replacement sequence of a sequence in Table 1, and the N to-be-coded bits correspond to N coded bits; and the obtaining module is specifically configured to:

determine locations of N−M to-be-deleted bits in the N coded bits;

sequentially read polar channel sequence numbers in the maximum first sequence $S_{max}$, and sequentially read polar channel sequence numbers in the maximum first sequence $S_{max}$ that do not correspond to the locations of the N−M bits and that are not greater than N; and when N polar channel sequence numbers are read, determine that a sequence including the N read polar channel sequence numbers is the first sequence corresponding to the mother code length N.

With reference to the third possible implementation of the second aspect, in a sixth possible implementation of the second aspect, the N to-be-coded bits correspond to a mother code whose code length is N; and the obtaining module is specifically configured to:

determine, based on a fourth sequence that corresponds to the mother code length N when rate matching does not need to be performed, a first sequence that corresponds to the mother code length N when rate matching needs to be performed, where the first sequence corresponding to the mother code length N is the first sequence that includes N polar channel sequence numbers.

With reference to the sixth possible implementation of the second aspect, in a seventh possible implementation of the second aspect, the fourth sequence is a sequence in Table 1 in the appendix or an equivalent replacement sequence of a sequence in Table 1, and the N to-be-coded bits correspond to N coded bits; and the obtaining module is specifically configured to:

determine locations of N−M to-be-deleted bits in the N coded bits;

sequentially read polar channel sequence numbers in the fourth sequence, and sequentially read polar channel sequence numbers in the fourth sequence that do not correspond to the locations of the N−M bits; and when N polar channel sequence numbers are read, determine that a sequence including the N read polar channel sequence numbers is the first sequence that corresponds to the mother code length N when rate matching needs to be performed.

With reference to the third possible implementation of the second aspect, in an eighth possible implementation of the second aspect, the obtaining module is specifically configured to:

obtain, from a sequence in Table 2, Table 3, or Table 4 in the appendix or an equivalent replacement sequence of a sequence in Table 2, Table 3, or Table 4, the first sequence that includes N polar channel sequences.

With reference to the second aspect and the possible implementations of the second aspect, in a ninth possible implementation of the second aspect, the obtaining module is specifically configured to:

determine a first sequence $S'_N$ based on N second sequences $S_1, S_2, \ldots,$ and $S_N$, where the second sequence $S_i$ includes i polar channel sequence numbers, $1 \le i \le N$, and i is a positive integer.

With reference to the ninth possible implementation of the second aspect, in a tenth possible implementation of the second aspect, the obtaining module is specifically configured to:

determine the N second sequences $S_1, S_2, \ldots,$ and $S_N$;

initialize a first sequence $S'_1$ to $S_1$; and set j to traverse from 2 to N, and calculate the first sequence $S'_N$ according to the following formula:

$$S'_j = S'_{j-1} + (S'_{j-1} \backslash S_j), \text{ where}$$

$2 \le j \le N$, j is a positive integer, "\" represents calculating a difference set of two sequences, and "+" represents connecting two sequences before and after "+" to form one sequence.

According to a third aspect, a communications apparatus is provided, and includes:

a memory, configured to store a program; and a processor, configured to execute the program stored in the memory, where when the program is executed, the processor is configured to perform any one of the first aspect or the possible implementations of the first aspect.

Another aspect of this application provides a computer readable storage medium. The computer readable storage medium stores an instruction. When the instruction runs on a computer, the computer is enabled to perform the method in the foregoing aspect.

Still another aspect of this application provides a computer program product that includes an instruction. When the instruction runs on a computer, the computer is enabled to perform the method in the foregoing aspect.

Yet another aspect of this application provides a computer program. When the computer program runs on a computer, the computer is enabled to perform the method in the foregoing aspect.

According to the embodiments of this application, the location of the information bit in the to-be-coded bits is determined based on the obtained first sequence that includes N polar channel sequence numbers, so that performance of the polar code can be improved.

DESCRIPTION OF DRAWINGS

FIG. 3b is a flowchart of another implementation of step 302 in FIG. 3a;

FIG. 3c is a flowchart of still another implementation of step 302 in FIG. 3a;

FIG. 3d is a flowchart of yet another implementation of step 302 in FIG. 3a;

FIG. 4b is a flowchart of another implementation of step 402 in FIG. 4a;

DESCRIPTION OF EMBODIMENTS

Figure 1:
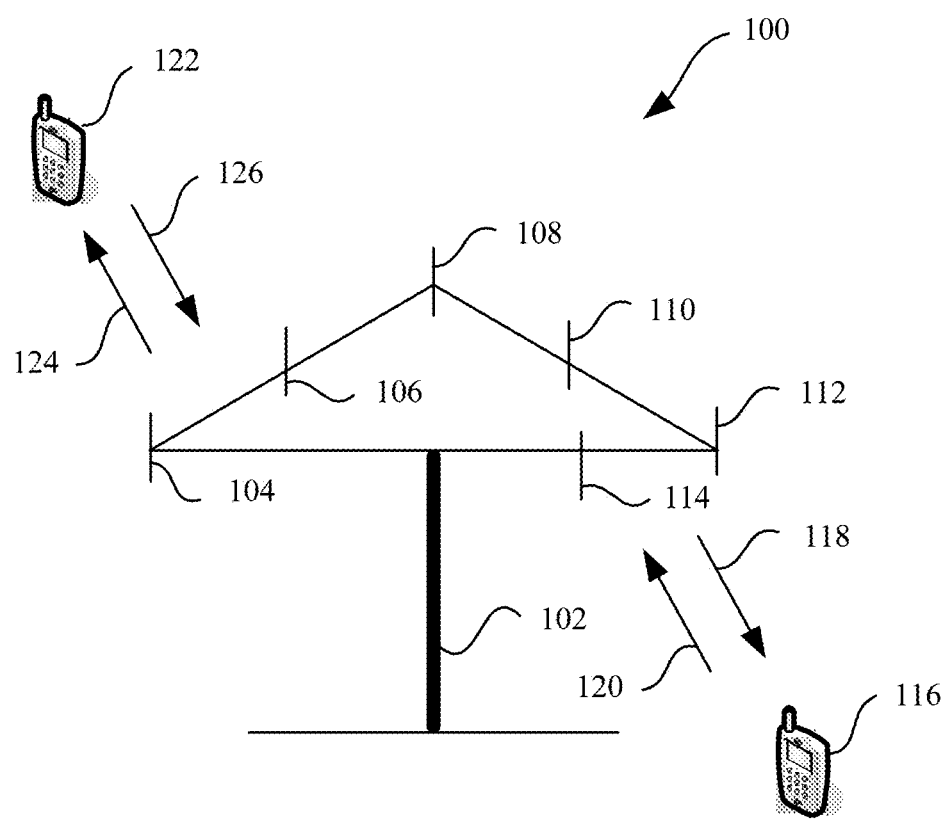
FIG. 1 shows a structure of a wireless communications system according to this application.

Embodiments of the present invention may be applied to various communications systems. Therefore, the following descriptions are not limited to a specific communications system. The communications systems include a global system for mobile communications (Global System of Mobile communication, "GSM" for short) system, a code division multiple access (Code Division Multiple Access, "CDMA" for short) system, a wideband code division multiple access (Wideband Code Division Multiple Access, "WCDMA" for short) system, a general packet radio service (General Packet Radio Service, "GPRS" for short), a long term evolution (Long Term Evolution, "LTE" for short) system, an LTE frequency division duplex (Frequency Division Duplex, "FDD" for short) system, LTE time division duplex (Time Division Duplex, "TDD" for short), a universal mobile telecommunications system (Universal Mobile Telecommunication System, "UMTS" for short), and the like. All information or data coded by a base station or a terminal in the foregoing system by using a conventional turbo code and a conventional LDPC code can be coded by using a polar code in the embodiments.

Terms such as "component", "module", and "system" used in this specification are used to indicate computer-related entities, hardware, firmware, combinations of hardware and software, software, or software being executed. For example, a component may be but is not limited to a process that runs on a processor, a processor, an object, an executable file, a thread of execution, a program, and/or a computer. As shown in figures, both a computing device and an application that runs on the computing device may be components. One or more components may reside within a process and/or a thread of execution, and a component may be located on one computer and/or distributed between two or more computers. In addition, these components may be executed on various computer readable media that store various data structures. For example, the components may communicate by using a local and/or remote process and based on, for example, a signal having one or more data packets (for example, data from two components interacting with another component in a local system, a distributed system, and/or across a network such as the Internet interacting with another system by using the signal).

In addition, the embodiments are described with reference to an access terminal. The access terminal may also be referred to as a system, a subscriber unit, a subscriber station, a mobile station, a mobile console, a remote station, a remote terminal, a mobile device, a user terminal, a terminal, a wireless communications device, a user agent, a user apparatus, or UE (User Equipment, user equipment). The access terminal may be a cellular phone, a cordless phone, a SIP (Session Initiation Protocol, session initiation protocol) phone, a WLL (Wireless Local Loop, wireless local loop) station, a PDA (Personal Digital Assistant, personal digital assistant), a handheld device having a wireless communication function, a computing device, or another processing device connected to a wireless modem. In addition, the embodiments are described with reference to a base station. The base station can be used to communicate with a mobile device. The base station may be a BTS (Base Transceiver Station, base transceiver station) in GSM (Global System of Mobile communication, global system for mobile communications) or CDMA (Code Division Multiple Access, code division multiple access); or may be an NB (NodeB, NodeB) in WCDMA (Wideband Code Division Multiple Access, wideband code division multiple access); or may be an eNB or eNodeB (Evolutional NodeB, evolved NodeB) in LTE (Long Term Evolution, long term evolution), a relay station or an access point, a base station device in a future 5G network, or the like.

Currently, FIG. 1 shows a wireless communications system 100 according to various embodiments. The system 100 includes a base station 102, and the base station 102 may include a plurality of antenna groups. For example, one antenna group may include an antenna 104 and an antenna 106, another antenna group may include an antenna 108 and an antenna 110, and an additional group may include an antenna 112 and an antenna 114. Two antennas are shown for each antenna group, but each group may have more or fewer antennas. The base station 102 may additionally include a transmitter chain and a receiver chain, and a person of ordinary skill in the art may understand that both the transmitter chain and the receiver chain may include a plurality of components (for example, a processor, a modulator, a multiplexer, a demodulator, a demultiplexer, or an antenna) related to signal sending and receiving.

The base station 102 may communicate with one or more access terminals (such as an access terminal 116 and an access terminal 122). However, it may be understood that the base station 102 may communicate with approximately any quantity of access terminals similar to the access terminal 116 and the access terminal 122. The access terminal 116 and the access terminal 122 may be, for example, cellular phones, smartphones, portable computers, handheld communications devices, handheld computing devices, satellite radio apparatuses, the global positioning systems, PDAs, and/or any other proper devices used for communication in the wireless communications system 100. As shown in the figure, the access terminal 116 communicates with the antenna 112 and the antenna 114. The antenna 112 and the antenna 114 send information to the access terminal 116 through a forward link 118, and receive information from the access terminal 116 through a reverse link 120. In addition, the access terminal 122 communicates with the antenna 104 and the antenna 106. The antenna 104 and the antenna 106 send information to the access terminal 122 through a forward link 124, and receive information from the access terminal 122 through a reverse link 126. For example, in an FDD (Frequency Division Duplex, frequency division duplex) system, the forward link 118 and the forward link 120 may use different frequency bands, and the forward link 124 and the reverse link 126 may use different frequency bands. In addition, in a TDD (Time Division Duplex, time division duplex) system, the forward link 118 and the reverse link 120 may use a common frequency band, and the forward link 124 and the reverse link 126 may use a common frequency band.

Each antenna group and/or each area designed for communication are/is referred to as a sector of the base station 102. For example, the antenna group may be designed to communicate with an access terminal in a sector within coverage of the base station 102. During communication through the forward link 118 and the forward link 124, a transmit antenna of the base station 102 may increase signal-to-noise ratios of the forward link 118 for the access terminal 116 and the forward link 124 for the access terminal 122 through beamforming. In addition, in comparison with a case in which a base station performs sending to all access terminals of the base station by using a single antenna, when the base station 102 performs, through beamforming, sending to the access terminal 116 and the access terminal 122 that are randomly scattered in a related coverage area, less interference is caused to a mobile device in a neighboring cell.

At a given time, the base station 102, the access terminal 116, and/or the access terminal 122 may be wireless communications sending apparatuses and/or wireless communications receiving apparatuses. When sending data, the wireless communications sending apparatus may code the data for transmission. For achieving this, in some embodiments, the wireless communications sending apparatus may have (for example, generate, obtain, or store in a memory) a specific quantity of information bits that need to be sent to the wireless communications receiving apparatus through a channel. The information bits may be included in a transport block (or a plurality of transport blocks) of data, and the transport block may be segmented to generate a plurality of code blocks. In addition, the wireless communications sending apparatus may code each code block by using a polar code coder (not shown).

Figure 2A:
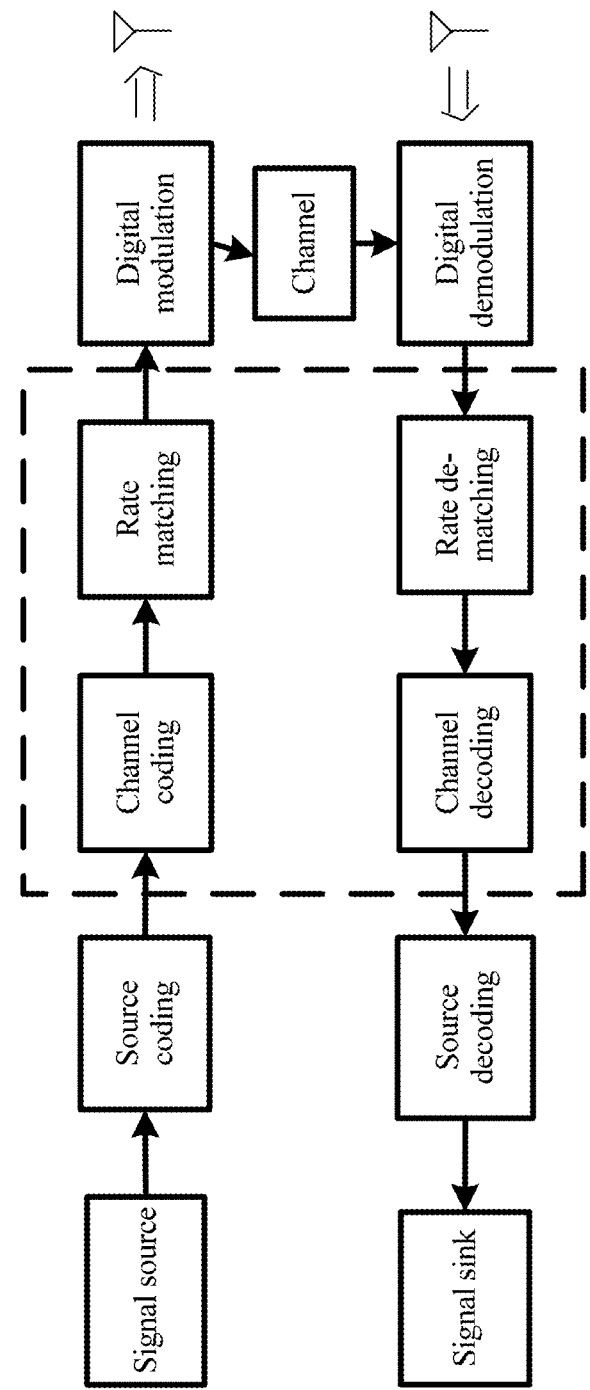
FIG. 2a is a schematic diagram of a basic process of a transmit end and a receive end during wireless communication.

FIG. 2a shows a basic process of wireless communication. At a transmit end, a signal source is transmitted after source coding, channel coding, and digital modulation are sequentially performed. At a receive end, a signal sink is output after digital demodulation, channel decoding, and source decoding are sequentially performed. A polar code may be used for channel coding and decoding. Because a code length of an original polar code (mother code) is an integral power of 2, a polar code of any code length needs to be implemented through rate matching in actual application. As shown in FIG. 2a, rate matching is performed after channel coding at the transmit end, to implement any target code length, and rate de-matching is performed before channel decoding at the receive end.

Figure 2B:
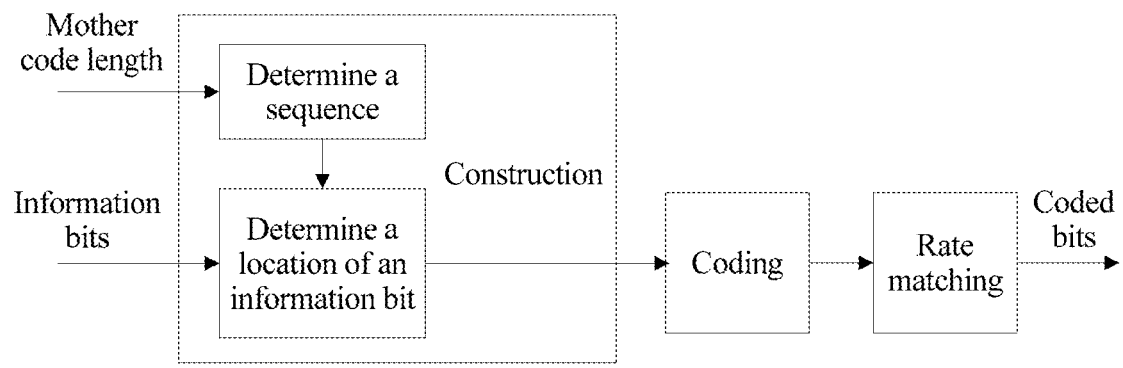
FIG. 2b is a schematic diagram of a polar code coding process according to an embodiment of this application.

As shown in FIG. 2b, a polar code coding process includes three processing processes: a construction process, a coding process, and a rate matching process.

First, the construction process is performed: receiving input N1 information bits; determining, based on a mother code length N, a sequence corresponding to the mother code length N, where the mother code length N is determined based on a target code length M obtained after coding, there are N to-be-coded bits, and the N to-be-coded bits include the N1 information bits and N2 fixed bits; and determining locations of the information bits from the sequence based on a quantity of information bits, that is, determining locations of the fixed bits. Then, the coding process is performed: performing polar coding on the to-be-coded bits to obtain polar-coded bits. Finally, the rate matching process is performed: Because a code length (namely, a mother code length) obtained after polar code coding is a positive integral power of 2, a polar code of any code length usually needs to be implemented through rate matching in actual application, the rate matching may be implemented by using a puncturing (puncture) scheme or a shortening (shorten) scheme, and specific implementation includes: deleting N−M bits from a code length that is a positive integral power of 2, to obtain a target code length. N, M, N1, and N2 each are a positive integer.

A coding method provided in various embodiments relates to the polar code coding process shown in FIG. 2b, and mainly relates to the construction process, to be specific, how to determine a location of an information bit. According to the coding method provided in various embodiments, a location of an information bit in to-be-coded bits is determined based on an obtained first sequence that includes N polar channel sequence numbers, so that performance of a polar code can be improved.

Because a mother code length obtained after polar code coding is a positive integral power of 2, and an output target code length of the polar code may or may not be a positive integral power of 2, rate matching does not need to be performed when the output target code length of the polar code is a positive integral power of 2, and rate matching needs to be performed when the output target code length of the polar code is not a positive integral power of 2.

Figure 3A:
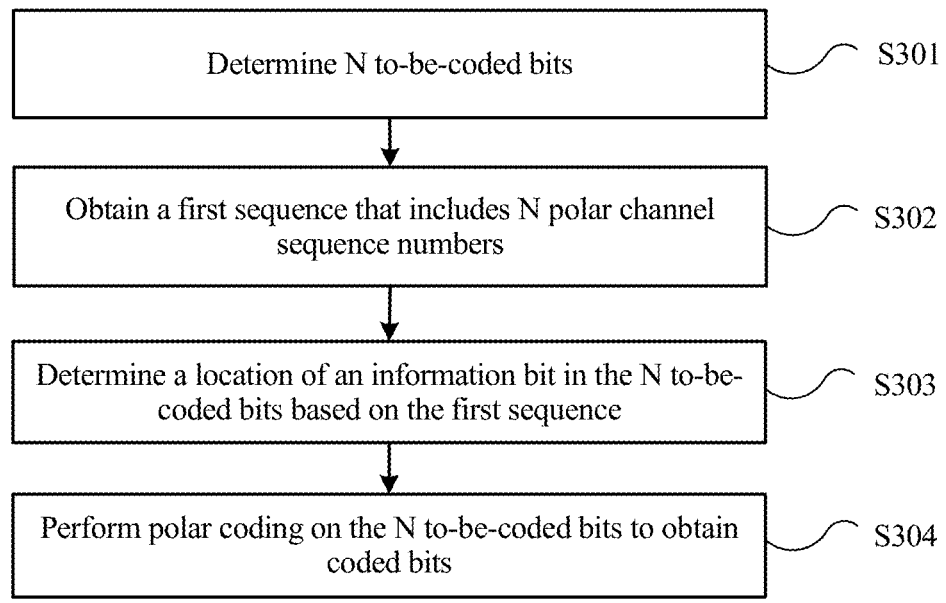
FIG. 3a is a schematic flowchart of a coding method according to an embodiment of this application.

FIG. 3a shows a coding method process 300. The following embodiments are described below in detail with reference to FIG. 3a.

Embodiment 1

A coding method provided in this embodiment includes the following steps.

S301. Determine N to-be-coded bits.

Herein, N=M, M is used as an output target code length of a polar code and is equal to a positive integral power of 2, and M is a positive integer. The N to-be-coded bits correspond to N polar channels, and one bit corresponds to one polar channel.

S302. Obtain a first sequence that includes N polar channel sequence numbers.

In one embodiment, Table 1 in the appendix shows first sequences corresponding to different values of N. In Table 1, N is a length of the to-be-coded bits, and an element of each first sequence in the table is a polar channel sequence number. All or some of the first sequences in Table 1 may be stored in a communications system to which this implementation is applied.

It should be noted that Table 1 and Table 2, Table 3, and Table 4 that are used in subsequent embodiments are merely examples. Without affecting an overall effect, operations performed on sequences in Table 1, Table 2, Table 3, and Table 4 may include but are not limited to adjustments or equivalent replacement in the following aspects:

1. Exchange locations of several elements of each first sequence in Table 1, Table 2, Table 3, and Table 4. For example, locations of two elements in each first sequence whose interval does not exceed 10 are exchanged.

2. Each first sequence in Table 1, Table 2, Table 3, and Table 4 includes N elements from 1 to N, where N is a mother code length, and the N elements from 1 to N represent N polar channel sequence numbers. Actually, the N polar channel sequence numbers may alternatively be from 0 to N−1. Therefore, 1 is subtracted from each element of each first sequence in Table 1, Table 2, Table 3, and Table 4 in the current appendix, to form N elements from 0 to N−1. Certainly, another manner may alternatively be used to represent the polar channel sequence numbers or polar channel identifiers, and a specific expression manner does not affect a specific polar channel location indicated in the tables.

3. A sequence of elements of each first sequence in Table 1, Table 2, Table 3, and Table 4 may be reversed.

S303. Determine a location of an information bit in the N to-be-coded bits based on the first sequence.

For achieving this, in some embodiments, polar channel locations corresponding to first K polar channel sequence numbers or last K polar channel sequence numbers in the first sequence are selected as locations of information bits, and other polar channel locations are used as locations of fixed bits. In this way, the locations of the information bits and the locations of the fixed bits are obtained. K is a quantity of information bits in the N to-be-coded bits, and K is a positive integer less than N.

It should be noted that in this embodiment, the locations of the information bits are not limited to the polar channel locations corresponding to the first K polar channel sequence numbers or the last K polar channel sequence numbers in the first sequence.

Further, the locations of the information bits determined based on the first sequence meets an inclusion relationship. To be specific, a set of determined locations of the K information bits is a subset of a set of locations of K+m information bits, where m is a positive integer, so that storage complexity of polar code coding is reduced.

S304. Perform polar coding on the N to-be-coded bits to obtain coded bits.

For achieving this, in some embodiments, a coding process of the to-be-coded bits may be completed by using a coding matrix $F_N$ of the polar code, to obtain the polar-coded bits.

The foregoing implementation differs from other implementations mainly in step S302. In this way, the communications system stores the first sequence S, so that calculation complexity in construction of the first sequence is greatly reduced.

Embodiment 2

In another embodiment, for the first sequence in S302 in Embodiment 1, a first sequence $S'_N$ may be alternatively generated based on N second sequences $S_1, S_2, \ldots,$ and $S_N$. The second sequence $S_i$ includes i polar channel sequence numbers, in other words, includes i elements, and the second sequence $S_i$ is determined based on reliability of N polar channels, where $1 \le i \le N$, and i is a positive integer.

Figure 3B:
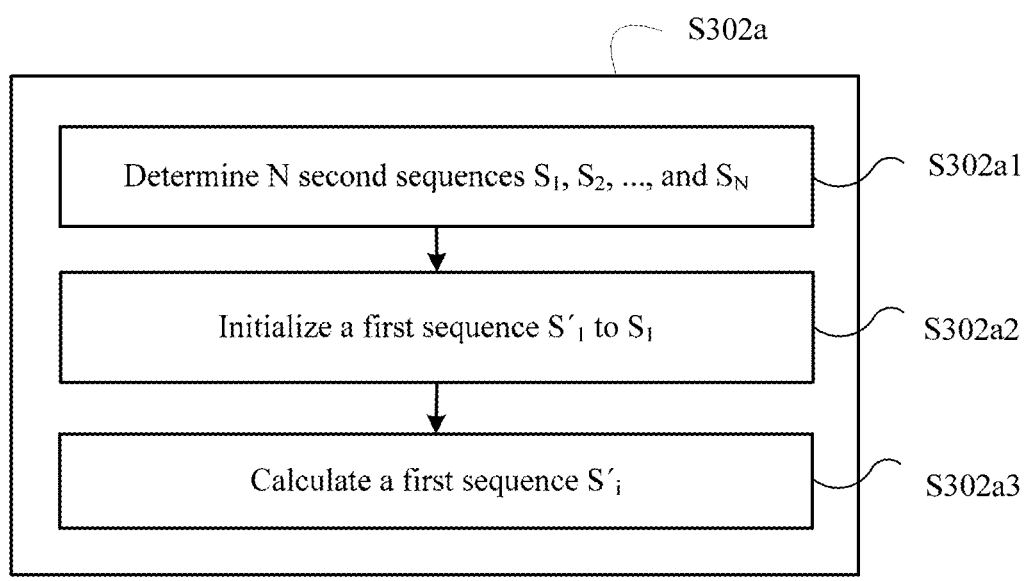

For achieving this, in some embodiments, as shown in FIG. 3b, S302a of generating a first sequence $S'_N$ based on N second sequences $S_1, S_2, \ldots,$ and $S_N$ includes the following steps.

S302a1. Determine the N second sequences $S_1, S_2, \ldots,$ and $S_N$, where for the second sequence $S_i$, $1 \le i \le N$, and a process of determining the second sequence $S_i$ is:

determining reliability of N polar channels; and determining the second sequence $S_i$ based on the reliability of the N polar channels, where the second sequence $S_i$ includes i polar channel sequence numbers, the i polar channel sequence numbers correspond to i polar channels, and reliability of any one of the i polar channels is greater than reliability of (N−i) polar channels other than the i polar channels in the N polar channels.

It should be noted that the i elements (namely, the i polar channel sequence numbers) included in the second sequence $S_i$ may or may not be sorted based on reliability of the polar channels. In other words, the second sequence $S_i$ may be an unsorted set.

For example, for the second sequence $S_1$, the reliability of the N polar channels is determined, and a sequence including a polar channel sequence number corresponding to maximum reliability in the determined reliability of the N polar channels is used as the second sequence $S_1$. In other words, $S_1$ includes the polar channel sequence number corresponding to the maximum reliability. Because $S_1$ includes one element, the element included in $S_1$ does not need to be sorted.

Common polar channel reliability measurements include an error probability, a channel capacity, a polarization weight, and the like. For example, the reliability of the polar channels may be determined by using a Gaussian approximation algorithm or a density evolution algorithm. An algorithm used to determine the reliability of the polar channels is not limited in the present invention.

S302a2. Initialize a first sequence $S'_1$ to $S_1$.

S302a3. Calculate the first sequence $S'_i$.

For achieving this, in some embodiments, the first sequence $S'_i$ is calculated by using the following formula:

$$S'_j = S'_{j-1} + (S'_{j-1} \backslash S_j), \text{ where}$$

$2 \le j \le N$; j is a positive integer; \ represents calculating a difference set of two sequences, for example, sequence [1 2 3]\ sequence [1 3 2 4] is [4]; and "+" represents connecting two sequences before and after "+" to form one sequence, for example, [3 2 1]+[4] is [3 2 1 4]; and j sequentially traverses from 2 to N, to obtain a first sequence $S'_N$.

In this implementation, for other steps S301a, S303a, and S304a, respectively refer to the foregoing S301, S303, and S304. Details are not described herein again. This implementation differs from other implementations mainly in step S302a. In this way, a communications system does not need to store the first sequence, thereby greatly saving storage resources.

Embodiment 3

In still another embodiment of the present invention, a first sequence S corresponding to a current mother code length N may be determined based on a maximum first sequence $S_{max}$ corresponding to a maximum mother code length $N_{max}$ supported by a communications system.

The maximum first sequence $S_{max}$ may be agreed on in a protocol, and is stored in the communications system. For example, the maximum first sequence $S_{max}$ may be a first sequence corresponding to N that ranges from 256 to 1024 or ranges from 1024 to 2048 in Table 1 in Embodiment 1, or may be a first sequence generated and stored by using a generation method in Embodiment 2.

It should be additionally noted that a current maximum mother code length of a polar code (Maximum mother code size of a polar code) may be:

$256 \le N_{max} \le 1024$ (for downlink control information); or $1024 \le N_{max} \le 2048$ (for uplink control information).

When the current mother code length N is equal to Nmax, this implementation is equivalent to the foregoing S301 to S304 or S301a to S304a, and details are not described herein again.

Figure 3C:
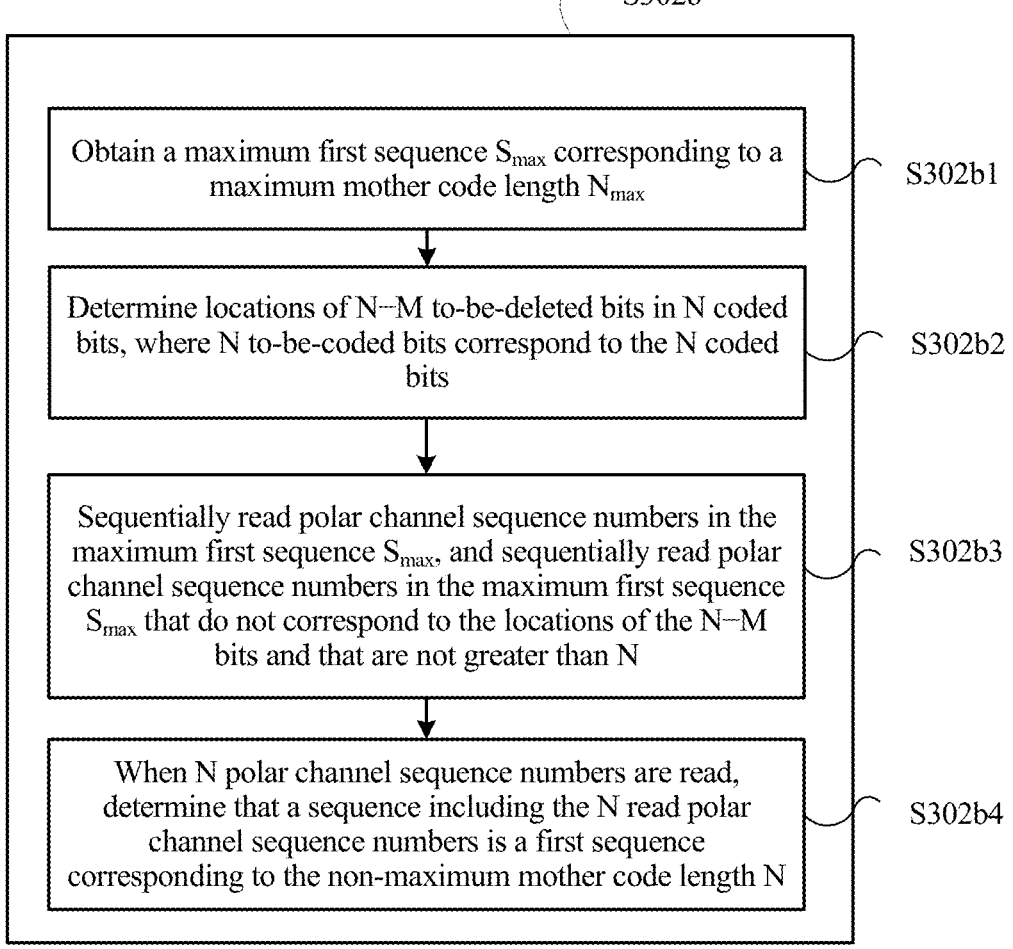

When N is less than $N_{max}$, as shown in FIG. 3c, this implementation includes the following steps.

S301b. Determine N to-be-coded bits.

Herein, $N < N_{max}$ and $N = 2^{\lfloor log_2(M-1) \rfloor + 1}$, M is used as a non-maximum target code length of the polar code and is not equal to a positive integral power of 2, and M is a positive integer.

In this case, the N to-be-coded bits correspond to a current mother code whose code length is N, the current mother code length N is less than the maximum mother code length N, and rate matching needs to be performed on the current mother code length N to obtain the target code length M.

S302b. Obtain a first sequence that includes N polar channel sequence numbers.

For achieving this, in some embodiments, the first sequence corresponding to the current mother code length N is determined based on the maximum first sequence $S_{max}$ corresponding to the maximum mother code length $N_{max}$ supported by the communications system specifically includes the following steps.

S302b1. Obtain a maximum first sequence $S_{max}$ corresponding to the maximum mother code length $N_{max}$.

As described above, the maximum first sequence $S_{max}$ may be directly obtained from a memory, and the maximum first sequence $S_{max}$ may be agreed on in a protocol, and is stored in the communications system. For example, the maximum first sequence $S_{max}$ may be a first sequence corresponding to N that ranges from 256 to 1024 or ranges from 1024 to 2048 in Table 1 in Embodiment 1, or may be a first sequence generated and stored by using a generation method in Embodiment 2.

S302b2. Determine locations of N−M to-be-deleted bits in N coded bits, where the N to-be-coded bits correspond to the N coded bits.

Because rate matching needs to be performed on the current mother code length N to obtain the target code length M, and the rate matching may usually be implemented by using a punctured location in a puncturing pattern or a shortened location in a shortening (shorten) pattern, the locations of the N−M to-be-deleted bits may be punctured locations in the puncturing pattern or shortened locations in the shortening (shorten) pattern. The puncturing pattern may be a front-to-back order or a front-to-back bit reversal order. The shortening pattern may be a back-to-front order or a back-to-front bit reversal order.

The punctured location or the shortened location is described below.

1. Punctured Location
(1) Front-to-Back Order
0 is set at locations of first N−M bits, and 1 is set at locations of the other bits, namely, $$\left( \underbrace{0, 0, \ldots, 0}_{N\text{-}M\ 0s}, \underbrace{1, 1, \ldots, 1}_{M\ 1s} \right),$$

where "0" represents a punctured location, and "1" represents a non-punctured location.

(2) Front-to-Back Bit Reversal Order
Bit reversal is performed on front-to-back punctured locations. The bit reversal is converting a decimal integer into a binary form, reversing an order of binary elements, and converting a binary number obtained after the reversing into a decimal number. An obtained new number is a bit reversal value of the original number.

For achieving this, in some embodiments, for an auxiliary sequence whose initialized length is N (namely, the front-to-back punctured locations), first N−M elements are set to 0, and last M elements are set to 1, where N represents a mother code length, M represents a target code length, "0" represents a punctured location, and "1" represents a non-punctured location. The auxiliary sequence is:

$$q_0^{N-1} = \left( \underbrace{0, 0, \ldots, 0}_{N\text{-}M\ 0s}, \underbrace{1, 1, \ldots, 1}_{M\ 1s} \right)$$

Bit-reversal rearrangement is performed on the auxiliary sequence $q_0^{N-1}$, to obtain a puncturing pattern $p_0^{N-1}$, namely, a front-to-back bit-reversal puncturing pattern, where $$p_i = p_{D(b_1 b_2 \ldots b_n)} = q_{D(b_n b_{n-1} \ldots b_1)}, \text{where}$$

$D(b_1 b_2 \ldots b_n)$ converts a binary sequence $b_1 b_2 \ldots b_n$ into a decimal number, and $$D(b_1 b_2 \ldots b_n) = 1 + \sum_{j=1}^{n} b_j \cdot 2^{n-j}.$$

2. Shortened Location
(1) Back-to-Front Order
0 is set at locations of last N−M bits, and 1 is set at locations of the other bits, namely, $$\left( \underbrace{1, 1, \ldots, 1}_{M\ 1s}, \underbrace{0, 0, \ldots, 0}_{N\text{-}M\ 0s} \right),$$

where "0" represents a shortened location, and "1" represents a non-shortened location.

(2) Back-to-Front Bit Reversal Order
Bit reversal is performed on back-to-front shortened locations.

For achieving this, in some embodiments, for an auxiliary sequence whose initialized length is N, first M elements are set to 1, and last N−M elements are set to 0, where N represents a mother code length, and M represents a target code length. The auxiliary sequence is:

$$q_0^{N-1} = \left( \underbrace{1, 1, \ldots, 1}_{M\ 1s}, \underbrace{0, 0, \ldots, 0}_{N\text{-}M\ 0s} \right)$$

Bit-reversal rearrangement is performed on $q_0^{N-1}$, to obtain a puncturing pattern $p_0^{N-1}$, where a coded bit at a location "0" is shortened, and $$p_i = p_{D(b_1 b_2 \ldots b_n)} = q_{D(b_n b_{n-1} \ldots b_1)}, \text{where}$$

$D(b_1 b_2 \ldots b_n)$ converts a binary sequence $b_1 b_2 \ldots b_n$ into a decimal number, and $$D(b_1 b_2 \ldots b_n) = 1 + \sum_{j=1}^{n} b_j \cdot 2^{n-j}.$$

S302b3. Sequentially read polar channel sequence numbers in the maximum first sequence $S_{max}$, and sequentially read polar channel sequence numbers in the maximum first sequence $S_{max}$ that do not correspond to the locations of the N−M bits and that are not greater than N.

S302b4. When N polar channel sequence numbers are read, determine that a sequence including the N read polar channel sequence numbers is the first sequence corresponding to the non-maximum mother code length N.

S303b. Determine a location of an information bit in the N to-be-coded bits based on the first sequence.

For achieving this, in some embodiments, polar channel locations corresponding to first K polar channel sequence numbers or last K polar channel sequence numbers in the first sequence may be selected as locations of information bits, and other polar channel locations are used as locations of fixed bits, where K is a quantity of information bits in the N to-be-coded bits.

S304b. Perform polar coding on the N to-be-coded bits to obtain coded bits.

It can be learned from this implementation that this implementation differs from other implementations mainly in step S302b. In this case, the communications system needs to store only the maximum first sequence $S_{max}$, thereby saving storage space. In addition, calculation complexity of a construction process of the first sequence is relatively low.

Embodiment 4

In yet another embodiment, a first sequence that corresponds to a mother code length N when rate matching needs to be performed may be determined based on a fourth sequence that corresponds to the same mother code length N when rate matching does not need to be performed.

The fourth sequence that corresponds to the mother code length N when rate matching does not need to be performed may be agreed on in a protocol, and is stored in a communications system. For example, the fourth sequence may be a first sequence corresponding to different values of N in Table 1 in Embodiment 1, or may be a first sequence generated and stored according to a generation method in Embodiment 2.

Figure 3D:
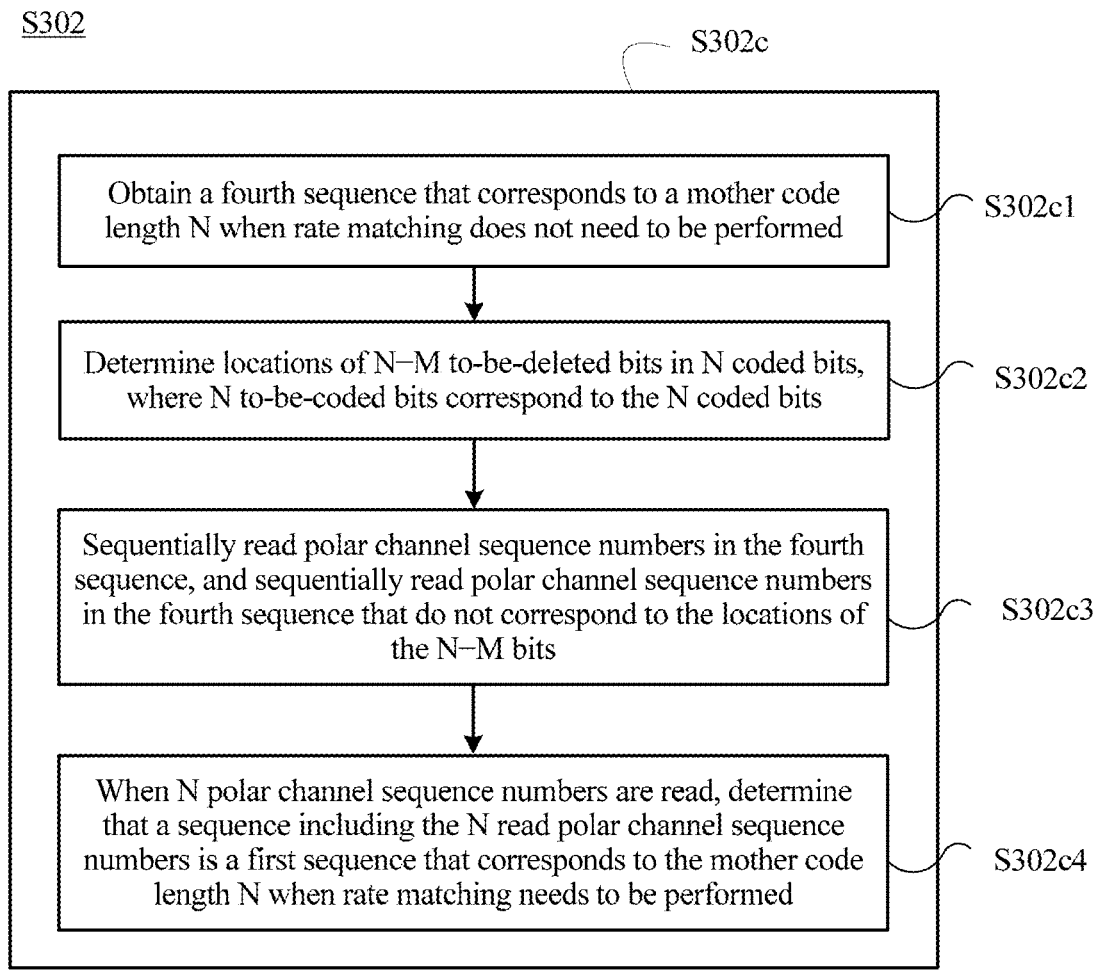

The following describes how to determine the first sequence that corresponds to the mother code length N when rate matching needs to be performed. As shown in FIG. 3d, this implementation includes the following steps.

S301c. Determine N to-be-coded bits.

Herein, $N=2^{\lfloor log_2(M-1) \rfloor+1}$, M is used as a target code length of a polar code and is not equal to a positive integral power of 2, and M is a positive integer.

In this case, the N to-be-coded bits correspond to a mother code whose code length is N, and rate matching needs to be performed on the mother code length N to obtain the target code length M.

S302c. Obtain a first sequence that includes N polar channel sequence numbers.

For achieving this, in some embodiments, that the first sequence corresponding to the mother code length N is determined based on the fourth sequence that corresponds to the mother code length N when rate matching does not need to be performed specifically includes the following steps.

S302c1. Obtain the fourth sequence that corresponds to the mother code length N when rate matching does not need to be performed.

As described above, the fourth sequence that corresponds to the mother code length N when rate matching does not need to be performed may be agreed on in the protocol, and is stored in the communications system. For example, the fourth sequence may be a first sequence corresponding to different values of N in Table 1 in Embodiment 1, or may be a first sequence generated and stored according to the generation method in Embodiment 2.

S302c2. Determine locations of N–M to-be-deleted bits in N coded bits, where the N to-be-coded bits correspond to the N coded bits.

Because rate matching needs to be performed on the mother code length N to obtain the target code length M, and the rate matching may usually be implemented by using a punctured location in a puncturing pattern or a shortened location in a shortening (shorten) pattern, the locations of the N–M to-be-deleted bits may be punctured locations in the puncturing pattern or shortened locations in the shortening (shorten) pattern. For the punctured location or the shortened location, refer to the foregoing related descriptions.

S302c3. Sequentially read polar channel sequence numbers in the fourth sequence, and sequentially read polar channel sequence numbers in the fourth sequence that do not correspond to the locations of the N–M bits.

S302c4. When N polar channel sequence numbers are read, determine that a sequence including the N read polar channel sequence numbers is the first sequence that corresponds to the mother code length N when rate matching needs to be performed.

S303c. Determine a location of an information bit in the N to-be-coded bits based on the first sequence.

For achieving this, in some embodiments, polar channel locations corresponding to first K polar channel sequence numbers or last K polar channel sequence numbers in a third sequence may be selected as locations of information bits, and other polar channel locations are used as locations of fixed bits, where K is a quantity of information bits in the N to-be-coded bits.

It should be noted that in this embodiment, the locations of the information bits are not limited to the polar channel locations corresponding to the first K polar channel sequence numbers or the last K polar channel sequence numbers in the first sequence.

S304c. Perform polar coding on the N to-be-coded bits to obtain coded bits.

For achieving this, in some embodiments, a coding process of the to-be-coded bits may be completed by using a coding matrix $F_N$ of the polar code, to obtain the polar-coded bits.

It can be learned that this implementation differs from other implementations mainly in step S302c. In this way, the communications system needs to store only the fourth sequence that corresponds to the mother code length N when rate matching does not need to be performed, thereby saving storage space. In addition, calculation complexity of a construction process of the first sequence that corresponds to the mother code length N when rate matching needs to be performed is relatively low.

Embodiment 5

In comparison with Embodiment 4, in this embodiment, a first sequence that corresponds to a mother code length N when rate matching needs to be performed is determined based on a table in the related appendix.

Figure 4A:
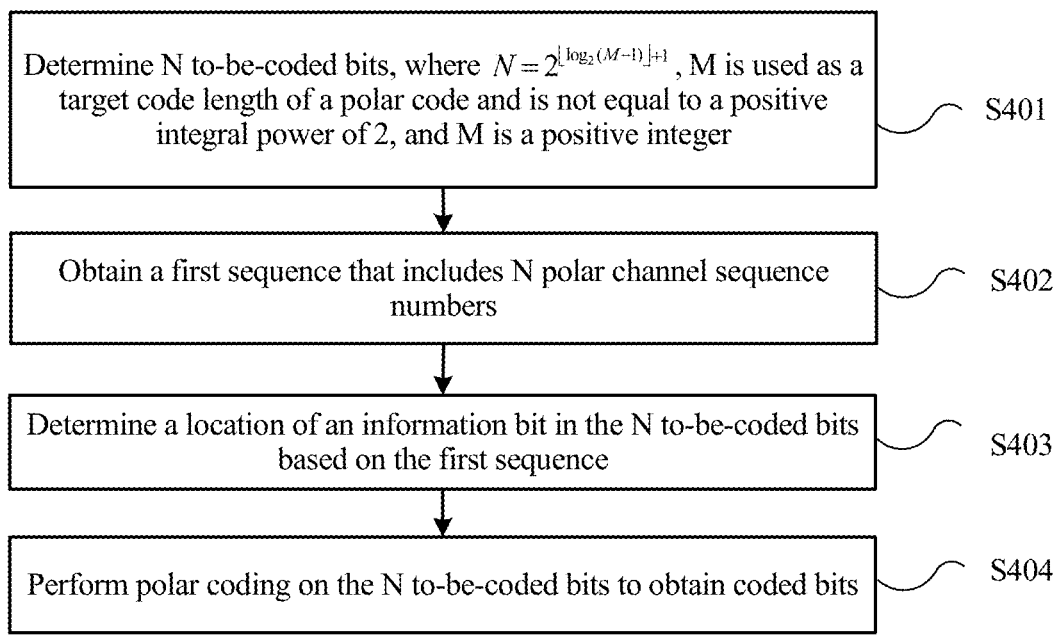
FIG. 4a is a schematic flowchart of another coding method according to an embodiment of this application.

FIG. 4a shows a coding method process 400 according to another embodiment. For achieving this, in some embodiments, the coding process includes the following steps.

S401. Determine N to-be-coded bits, where $N=2^{\lfloor log_2(M-1) \rfloor+1}$, M is used as a target code length of a polar code and is not equal to a positive integral power of 2, and M is a positive integer.

In this case, rate matching needs to be performed on the mother code length N to obtain the target code length M.

S402. Obtain a first sequence that includes N polar channel sequence numbers.

In one embodiment, Table 2 in the appendix shows first sequences corresponding to different values of M and N. In Table 2, M is the target code length of the polar code, N is a quantity of to-be-coded bits, and elements of each first sequence are polar channel sequence numbers.

In another embodiment of the present invention, Table 3 in the appendix shows first sequences corresponding to different values of M and N. In Table 3, M is the target code length of the polar code, N is a quantity of to-be-coded bits, and elements of each first sequence are polar channel sequence numbers.

In still another embodiment, Table 4 in the appendix shows first sequences corresponding to different values of M and N. In Table 4, M is the target code length of the polar code, N is a quantity of to-be-coded bits, and elements of each first sequence are polar channel sequence numbers.

For equivalent replacements of sequences in Table 2, Table 3, and Table 4, refer to related descriptions in Embodiment 1.

S403. Determine a location of an information bit in the N to-be-coded bits based on the first sequence.

For achieving this, in some embodiments, polar channel locations corresponding to first K polar channel sequence numbers in the first sequence are selected as locations of information bits, and other polar channel locations are used as locations of fixed bits. In this way, the locations of the information bits and the locations of the fixed bits are obtained. K is a quantity of information bits in the N to-be-coded bits.

It should be noted that in this embodiment, the locations of the information bits are not limited to the polar channel locations corresponding to the first K polar channel sequence numbers or polar channel locations corresponding to last K polar channel sequence numbers in the first sequence.

S404. Perform polar coding on the N to-be-coded bits to obtain coded bits.

For achieving this, in some embodiments, a coding process of the to-be-coded bits may be completed by using a coding matrix $F_N$ of the polar code, to obtain the polar-coded bits.

Embodiment 6

Similar to Embodiment 5, in still another embodiment of the present invention, a first sequence that corresponds to a mother code length N when rate matching needs to be performed is determined based on N second sequences $S_1$, $S_2$, ..., and $S_N$.

For achieving this, in some embodiments, for the foregoing S402, alternatively, the first sequence is determined based on the N second sequences $S_1$, $S_2$, ..., and $S_N$. The second sequence $S_i$ includes i polar channel sequence numbers, in other words, includes i elements, and the second sequence $S_i$ is determined based on reliability of N polar channels, where $1 \le i \le N$, and i is a positive integer.

Figure 4B:
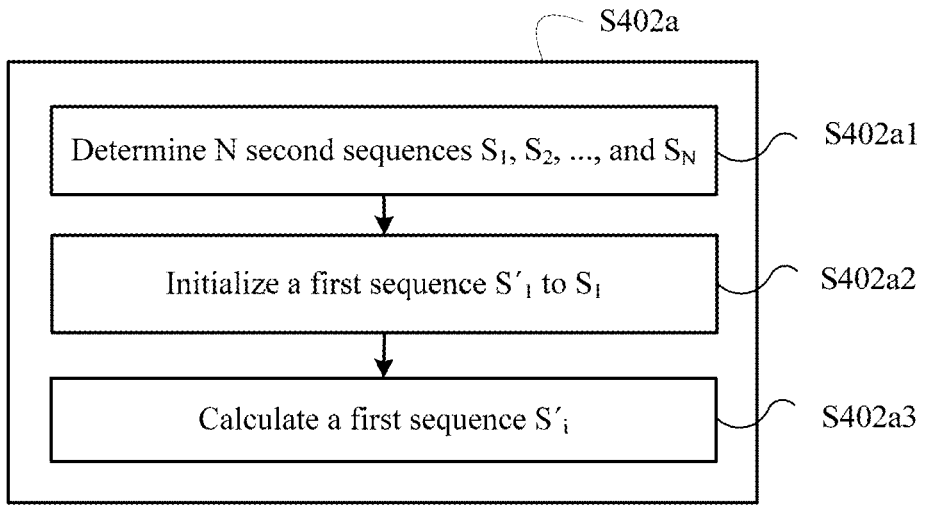

For achieving this, in some embodiments, as shown in FIG. 4b, S402a of determining a first sequence based on N second sequences $S_1$, $S_2$, ..., and $S_N$ includes the following steps.

S402a1. Determine the N second sequences $S_1$, $S_2$, ..., and $S_N$.

For the second sequence $S_i$, $1 \le i \le N$, and a process of determining the second sequence $S_i$ is:

determining reliability of N polar channels; and determining the second sequence $S_i$ based on the reliability of the N polar channels, where the second sequence $S_i$ includes i polar channel sequence numbers, the i polar channel sequence numbers correspond to i polar channels, and reliability of any one of the i polar channels is greater than reliability of (N−i) polar channels other than the i polar channels in the N polar channels.

It should be noted that the i elements (namely, the i polar channel sequence numbers) included in the second sequence $S_i$ may or may not be sorted based on reliability of the polar channels. In other words, the second sequence $S_i$ may be an unsorted set.

For example, for the second sequence $S_1$, the reliability of the N polar channels is determined, and a sequence including a polar channel sequence number corresponding to maximum reliability in the determined reliability of the N polar channels is used as the second sequence $S_1$. In other words, $S_1$ includes the polar channel sequence number corresponding to the maximum reliability. Because $S_1$ includes one element, the element included in $S_1$ does not need to be sorted.

Common polar channel reliability measurements include an error probability, a channel capacity, a polarization weight, and the like. For example, the reliability of the polar channels may be determined by using a Gaussian approximation algorithm or a density evolution algorithm. An algorithm used to determine the reliability of the polar channels is not limited in the present invention.

Rate matching may usually be implemented by using a puncturing pattern or a shortening (shorten) pattern. In the puncturing pattern, punctured locations may be in a front-to-back order or a front-to-back bit reversal order. In the shortening pattern, shortened locations may be in a back-to-front order or a back-to-front bit reversal order. Different punctured locations or different shortened locations may lead to different determined reliability of polar channels, and therefore different second sequences Si are generated. For example, in the Gaussian approximation algorithm, different punctured locations or shortened locations affect an initial value, and therefore different error probabilities are calculated. How to calculate an error probability by using a punctured location or a shortened location in the Gaussian approximation algorithm is further described below.

S402a2. Initialize a first sequence $S'_1$ to $S_1$.

S402a3. Calculate the first sequence $S'_i$.

For achieving this, in some embodiments, the first sequence $S'_1$ is calculated according to the following formula:

$$S'_j = S'_{j-1} + (S'_{j-1} \backslash S_j), \text{ where}$$

$2 \le j \le N$; j is a positive integer; \ represents calculating a difference set of two sequences, for example, sequence [1 2 3]\sequence [1 3 2 4] is [4]; and "+" represents connecting two sequences before and after "+" to form one sequence, for example, [3 2 1]+[4] is [3 2 1 4]; and j sequentially traverses from 2 to N, to obtain a first sequence $S'_N$.

In this implementation, for other steps S401a, S403a, and S404a, respectively refer to the foregoing S401, S403, and S404. Details are not described herein again.

This implementation differs from other implementations mainly in step S402a. In this way, a communications system does not need to store the first sequence S, thereby greatly saving storage resources.

For the foregoing implementations, the following describes a process of calculating an error probability of N polar channels by using a Gaussian approximation algorithm.

1. Initialize a log-likelihood ratio average value corresponding to each of the N polar channels, to obtain an initial value of the log-likelihood ratio average value.

A corresponding log-likelihood ratio of each code symbol location of a polar code is initialized, to obtain an initial value of a log-likelihood ratio average value of each code symbol location.

In the embodiment corresponding to FIG. 3, that is, when no rate matching does not need to be performed (no puncturing or shortening needs to be performed), the initial value of the log-likelihood ratio average value of each code symbol location is calculated by using the following formula:

$$E[L_1^{(i)}(y_i)] = \frac{2}{\sigma^2},$$

where $E[L_1^{(i)}(y_i)]$ represents an initial value of a log-likelihood ratio average value of an $i^{th}$ code symbol location, and $\sigma$ is used to indicate signal noise.

In the embodiment corresponding to FIG. 4, namely, when rate matching needs to be performed, different initial values are separately provided for a puncturing pattern or a shortening pattern.

In the puncturing pattern, the initial value of the log-likelihood ratio average value of each code symbol location is calculated by using the following formula:

$$E[L_1^{(i)}(y_i)] = \begin{cases} \frac{2}{\sigma^2} & \text{if } NoPuncturing\ x(i) \\ 0 & \text{if } puncturing\ x(i) \end{cases},$$

where puncturing $x(i)$ represents that an $i^{th}$ code symbol location is a punctured location, No puncturing $x(i)$ represents that the $i^{th}$ code symbol location is a non-punctured location, $x(i)$ represents the $i^{th}$ code symbol location, $E[L_1^{(i)}*y_i]$ represents an initial value of a log-likelihood ratio average value of the $i^{th}$ code symbol location, and $\sigma$ is used to represent a standard deviation of signal noise.

In the shortening (shorten) pattern, the initial value of the log-likelihood ratio average value of each code symbol location is calculated by using the following formula:

$$E[L_1^{(i)}(y_i)] = \begin{cases} \frac{2}{\sigma^2} & \text{if } NoShorting\ x(i) \\ \infty & \text{if } shorting\ x(i) \end{cases},$$

where shorting $x(i)$ represents that an $i^{th}$ code symbol location is a shortened location, and NoShorting $x(i)$ represents that the $i^{th}$ code symbol location is a non-shortened location.

2. Recursively update the log-likelihood ratio average value based on the initial value of the log-likelihood ratio average value.

The log-likelihood ratio average value is recursively updated based on the calculated initial value of the log-likelihood ratio average value.

The following formulas are used:

$$\begin{cases} L_{n/2}^{(i)}\left(y_1^{n/2}, \hat{u}_{1,e}^{2i-2} \oplus \hat{u}_{1,o}^{2i-2}\right) = L_{n/2}^{(i)}(up) \\ L_{n/2}^{(i)}\left(y_{n/2+1}^{n}, \hat{u}_{1,e}^{2i-2}\right) = L_{n/2}^{(i)}(down) \end{cases} \quad \text{(Formula 1)}$$

and $$\begin{cases} E[L_n^{(2i-1)}] = \begin{cases} \Phi^{-1}(1 - (1 - \Phi(E[L_{n/2}^{(i)}(up)]))) & \text{(Formula 2)} \\ (1 - \Phi(E[L_{n/2}^{(i)}(down)])))_{none\ of\ them\ equals\ 0} \\ 0 & E[L_{n/2}^{(i)}(up)] = 0 \\ 0 & E[L_{n/2}^{(i)}(down)] = 0 \end{cases} \\ E[L_n^{(2i)}] = E[L_{n/2}^{(i)}(up)] + E[L_{n/2}^{(i)}(down)] \end{cases}$$

Formula 1 defines $$L_{n/2}^{(i)}\left(y_1^{n/2}, \hat{u}_{1,e}^{2i-2} \oplus \hat{u}_{1,o}^{2i-2}\right) \text{ and } L_{n/2}^{(i)}\left(y_{n/2+1}^{n}, \hat{u}_{1,e}^{2i-2}\right).$$

Formula 2 relates to $\varphi^{-1}(x)$, and $\varphi(x)$ can be expressed as follows:

$$\varphi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}.$$

3. Obtain the error probability of the N polar channels based on the updated log-likelihood ratio average value.

An error probability of an $i^{th}$ bit channel of the polar code based on an updated log-likelihood ratio average value. The following formula is used:

$p_i = Q(\sqrt{E[L_N^{(i)}]/2}), 1 \leq i \leq N$, where $p_i$ represents an error probability of an $i^{th}$ polar channel, and $Q(*)$ represents a Q function commonly used in communication. For example, the Q function may be defined as $$Q(a) = \int_a^{+\infty} \frac{1}{\sqrt{2\pi}} e^{-\frac{y^2}{2}} dy.$$

Figure 5:
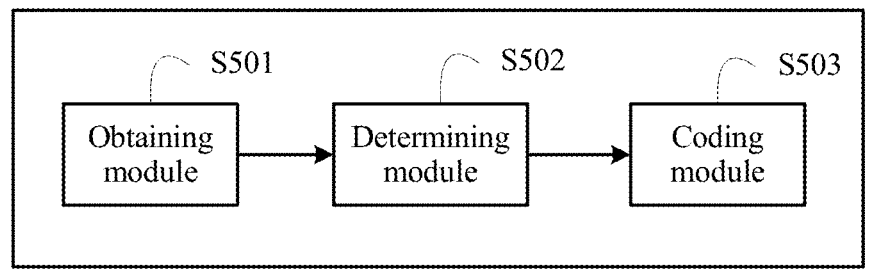
FIG. 5 is a structural diagram of a coding apparatus according to an embodiment of this application.

A coding apparatus 500 provided in one embodiment is described below with reference to FIG. 5. The coding apparatus 500 includes:

a determining module 501, configured to determine N to-be-coded bits, where N is a positive integer;

an obtaining module 502, configured to obtain a first sequence that includes N polar channel sequence numbers, where the determining module 501 is further configured to determine a location of an information bit in the N to-be-coded bits based on the first sequence; and a coding module 503, configured to perform polar coding on the N to-be-coded bits to obtain coded bits.

In one embodiment, the determining module 501 is specifically configured to:

determine N based on M, where N=M, M is an output target code length of a polar code, M is equal to a positive integral power of 2, and M is a positive integer.

Correspondingly, the obtaining module 502 is specifically configured to:

obtain, from a sequence in Table 1 in the appendix or an equivalent replacement sequence of a sequence in Table 1, the first sequence that includes N polar channel sequences.

In another embodiment of the present invention, the determining module 501 is specifically configured to:

determine N based on M, where $N=2^{\lfloor log_2(M-1) \rfloor+1}$, the symbol $\lfloor \ \rfloor$ represents rounding down, M is an output target code length of a polar code, M is not equal to a positive integral power of 2, and M is a positive integer.

Correspondingly, in a first feasible implementation of this embodiment, the N to-be-coded bits correspond to a mother code whose code length is N; and the obtaining module 502 is specifically configured to:

determine, based on a maximum first sequence $S_{max}$ corresponding to a maximum mother code length $N_{max}$ supported by a communications system, a first sequence corresponding to the mother code length N, where the first sequence corresponding to the mother code length N is the first sequence that includes N polar channel sequence numbers.

Further, the maximum first sequence $S_{max}$ is a sequence in Table 1 in the appendix or an equivalent replacement sequence of a sequence in Table 1, and the N to-be-coded bits correspond to N coded bits; and the obtaining module 502 is specifically configured to:

determine locations of N−M to-be-deleted bits in the N coded bits;

sequentially read polar channel sequence numbers in the maximum first sequence $S_{max}$, and sequentially read polar channel sequence numbers in the maximum first sequence $S_{max}$ that do not correspond to the locations of the N−M bits and that are not greater than N; and when N polar channel sequence numbers are read, determine that a sequence including the N read polar channel sequence numbers is the first sequence corresponding to the mother code length N.

Correspondingly, in a second feasible implementation of this embodiment, the N to-be-coded bits correspond to a mother code whose code length is N; and the obtaining module 502 is specifically configured to:

determine, based on a fourth sequence that corresponds to the mother code length N when rate matching does not need to be performed, a first sequence that corresponds to the mother code length N when rate matching needs to be performed, where the first sequence corresponding to the mother code length N is the first sequence that includes N polar channel sequence numbers.

Further, the fourth sequence is a sequence in Table 1 in the appendix or an equivalent replacement sequence of a sequence in Table 1, and the N to-be-coded bits correspond to N coded bits; and the obtaining module 502 is specifically configured to:

determine locations of N−M to-be-deleted bits in the N coded bits;

sequentially read polar channel sequence numbers in the fourth sequence, and sequentially read polar channel sequence numbers in the fourth sequence that do not correspond to the locations of the N−M bits; and when N polar channel sequence numbers are read, determine that a sequence including the N read polar channel sequence numbers is the first sequence that corresponds to the mother code length N when rate matching needs to be performed.

Correspondingly, in a third feasible implementation of this embodiment, the obtaining module 502 is specifically configured to:

obtain, from a sequence in Table 2, Table 3, or Table 4 in the appendix or an equivalent replacement sequence of a sequence in Table 2, Table 3, or Table 4, the first sequence that includes N polar channel sequences.

In still another embodiment of the present invention, the obtaining module 502 is specifically configured to:

determine a first sequence $S'_N$ based on N second sequences $S_1, S_2, \ldots,$ and $S_N$, where the second sequence $S_i$ includes i polar channel sequence numbers, $1 \le i \le N$, and i is a positive integer.

Further, the obtaining module 502 is specifically configured to:

determine the N second sequences $S_1, S_2, \ldots,$ and $S_N$;
initialize a first sequence $S'_1$ to $S_1$; and
set j to traverse from 2 to N, and calculate the first sequence $S'_N$ according to the following formula:

$$S'_j = S'_{j-1} + (S'_{j-1} \backslash S_j), \text{ where}$$

$2 \le j \le N$, j is a positive integer, "\" represents calculating a difference set of two sequences, and "+" represents connecting two sequences before and after "+" to form one sequence.

Figure 6:
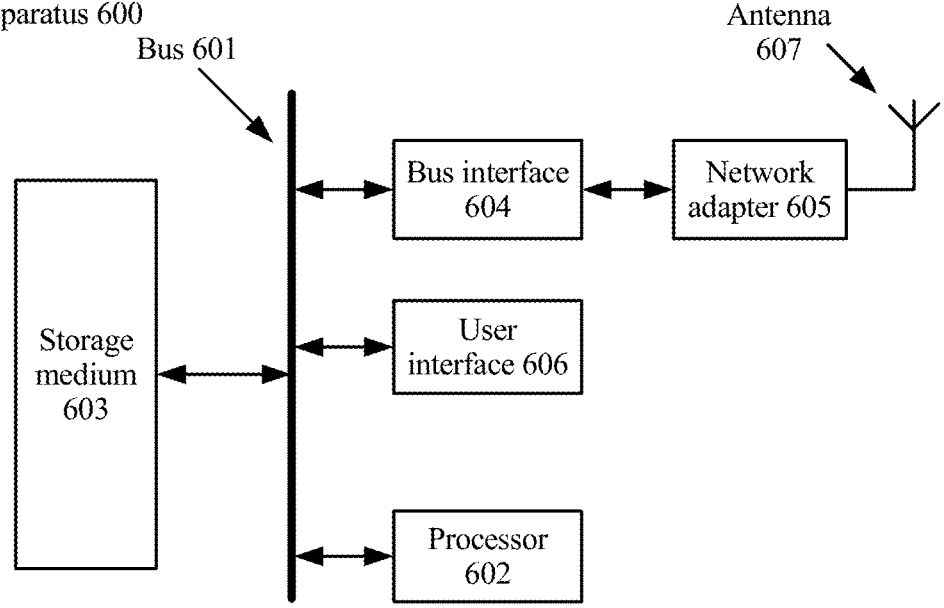
FIG. 6 is a structural diagram of a communications apparatus according to an embodiment of this application.

FIG. 6 is a schematic structural diagram of a communications apparatus 600 (for example, a communications apparatus such as an access point, a base station, a station, or a terminal, or a chip in the foregoing communications apparatus) according to one embodiment.

As shown in FIG. 6, the communications apparatus 600 may be implemented by using a bus 601 as a general bus architecture. The bus 601 may include any quantity of interconnected buses and bridges based on specific application and an overall design constraint condition of the communications apparatus 600. The bus 601 connects various circuits together, and these circuits include a processor 602, a storage medium 603, and a bus interface 604. In some embodiments, in the communications apparatus 600, a network adapter 605 and the like are connected by using the bus interface 604 and the bus 601. The network adapter 605 may be configured to: implement a signal processing function of a physical layer in a wireless communications network, and send and receive a radio frequency signal by using an antenna 607. A user interface 606 may be connected to a user terminal, for example, a keyboard, a display, a mouse, or a joystick. The bus 601 may be further connected to various other circuits, for example, a timing source, a peripheral device, a voltage regulator, and a power management circuit. These circuits are well-known in the art, and therefore are not described in detail.

Alternatively, the communications apparatus 600 may be configured as a general processing system. For example, the general processing system is usually referred to as a chip. The general processing system includes one or more microprocessors that provide a processor function, and an external memory that provides at least a part of the storage medium 603. All these components are connected to other supporting circuits by using an external bus architecture.

Alternatively, the communications apparatus 600 may be implemented by using an ASIC (application-specific integrated circuit) that includes the processor 602, the bus interface 604, and the user interface 606, and at least a part the storage medium 603 integrated into a single chip. Alternatively, the communications apparatus 600 may be implemented by using one or more FPGAs (field programmable gate array), a PLD (programmable logic device), a controller, a state machine, gate logic, a discrete hardware component, any other appropriate circuit, or any combination of circuits that can perform various functions described in the present invention.

The processor 602 is responsible for managing the bus and general processing (including executing software stored in the storage medium 1203). The processor 602 may be implemented by using one or more general-purpose processors and/or dedicated processors. Examples of the processor include a microprocessor, a microcontroller, a DSP processor, and another circuit capable of executing software. The software should be broadly construed as representation of instructions, data, or any combination thereof regardless of whether the software is referred to as software, firmware, middleware, microcode, hardware description language, or others.

It is shown in the following figure that the storage medium 603 is separated from the processor 602. However, a person skilled in the art can easily understand that the storage medium 603 or any part of the storage medium 603 may be located outside the communications apparatus 600. For example, the storage medium 603 may include a transmission wire, a carrier waveform modulated by using data, and/or a computer product separated from a wireless node. All these media are accessible to the processor 602 by using the bus interface 604. Alternatively, the storage medium 603 or any part of the storage medium 603 may be integrated into the processor 602, for example, may be a cache and/or a general-purpose register.

The processor 602 may execute the foregoing embodiments, for example, Embodiment 1, Embodiment 2, Embodiment 3, Embodiment 4, Embodiment 5, and Embodiment 6 that sequentially correspond to FIG. 3a, FIG. 3b, FIG. 3c, FIG. 3d, FIG. 4a, and FIG. 4b, and an execution process of the processor 602 is not described herein again.

The communications apparatus in the embodiments of this application may be a wireless communications device such as an access point, a station, a base station, or a user terminal.

The polar code in the embodiments of this application includes but is not limited to an Arikan polar code, a CA-polar code, or a PC-polar code. The Arikan polar code is an original polar code, is not concatenated with another code, and includes only an information bit and a frozen bit. The CA-polar code is a polar code that is concatenated with a cyclic redundancy check (Cyclic Redundancy Check, CRC for short) code. The PC-polar code is a polar code that is concatenated with a parity check (Parity Check, PC for short) code. The PC-polar code and the CA-polar code are concatenated with different codes, to improve performance of the polar code.

An "information bit sequence" in the embodiments of this application may also be referred to as a "to-be-coded bit sequence" or an "information bit set". Correspondingly, a "quantity of information bits" may be a quantity of to-be-coded bits in the to-be-coded bit sequence or a quantity of elements in the information bit set.

In the examples described in the embodiments of this application, units and method processes can be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application.

In the several embodiments provided in this application, it should be understood that the disclosed apparatus and method may be implemented in other manners. For example, the described apparatus embodiments are merely examples. For example, the unit division is merely logical function division and may be other division in actual implementation. For example, a plurality of units or components may be combined or integrated into another system, or some steps may be ignored or not performed. In addition, couplings or direct couplings or communication connections between the units may be implemented by using some interfaces, and these interfaces may be implemented in electronic, mechanical, or other forms.

The units described as separate parts may or may not be physically separate, and may be located in one location or may be distributed on a plurality of network units.

In addition, functional units in the embodiments of this application may be integrated into one processing unit, or each of the units may exist alone physically, or two or more units are integrated into one unit.

All or some of the foregoing embodiments may be implemented by using software, hardware, firmware, or any combination thereof. When software is used to implement the embodiments, all or some of the embodiments may be implemented in a form of a computer program product. The computer program product includes one or more computer instructions. When the computer program instructions are loaded and executed on a computer, all or some procedures or functions according to various embodiments are generated. The computer may be a general-purpose computer, a dedicated computer, a computer network, or other programmable apparatuses. The computer instructions may be stored in a computer readable storage medium or may be transmitted from a computer readable storage medium to another computer readable storage medium. For example, the computer instructions may be transmitted from one website, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk solid state disk (SSD)), or the like.

APPENDIX

TABLE 1

N = 32
32, 31, 30, 28, 24, 16, 29, 27, 26, 23, 22, 15, 20, 14, 12, 25, 8, 21, 19, 13,
18, 11, 10, 7, 6, 4, 17, 9, 5, 3, 2, 1
N = 64
64, 63, 62, 60, 56, 48, 61, 32, 59, 58, 55, 54, 47, 52, 46, 31, 44, 57, 30, 40,
53, 28, 51, 24, 45, 50, 43, 16, 42, 29, 39, 27, 38, 26, 23, 36, 22, 49, 15, 20, 41, 14, 12,
37, 25, 35, 8, 21, 34, 19, 13, 18, 11, 10, 7, 6, 33, 4, 17, 9, 5, 3, 2, 1
N = 128
128, 127, 126, 124, 120, 112, 125, 96, 123, 122, 119, 64, 118, 111, 116,
110, 95, 108, 121, 94, 104, 117, 92, 63, 115, 62, 88, 109, 114, 60, 107, 80, 106, 93, 56,
103, 91, 102, 48, 90, 87, 61, 100, 86, 59, 32, 113, 79, 58, 84, 55, 78, 105, 54, 76, 101,
47, 52, 89, 99, 46, 72, 85, 98, 31, 44, 83, 30, 57, 77, 40, 82, 28, 53, 75, 51, 74, 24, 45,

TABLE 1-continued 71, 50, 70, 43, 16, 42, 29, 97, 68, 39, 27, 38, 81, 26, 23, 36, 73, 22, 49, 15, 69, 20, 14,
41, 67, 12, 37, 66, 25, 35, 8, 21, 34, 19, 13, 18, 11, 65, 10, 7, 6, 33, 4, 17, 9, 5, 3, 2, 1

N = 256
256, 255, 254, 252, 248, 240, 253, 224, 251, 250, 247, 192, 246, 239, 244,
238, 128, 223, 236, 249, 222, 232, 245, 220, 191, 243, 190, 216, 237, 242, 188, 235,
127, 208, 234, 221, 126, 184, 231, 219, 124, 230, 176, 218, 215, 189, 228, 120, 214,
187, 160, 241, 207, 186, 212, 112, 183, 206, 233, 125, 182, 204, 229, 123, 96, 175,
180, 217, 122, 174, 227, 200, 119, 213, 226, 159, 172, 64, 118, 211, 158, 111, 185,
205, 116, 168, 210, 110, 156, 181, 203, 95, 108, 179, 202, 152, 173, 199, 94, 121, 178,
104, 198, 171, 92, 144, 117, 63, 170, 157, 196, 225, 167, 115, 62, 88, 109, 155, 166,
114, 60, 209, 154, 107, 80, 151, 164, 106, 93, 56, 201, 150, 103, 177, 91, 143, 102,
197, 148, 48, 90, 142, 169, 87, 100, 61, 195, 140, 86, 59, 165, 32, 194, 113, 79, 153,
58, 84, 136, 163, 55, 78, 105, 149, 54, 162, 76, 101, 147, 47, 52, 89, 141, 46, 72, 99,
146, 139, 85, 44, 31, 98, 138, 83, 30, 57, 135, 77, 40, 82, 193, 28, 53, 134, 75, 51, 161,
74, 132, 24, 45, 71, 50, 70, 43, 145, 16, 42, 29, 68, 39, 97, 137, 27, 38, 81, 26, 133, 23,
36, 22, 73, 131, 49, 15, 20, 69, 130, 14, 41, 67, 12, 37, 66, 25, 35, 8, 21, 34, 19, 129,
13, 18, 11, 65, 10, 7, 6, 33, 4, 17, 9, 5, 3, 2, 1

N = 512
512, 511, 510, 508, 504, 496, 509, 480, 507, 506, 503, 448, 502, 495, 500,
494, 384, 479, 492, 505, 478, 488, 501, 256, 476, 447, 499, 446, 472, 493, 498, 444,
383, 491, 464, 490, 477, 382, 440, 487, 475, 486, 380, 432, 255, 474, 471, 484, 445,
376, 254, 470, 443, 416, 497, 463, 252, 442, 468, 368, 439, 462, 489, 381, 438, 248,
460, 379, 485, 352, 431, 436, 473, 378, 430, 483, 456, 240, 375, 469, 253, 482, 415,
428, 320, 374, 467, 414, 367, 441, 251, 224, 372, 461, 424, 466, 366, 250, 412, 437,
459, 247, 351, 364, 435, 458, 192, 246, 408, 429, 455, 350, 377, 434, 239, 360, 244,
454, 427, 348, 400, 373, 238, 319, 426, 413, 128, 452, 481, 423, 371, 318, 236, 223,
344, 365, 411, 422, 370, 222, 316, 249, 465, 410, 363, 232, 336, 407, 420, 220, 245,
362, 349, 191, 312, 457, 406, 359, 433, 243, 347, 190, 399, 358, 216, 453, 404, 237,
304, 346, 242, 398, 188, 425, 343, 356, 317, 235, 127, 451, 208, 396, 342, 315, 234,
421, 288, 221, 126, 184, 450, 231, 369, 335, 409, 314, 340, 219, 392, 419, 311, 230,
334, 124, 361, 176, 405, 218, 310, 418, 215, 228, 332, 189, 120, 357, 303, 403, 214,
308, 187, 345, 397, 160, 302, 328, 355, 402, 241, 207, 186, 212, 112, 395, 341, 183,
300, 206, 287, 354, 233, 125, 394, 182, 339, 286, 313, 204, 391, 333, 296, 123, 229,
96, 175, 338, 180, 284, 309, 390, 217, 449, 122, 331, 174, 200, 227, 119, 307, 213,
330, 280, 388, 172, 159, 226, 118, 64, 301, 327, 417, 306, 211, 158, 111, 185, 326,
299, 116, 205, 168, 272, 401, 210, 110, 156, 298, 181, 285, 203, 324, 295, 353, 108,
95, 393, 179, 283, 202, 152, 294, 173, 199, 94, 121, 178, 282, 104, 337, 198, 279, 171,
292, 389, 92, 144, 117, 63, 278, 170, 157, 329, 196, 387, 167, 62, 115, 88, 225, 271,
305, 109, 155, 276, 166, 114, 325, 386, 60, 270, 154, 107, 209, 80, 297, 151, 164, 323,
106, 268, 93, 56, 150, 103, 201, 293, 322, 91, 143, 102, 281, 177, 148, 264, 291, 197,
48, 90, 142, 87, 100, 277, 61, 169, 290, 195, 140, 86, 59, 32, 275, 165, 194, 79, 113,
269, 84, 58, 153, 136, 274, 55, 163, 78, 267, 105, 149, 54, 162, 385, 76, 266, 101, 147,
47, 52, 263, 89, 141, 46, 72, 99, 146, 262, 321, 139, 85, 44, 98, 31, 289, 138, 260, 83,
30, 57, 40, 77, 135, 82, 28, 53, 134, 193, 75, 273, 51, 74, 132, 24, 161, 45, 71, 265, 50,
43, 70, 16, 145, 42, 261, 29, 68, 39, 97, 137, 27, 259, 38, 81, 26, 133, 258, 23, 36, 22,
73, 131, 15, 49, 20, 69, 130, 14, 41, 67, 12, 37, 66, 25, 257, 8, 35, 21, 34, 129, 19, 13,
18, 11, 65, 10, 7, 6, 33, 4, 17, 9, 5, 3, 2, 1

N = 1024
1024, 1023, 1022, 1020, 1016, 1008, 1021, 992, 1019, 1018, 1015, 960,
1014, 1007, 1012, 1006, 896, 991, 1004, 1017, 990, 1000, 1013, 768, 988, 959, 1011,
958, 984, 1005, 1010, 956, 895, 1003, 976, 512, 1002, 989, 894, 952, 999, 987, 892,
998, 944, 767, 986, 983, 957, 996, 888, 766, 982, 955, 928, 1009, 975, 764, 954, 980,
880, 951, 974, 1001, 893, 511, 950, 760, 972, 891, 997, 864, 510, 943, 948, 985, 890,
942, 995, 968, 752, 887, 508, 981, 765, 994, 927, 940, 832, 886, 979, 504, 926, 879,
953, 763, 736, 884, 973, 936, 978, 878, 762, 924, 949, 971, 759, 496, 863, 876, 947,
970, 704, 758, 920, 509, 941, 967, 862, 889, 946, 751, 872, 507, 756, 966, 939, 480,
860, 912, 885, 750, 831, 506, 938, 925, 640, 964, 993, 935, 503, 883, 830, 748, 856,
735, 877, 923, 934, 448, 882, 502, 734, 828, 761, 977, 922, 875, 744, 495, 848, 919,
932, 500, 732, 874, 757, 861, 703, 824, 494, 918, 969, 871, 755, 859, 702, 945, 384,
911, 870, 728, 916, 965, 492, 479, 749, 816, 858, 754, 910, 700, 855, 937, 868, 829,
478, 747, 639, 505, 963, 720, 488, 908, 854, 827, 746, 933, 800, 733, 638, 696, 476,
962, 501, 743, 881, 847, 447, 256, 921, 852, 826, 731, 904, 931, 823, 742, 846, 636,
446, 499, 472, 873, 688, 730, 917, 493, 822, 930, 727, 498, 740, 804, 844, 701, 444, 632,
869, 815, 915, 491, 383, 726, 820, 464, 699, 857, 909, 672, 814, 840, 867, 914, 490,
719, 753, 477, 382, 440, 724, 698, 487, 624, 907, 853, 695, 812, 718, 799, 866, 475,
745, 637, 486, 380, 906, 694, 851, 798, 825, 432, 716, 474, 903, 255, 845, 808, 635,
741, 608, 687, 471, 484, 850, 445, 692, 796, 376, 821, 902, 729, 634, 686, 254, 843,
961, 712, 470, 739, 631, 443, 416, 819, 725, 842, 463, 497, 792, 684, 900, 671, 738,
630, 252, 468, 576, 442, 813, 839, 368, 929, 818, 439, 462, 723, 670, 623, 697, 489,
381, 838, 811, 628, 680, 717, 438, 784, 248, 722, 622, 460, 913, 668, 810, 693, 379,
797, 485, 431, 352, 715, 836, 807, 436, 865, 620, 473, 607, 378, 691, 430, 905, 456,
795, 664, 483, 714, 806, 240, 375, 685, 606, 711, 633, 690, 469, 794, 428, 616, 415,
253, 374, 482, 849, 320, 710, 791, 683, 804, 901, 604, 656, 467, 629, 414, 575, 367,
251, 441, 224, 372, 790, 682, 424, 461, 669, 841, 708, 679, 366, 466, 574, 899, 627,
412, 600, 250, 737, 783, 437, 817, 621, 667, 459, 788, 247, 678, 837, 626, 898, 364,
351, 572, 782, 435, 666, 458, 619, 408, 246, 721, 192, 809, 592, 663, 429, 350, 676,
455, 835, 377, 434, 618, 360, 780, 239, 605, 568, 662, 244, 615, 454, 427, 713, 805,
348, 400, 834, 373, 238, 319, 603, 655, 689, 793, 614, 426, 413, 660, 776, 452, 709,
803, 128, 423, 318, 560, 371, 602, 344, 236, 654, 223, 481, 599, 365, 411, 612, 789,
573, 681, 422, 370, 802, 707, 222, 316, 652, 598, 249, 410, 363, 465, 232, 571, 787,

TABLE 1-continued 544, 336, 677, 407, 420, 706, 591, 625, 220, 362, 781, 596, 245, 570, 312, 349, 191,
665, 406, 359, 648, 786, 457, 567, 590, 675, 347, 190, 243, 779, 617, 399, 433, 358,
216, 661, 566, 404, 674, 237, 453, 304, 588, 897, 346, 242, 398, 778, 188, 343, 559,
356, 613, 659, 317, 564, 425, 235, 775, 127, 208, 451, 601, 653, 558, 396, 342, 584,
611, 658, 315, 234, 288, 221, 126, 184, 421, 774, 833, 450, 231, 335, 369, 651, 597,
556, 409, 340, 314, 543, 610, 219, 392, 311, 230, 334, 124, 419, 650, 542, 772, 595,
176, 361, 218, 569, 405, 310, 647, 801, 552, 589, 418, 215, 228, 332, 189, 594, 120,
540, 357, 303, 403, 565, 646, 705, 214, 308, 187, 160, 587, 345, 302, 397, 328, 785,
207, 355, 402, 563, 241, 586, 536, 212, 186, 644, 112, 395, 557, 341, 583, 183, 300,
206, 287, 673, 354, 562, 777, 233, 125, 394, 182, 582, 555, 339, 286, 313, 204, 528,
296, 391, 123, 333, 175, 96, 229, 657, 554, 180, 338, 284, 541, 773, 580, 309, 390,
217, 551, 122, 174, 331, 200, 449, 609, 227, 119, 539, 649, 771, 307, 550, 213, 330,
280, 388, 172, 159, 64, 118, 226, 301, 327, 538, 306, 417, 593, 158, 211, 535, 111,
548, 645, 185, 116, 326, 299, 770, 168, 205, 272, 210, 110, 534, 401, 585, 156, 298,
181, 643, 285, 203, 324, 295, 561, 353, 527, 108, 95, 179, 532, 152, 202, 283, 294,
581, 393, 526, 173, 94, 642, 199, 121, 178, 282, 104, 553, 337, 579, 198, 279, 171,
389, 292, 92, 524, 144, 117, 63, 278, 170, 549, 157, 329, 196, 578, 167, 62, 115, 387,
88, 225, 537, 271, 305, 520, 109, 155, 276, 166, 547, 114, 325, 60, 270, 386, 154, 107,
533, 209, 297, 80, 546, 151, 164, 323, 106, 268, 56, 93, 150, 531, 103, 201, 293, 322,
525, 91, 769, 143, 177, 281, 102, 530, 148, 264, 197, 291, 48, 90, 142, 523, 87, 100,
277, 61, 169, 290, 195, 641, 522, 140, 86, 59, 275, 165, 32, 519, 79, 194, 113, 269, 84,
58, 153, 136, 274, 55, 163, 518, 78, 577, 267, 105, 149, 54, 162, 385, 47, 76, 266, 101,
147, 52, 516, 263, 545, 89, 141, 46, 72, 99, 146, 262, 321, 529, 521, 289, 31, 44, 85,
139, 98, 193, 260, 517, 30, 57, 138, 83, 273, 40, 135, 515, 77, 28, 82, 53, 134, 514,
161, 75, 265, 24, 51, 132, 74, 45, 71, 261, 50, 145, 16, 43, 70, 97, 259, 29, 42, 137, 68,
258, 39, 27, 81, 38, 133, 513, 26, 23, 36, 131, 73, 22, 49, 130, 15, 69, 20, 14, 41, 67,
257, 12, 66, 37, 25, 8, 35, 21, 34, 129, 19, 13, 18, 11, 65, 10, 7, 6, 33, 4, 17, 9, 5, 3, 2,
1

N = 2048
2048, 2047, 2046, 2044, 2040, 2032, 2045, 2016, 2043, 2042, 2039, 2038,
1984, 2031, 2036, 2030, 1920, 2028, 2015, 2014, 2041, 2024, 2012, 2037, 1983, 1792,
2035, 1982, 2008, 2029, 2034, 1980, 2027, 1919, 2000, 1536, 2026, 2013, 1918, 1976,
2023, 2011, 2022, 1916, 1968, 2010, 1791, 2007, 2020, 1981, 1912, 1790, 1024, 2006,
1979, 1952, 2033, 1999, 1788, 1978, 2004, 1904, 1975, 1998, 2025, 1917, 1535, 1974,
1784, 1996, 1915, 2021, 1888, 1967, 1534, 1972, 2009, 1914, 1966, 1992, 2019, 1776,
1911, 1532, 2005, 1789, 1964, 1951, 2018, 1910, 1856, 2003, 1023, 1950, 1528, 1903,
1787, 1977, 1760, 1908, 1960, 1997, 2002, 1902, 1948, 1786, 1022, 1973, 1995, 1783,
1520, 1900, 1887, 1971, 1994, 1020, 1944, 1782, 1728, 1533, 1965, 1991, 1886, 1913,
1970, 1775, 1896, 1780, 1531, 1990, 1963, 1504, 1884, 1936, 1016, 1909, 1774, 1855,
1962, 1530, 1949, 1988, 1664, 1959, 1907, 1527, 1854, 2017, 1880, 1772, 1759, 1901,
1947, 1958, 1008, 1906, 1526, 1472, 1758, 1852, 1785, 1946, 1899, 2001, 1768, 1021,
1872, 1519, 1943, 1956, 1524, 1756, 1898, 1781, 1885, 1848, 1727, 1942, 1518, 1019,
1895, 1993, 992, 1883, 1779, 1726, 1969, 1408, 1935, 1894, 1752, 1018, 1940, 1516,
1503, 1773, 1989, 1840, 1015, 1882, 1778, 1934, 1724, 1879, 1892, 1961, 1853, 1502,
1771, 1663, 1014, 1529, 960, 1987, 1744, 1512, 1932, 1878, 1851, 1770, 1824, 1757,
1662, 1720, 1957, 1007, 1500, 1767, 1986, 1871, 1525, 1012, 1471, 1905, 1280, 1876,
1850, 1945, 1755, 1928, 1006, 1847, 1766, 1870, 1955, 1660, 1470, 1523, 1496, 1712,
1897, 1754, 1941, 896, 1846, 1517, 1954, 1004, 1751, 1868, 1764, 991, 1522, 1725,
1468, 1656, 1839, 1893, 1939, 1515, 1750, 1844, 1407, 990, 1488, 1723, 1881, 1696,
1933, 1017, 1838, 1864, 1000, 1891, 1514, 1743, 1938, 1777, 1501, 1464, 1406, 1748,
1722, 1511, 1648, 988, 1931, 1877, 1719, 1836, 1742, 1013, 1823, 959, 1890, 768,
1499, 1661, 1769, 1510, 1404, 1718, 1930, 1875, 1822, 958, 1011, 1456, 1740, 1849,
1498, 984, 1927, 1832, 1869, 1659, 1279, 1711, 1632, 1765, 1495, 1005, 1508, 1874,
1716, 1469, 1820, 1010, 1400, 1845, 1926, 1753, 956, 1658, 1710, 1278, 1867, 1736,
1494, 1985, 1763, 1003, 1655, 1467, 895, 1440, 976, 1843, 1866, 1749, 1487, 1816,
1708, 1521, 1695, 1924, 1654, 1762, 1492, 1276, 1600, 1466, 1002, 512, 1837, 1863,
952, 1392, 989, 894, 1463, 1842, 1486, 999, 1953, 1694, 1747, 1647, 1721, 1405,
1652, 1862, 1835, 1513, 1704, 987, 1741, 1462, 1808, 998, 892, 1272, 1646, 1746,
1484, 1692, 1937, 1834, 944, 1717, 1403, 986, 1455, 1376, 1821, 1509, 1739, 1860,
767, 1460, 1831, 983, 996, 1644, 1631, 957, 1889, 1497, 1402, 1454, 1715, 1480, 888,
1738, 1688, 1819, 1507, 1830, 1264, 1399, 1929, 766, 982, 1709, 1630, 1735, 955,
1657, 1714, 1493, 928, 1818, 1452, 1640, 1439, 1277, 1398, 1506, 1344, 1873, 975,
1734, 1815, 1707, 1828, 1009, 1925, 1628, 980, 764, 954, 1680, 1438, 1491, 1653,
880, 1599, 1391, 1275, 951, 1465, 974, 1396, 1248, 1814, 1706, 1448, 1485, 1693,
1865, 1732, 893, 1703, 1001, 1390, 1490, 1598, 1923, 1651, 1436, 1624, 950, 511,
1274, 1807, 1761, 1461, 760, 972, 1645, 1691, 1483, 1841, 1812, 1271, 1702, 1650,
891, 1861, 1388, 943, 864, 1375, 1596, 997, 510, 1922, 1806, 948, 1459, 1690, 1482,
1432, 1643, 1270, 1216, 1745, 1616, 1833, 985, 890, 942, 1687, 1374, 1453, 1700,
1479, 968, 1859, 995, 1458, 1401, 752, 887, 1642, 1384, 1804, 1263, 508, 1592, 1629,
1686, 1268, 1639, 1478, 1451, 981, 1737, 1372, 940, 1829, 1424, 927, 886, 765, 994,
1262, 832, 1397, 1858, 1343, 1627, 1679, 1638, 1450, 1817, 1713, 1684, 1437, 1800,
926, 979, 1476, 879, 504, 1152, 1447, 1584, 1342, 1827, 1733, 763, 1395, 1626, 953,
1368, 884, 1260, 736, 1678, 936, 1247, 973, 1505, 1623, 1435, 1389, 1636, 878, 1597,
978, 1446, 1813, 924, 1705, 1394, 762, 1246, 1340, 1826, 1731, 949, 1676, 1622, 971,
1434, 759, 1273, 1387, 1256, 1595, 1489, 1360, 496, 1568, 876, 1811, 1431, 863,
1444, 1701, 947, 1730, 1615, 1244, 970, 920, 1386, 758, 1649, 704, 1620, 1336, 1594,
1805, 1373, 1269, 1215, 509, 1430, 1689, 862, 941, 967, 1383, 1672, 1810, 1591,
1614, 1481, 946, 1699, 889, 872, 751, 1371, 1214, 1267, 1423, 756, 1803, 1641, 1240,
1382, 966, 939, 507, 1457, 1685, 1590, 860, 1428, 480, 912, 1261, 750, 1328, 1698,
1612, 885, 831, 1477, 1370, 1422, 1266, 938, 1802, 1212, 1583, 506, 1367, 925, 1380,

TABLE 1-continued 1637, 1921, 1683, 964, 1341, 1588, 1259, 1449, 640, 935, 830, 883, 1151, 503, 1799,
1232, 856, 748, 1475, 735, 1582, 1625, 1420, 1366, 1677, 1608, 993, 923, 877, 1339,
1258, 1635, 934, 1682, 1312, 1208, 1245, 1150, 882, 502, 448, 1445, 1798, 734, 828,
1255, 1359, 1474, 1675, 922, 1621, 761, 1393, 1580, 875, 1364, 1857, 744, 1338, 848,
1567, 1433, 1634, 1243, 1416, 977, 919, 495, 932, 1335, 1254, 1358, 1148, 1443, 500,
732, 874, 1674, 1566, 1619, 824, 1200, 1796, 861, 757, 703, 1242, 918, 1385, 494,
1334, 871, 1593, 1429, 1576, 1671, 969, 1239, 1613, 1356, 1252, 1442, 1825, 1213,
859, 702, 1618, 755, 911, 1144, 1564, 728, 870, 1327, 384, 1381, 916, 945, 1427,
1332, 1238, 1670, 1589, 492, 479, 749, 1611, 816, 1211, 858, 965, 1184, 910, 754,
1326, 1369, 1421, 1729, 1352, 700, 855, 1231, 868, 1379, 1426, 1809, 478, 829, 1236,
747, 1560, 1210, 1587, 1610, 1265, 937, 639, 720, 1136, 1668, 505, 488, 963, 1207,
908, 854, 1324, 1230, 1419, 1581, 1365, 1607, 1311, 1378, 746, 827, 1586, 800, 696,
638, 733, 476, 1697, 1149, 933, 1257, 743, 1206, 847, 1310, 1418, 501, 962, 1606,
447, 1579, 1363, 852, 1228, 1801, 826, 256, 881, 1552, 1337, 1320, 921, 904, 731,
1415, 1147, 1357, 823, 742, 1199, 846, 1120, 636, 931, 1253, 446, 1204, 1578, 1362,
499, 472, 1308, 688, 1565, 1681, 730, 1604, 873, 1414, 822, 1198, 1146, 1333, 1575,
1224, 1241, 917, 1797, 493, 1355, 727, 844, 740, 930, 1143, 1251, 498, 701, 444,
1473, 632, 1563, 1633, 815, 1574, 1331, 1304, 869, 1354, 1196, 820, 726, 491, 1237,
915, 1183, 1142, 1673, 383, 1412, 464, 1088, 1250, 699, 1795, 672, 1325, 1351, 814,
1562, 857, 840, 909, 1330, 719, 1182, 490, 867, 914, 1135, 440, 1235, 1559, 724, 382,
477, 1441, 1572, 698, 1617, 753, 1140, 1192, 624, 487, 1350, 1209, 1323, 812, 695,
1296, 1229, 718, 1669, 907, 853, 799, 1134, 1794, 1234, 866, 1180, 1558, 475, 486,
637, 1322, 380, 694, 1205, 745, 798, 1309, 1227, 906, 1609, 1425, 1348, 851, 716,
432, 1319, 1132, 474, 1667, 808, 1551, 825, 1119, 903, 635, 687, 845, 255, 1556, 608,
1203, 471, 1176, 484, 1226, 1307, 692, 741, 1585, 796, 850, 445, 1377, 1318, 376,
1118, 1550, 1197, 1605, 1223, 1417, 686, 902, 634, 821, 712, 729, 254, 470, 843,
1666, 1202, 1128, 1145, 1306, 631, 739, 443, 416, 961, 1577, 1222, 1303, 1195, 1361,
1316, 1116, 819, 792, 1168, 463, 684, 842, 1603, 725, 1548, 671, 1413, 630, 468, 900,
1141, 442, 252, 576, 1087, 738, 497, 813, 368, 839, 1302, 1194, 439, 462, 818, 1181,
670, 1573, 1220, 723, 623, 929, 1191, 1353, 1086, 1139, 1112, 1602, 628, 680, 697,
838, 811, 381, 1411, 489, 438, 1295, 717, 784, 1561, 1544, 1249, 1179, 1133, 1793,
248, 913, 352, 379, 460, 622, 1329, 431, 1410, 668, 485, 1571, 865, 722, 436, 693,
1084, 1349, 378, 473, 607, 1138, 240, 797, 1233, 1300, 430, 620, 1557, 715, 810,
1190, 375, 905, 456, 1570, 1665, 836, 1104, 483, 1294, 807, 1131, 664, 1321, 1178,
691, 606, 1347, 253, 320, 415, 633, 1080, 714, 795, 1175, 374, 428, 469, 1555, 685,
1188, 849, 1117, 482, 616, 711, 806, 1130, 901, 1225, 1292, 1549, 690, 367, 1346,
224, 1127, 414, 604, 1317, 251, 794, 1174, 441, 575, 1554, 656, 1201, 372, 467, 629,
683, 710, 791, 1115, 424, 1305, 737, 804, 1072, 899, 1167, 366, 461, 1547, 1126, 841,
1221, 1288, 250, 1601, 412, 574, 1315, 669, 1172, 466, 600, 682, 247, 790, 1114, 437,
627, 708, 817, 1085, 898, 1166, 351, 679, 1546, 1111, 1193, 364, 1301, 459, 621,
1124, 783, 1219, 1314, 192, 1409, 1543, 572, 837, 667, 246, 408, 626, 721, 788, 1056,
435, 350, 678, 1083, 1110, 1164, 377, 458, 592, 1137, 239, 782, 1218, 1299, 429, 619,
1542, 809, 1189, 360, 666, 455, 1569, 835, 1103, 244, 1293, 434, 568, 663, 1082,
1177, 348, 676, 605, 1108, 238, 319, 1298, 400, 618, 1079, 713, 780, 1160, 373, 427,
454, 1540, 1187, 834, 1102, 481, 615, 805, 1129, 662, 1291, 689, 128, 1345, 223, 318,
413, 603, 1078, 236, 793, 1173, 344, 426, 560, 1553, 655, 1186, 371, 452, 614, 709,
776, 1100, 423, 1290, 803, 1071, 660, 365, 222, 1125, 602, 1287, 249, 316, 411, 573,
1076, 654, 1171, 370, 465, 599, 681, 232, 789, 1113, 422, 612, 707, 802, 1070, 897,
1165, 336, 1545, 1096, 363, 1286, 220, 1123, 410, 544, 1313, 191, 1170, 571, 598,
652, 245, 312, 407, 625, 706, 787, 1055, 420, 349, 677, 1068, 1109, 1163, 362, 457,
591, 1122, 781, 1217, 1284, 190, 1541, 570, 359, 665, 216, 406, 596, 243, 786, 1054,
433, 567, 648, 1081, 1162, 347, 675, 590, 1107, 237, 304, 1297, 399, 617, 1064, 779,
1159, 358, 188, 453, 1539, 833, 1101, 242, 404, 566, 661, 1052, 346, 674, 127, 1106,
208, 317, 398, 588, 1077, 235, 778, 1158, 343, 425, 559, 1538, 1185, 356, 451, 613,
775, 1099, 184, 1289, 564, 659, 126, 221, 288, 601, 1048, 234, 315, 342, 396, 558,
1075, 653, 1156, 369, 450, 584, 231, 774, 1098, 421, 611, 801, 1069, 658, 335, 1095,
124, 1285, 219, 314, 409, 543, 1074, 176, 1169, 340, 556, 597, 651, 230, 311, 392,
610, 705, 772, 1040, 419, 334, 1067, 1094, 361, 218, 1121, 542, 1283, 189, 569, 120,
650, 215, 310, 405, 595, 228, 785, 1053, 418, 552, 647, 1066, 1161, 332, 589, 1092,
303, 1282, 160, 1063, 540, 357, 187, 214, 594, 241, 308, 403, 565, 646, 1051, 345,
673, 112, 1105, 207, 302, 397, 587, 1062, 777, 1157, 328, 186, 1537, 355, 212, 402,
536, 183, 1050, 563, 644, 125, 206, 287, 586, 1047, 233, 300, 341, 395, 557, 1060,
1155, 354, 449, 583, 773, 1097, 182, 562, 657, 96, 286, 123, 1046, 204, 313, 394, 528,
1073, 175, 1154, 339, 555, 582, 229, 296, 391, 609, 771, 1039, 180, 333, 1093, 122,
217, 284, 541, 1044, 174, 338, 554, 119, 649, 200, 309, 390, 580, 227, 770, 1038, 417,
551, 1065, 331, 1091, 64, 1281, 159, 539, 118, 172, 213, 280, 593, 226, 307, 388, 550,
645, 1036, 330, 111, 1090, 301, 158, 1061, 538, 327, 185, 116, 211, 306, 401, 535,
168, 1049, 548, 643, 110, 205, 272, 585, 1032, 299, 326, 156, 1059, 353, 210, 534,
181, 561, 642, 95, 285, 108, 1045, 203, 298, 393, 527, 1058, 1153, 324, 581, 295, 152,
532, 179, 94, 121, 202, 283, 526, 1043, 173, 337, 553, 104, 199, 294, 389, 579, 769,
1037, 178, 92, 282, 63, 1042, 144, 524, 117, 171, 198, 279, 578, 225, 292, 387, 549,
1035, 329, 1089, 62, 157, 537, 88, 170, 278, 115, 196, 305, 386, 520, 167, 1034, 547,
109, 271, 1031, 60, 325, 155, 114, 209, 276, 533, 166, 546, 641, 80, 270, 107, 1030,
297, 154, 1057, 323, 56, 151, 531, 164, 93, 106, 201, 268, 525, 1028, 322, 103, 293,
150, 530, 177, 91, 281, 48, 1041, 143, 523, 102, 197, 264, 577, 291, 148, 90, 61, 142,
522, 87, 169, 277, 100, 195, 290, 385, 519, 1033, 32, 59, 86, 140, 113, 194, 275, 518,
165, 545, 79, 269, 1029, 58, 153, 84, 274, 55, 136, 516, 163, 78, 105, 267, 1027, 321,
54, 149, 529, 162, 76, 266, 47, 1026, 101, 263, 52, 147, 89, 46, 141, 521, 72, 262, 99,
289, 146, 31, 44, 85, 139, 98, 193, 260, 517, 30, 57, 138, 83, 273, 40, 135, 515, 77, 28,
82, 53, 134, 514, 161, 75, 265, 1025, 24, 51, 132, 74, 45, 71, 261, 50, 145, 16, 43, 70, TABLE 1-continued 97, 259, 29, 42, 137, 68, 258, 39, 27, 81, 38, 133, 513, 26, 23, 36, 131, 73, 22, 49, 130,
15, 69, 20, 14, 41, 67, 257, 12, 66, 37, 25, 8, 35, 21, 34, 129, 19, 13, 18, 11, 65, 10, 7,
6, 33, 4, 17, 9, 5, 3, 2, 1

TABLE 2

M = 48, N = 64
48, 32, 47, 46, 31, 44, 30, 40, 28, 45, 24, 43, 42, 39, 29, 16, 38, 27, 36, 26,
23, 22, 41, 20, 15, 37, 14, 25, 35, 12, 34, 21, 8, 19, 18, 13, 11, 10, 7, 33, 6, 4, 17, 9, 5,
3, 2, 1, 64, 63, 62, 61, 60, 59, 58, 57, 56, 55, 54, 53, 52, 51, 50, 49
M = 72, N = 128
64, 63, 62, 60, 56, 48, 61, 72, 71, 32, 59, 70, 58, 55, 68, 54, 47, 52, 46, 31,
44, 57, 30, 40, 53, 28, 69, 51, 24, 45, 67, 50, 43, 16, 66, 29, 42, 39, 27, 38, 26, 36, 23,
49, 22, 15, 20, 41, 14, 65, 37, 12, 25, 35, 8, 21, 34, 19, 13, 18, 11, 10, 7, 33, 6, 4, 17, 9,
5, 3, 2, 1, 128, 127, 126, 125, 124, 123, 122, 121, 120, 119, 118, 117, 116, 115, 114,
113, 112, 111, 110, 109, 108, 107, 106, 105, 104, 103, 102, 101, 100, 99, 98, 97, 96,
95, 94, 93, 92, 91, 90, 89, 88, 87, 86, 85, 84, 83, 82, 81, 80, 79, 78, 77, 76, 75, 74, 73
M = 96, N = 128
96, 64, 95, 94, 92, 63, 62, 88, 80, 60, 93, 56, 91, 90, 48, 87, 61, 86, 79, 59,
84, 78, 58, 32, 55, 76, 54, 89, 47, 72, 52, 85, 46, 83, 44, 77, 57, 82, 31, 40, 75, 53, 30,
74, 51, 71, 28, 45, 50, 70, 24, 43, 68, 42, 16, 81, 39, 29, 38, 27, 73, 36, 26, 23, 49, 69,
22, 67, 41, 15, 20, 14, 66, 37, 12, 35, 25, 8, 34, 21, 19, 13, 18, 65, 11, 10, 7, 33, 6, 4,
17, 9, 5, 3, 2, 1, 128, 127, 126, 125, 124, 123, 122, 121, 120, 119, 118, 117, 116, 115,
114, 113, 112, 111, 110, 109, 108, 107, 106, 105, 104, 103, 102, 101, 100, 99, 98, 97
M = 120, N = 128
120, 112, 96, 119, 64, 118, 111, 116, 110, 108, 95, 94, 117, 104, 92, 115,
63, 109, 114, 62, 88, 107, 60, 106, 80, 93, 103, 56, 91, 102, 90, 48, 61, 100, 87, 113,
86, 59, 32, 79, 58, 84, 105, 55, 78, 54, 101, 76, 89, 47, 52, 99, 46, 72, 85, 98, 31, 44,
83, 57, 30, 77, 82, 40, 53, 28, 75, 51, 74, 24, 45, 71, 50, 70, 43, 16, 97, 42, 29, 68, 39,
27, 81, 38, 26, 23, 36, 73, 22, 49, 69, 15, 20, 41, 14, 67, 12, 37, 66, 25, 35, 8, 21, 34,
19, 13, 18, 11, 65, 10, 7, 6, 33, 4, 17, 9, 5, 3, 2, 1, 128, 127, 126, 125, 124, 123, 122,
121
M = 144, N = 256
128, 127, 126, 124, 120, 112, 125, 144, 143, 96, 123, 142, 122, 119, 64,
140, 118, 111, 116, 136, 110, 95, 108, 121, 94, 104, 63, 117, 92, 141, 62, 115, 88, 109,
139, 114, 60, 107, 80, 138, 56, 93, 106, 135, 103, 91, 134, 48, 102, 90, 61, 100, 87,
132, 113, 32, 86, 59, 79, 58, 84, 105, 55, 78, 137, 54, 101, 76, 47, 89, 52, 99, 72, 46,
133, 85, 98, 31, 44, 57, 83, 30, 131, 77, 40, 82, 53, 28, 130, 75, 51, 24, 74, 71, 45, 50,
97, 70, 16, 43, 68, 29, 42, 81, 39, 27, 38, 26, 73, 36, 23, 49, 129, 22, 69, 15, 20, 41, 67,
14, 66, 12, 37, 25, 8, 35, 34, 21, 19, 13, 18, 11, 65, 10, 7, 6, 33, 4, 17, 9, 5, 3, 2, 1, 256,
255, 254, 253, 252, 251, 250, 249, 248, 247, 246, 245, 244, 243, 242, 241, 240, 239,
238, 237, 236, 235, 234, 233, 232, 231, 230, 229, 228, 227, 226, 225, 224, 223, 222,
221, 220, 219, 218, 217, 216, 215, 214, 213, 212, 211, 210, 209, 208, 207, 206, 205,
204, 203, 202, 201, 200, 199, 198, 197, 196, 195, 194, 193, 192, 191, 190, 189, 188,
187, 186, 185, 184, 183, 182, 181, 180, 179, 178, 177, 176, 175, 174, 173, 172, 171,
170, 169, 168, 167, 166, 165, 164, 163, 162, 161, 160, 159, 158, 157, 156, 155, 154,
153, 152, 151, 150, 149, 148, 147, 146, 145
M = 160, N = 256
128, 127, 126, 124, 120, 160, 159, 158, 156, 112, 125, 152, 96, 123, 144,
122, 119, 157, 64, 118, 155, 111, 116, 154, 110, 151, 95, 108, 121, 150, 94, 104, 143,
117, 148, 92, 63, 142, 115, 62, 109, 88, 140, 114, 153, 60, 107, 80, 136, 106, 93, 56,
149, 103, 91, 102, 48, 147, 90, 141, 100, 61, 87, 146, 113, 86, 139, 59, 32, 79, 105, 84,
58, 138, 55, 78, 135, 101, 54, 76, 134, 47, 89, 99, 52, 72, 46, 132, 98, 85, 145, 44, 31,
83, 57, 77, 30, 40, 82, 137, 53, 75, 28, 51, 74, 133, 24, 71, 45, 50, 97, 70, 131, 43, 16,
68, 42, 130, 29, 39, 81, 27, 38, 73, 26, 36, 23, 49, 69, 22, 15, 41, 20, 67, 14, 66, 37,
129, 12, 25, 35, 8, 34, 21, 19, 13, 18, 11, 65, 10, 7, 6, 33, 4, 17, 9, 5, 3, 2, 1, 256, 255,
254, 253, 252, 251, 250, 249, 248, 247, 246, 245, 244, 243, 242, 241, 240, 239, 238,
237, 236, 235, 234, 233, 232, 231, 230, 229, 228, 227, 226, 225, 224, 223, 222, 221,
220, 219, 218, 217, 216, 215, 214, 213, 212, 211, 210, 209, 208, 207, 206, 205, 204,
203, 202, 201, 200, 199, 198, 197, 196, 195, 194, 193, 192, 191, 190, 189, 188, 187,
186, 185, 184, 183, 182, 181, 180, 179, 178, 177, 176, 175, 174, 173, 172, 171, 170,
169, 168, 167, 166, 165, 164, 163, 162, 161
M = 180, N = 256
128, 127, 126, 124, 176, 160, 175, 180, 174, 120, 179, 172, 159, 112, 125,
178, 158, 168, 96, 123, 156, 122, 119, 173, 152, 118, 64, 171, 111, 116, 110, 170, 157,
144, 167, 95, 108, 121, 177, 166, 155, 94, 104, 117, 154, 92, 164, 151, 63, 115, 88,
150, 109, 114, 62, 169, 143, 107, 148, 80, 60, 93, 106, 142, 165, 103, 56, 91, 140, 102,
153, 163, 90, 48, 87, 100, 136, 149, 162, 61, 113, 86, 32, 79, 59, 147, 84, 105, 141, 78,
58, 146, 55, 101, 76, 139, 54, 89, 99, 47, 138, 72, 52, 135, 85, 98, 46, 161, 134, 31, 83,
44, 77, 57, 30, 82, 132, 40, 145, 75, 53, 28, 74, 51, 71, 24, 45, 137, 50, 70, 97, 43, 16,
133, 68, 29, 42, 81, 39, 131, 27, 38, 73, 26, 130, 23, 36, 49, 69, 22, 15, 67, 20, 41, 14,
66, 37, 12, 25, 35, 8, 21, 129, 34, 19, 13, 18, 11, 65, 10, 7, 6, 33, 4, 17, 9, 5, 3, 2, 1,

TABLE 2-continued 256, 255, 254, 253, 252, 251, 250, 249, 248, 247, 246, 245, 244, 243, 242, 241, 240,
239, 238, 237, 236, 235, 234, 233, 232, 231, 230, 229, 228, 227, 226, 225, 224, 223,
222, 221, 220, 219, 218, 217, 216, 215, 214, 213, 212, 211, 210, 209, 208, 207, 206,
205, 204, 203, 202, 201, 200, 199, 198, 197, 196, 195, 194, 193, 192, 191, 190, 189,
188, 187, 186, 185, 184, 183, 182, 181

M = 192, N = 256
192, 128, 191, 190, 188, 127, 184, 126, 176, 124, 189, 160, 187, 120, 186,
183, 112, 182, 125, 175, 96, 180, 123, 174, 122, 159, 119, 172, 185, 158, 118, 168,
111, 181, 156, 116, 64, 110, 179, 152, 173, 95, 108, 178, 121, 171, 94, 144, 104, 157,
170, 117, 92, 167, 155, 115, 166, 88, 109, 63, 154, 114, 151, 164, 62, 107, 80, 177,
150, 93, 106, 60, 143, 103, 148, 169, 91, 142, 102, 56, 90, 165, 87, 140, 100, 48, 153,
113, 86, 61, 163, 136, 79, 149, 32, 84, 59, 162, 105, 78, 58, 147, 55, 101, 141, 76, 146,
89, 54, 99, 139, 72, 47, 85, 52, 98, 138, 46, 135, 83, 31, 44, 77, 134, 57, 82, 161, 30,
75, 40, 132, 53, 28, 74, 145, 71, 51, 24, 45, 70, 50, 97, 137, 43, 16, 68, 29, 42, 133, 81,
39, 27, 38, 131, 73, 26, 23, 36, 130, 69, 49, 22, 15, 67, 20, 41, 14, 66, 37, 12, 25, 35, 8,
21, 34, 129, 19, 13, 18, 65, 11, 10, 7, 6, 33, 4, 17, 9, 5, 3, 2, 1, 256, 255, 254, 253, 252,
251, 250, 249, 248, 247, 246, 245, 244, 243, 242, 241, 240, 239, 238, 237, 236, 235,
234, 233, 232, 231, 230, 229, 228, 227, 226, 225, 224, 223, 222, 221, 220, 219, 218,
217, 216, 215, 214, 213, 212, 211, 210, 209, 208, 207, 206, 205, 204, 203, 202, 201,
200, 199, 198, 197, 196, 195, 194, 193

M = 240, N = 256
240, 224, 192, 239, 238, 128, 223, 236, 232, 222, 220, 191, 237, 216, 190,
235, 188, 234, 127, 231, 221, 208, 184, 230, 126, 219, 218, 228, 124, 215, 176, 189,
214, 120, 187, 212, 233, 160, 207, 186, 183, 112, 206, 125, 229, 182, 204, 217, 123,
227, 180, 175, 96, 122, 226, 200, 213, 174, 119, 211, 118, 159, 172, 64, 185, 158, 210,
205, 111, 116, 168, 181, 110, 203, 156, 179, 202, 95, 108, 152, 199, 173, 178, 121, 94,
198, 104, 171, 225, 117, 92, 144, 63, 170, 157, 196, 115, 167, 62, 88, 209, 109, 155,
166, 114, 60, 154, 107, 151, 164, 80, 201, 106, 93, 56, 150, 103, 177, 197, 91, 143,
102, 148, 169, 48, 90, 142, 195, 87, 100, 61, 165, 140, 86, 194, 113, 59, 32, 153, 79,
163, 58, 84, 136, 55, 78, 105, 149, 162, 54, 76, 101, 147, 47, 52, 89, 141, 99, 146, 46,
72, 139, 85, 98, 31, 44, 138, 83, 57, 30, 135, 77, 193, 40, 82, 53, 134, 28, 75, 161, 51,
74, 132, 24, 45, 71, 50, 145, 70, 43, 16, 97, 42, 29, 68, 39, 137, 27, 38, 81, 133, 26, 23,
36, 73, 131, 22, 49, 69, 130, 15, 20, 41, 14, 67, 12, 66, 37, 25, 8, 35, 21, 34, 129, 19,
13, 18, 11, 65, 10, 7, 6, 33, 4, 17, 9, 5, 3, 2, 1, 256, 255, 254, 253, 252, 251, 250, 249,
248, 247, 246, 245, 244, 243, 242, 241

M = 288, N = 512
256, 255, 254, 252, 248, 240, 253, 288, 287, 224, 251, 286, 250, 287, 247, 192,
284, 246, 239, 244, 128, 280, 238, 223, 236, 249, 272, 222, 232, 191, 245, 220, 285,
190, 243, 216, 237, 283, 242, 188, 127, 208, 235, 282, 126, 184, 279, 221, 234, 231,
124, 278, 219, 176, 230, 271, 218, 120, 189, 228, 215, 276, 241, 160, 187, 214, 270,
112, 207, 186, 212, 233, 125, 183, 206, 268, 96, 281, 182, 229, 123, 204, 175, 217,
264, 180, 227, 122, 200, 174, 119, 64, 277, 213, 226, 159, 172, 118, 185, 211, 111,
275, 158, 205, 116, 168, 269, 210, 110, 181, 156, 274, 203, 95, 108, 267, 179, 152,
202, 121, 94, 173, 199, 178, 104, 266, 225, 198, 144, 63, 171, 92, 117, 263, 196, 170,
157, 62, 115, 88, 167, 209, 262, 109, 155, 60, 114, 166, 80, 260, 107, 154, 201, 164,
151, 56, 273, 106, 93, 177, 103, 150, 197, 48, 143, 91, 102, 148, 169, 195, 142, 265,
90, 61, 100, 87, 194, 32, 165, 113, 140, 59, 86, 153, 261, 79, 163, 136, 58, 84, 105, 55,
78, 162, 149, 259, 54, 101, 76, 147, 47, 258, 89, 141, 52, 146, 99, 72, 46, 193, 139, 98,
85, 31, 44, 138, 30, 57, 135, 83, 40, 77, 161, 82, 134, 28, 53, 75, 132, 24, 51, 74, 145,
71, 45, 16, 50, 97, 257, 70, 43, 137, 68, 29, 42, 39, 27, 81, 38, 133, 26, 23, 36, 131, 73,
22, 49, 130, 15, 69, 20, 14, 41, 67, 12, 66, 37, 25, 8, 35, 21, 34, 129, 19, 13, 18, 11, 65,
10, 7, 6, 33, 4, 17, 9, 5, 3, 2, 1, 512, 511, 510, 509, 508, 507, 506, 505, 504, 503, 502,
501, 500, 499, 498, 497, 496, 495, 494, 493, 492, 491, 490, 489, 488, 487, 486, 485,
484, 483, 482, 481, 480, 479, 478, 477, 476, 475, 474, 473, 472, 471, 470, 469, 468,
467, 466, 465, 464, 463, 462, 461, 460, 459, 458, 457, 456, 455, 454, 453, 452, 451,
450, 449, 448, 447, 446, 445, 444, 443, 442, 441, 440, 439, 438, 437, 436, 435, 434,
433, 432, 431, 430, 429, 428, 427, 426, 425, 424, 423, 422, 421, 420, 419, 418, 417,
416, 415, 414, 413, 412, 411, 410, 409, 408, 407, 406, 405, 404, 403, 402, 401, 400,
399, 398, 397, 396, 395, 394, 393, 392, 391, 390, 389, 388, 387, 386, 385, 384, 383,
382, 381, 380, 379, 378, 377, 376, 375, 374, 373, 372, 371, 370, 369, 368, 367, 366,
365, 364, 363, 362, 361, 360, 359, 358, 357, 356, 355, 354, 353, 352, 351, 350, 349,
348, 347, 346, 345, 344, 343, 342, 341, 340, 339, 338, 337, 336, 335, 334, 333, 332,
331, 330, 329, 328, 327, 326, 325, 324, 323, 322, 321, 320, 319, 318, 317, 316, 315,
314, 313, 312, 311, 310, 309, 308, 307, 306, 305, 304, 303, 302, 301, 300, 299, 298,
297, 296, 295, 294, 293, 292, 291, 290, 289

M = 300, N = 512
256, 255, 254, 252, 248, 240, 288, 300, 296, 253, 224, 251, 250, 287, 247,
192, 246, 286, 239, 299, 244, 128, 238, 284, 223, 298, 236, 249, 222, 232, 280, 295,
245, 191, 220, 294, 190, 243, 216, 237, 242, 272, 188, 127, 285, 235, 208, 126, 184,
221, 234, 292, 231, 283, 124, 219, 176, 230, 282, 297, 218, 189, 120, 228, 215, 279,
241, 160, 214, 187, 278, 112, 207, 212, 186, 233, 293, 125, 183, 206, 271, 276, 96,
229, 182, 204, 123, 270, 175, 217, 291, 180, 227, 122, 200, 174, 119, 213, 64, 226,
281, 268, 159, 290, 172, 118, 211, 185, 111, 158, 205, 264, 116, 168, 277, 210, 110,
181, 156, 203, 95, 275, 108, 179, 202, 152, 121, 199, 173, 94, 269, 178, 104, 274, 225,
198, 144, 171, 92, 117, 63, 196, 157, 170, 267, 62, 115, 209, 167, 88, 109, 289, 155,
266, 114, 166, 60, 263, 80, 201, 154, 107, 164, 151, 56, 93, 177, 106, 262, 150, 103,
197, 143, 91, 48, 102, 148, 260, 169, 195, 273, 142, 90, 61, 100, 87, 194, 165, 113, 32,
140, 86, 59, 153, 79, 163, 136, 265, 84, 58, 105, 55, 149, 78, 162, 54, 76, 101, 261,
147, 47, 89, 141, 52, 146, 99, 72, 46, 193, 259, 139, 98, 85, 31, 44, 138, 258, 83, 135,
57, 30, 77, 40, 161, 82, 134, 28, 53, 75, 132, 24, 74, 51, 145, 71, 45, 50, 97, 16, 70, 43,

TABLE 2-continued 137, 68, 29, 42, 81, 39, 133, 257, 27, 38, 131, 26, 73, 23, 36, 22, 49, 130, 15, 69, 20,
14, 41, 67, 12, 66, 37, 25, 8, 35, 21, 34, 129, 19, 13, 18, 11, 65, 10, 7, 6, 33, 4, 17, 9, 5,
3, 2, 1, 512, 511, 510, 509, 508, 507, 506, 505, 504, 503, 502, 501, 500, 499, 498, 497,
496, 495, 494, 493, 492, 491, 490, 489, 488, 487, 486, 485, 484, 483, 482, 481, 480,
479, 478, 477, 476, 475, 474, 473, 472, 471, 470, 469, 468, 467, 466, 465, 464, 463,
462, 461, 460, 459, 458, 457, 456, 455, 454, 453, 452, 451, 450, 449, 448, 447, 446,
445, 444, 443, 442, 441, 440, 439, 438, 437, 436, 435, 434, 433, 432, 431, 430, 429,
428, 427, 426, 425, 424, 423, 422, 421, 420, 419, 418, 417, 416, 415, 414, 413, 412,
411, 410, 409, 408, 407, 406, 405, 404, 403, 402, 401, 400, 399, 398, 397, 396, 395,
394, 393, 392, 391, 390, 389, 388, 387, 386, 385, 384, 383, 382, 381, 380, 379, 378,
377, 376, 375, 374, 373, 372, 371, 370, 369, 368, 367, 366, 365, 364, 363, 362, 361,
360, 359, 358, 357, 356, 355, 354, 353, 352, 351, 350, 349, 348, 347, 346, 345, 344,
343, 342, 341, 340, 339, 338, 337, 336, 335, 334, 333, 332, 331, 330, 329, 328, 327,
326, 325, 324, 323, 322, 321, 320, 319, 318, 317, 316, 315, 314, 313, 312, 311, 310,
309, 308, 307, 306, 305, 304, 303, 302, 301
M = 360, N = 512
256, 255, 254, 252, 352, 320, 351, 350, 360, 248, 359, 348, 240, 319, 358,
253, 344, 318, 224, 251, 356, 316, 250, 336, 247, 349, 192, 246, 312, 347, 239, 244,
346, 238, 304, 343, 317, 223, 357, 236, 128, 249, 342, 222, 315, 232, 335, 355, 245,
191, 340, 220, 314, 288, 334, 311, 243, 190, 354, 216, 237, 332, 242, 310, 345, 188,
235, 303, 208, 308, 234, 221, 184, 127, 328, 341, 231, 302, 219, 126, 230, 339, 176,
300, 313, 218, 287, 333, 189, 124, 228, 215, 338, 241, 286, 296, 160, 214, 187, 331,
309, 120, 207, 353, 284, 186, 212, 233, 330, 307, 183, 206, 112, 327, 301, 280, 306,
182, 229, 125, 204, 326, 175, 217, 299, 180, 227, 96, 123, 272, 200, 174, 324, 298,
213, 226, 122, 285, 337, 295, 159, 119, 172, 211, 185, 64, 294, 283, 158, 118, 205,
168, 329, 210, 111, 181, 282, 292, 156, 116, 203, 279, 305, 110, 179, 325, 202, 152,
278, 173, 199, 95, 108, 178, 271, 121, 297, 323, 198, 225, 171, 276, 94, 144, 104, 270,
157, 170, 117, 322, 196, 63, 92, 293, 167, 209, 268, 155, 115, 62, 281, 166, 88, 109,
291, 154, 114, 201, 264, 60, 151, 164, 107, 290, 277, 80, 177, 150, 197, 106, 56, 93,
143, 275, 103, 148, 169, 269, 91, 195, 102, 142, 48, 274, 90, 194, 61, 165, 267, 321,
100, 87, 140, 153, 113, 32, 86, 59, 266, 163, 136, 263, 79, 149, 58, 162, 84, 105, 289,
55, 78, 262, 147, 54, 101, 141, 76, 260, 47, 146, 89, 52, 99, 273, 139, 72, 46, 193, 85,
98, 138, 31, 44, 135, 265, 57, 83, 30, 161, 77, 134, 40, 82, 53, 28, 261, 75, 132, 145,
51, 74, 24, 45, 71, 259, 50, 97, 70, 258, 16, 137, 43, 29, 68, 42, 39, 133, 81, 27, 38,
131, 26, 73, 36, 23, 22, 49, 130, 15, 69, 20, 14, 41, 67, 257, 12, 66, 37, 25, 8, 35, 21,
34, 129, 19, 13, 18, 11, 65, 10, 7, 6, 33, 4, 17, 9, 5, 3, 2, 1, 512, 511, 510, 509, 508,
507, 506, 505, 504, 503, 502, 501, 500, 499, 498, 497, 496, 495, 494, 493, 492, 491,
490, 489, 488, 487, 486, 485, 484, 483, 482, 481, 480, 479, 478, 477, 476, 475, 474,
473, 472, 471, 470, 469, 468, 467, 466, 465, 464, 463, 462, 461, 460, 459, 458, 457,
456, 455, 454, 453, 452, 451, 450, 449, 448, 447, 446, 445, 444, 443, 442, 441, 440,
439, 438, 437, 436, 435, 434, 433, 432, 431, 430, 429, 428, 427, 426, 425, 424, 423,
422, 421, 420, 419, 418, 417, 416, 415, 414, 413, 412, 411, 410, 409, 408, 407, 406,
405, 404, 403, 402, 401, 400, 399, 398, 397, 396, 395, 394, 393, 392, 391, 390, 389,
388, 387, 386, 385, 384, 383, 382, 381, 380, 379, 378, 377, 376, 375, 374, 373, 372,
371, 370, 369, 368, 367, 366, 365, 364, 363, 362, 361
M = 384, N = 512
384, 256, 383, 382, 380, 255, 376, 254, 368, 381, 252, 352, 379, 248, 378,
375, 320, 240, 374, 253, 367, 372, 224, 366, 251, 351, 250, 364, 247, 377, 350, 192,
360, 246, 373, 319, 348, 239, 244, 318, 371, 238, 344, 365, 370, 316, 223, 236, 363,
336, 249, 222, 349, 362, 312, 232, 359, 128, 245, 191, 220, 347, 358, 304, 190, 243,
346, 317, 216, 343, 237, 356, 242, 188, 369, 288, 342, 315, 235, 208, 335, 314, 340,
221, 234, 184, 361, 311, 231, 334, 127, 219, 310, 230, 357, 332, 176, 303, 126, 218,
345, 189, 308, 215, 228, 355, 302, 328, 124, 241, 341, 160, 214, 187, 354, 287, 300,
207, 186, 339, 313, 120, 212, 233, 286, 183, 333, 206, 296, 338, 309, 182, 112, 284,
229, 331, 204, 175, 125, 217, 307, 180, 330, 227, 280, 200, 301, 174, 327, 96, 123,
213, 306, 226, 159, 326, 299, 172, 122, 353, 272, 211, 185, 119, 158, 64, 205, 285,
298, 324, 168, 210, 118, 295, 181, 156, 337, 203, 283, 111, 294, 116, 179, 202, 282,
110, 152, 173, 199, 329, 279, 292, 178, 95, 108, 305, 198, 171, 278, 225, 121, 144, 94,
325, 271, 157, 170, 104, 196, 276, 167, 297, 117, 63, 92, 323, 270, 209, 155, 166, 62,
115, 293, 322, 88, 154, 109, 268, 201, 151, 114, 164, 281, 60, 291, 107, 177, 80, 150,
264, 197, 277, 93, 56, 106, 143, 290, 103, 148, 169, 195, 91, 142, 275, 102, 48, 269,
165, 90, 194, 61, 140, 274, 87, 100, 153, 267, 113, 32, 163, 86, 59, 136, 321, 79, 149,
266, 162, 58, 84, 105, 263, 55, 78, 147, 262, 54, 141, 289, 101, 76, 146, 47, 89, 52,
139, 99, 260, 72, 46, 193, 85, 273, 138, 98, 31, 135, 44, 57, 83, 30, 77, 134, 161, 265,
40, 82, 53, 28, 75, 132, 261, 145, 51, 74, 24, 45, 71, 50, 259, 137, 97, 70, 16, 43, 258,
29, 42, 68, 133, 39, 81, 27, 38, 26, 23, 36, 131, 73, 22, 49, 130, 15, 69, 20, 14, 41, 67,
257, 12, 66, 37, 25, 8, 35, 21, 34, 129, 19, 13, 18, 11, 65, 10, 7, 6, 33, 4, 17, 9, 5, 3, 2,
1, 512, 511, 510, 509, 508, 507, 506, 505, 504, 503, 502, 501, 500, 499, 498, 497, 496,
495, 494, 493, 492, 491, 490, 489, 488, 487, 486, 485, 484, 483, 482, 481, 480, 479,
478, 477, 476, 475, 474, 473, 472, 471, 470, 469, 468, 467, 466, 465, 464, 463, 462,
461, 460, 459, 458, 457, 456, 455, 454, 453, 452, 451, 450, 449, 448, 447, 446, 445,
444, 443, 442, 441, 440, 439, 438, 437, 436, 435, 434, 433, 432, 431, 430, 429, 428,
427, 426, 425, 424, 423, 422, 421, 420, 419, 418, 417, 416, 415, 414, 413, 412, 411,
410, 409, 408, 407, 406, 405, 404, 403, 402, 401, 400, 399, 398, 397, 396, 395, 394,
393, 392, 391, 390, 389, 388, 387, 386, 385
M = 400, N = 512
384, 256, 383, 382, 380, 255, 376, 254, 400, 368, 252, 381, 399, 352, 379,
248, 378, 398, 375, 320, 240, 374, 253, 396, 367, 372, 224, 251, 366, 351, 250, 392,
364, 247, 377, 350, 192, 360, 246, 373, 319, 348, 239, 244, 371, 397, 318, 238, 344,
365, 370, 223, 316, 236, 395, 363, 249, 336, 222, 349, 362, 128, 312, 232, 359, 394, TABLE 2-continued 245, 191, 220, 347, 391, 358, 243, 304, 190, 346, 216, 237, 317, 343, 356, 242, 390,
188, 369, 342, 235, 315, 288, 208, 335, 388, 234, 221, 314, 340, 184, 361, 231, 311,
334, 127, 219, 230, 310, 357, 126, 176, 332, 218, 303, 345, 189, 215, 228, 308, 355,
124, 393, 328, 302, 241, 214, 187, 341, 160, 354, 287, 207, 120, 300, 186, 212, 339,
233, 313, 183, 389, 206, 286, 333, 338, 296, 112, 182, 309, 229, 204, 284, 125, 331,
387, 175, 217, 180, 307, 227, 330, 96, 123, 200, 174, 280, 301, 327, 213, 306, 386,
226, 122, 159, 172, 119, 326, 299, 211, 185, 353, 272, 64, 158, 205, 118, 298, 285,
168, 210, 324, 295, 181, 111, 156, 203, 337, 116, 283, 294, 110, 179, 202, 152, 282,
173, 199, 95, 329, 178, 279, 292, 108, 121, 198, 171, 305, 94, 225, 278, 144, 104, 325,
157, 170, 117, 271, 196, 63, 92, 167, 276, 297, 209, 323, 155, 270, 115, 62, 166, 385,
88, 109, 154, 293, 114, 322, 268, 201, 151, 60, 164, 107, 281, 80, 177, 291, 150, 93,
106, 264, 197, 56, 103, 143, 277, 290, 148, 169, 91, 195, 102, 142, 48, 275, 90, 61,
165, 269, 87, 194, 100, 140, 274, 153, 113, 86, 32, 59, 163, 267, 136, 79, 149, 58, 84,
321, 162, 105, 266, 55, 78, 263, 147, 54, 101, 141, 76, 262, 289, 47, 146, 89, 52, 99,
139, 72, 46, 260, 85, 193, 98, 138, 31, 273, 44, 135, 83, 57, 30, 77, 134, 40, 82, 161,
53, 265, 28, 75, 132, 51, 74, 145, 24, 261, 45, 71, 50, 70, 43, 259, 97, 16, 137, 29, 42,
258, 68, 39, 133, 81, 27, 38, 131, 26, 73, 36, 23, 22, 49, 130, 15, 69, 20, 14, 41, 67,
257, 12, 66, 37, 25, 8, 35, 21, 34, 129, 19, 13, 18, 11, 65, 10, 7, 6, 33, 4, 17, 9, 5, 3, 2,
1, 512, 511, 510, 509, 508, 507, 506, 505, 504, 503, 502, 501, 500, 499, 498, 497, 496,
495, 494, 493, 492, 491, 490, 489, 488, 487, 486, 485, 484, 483, 482, 481, 480, 479,
478, 477, 476, 475, 474, 473, 472, 471, 470, 469, 468, 467, 466, 465, 464, 463, 462,
461, 460, 459, 458, 457, 456, 455, 454, 453, 452, 451, 450, 449, 448, 447, 446, 445,
444, 443, 442, 441, 440, 439, 438, 437, 436, 435, 434, 433, 432, 431, 430, 429, 428,
427, 426, 425, 424, 423, 422, 421, 420, 419, 418, 417, 416, 415, 414, 413, 412, 411,
410, 409, 408, 407, 406, 405, 404, 403, 402, 401

M = 480, N = 512

480, 448, 384, 479, 478, 476, 447, 256, 472, 446, 464, 444, 477, 383, 440,
475, 382, 474, 432, 471, 380, 445, 470, 255, 463, 376, 443, 468, 254, 462, 442, 439,
416, 368, 252, 460, 381, 438, 473, 431, 379, 456, 436, 248, 469, 430, 352, 378, 375,
467, 240, 428, 461, 374, 253, 441, 415, 466, 320, 367, 424, 459, 372, 251, 414, 437,
366, 224, 458, 250, 412, 435, 455, 247, 364, 429, 351, 434, 454, 246, 408, 377, 192,
427, 360, 350, 239, 244, 373, 452, 426, 400, 238, 348, 423, 319, 413, 371, 465, 422,
365, 128, 236, 318, 344, 411, 223, 370, 249, 363, 420, 457, 410, 316, 222, 232, 407,
336, 362, 245, 433, 359, 349, 220, 453, 406, 312, 191, 243, 358, 399, 347, 190, 425,
404, 237, 451, 216, 242, 398, 304, 346, 356, 343, 235, 188, 317, 450, 421, 127, 396,
208, 342, 369, 234, 315, 221, 419, 231, 409, 288, 126, 184, 335, 340, 314, 392, 361,
219, 230, 311, 334, 418, 405, 124, 176, 218, 310, 357, 228, 332, 215, 189, 403, 303,
120, 397, 345, 308, 214, 355, 241, 187, 402, 302, 328, 160, 207, 395, 354, 341, 212,
186, 112, 233, 300, 183, 206, 287, 394, 125, 339, 449, 313, 391, 182, 286, 333, 204,
229, 296, 123, 338, 175, 96, 390, 309, 180, 217, 284, 331, 227, 122, 174, 200, 417,
119, 307, 388, 330, 213, 226, 280, 301, 327, 172, 159, 118, 64, 306, 211, 185, 326,
111, 158, 299, 401, 205, 116, 168, 272, 210, 110, 353, 298, 181, 156, 285, 324, 203,
295, 393, 108, 179, 95, 202, 283, 294, 152, 173, 199, 337, 121, 389, 94, 178, 282, 104,
198, 292, 279, 171, 117, 329, 144, 92, 387, 63, 225, 170, 278, 157, 196, 305, 167, 115,
62, 271, 325, 88, 386, 109, 155, 276, 166, 114, 209, 270, 297, 60, 107, 154, 323, 80,
151, 164, 268, 106, 201, 93, 293, 56, 322, 150, 103, 177, 281, 91, 143, 102, 291, 197,
264, 148, 48, 90, 142, 277, 169, 290, 87, 100, 61, 195, 275, 140, 86, 165, 194, 59, 32,
113, 269, 79, 153, 274, 58, 84, 163, 136, 55, 78, 267, 105, 385, 149, 162, 54, 266, 76,
101, 147, 47, 263, 52, 321, 89, 141, 99, 46, 72, 146, 262, 139, 85, 98, 31, 44, 289, 260,
138, 83, 57, 30, 135, 77, 40, 193, 82, 273, 53, 134, 28, 75, 51, 74, 132, 24, 161, 45, 71,
265, 50, 70, 43, 145, 261, 16, 97, 42, 29, 68, 137, 39, 27, 259, 38, 81, 26, 133, 258, 23,
36, 73, 131, 22, 49, 69, 15, 130, 20, 41, 14, 67, 257, 12, 66, 37, 25, 8, 35, 21, 34, 129,
19, 13, 18, 11, 65, 10, 7, 6, 33, 4, 17, 9, 5, 3, 2, 1, 512, 511, 510, 509, 508, 507, 506,
505, 504, 503, 502, 501, 500, 499, 498, 497, 496, 495, 494, 493, 492, 491, 490, 489,
488, 487, 486, 485, 484, 483, 482, 481

M = 576, N = 1024

512, 511, 510, 508, 504, 496, 509, 576, 575, 480, 507, 574, 506, 503, 448,
572, 502, 495, 500, 384, 568, 494, 479, 492, 560, 505, 478, 256, 488, 447, 501, 476,
573, 446, 499, 544, 472, 493, 571, 498, 444, 383, 464, 491, 570, 382, 440, 477, 567,
490, 487, 380, 566, 475, 432, 255, 486, 559, 474, 376, 445, 254, 484, 471, 564, 416,
497, 558, 470, 443, 252, 368, 463, 543, 442, 468, 489, 381, 439, 462, 556, 248, 352,
569, 438, 485, 542, 460, 379, 431, 473, 240, 552, 436, 378, 483, 456, 430, 375, 540,
565, 320, 253, 469, 482, 415, 224, 374, 428, 251, 467, 441, 367, 563, 414, 536, 461,
372, 424, 557, 466, 250, 366, 412, 437, 562, 247, 192, 459, 351, 528, 364, 555, 246,
408, 435, 458, 377, 350, 455, 429, 239, 541, 434, 360, 128, 244, 554, 481, 400, 454,
348, 319, 427, 238, 373, 551, 452, 223, 413, 426, 539, 318, 236, 344, 371, 423, 465,
550, 365, 249, 222, 411, 316, 370, 422, 538, 232, 336, 548, 535, 410, 363, 457, 220,
191, 420, 245, 407, 312, 561, 349, 433, 362, 534, 190, 406, 359, 453, 216, 243, 399,
304, 527, 347, 237, 358, 404, 188, 425, 242, 532, 451, 127, 398, 553, 346, 208, 317,
356, 526, 343, 235, 450, 288, 126, 184, 396, 421, 369, 221, 234, 342, 315, 409, 524,
231, 549, 335, 124, 419, 392, 340, 176, 314, 219, 361, 537, 230, 311, 334, 405, 418,
120, 520, 218, 547, 189, 310, 228, 332, 215, 357, 160, 403, 303, 241, 345, 546, 533,
397, 308, 214, 112, 187, 402, 328, 355, 302, 207, 449, 395, 212, 186, 354, 341, 287,
233, 531, 125, 183, 206, 300, 96, 394, 525, 286, 339, 391, 313, 182, 530, 204, 123,
229, 296, 333, 417, 175, 338, 390, 284, 217, 180, 122, 523, 64, 309, 200, 227, 331,
174, 119, 388, 280, 226, 213, 330, 159, 307, 401, 522, 118, 172, 327, 301, 519, 306,
111, 158, 272, 211, 353, 185, 326, 116, 168, 205, 299, 545, 393, 110, 210, 518, 156,
324, 285, 298, 181, 95, 203, 108, 295, 337, 152, 389, 516, 94, 202, 283, 179, 294, 121,
199, 104, 173, 529, 387, 282, 178, 144, 329, 225, 92, 292, 198, 63, 279, 117, 171, 386,
305, 278, 62, 196, 88, 157, 325, 170, 271, 115, 167, 209, 521, 276, 60, 109, 297, 323,

TABLE 2-continued 155, 270, 114, 80, 166, 322, 154, 107, 56, 201, 268, 164, 151, 293, 517, 93, 106, 177,
281, 150, 264, 103, 48, 197, 291, 143, 91, 515, 102, 148, 290, 385, 277, 195, 142, 169,
32, 90, 61, 514, 100, 87, 194, 275, 140, 113, 165, 269, 86, 59, 274, 153, 79, 136, 321,
163, 58, 84, 267, 55, 78, 105, 162, 149, 266, 54, 263, 76, 47, 101, 147, 289, 262, 52,
141, 72, 89, 46, 146, 99, 260, 193, 31, 139, 44, 98, 85, 273, 30, 513, 138, 40, 135, 83,
57, 77, 28, 82, 53, 134, 161, 75, 265, 24, 51, 132, 74, 45, 71, 261, 50, 145, 16, 43, 70,
97, 259, 29, 42, 137, 68, 258, 39, 27, 81, 38, 133, 26, 23, 36, 131, 73, 22, 49, 130, 15,
69, 20, 14, 41, 67, 257, 12, 66, 37, 25, 8, 35, 21, 34, 129, 19, 13, 18, 11, 65, 10, 7, 6,
33, 4, 17, 9, 5, 3, 2, 1, 1024, 1023, 1022, 1021, 1020, 1019, 1018, 1017, 1016, 1015,
1014, 1013, 1012, 1011, 1010, 1009, 1008, 1007, 1006, 1005, 1004, 1003, 1002, 1001,
1000, 999, 998, 997, 996, 995, 994, 993, 992, 991, 990, 989, 988, 987, 986, 985, 984,
983, 982, 981, 980, 979, 978, 977, 976, 975, 974, 973, 972, 971, 970, 969, 968, 967,
966, 965, 964, 963, 962, 961, 960, 959, 958, 957, 956, 955, 954, 953, 952, 951, 950,
949, 948, 947, 946, 945, 944, 943, 942, 941, 940, 939, 938, 937, 936, 935, 934, 933,
932, 931, 930, 929, 928, 927, 926, 925, 924, 923, 922, 921, 920, 919, 918, 917, 916,
915, 914, 913, 912, 911, 910, 909, 908, 907, 906, 905, 904, 903, 902, 901, 900, 899,
898, 897, 896, 895, 894, 893, 892, 891, 890, 889, 888, 887, 886, 885, 884, 883, 882,
881, 880, 879, 878, 877, 876, 875, 874, 873, 872, 871, 870, 869, 868, 867, 866, 865,
864, 863, 862, 861, 860, 859, 858, 857, 856, 855, 854, 853, 852, 851, 850, 849, 848,
847, 846, 845, 844, 843, 842, 841, 840, 839, 838, 837, 836, 835, 834, 833, 832, 831,
830, 829, 828, 827, 826, 825, 824, 823, 822, 821, 820, 819, 818, 817, 816, 815, 814,
813, 812, 811, 810, 809, 808, 807, 806, 805, 804, 803, 802, 801, 800, 799, 798, 797,
796, 795, 794, 793, 792, 791, 790, 789, 788, 787, 786, 785, 784, 783, 782, 781, 780,
779, 778, 777, 776, 775, 774, 773, 772, 771, 770, 769, 768, 767, 766, 765, 764, 763,
762, 761, 760, 759, 758, 757, 756, 755, 754, 753, 752, 751, 750, 749, 748, 747, 746,
745, 744, 743, 742, 741, 740, 739, 738, 737, 736, 735, 734, 733, 732, 731, 730, 729,
728, 727, 726, 725, 724, 723, 722, 721, 720, 719, 718, 717, 716, 715, 714, 713, 712,
711, 710, 709, 708, 707, 706, 705, 704, 703, 702, 701, 700, 699, 698, 697, 696, 695,
694, 693, 692, 691, 690, 689, 688, 687, 686, 685, 684, 683, 682, 681, 680, 679, 678,
677, 676, 675, 674, 673, 672, 671, 670, 669, 668, 667, 666, 665, 664, 663, 662, 661,
660, 659, 658, 657, 656, 655, 654, 653, 652, 651, 650, 649, 648, 647, 646, 645, 644,
643, 642, 641, 640, 639, 638, 637, 636, 635, 634, 633, 632, 631, 630, 629, 628, 627,
626, 625, 624, 623, 622, 621, 620, 619, 618, 617, 616, 615, 614, 613, 612, 611, 610,
609, 608, 607, 606, 605, 604, 603, 602, 601, 600, 599, 598, 597, 596, 595, 594, 593,
592, 591, 590, 589, 588, 587, 586, 585, 584, 583, 582, 581, 580, 579, 578, 577

M = 600, N = 1024

512, 511, 510, 508, 504, 496, 576, 600, 592, 509, 480, 507, 506, 575, 503,
448, 502, 574, 495, 599, 500, 384, 494, 572, 598, 479, 492, 505, 478, 256, 488, 568,
596, 501, 476, 447, 591, 446, 499, 472, 590, 493, 560, 498, 444, 383, 464, 491, 573,
588, 440, 382, 477, 490, 487, 571, 380, 544, 475, 432, 255, 486, 597, 570, 474, 445,
376, 484, 471, 254, 567, 416, 497, 584, 443, 470, 595, 252, 368, 463, 566, 442, 468,
489, 439, 381, 462, 559, 248, 594, 589, 352, 564, 438, 485, 460, 379, 431, 473, 558,
240, 436, 483, 378, 587, 456, 430, 375, 320, 253, 469, 556, 482, 415, 543, 569, 428,
374, 224, 586, 441, 467, 251, 414, 367, 461, 552, 372, 424, 542, 466, 250, 583, 366,
437, 412, 565, 192, 247, 459, 351, 540, 364, 435, 582, 408, 458, 246, 377, 563, 429,
455, 350, 239, 434, 593, 360, 557, 481, 244, 400, 454, 536, 427, 580, 319, 373, 348,
128, 562, 238, 413, 452, 426, 318, 223, 555, 423, 371, 465, 344, 236, 365, 528, 411,
249, 222, 422, 316, 370, 554, 585, 232, 336, 410, 541, 457, 363, 551, 420, 407, 191,
220, 245, 312, 433, 349, 362, 406, 550, 190, 359, 453, 539, 216, 243, 399, 304, 347,
581, 237, 404, 358, 425, 188, 451, 242, 548, 538, 398, 346, 127, 317, 208, 356, 561,
343, 235, 535, 450, 288, 421, 396, 184, 369, 579, 126, 221, 315, 342, 234, 409, 534,
231, 335, 419, 392, 578, 124, 314, 340, 176, 527, 361, 219, 553, 311, 405, 230, 418,
334, 532, 218, 189, 120, 526, 310, 228, 357, 332, 403, 215, 160, 303, 549, 241, 397,
345, 308, 402, 187, 214, 355, 524, 328, 112, 302, 207, 449, 395, 537, 186, 212, 354,
341, 547, 287, 233, 183, 300, 125, 206, 394, 520, 96, 391, 286, 313, 339, 546, 182,
204, 229, 296, 333, 533, 123, 417, 175, 338, 390, 284, 217, 180, 309, 122, 227, 200,
331, 64, 174, 388, 119, 531, 280, 577, 307, 226, 213, 330, 401, 159, 172, 525, 327,
301, 118, 530, 306, 158, 185, 211, 353, 111, 272, 326, 168, 116, 299, 205, 393, 523,
210, 156, 110, 324, 285, 298, 181, 203, 95, 295, 522, 337, 108, 389, 152, 519, 283,
179, 202, 294, 94, 121, 545, 199, 173, 387, 104, 178, 282, 329, 144, 225, 292, 518,
279, 198, 92, 63, 171, 386, 117, 305, 278, 196, 157, 62, 325, 170, 516, 88, 271, 167,
115, 209, 276, 529, 60, 297, 109, 155, 323, 270, 166, 114, 80, 154, 322, 201, 268, 107,
164, 56, 293, 151, 521, 93, 177, 281, 106, 150, 264, 103, 291, 197, 48, 143, 91, 148,
102, 290, 277, 385, 169, 142, 195, 517, 90, 32, 61, 100, 87, 194, 275, 140, 165, 113,
269, 59, 86, 274, 515, 153, 136, 79, 321, 163, 58, 267, 84, 514, 55, 105, 162, 149, 78,
266, 54, 263, 76, 101, 147, 47, 289, 262, 52, 141, 89, 72, 146, 46, 99, 260, 193, 31,
139, 44, 98, 85, 273, 30, 138, 135, 40, 57, 83, 28, 134, 161, 77, 82, 265, 513, 24, 53,
132, 75, 16, 261, 74, 51, 145, 71, 45, 50, 43, 70, 97, 259, 29, 42, 137, 68, 258, 39, 27,
81, 38, 133, 26, 23, 36, 131, 73, 22, 49, 130, 15, 69, 20, 14, 41, 67, 257, 12, 66, 37, 25,
8, 35, 21, 34, 129, 19, 13, 18, 11, 65, 10, 7, 6, 33, 4, 17, 9, 5, 3, 2, 1, 1024, 1023, 1022,
1021, 1020, 1019, 1018, 1017, 1016, 1015, 1014, 1013, 1012, 1011, 1010, 1009, 1008,
1007, 1006, 1005, 1004, 1003, 1002, 1001, 1000, 999, 998, 997, 996, 995, 994, 993,
992, 991, 990, 989, 988, 987, 986, 985, 984, 983, 982, 981, 980, 979, 978, 977, 976,
975, 974, 973, 972, 971, 970, 969, 968, 967, 966, 965, 964, 963, 962, 961, 960, 959,
958, 957, 956, 955, 954, 953, 952, 951, 950, 949, 948, 947, 946, 945, 944, 943, 942,
941, 940, 939, 938, 937, 936, 935, 934, 933, 932, 931, 930, 929, 928, 927, 926, 925,
924, 923, 922, 921, 920, 919, 918, 917, 916, 915, 914, 913, 912, 911, 910, 909, 908,
907, 906, 905, 904, 903, 902, 901, 900, 899, 898, 897, 896, 895, 894, 893, 892, 891,
890, 889, 888, 887, 886, 885, 884, 883, 882, 881, 880, 879, 878, 877, 876, 875, 874,
873, 872, 871, 870, 869, 868, 867, 866, 865, 864, 863, 862, 861, 860, 859, 858, 857,

TABLE 2-continued 856, 855, 854, 853, 852, 851, 850, 849, 848, 847, 846, 845, 844, 843, 842, 841, 840,
839, 838, 837, 836, 835, 834, 833, 832, 831, 830, 829, 828, 827, 826, 825, 824, 823,
822, 821, 820, 819, 818, 817, 816, 815, 814, 813, 812, 811, 810, 809, 808, 807, 806,
805, 804, 803, 802, 801, 800, 799, 798, 797, 796, 795, 794, 793, 792, 791, 790, 789,
788, 787, 786, 785, 784, 783, 782, 781, 780, 779, 778, 777, 776, 775, 774, 773, 772,
771, 770, 769, 768, 767, 766, 765, 764, 763, 762, 761, 760, 759, 758, 757, 756, 755,
754, 753, 752, 751, 750, 749, 748, 747, 746, 745, 744, 743, 742, 741, 740, 739, 738,
737, 736, 735, 734, 733, 732, 731, 730, 729, 728, 727, 726, 725, 724, 723, 722, 721,
720, 719, 718, 717, 716, 715, 714, 713, 712, 711, 710, 709, 708, 707, 706, 705, 704,
703, 702, 701, 700, 699, 698, 697, 696, 695, 694, 693, 692, 691, 690, 689, 688, 687,
686, 685, 684, 683, 682, 681, 680, 679, 678, 677, 676, 675, 674, 673, 672, 671, 670,
669, 668, 667, 666, 665, 664, 663, 662, 661, 660, 659, 658, 657, 656, 655, 654, 653,
652, 651, 650, 649, 648, 647, 646, 645, 644, 643, 642, 641, 640, 639, 638, 637, 636,
635, 634, 633, 632, 631, 630, 629, 628, 627, 626, 625, 624, 623, 622, 621, 620, 619,
618, 617, 616, 615, 614, 613, 612, 611, 610, 609, 608, 607, 606, 605, 604, 603, 602,
601

M = 720, N = 1024

512, 511, 510, 508, 704, 640, 703, 702, 720, 504, 719, 700, 496, 639, 718,
509, 696, 480, 638, 507, 716, 688, 506, 636, 503, 701, 448, 712, 502, 632, 699, 495,
672, 500, 698, 494, 384, 695, 624, 479, 717, 492, 637, 694, 505, 478, 715, 488, 687,
635, 692, 608, 501, 447, 476, 686, 714, 634, 499, 446, 256, 711, 631, 472, 493, 671,
684, 498, 697, 444, 383, 630, 710, 491, 464, 670, 680, 623, 382, 477, 490, 576, 693,
440, 628, 487, 668, 708, 622, 475, 380, 691, 486, 432, 474, 607, 664, 685, 620, 445,
690, 471, 484, 376, 633, 497, 255, 606, 416, 470, 683, 443, 713, 616, 463, 629, 368,
656, 254, 682, 442, 468, 669, 604, 489, 381, 439, 679, 462, 709, 627, 575, 252, 667,
438, 352, 485, 600, 678, 379, 621, 460, 626, 431, 473, 574, 707, 666, 248, 436, 483,
378, 676, 663, 619, 456, 430, 375, 689, 469, 592, 572, 320, 482, 706, 415, 662, 618,
605, 374, 240, 428, 615, 467, 441, 367, 568, 253, 414, 655, 461, 660, 603, 681, 372,
424, 466, 614, 366, 437, 224, 412, 654, 251, 459, 602, 560, 351, 677, 612, 599, 435,
364, 250, 458, 625, 573, 652, 408, 377, 429, 455, 247, 665, 350, 598, 434, 675, 192,
360, 544, 454, 571, 246, 481, 427, 591, 648, 400, 373, 319, 348, 596, 661, 617, 674,
239, 413, 426, 570, 452, 244, 590, 318, 371, 423, 567, 465, 344, 238, 659, 128, 365,
613, 705, 411, 370, 422, 588, 566, 223, 316, 653, 601, 658, 236, 410, 363, 336, 457,
611, 249, 559, 407, 420, 222, 564, 584, 651, 349, 312, 362, 433, 232, 597, 558, 610,
406, 359, 453, 245, 220, 191, 650, 347, 399, 543, 358, 304, 595, 647, 404, 556, 425,
243, 451, 190, 569, 346, 398, 216, 589, 317, 542, 237, 673, 343, 356, 594, 646, 242,
450, 552, 421, 369, 188, 288, 396, 127, 342, 315, 565, 587, 235, 409, 208, 540, 644,
335, 419, 126, 314, 392, 221, 184, 340, 234, 586, 657, 361, 563, 311, 231, 405, 334,
583, 536, 418, 557, 219, 124, 562, 310, 230, 357, 609, 176, 582, 403, 332, 303, 649,
218, 345, 555, 397, 528, 189, 308, 215, 228, 120, 355, 402, 580, 328, 302, 241, 541,
554, 160, 395, 341, 214, 593, 187, 354, 551, 449, 645, 287, 112, 207, 300, 394, 539,
212, 186, 339, 313, 233, 550, 391, 286, 125, 183, 206, 333, 643, 585, 296, 538, 338,
417, 96, 390, 548, 535, 309, 182, 229, 284, 123, 204, 331, 642, 561, 217, 175, 581,
388, 534, 180, 307, 227, 122, 330, 280, 200, 401, 174, 119, 301, 327, 527, 213, 64,
306, 226, 532, 553, 159, 579, 353, 118, 326, 172, 272, 299, 526, 211, 185, 393, 111,
158, 205, 578, 285, 298, 116, 324, 168, 549, 210, 295, 524, 110, 337, 181, 156, 537,
203, 389, 283, 95, 294, 547, 108, 179, 520, 202, 152, 282, 121, 329, 387, 199, 173, 94,
533, 292, 279, 546, 178, 104, 305, 641, 225, 198, 386, 144, 171, 278, 63, 117, 92, 325,
531, 271, 157, 196, 525, 170, 62, 276, 297, 115, 167, 88, 209, 530, 323, 270, 109, 155,
114, 60, 166, 523, 577, 322, 293, 268, 80, 107, 154, 201, 151, 164, 281, 522, 56, 93,
106, 291, 177, 519, 264, 150, 103, 197, 277, 290, 545, 143, 91, 48, 102, 518, 148, 169,
195, 385, 90, 142, 275, 61, 100, 87, 516, 269, 194, 32, 165, 113, 140, 274, 86, 59, 529,
153, 267, 79, 163, 321, 136, 58, 84, 105, 55, 266, 149, 78, 162, 263, 521, 54, 101, 76,
147, 289, 47, 262, 89, 141, 52, 517, 146, 99, 72, 46, 260, 193, 139, 85, 98, 31, 273,
515, 44, 138, 30, 57, 83, 40, 135, 77, 28, 82, 53, 134, 514, 161, 75, 265, 24, 51, 132,
74, 45, 71, 261, 50, 145, 16, 43, 70, 97, 259, 29, 42, 137, 68, 258, 39, 27, 81, 38, 133,
513, 26, 23, 36, 131, 73, 22, 49, 130, 15, 69, 20, 14, 41, 67, 257, 12, 66, 37, 25, 8, 35,
21, 34, 129, 19, 13, 18, 11, 65, 10, 7, 6, 33, 4, 17, 9, 5, 3, 2, 1, 1024, 1023, 1022, 1021,
1020, 1019, 1018, 1017, 1016, 1015, 1014, 1013, 1012, 1011, 1010, 1009, 1008, 1007,
1006, 1005, 1004, 1003, 1002, 1001, 1000, 999, 998, 997, 996, 995, 994, 993, 992,
991, 990, 989, 988, 987, 986, 985, 984, 983, 982, 981, 980, 979, 978, 977, 976, 975,
974, 973, 972, 971, 970, 969, 968, 967, 966, 965, 964, 963, 962, 961, 960, 959, 958,
957, 956, 955, 954, 953, 952, 951, 950, 949, 948, 947, 946, 945, 944, 943, 942, 941,
940, 939, 938, 937, 936, 935, 934, 933, 932, 931, 930, 929, 928, 927, 926, 925, 924,
923, 922, 921, 920, 919, 918, 917, 916, 915, 914, 913, 912, 911, 910, 909, 908, 907,
906, 905, 904, 903, 902, 901, 900, 899, 898, 897, 896, 895, 894, 893, 892, 891, 890,
889, 888, 887, 886, 885, 884, 883, 882, 881, 880, 879, 878, 877, 876, 875, 874, 873,
872, 871, 870, 869, 868, 867, 866, 865, 864, 863, 862, 861, 860, 859, 858, 857, 856,
855, 854, 853, 852, 851, 850, 849, 848, 847, 846, 845, 844, 843, 842, 841, 840, 839,
838, 837, 836, 835, 834, 833, 832, 831, 830, 829, 828, 827, 826, 825, 824, 823, 822,
821, 820, 819, 818, 817, 816, 815, 814, 813, 812, 811, 810, 809, 808, 807, 806, 805,
804, 803, 802, 801, 800, 799, 798, 797, 796, 795, 794, 793, 792, 791, 790, 789, 788,
787, 786, 785, 784, 783, 782, 781, 780, 779, 778, 777, 776, 775, 774, 773, 772, 771,
770, 769, 768, 767, 766, 765, 764, 763, 762, 761, 760, 759, 758, 757, 756, 755, 754,
753, 752, 751, 750, 749, 748, 747, 746, 745, 744, 743, 742, 741, 740, 739, 738, 737,
736, 735, 734, 733, 732, 731, 730, 729, 728, 727, 726, 725, 724, 723, 722, 721

M = 768, N = 1024

768, 512, 767, 766, 764, 760, 511, 510, 752, 765, 508, 736, 763, 504, 762,
759, 704, 496, 758, 509, 751, 756, 640, 750, 480, 507, 735, 748, 506, 761, 734, 503,
744, 448, 757, 703, 502, 732, 495, 702, 755, 500, 728, 749, 494, 384, 754, 700, 639,

TABLE 2-continued 747, 479, 720, 492, 638, 733, 746, 505, 696, 478, 743, 488, 731, 636, 501, 742, 447,
688, 476, 730, 701, 727, 632, 740, 446, 499, 472, 493, 753, 672, 726, 699, 498, 444,
719, 383, 624, 491, 698, 724, 464, 745, 256, 695, 637, 718, 382, 477, 490, 440, 487,
694, 741, 608, 635, 716, 475, 687, 380, 729, 486, 692, 432, 634, 739, 474, 686, 712,
631, 445, 471, 725, 484, 376, 576, 738, 671, 630, 684, 497, 416, 470, 443, 723, 697,
623, 670, 463, 717, 368, 628, 680, 442, 722, 468, 255, 489, 622, 693, 439, 381, 668,
462, 715, 254, 607, 438, 352, 691, 620, 485, 379, 714, 460, 664, 633, 685, 431, 711,
473, 606, 252, 690, 436, 378, 483, 616, 456, 430, 710, 683, 375, 629, 737, 656, 575,
604, 469, 320, 482, 248, 415, 669, 682, 374, 428, 708, 574, 627, 679, 467, 441, 600,
367, 414, 621, 721, 667, 461, 240, 372, 626, 678, 424, 466, 572, 366, 437, 253, 619,
666, 412, 459, 592, 713, 663, 676, 351, 224, 605, 618, 568, 435, 364, 251, 458, 689,
408, 615, 662, 377, 429, 455, 350, 709, 434, 250, 603, 655, 360, 614, 247, 560, 660,
454, 427, 681, 481, 373, 319, 400, 192, 602, 348, 707, 654, 573, 246, 599, 612, 413,
426, 452, 318, 371, 423, 677, 239, 706, 625, 652, 544, 344, 598, 571, 365, 465, 244,
411, 665, 370, 422, 128, 238, 591, 316, 675, 570, 596, 363, 648, 410, 617, 336, 567,
223, 457, 407, 661, 590, 420, 236, 674, 349, 362, 312, 249, 433, 566, 222, 359, 406,
613, 588, 659, 453, 232, 559, 347, 399, 601, 653, 358, 245, 191, 304, 564, 404, 220,
425, 611, 658, 346, 451, 584, 558, 398, 317, 343, 190, 356, 651, 597, 243, 610, 216,
543, 421, 237, 450, 369, 288, 396, 556, 705, 342, 315, 242, 650, 409, 595, 188, 569,
127, 542, 647, 335, 235, 419, 589, 208, 314, 340, 392, 552, 361, 594, 311, 126, 405,
334, 221, 234, 184, 565, 646, 418, 540, 673, 587, 231, 310, 357, 124, 219, 332, 403,
563, 644, 230, 586, 303, 176, 345, 536, 397, 557, 308, 583, 218, 355, 657, 402, 189,
562, 328, 302, 120, 215, 228, 395, 341, 582, 555, 609, 354, 241, 528, 160, 287, 214,
187, 449, 300, 649, 394, 112, 541, 313, 339, 554, 207, 580, 286, 391, 186, 212, 551,
333, 233, 125, 183, 296, 593, 206, 338, 539, 390, 309, 645, 417, 284, 550, 331, 96,
182, 229, 123, 204, 538, 175, 307, 217, 388, 585, 330, 535, 548, 643, 280, 180, 122,
227, 301, 327, 401, 200, 174, 119, 306, 561, 64, 534, 213, 642, 226, 326, 581, 159,
299, 353, 272, 118, 172, 527, 211, 185, 393, 532, 285, 111, 298, 158, 553, 324, 205,
579, 116, 295, 526, 168, 210, 337, 110, 181, 283, 156, 389, 203, 294, 549, 578, 524,
95, 282, 108, 179, 537, 202, 329, 152, 387, 279, 121, 292, 173, 199, 94, 547, 178, 520,
305, 104, 278, 386, 198, 533, 225, 171, 325, 63, 144, 117, 546, 92, 271, 157, 276, 170,
297, 196, 62, 115, 531, 323, 167, 641, 270, 88, 209, 109, 525, 155, 114, 60, 166, 293,
530, 322, 268, 107, 154, 80, 281, 201, 523, 151, 164, 56, 291, 577, 93, 106, 264, 177,
103, 150, 522, 277, 197, 290, 91, 519, 143, 48, 102, 148, 169, 385, 275, 195, 90, 545,
142, 518, 87, 61, 100, 269, 274, 165, 194, 113, 32, 140, 59, 86, 516, 153, 267, 79, 321,
529, 163, 58, 136, 84, 105, 266, 55, 149, 78, 162, 263, 54, 521, 101, 289, 76, 262, 147,
47, 89, 141, 52, 46, 72, 99, 146, 31, 44, 85, 139, 98, 193, 260, 517, 30, 57, 138, 83,
273, 40, 135, 515, 77, 28, 82, 53, 134, 514, 161, 75, 265, 24, 51, 132, 74, 45, 71, 261,
50, 145, 16, 43, 70, 97, 259, 29, 42, 137, 68, 258, 39, 27, 81, 38, 133, 513, 26, 23, 36,
131, 73, 22, 49, 130, 15, 69, 20, 14, 41, 67, 257, 12, 66, 37, 25, 8, 35, 21, 34, 129, 19,
13, 18, 11, 65, 10, 7, 6, 33, 4, 17, 9, 5, 3, 2, 1, 1024, 1023, 1022, 1021, 1020, 1019,
1018, 1017, 1016, 1015, 1014, 1013, 1012, 1011, 1010, 1009, 1008, 1007, 1006, 1005,
1004, 1003, 1002, 1001, 1000, 999, 998, 997, 996, 995, 994, 993, 992, 991, 990, 989,
988, 987, 986, 985, 984, 983, 982, 981, 980, 979, 978, 977, 976, 975, 974, 973, 972,
971, 970, 969, 968, 967, 966, 965, 964, 963, 962, 961, 960, 959, 958, 957, 956, 955,
954, 953, 952, 951, 950, 949, 948, 947, 946, 945, 944, 943, 942, 941, 940, 939, 938,
937, 936, 935, 934, 933, 932, 931, 930, 929, 928, 927, 926, 925, 924, 923, 922, 921,
920, 919, 918, 917, 916, 915, 914, 913, 912, 911, 910, 909, 908, 907, 906, 905, 904,
903, 902, 901, 900, 899, 898, 897, 896, 895, 894, 893, 892, 891, 890, 889, 888, 887,
886, 885, 884, 883, 882, 881, 880, 879, 878, 877, 876, 875, 874, 873, 872, 871, 870,
869, 868, 867, 866, 865, 864, 863, 862, 861, 860, 859, 858, 857, 856, 855, 854, 853,
852, 851, 850, 849, 848, 847, 846, 845, 844, 843, 842, 841, 840, 839, 838, 837, 836,
835, 834, 833, 832, 831, 830, 829, 828, 827, 826, 825, 824, 823, 822, 821, 820, 819,
818, 817, 816, 815, 814, 813, 812, 811, 810, 809, 808, 807, 806, 805, 804, 803, 802,
801, 800, 799, 798, 797, 796, 795, 794, 793, 792, 791, 790, 789, 788, 787, 786, 785,
784, 783, 782, 781, 780, 779, 778, 777, 776, 775, 774, 773, 772, 771, 770, 769
M = 960, N = 1024
960, 896, 959, 768, 958, 956, 895, 952, 512, 894, 944, 892, 957, 928, 955,
767, 888, 954, 766, 951, 880, 950, 764, 893, 943, 948, 864, 891, 511, 942, 760, 890,
927, 940, 887, 510, 953, 752, 926, 886, 936, 765, 508, 879, 949, 924, 884, 763, 736,
832, 878, 947, 504, 920, 941, 762, 863, 876, 946, 759, 889, 939, 862, 496, 758, 912,
872, 509, 938, 925, 751, 885, 860, 704, 935, 756, 507, 923, 750, 480, 883, 934, 856,
831, 877, 922, 506, 735, 882, 748, 919, 932, 503, 830, 875, 640, 761, 734, 848, 918,
502, 744, 874, 945, 828, 861, 448, 871, 911, 757, 732, 495, 916, 500, 859, 870, 910,
824, 937, 703, 494, 755, 728, 858, 749, 855, 702, 868, 754, 908, 479, 933, 492, 384,
816, 747, 854, 921, 829, 720, 505, 478, 700, 881, 931, 904, 746, 847, 639, 733, 488,
852, 827, 743, 800, 917, 501, 476, 930, 846, 873, 696, 638, 731, 826, 742, 447, 256,
823, 915, 499, 730, 844, 869, 472, 636, 446, 909, 493, 727, 740, 822, 688, 498, 914,
857, 701, 867, 815, 726, 491, 840, 907, 444, 632, 820, 753, 464, 853, 383, 719, 699,
814, 672, 866, 490, 724, 477, 906, 487, 718, 698, 382, 440, 903, 745, 851, 799, 812,
624, 695, 475, 845, 486, 637, 902, 825, 716, 798, 850, 741, 694, 380, 474, 808, 432,
843, 471, 729, 635, 484, 687, 608, 255, 821, 796, 929, 445, 692, 739, 712, 900, 842,
470, 376, 634, 686, 725, 254, 839, 819, 631, 497, 443, 738, 416, 792, 463, 813, 671,
468, 684, 913, 723, 630, 838, 818, 442, 252, 576, 462, 368, 489, 717, 439, 670, 811,
697, 623, 722, 784, 381, 680, 628, 865, 836, 905, 438, 460, 715, 810, 622, 797, 485,
668, 693, 248, 807, 379, 352, 431, 473, 714, 436, 849, 795, 607, 901, 691, 620, 483,
456, 806, 711, 378, 430, 664, 685, 240, 375, 469, 794, 633, 606, 690, 482, 710, 899,
791, 841, 616, 804, 253, 415, 428, 683, 374, 320, 467, 656, 629, 604, 737, 790, 441,
414, 708, 461, 575, 367, 682, 251, 669, 224, 898, 372, 424, 466, 837, 817, 679, 627,
783, 366, 574, 600, 459, 412, 788, 437, 250, 667, 621, 678, 721, 626, 247, 782, 835, TABLE 2-continued 809, 458, 351, 364, 666, 435, 572, 619, 408, 455, 663, 246, 592, 676, 429, 192, 780,
713, 350, 834, 377, 434, 618, 805, 605, 239, 454, 360, 662, 568, 615, 427, 244, 793,
689, 400, 348, 373, 709, 603, 655, 238, 803, 776, 319, 614, 426, 660, 452, 413, 481,
423, 371, 602, 789, 654, 128, 560, 318, 681, 707, 344, 223, 802, 236, 599, 612, 411,
365, 573, 422, 370, 465, 787, 652, 222, 249, 598, 706, 316, 410, 677, 363, 571, 781,
544, 232, 336, 407, 420, 625, 591, 665, 786, 457, 362, 220, 596, 245, 349, 570, 675,
648, 897, 191, 406, 359, 312, 590, 779, 567, 617, 433, 661, 347, 243, 399, 453, 674,
190, 358, 216, 404, 566, 778, 237, 588, 346, 304, 613, 398, 242, 659, 775, 425, 559,
451, 833, 343, 188, 356, 317, 601, 653, 235, 564, 127, 208, 658, 611, 584, 396, 558,
774, 342, 421, 450, 234, 315, 221, 288, 651, 369, 597, 126, 184, 231, 335, 409, 610,
543, 556, 340, 314, 419, 392, 801, 772, 219, 650, 230, 334, 311, 595, 124, 361, 542,
569, 647, 405, 176, 589, 218, 418, 705, 552, 310, 594, 215, 332, 228, 189, 357, 646,
785, 540, 565, 403, 120, 303, 587, 214, 308, 345, 397, 187, 160, 355, 241, 402, 328,
302, 563, 673, 586, 644, 207, 536, 212, 777, 186, 395, 583, 557, 341, 112, 354, 183,
562, 206, 287, 300, 233, 125, 394, 582, 555, 339, 657, 182, 286, 313, 391, 773, 528,
204, 333, 229, 449, 296, 123, 96, 554, 338, 175, 541, 580, 180, 609, 390, 284, 217,
309, 551, 331, 122, 649, 227, 174, 200, 771, 539, 119, 550, 307, 213, 330, 388, 417,
280, 226, 593, 159, 172, 327, 301, 118, 64, 538, 645, 770, 306, 211, 535, 548, 158,
111, 185, 326, 299, 205, 116, 168, 401, 585, 272, 210, 534, 643, 110, 156, 181, 298,
285, 203, 561, 353, 324, 527, 295, 581, 108, 532, 95, 393, 642, 179, 202, 283, 152,
294, 526, 173, 199, 553, 94, 337, 121, 178, 579, 282, 389, 104, 198, 279, 171, 292,
524, 549, 117, 144, 92, 63, 329, 578, 278, 170, 387, 157, 196, 225, 537, 167, 115, 62,
305, 271, 88, 547, 520, 325, 109, 155, 386, 276, 166, 114, 533, 209, 270, 154, 60, 107,
297, 546, 80, 323, 151, 164, 531, 106, 268, 769, 93, 201, 56, 293, 150, 103, 322, 525,
177, 281, 530, 91, 143, 197, 102, 291, 264, 148, 48, 523, 90, 142, 277, 169, 641, 87,
100, 61, 290, 195, 522, 140, 86, 275, 519, 165, 59, 194, 32, 577, 113, 269, 153, 79,
274, 518, 58, 84, 163, 385, 136, 55, 105, 267, 78, 545, 149, 162, 516, 54, 266, 101,
321, 76, 147, 263, 529, 47, 89, 141, 52, 99, 46, 521, 72, 262, 289, 146, 31, 44, 85, 139,
98, 193, 260, 517, 30, 57, 138, 83, 273, 40, 135, 515, 77, 28, 82, 53, 134, 514, 161, 75,
265, 24, 51, 132, 74, 45, 71, 261, 50, 145, 16, 43, 70, 97, 259, 29, 42, 137, 68, 258, 39,
27, 81, 38, 133, 513, 26, 23, 36, 131, 73, 22, 49, 130, 15, 69, 20, 14, 41, 67, 257, 12,
66, 37, 25, 8, 35, 21, 34, 129, 19, 13, 18, 11, 65, 10, 7, 6, 33, 4, 17, 9, 5, 3, 2, 1, 1024,
1023, 1022, 1021, 1020, 1019, 1018, 1017, 1016, 1015, 1014, 1013, 1012, 1011, 1010,
1009, 1008, 1007, 1006, 1005, 1004, 1003, 1002, 1001, 1000, 999, 998, 997, 996, 995,
994, 993, 992, 991, 990, 989, 988, 987, 986, 985, 984, 983, 982, 981, 980, 979, 978,
977, 976, 975, 974, 973, 972, 971, 970, 969, 968, 967, 966, 965, 964, 963, 962, 961
M = 1200, N = 2048
1024, 1023, 1022, 1020, 1016, 1008, 1152, 1200, 1184, 1021, 992, 1019,
1018, 1151, 1015, 960, 1014, 1150, 1199, 1007, 1012, 896, 1006, 1148, 1198, 991,
1004, 1017, 990, 768, 1000, 1144, 1196, 959, 1013, 988, 1183, 958, 1011, 984, 1192,
1005, 512, 1136, 1010, 956, 1182, 895, 976, 1003, 1149, 894, 952, 989, 1002, 1180,
999, 1120, 892, 1147, 987, 944, 767, 998, 1197, 986, 1176, 888, 957, 1146, 996, 983,
766, 928, 1009, 1143, 955, 982, 1195, 880, 764, 975, 1142, 954, 511, 980, 1088, 1001,
893, 951, 974, 760, 1194, 1135, 864, 510, 950, 1191, 997, 1140, 891, 972, 1181, 943,
985, 1168, 752, 948, 1134, 890, 508, 995, 968, 942, 887, 832, 1190, 765, 981, 1119,
1179, 994, 927, 1132, 504, 886, 940, 736, 1145, 953, 979, 763, 879, 926, 1188, 1118,
1178, 973, 884, 936, 978, 1128, 496, 762, 878, 1175, 924, 949, 704, 759, 971, 1141,
863, 1116, 509, 876, 947, 920, 1174, 758, 970, 889, 1087, 480, 862, 941, 967, 751,
1139, 946, 507, 872, 1193, 1112, 756, 640, 993, 912, 966, 831, 939, 860, 885, 1133,
750, 1172, 1086, 506, 1138, 925, 448, 964, 938, 1167, 830, 503, 735, 883, 856, 935,
748, 977, 1104, 877, 1131, 1189, 1084, 761, 923, 502, 828, 734, 882, 934, 1166, 744,
495, 848, 922, 1117, 875, 969, 1130, 703, 500, 384, 932, 919, 732, 757, 824, 1080,
1177, 1187, 1127, 861, 494, 945, 874, 1164, 918, 871, 702, 965, 1115, 755, 479, 728,
911, 816, 1126, 859, 492, 1186, 749, 870, 916, 937, 700, 1173, 754, 505, 963, 639,
1160, 478, 910, 858, 1114, 1072, 829, 256, 720, 868, 855, 488, 1124, 747, 1111, 800,
962, 933, 881, 638, 696, 908, 447, 1085, 476, 1137, 501, 827, 854, 733, 746, 921,
1171, 1110, 847, 743, 931, 446, 1056, 636, 904, 826, 852, 472, 688, 873, 499, 731,
1083, 823, 1103, 846, 742, 917, 1170, 930, 493, 1108, 1165, 444, 1129, 632, 498, 383,
730, 701, 822, 869, 1082, 844, 740, 464, 1102, 727, 915, 672, 815, 491, 857, 1079,
753, 909, 820, 382, 440, 699, 1163, 914, 726, 624, 867, 840, 1125, 814, 477, 490,
1100, 719, 961, 1078, 907, 487, 853, 698, 866, 380, 799, 724, 1113, 745, 637, 432,
812, 1162, 695, 475, 718, 906, 608, 1185, 255, 1071, 486, 1123, 825, 798, 851, 1159,
1096, 903, 1076, 376, 694, 808, 474, 845, 635, 741, 716, 445, 929, 850, 484, 254, 687,
471, 902, 1109, 796, 1122, 416, 729, 1070, 821, 692, 1158, 634, 497, 843, 576, 739,
712, 443, 686, 470, 368, 631, 900, 252, 1055, 792, 819, 1068, 842, 463, 1107, 725,
738, 913, 671, 1156, 442, 813, 839, 630, 468, 684, 1169, 1081, 489, 381, 818, 1101,
439, 1054, 462, 623, 248, 784, 865, 670, 697, 352, 723, 1106, 838, 628, 1064, 811,
680, 717, 905, 438, 379, 622, 722, 460, 485, 668, 1052, 836, 797, 1099, 810, 1077,
431, 693, 240, 607, 473, 715, 807, 436, 849, 320, 378, 620, 901, 456, 483, 664, 1098,
430, 795, 375, 1161, 691, 714, 806, 1048, 606, 633, 1075, 1095, 253, 711, 685, 482,
415, 469, 224, 616, 794, 899, 374, 690, 428, 841, 804, 656, 791, 737, 1069, 575, 1121,
604, 710, 1074, 367, 1094, 414, 683, 629, 441, 817, 251, 467, 898, 372, 1157, 790,
1040, 424, 574, 461, 837, 708, 669, 682, 366, 600, 192, 466, 783, 1067, 412, 250, 627,
1092, 679, 721, 788, 437, 247, 572, 351, 809, 621, 459, 835, 782, 667, 364, 1053,
1105, 626, 1155, 1066, 678, 408, 592, 246, 1063, 435, 458, 350, 834, 666, 377, 780,
619, 568, 713, 128, 805, 455, 676, 239, 429, 663, 360, 1154, 434, 1051, 244, 605, 400,
793, 618, 319, 689, 481, 348, 1062, 454, 776, 662, 238, 615, 803, 427, 373, 1097, 560,
709, 1050, 655, 318, 603, 223, 452, 1060, 344, 413, 614, 802, 660, 789, 426, 1047,
236, 897, 681, 371, 707, 654, 423, 465, 602, 573, 1073, 544, 316, 222, 612, 365, 1093,
599, 249, 411, 787, 370, 706, 1046, 422, 336, 652, 232, 625, 677, 781, 571, 598, 191, TABLE 2-continued 220, 410, 786, 312, 1039, 363, 457, 665, 420, 407, 591, 1044, 1091, 648, 245, 833,
570, 675, 349, 779, 596, 1065, 362, 190, 433, 1038, 567, 216, 617, 406, 590, 359, 304,
674, 453, 661, 778, 1090, 243, 399, 347, 566, 188, 775, 358, 404, 127, 588, 237, 1036,
208, 613, 559, 242, 425, 1061, 398, 659, 451, 801, 288, 317, 346, 774, 564, 601, 653,
356, 343, 126, 184, 584, 658, 235, 1153, 450, 558, 1049, 611, 396, 369, 421, 1032,
772, 705, 315, 1059, 342, 221, 543, 651, 234, 610, 597, 124, 409, 556, 335, 785, 231,
176, 392, 314, 419, 650, 340, 542, 1058, 1045, 311, 219, 569, 647, 361, 334, 595, 230,
552, 120, 418, 405, 589, 673, 540, 218, 310, 160, 189, 594, 646, 777, 332, 228, 215,
1043, 357, 303, 565, 403, 112, 587, 308, 644, 536, 241, 1037, 345, 397, 187, 214, 328,
402, 302, 1042, 355, 563, 773, 586, 657, 207, 1089, 449, 583, 186, 287, 557, 395, 96,
212, 528, 354, 300, 562, 125, 341, 183, 1035, 206, 233, 609, 771, 582, 394, 286, 555,
313, 391, 649, 182, 339, 296, 123, 770, 204, 1034, 580, 64, 541, 175, 333, 284, 554,
229, 417, 1031, 390, 338, 551, 180, 122, 593, 217, 200, 309, 174, 645, 119, 1057, 539,
280, 331, 1030, 227, 388, 550, 159, 118, 172, 538, 307, 330, 643, 226, 401, 1028, 213,
548, 272, 535, 327, 111, 585, 301, 158, 306, 116, 642, 168, 534, 326, 353, 185, 561,
110, 211, 1041, 156, 299, 527, 205, 581, 393, 95, 324, 532, 210, 108, 285, 298, 152,
526, 181, 295, 94, 203, 579, 769, 553, 104, 337, 283, 389, 1033, 144, 524, 294, 63,
202, 92, 578, 179, 121, 282, 199, 173, 520, 292, 387, 62, 549, 178, 279, 88, 198, 1029,
329, 386, 537, 225, 117, 278, 60, 171, 80, 547, 196, 157, 170, 115, 305, 167, 109, 271,
325, 155, 114, 209, 276, 533, 166, 546, 641, 270, 107, 297, 154, 323, 56, 151, 531,
164, 93, 106, 201, 268, 525, 322, 103, 293, 150, 530, 177, 91, 281, 48, 143, 523, 102,
197, 264, 577, 291, 148, 90, 61, 142, 522, 87, 169, 277, 100, 195, 290, 385, 519, 32,
59, 86, 140, 113, 194, 275, 518, 165, 545, 79, 269, 58, 153, 84, 274, 55, 136, 516, 163,
78, 105, 267, 1027, 321, 54, 149, 529, 162, 76, 266, 47, 1026, 101, 263, 52, 147, 89,
46, 141, 521, 72, 262, 99, 289, 146, 31, 44, 85, 139, 98, 193, 260, 517, 30, 57, 138, 83,
273, 40, 135, 515, 77, 28, 82, 53, 134, 514, 161, 75, 265, 1025, 24, 51, 132, 74, 45, 71,
261, 50, 145, 16, 43, 70, 97, 259, 29, 42, 137, 68, 258, 39, 27, 81, 38, 133, 513, 26, 23,
36, 131, 73, 22, 49, 130, 15, 69, 20, 14, 41, 67, 257, 12, 66, 37, 25, 8, 35, 21, 34, 129,
19, 13, 18, 11, 65, 10, 7, 6, 33, 4, 17, 9, 5, 3, 2, 1, 2048, 2047, 2046, 2045, 2044, 2043,
2042, 2041, 2040, 2039, 2038, 2037, 2036, 2035, 2034, 2033, 2032, 2031, 2030, 2029,
2028, 2027, 2026, 2025, 2024, 2023, 2022, 2021, 2020, 2019, 2018, 2017, 2016, 2015,
2014, 2013, 2012, 2011, 2010, 2009, 2008, 2007, 2006, 2005, 2004, 2003, 2002, 2001,
2000, 1999, 1998, 1997, 1996, 1995, 1994, 1993, 1992, 1991, 1990, 1989, 1988, 1987,
1986, 1985, 1984, 1983, 1982, 1981, 1980, 1979, 1978, 1977, 1976, 1975, 1974, 1973,
1972, 1971, 1970, 1969, 1968, 1967, 1966, 1965, 1964, 1963, 1962, 1961, 1960, 1959,
1958, 1957, 1956, 1955, 1954, 1953, 1952, 1951, 1950, 1949, 1948, 1947, 1946, 1945,
1944, 1943, 1942, 1941, 1940, 1939, 1938, 1937, 1936, 1935, 1934, 1933, 1932, 1931,
1930, 1929, 1928, 1927, 1926, 1925, 1924, 1923, 1922, 1921, 1920, 1919, 1918, 1917,
1916, 1915, 1914, 1913, 1912, 1911, 1910, 1909, 1908, 1907, 1906, 1905, 1904, 1903,
1902, 1901, 1900, 1899, 1898, 1897, 1896, 1895, 1894, 1893, 1892, 1891, 1890, 1889,
1888, 1887, 1886, 1885, 1884, 1883, 1882, 1881, 1880, 1879, 1878, 1877, 1876, 1875,
1874, 1873, 1872, 1871, 1870, 1869, 1868, 1867, 1866, 1865, 1864, 1863, 1862, 1861,
1860, 1859, 1858, 1857, 1856, 1855, 1854, 1853, 1852, 1851, 1850, 1849, 1848, 1847,
1846, 1845, 1844, 1843, 1842, 1841, 1840, 1839, 1838, 1837, 1836, 1835, 1834, 1833,
1832, 1831, 1830, 1829, 1828, 1827, 1826, 1825, 1824, 1823, 1822, 1821, 1820, 1819,
1818, 1817, 1816, 1815, 1814, 1813, 1812, 1811, 1810, 1809, 1808, 1807, 1806, 1805,
1804, 1803, 1802, 1801, 1800, 1799, 1798, 1797, 1796, 1795, 1794, 1793, 1792, 1791,
1790, 1789, 1788, 1787, 1786, 1785, 1784, 1783, 1782, 1781, 1780, 1779, 1778, 1777,
1776, 1775, 1774, 1773, 1772, 1771, 1770, 1769, 1768, 1767, 1766, 1765, 1764, 1763,
1762, 1761, 1760, 1759, 1758, 1757, 1756, 1755, 1754, 1753, 1752, 1751, 1750, 1749,
1748, 1747, 1746, 1745, 1744, 1743, 1742, 1741, 1740, 1739, 1738, 1737, 1736, 1735,
1734, 1733, 1732, 1731, 1730, 1729, 1728, 1727, 1726, 1725, 1724, 1723, 1722, 1721,
1720, 1719, 1718, 1717, 1716, 1715, 1714, 1713, 1712, 1711, 1710, 1709, 1708, 1707,
1706, 1705, 1704, 1703, 1702, 1701, 1700, 1699, 1698, 1697, 1696, 1695, 1694, 1693,
1692, 1691, 1690, 1689, 1688, 1687, 1686, 1685, 1684, 1683, 1682, 1681, 1680, 1679,
1678, 1677, 1676, 1675, 1674, 1673, 1672, 1671, 1670, 1669, 1668, 1667, 1666, 1665,
1664, 1663, 1662, 1661, 1660, 1659, 1658, 1657, 1656, 1655, 1654, 1653, 1652, 1651,
1650, 1649, 1648, 1647, 1646, 1645, 1644, 1643, 1642, 1641, 1640, 1639, 1638, 1637,
1636, 1635, 1634, 1633, 1632, 1631, 1630, 1629, 1628, 1627, 1626, 1625, 1624, 1623,
1622, 1621, 1620, 1619, 1618, 1617, 1616, 1615, 1614, 1613, 1612, 1611, 1610, 1609,
1608, 1607, 1606, 1605, 1604, 1603, 1602, 1601, 1600, 1599, 1598, 1597, 1596, 1595,
1594, 1593, 1592, 1591, 1590, 1589, 1588, 1587, 1586, 1585, 1584, 1583, 1582, 1581,
1580, 1579, 1578, 1577, 1576, 1575, 1574, 1573, 1572, 1571, 1570, 1569, 1568, 1567,
1566, 1565, 1564, 1563, 1562, 1561, 1560, 1559, 1558, 1557, 1556, 1555, 1554, 1553,
1552, 1551, 1550, 1549, 1548, 1547, 1546, 1545, 1544, 1543, 1542, 1541, 1540, 1539,
1538, 1537, 1536, 1535, 1534, 1533, 1532, 1531, 1530, 1529, 1528, 1527, 1526, 1525,
1524, 1523, 1522, 1521, 1520, 1519, 1518, 1517, 1516, 1515, 1514, 1513, 1512, 1511,
1510, 1509, 1508, 1507, 1506, 1505, 1504, 1503, 1502, 1501, 1500, 1499, 1498, 1497,
1496, 1495, 1494, 1493, 1492, 1491, 1490, 1489, 1488, 1487, 1486, 1485, 1484, 1483,
1482, 1481, 1480, 1479, 1478, 1477, 1476, 1475, 1474, 1473, 1472, 1471, 1470, 1469,
1468, 1467, 1466, 1465, 1464, 1463, 1462, 1461, 1460, 1459, 1458, 1457, 1456, 1455,
1454, 1453, 1452, 1451, 1450, 1449, 1448, 1447, 1446, 1445, 1444, 1443, 1442, 1441,
1440, 1439, 1438, 1437, 1436, 1435, 1434, 1433, 1432, 1431, 1430, 1429, 1428, 1427,
1426, 1425, 1424, 1423, 1422, 1421, 1420, 1419, 1418, 1417, 1416, 1415, 1414, 1413,
1412, 1411, 1410, 1409, 1408, 1407, 1406, 1405, 1404, 1403, 1402, 1401, 1400, 1399,
1398, 1397, 1396, 1395, 1394, 1393, 1392, 1391, 1390, 1389, 1388, 1387, 1386, 1385,
1384, 1383, 1382, 1381, 1380, 1379, 1378, 1377, 1376, 1375, 1374, 1373, 1372, 1371,
1370, 1369, 1368, 1367, 1366, 1365, 1364, 1363, 1362, 1361, 1360, 1359, 1358, 1357,
1356, 1355, 1354, 1353, 1352, 1351, 1350, 1349, 1348, 1347, 1346, 1345, 1344, 1343,
1342, 1341, 1340, 1339, 1338, 1337, 1336, 1335, 1334, 1333, 1332, 1331, 1330, 1329, TABLE 2-continued 1328, 1327, 1326, 1325, 1324, 1323, 1322, 1321, 1320, 1319, 1318, 1317, 1316, 1315,
1314, 1313, 1312, 1311, 1310, 1309, 1308, 1307, 1306, 1305, 1304, 1303, 1302, 1301,
1300, 1299, 1298, 1297, 1296, 1295, 1294, 1293, 1292, 1291, 1290, 1289, 1288, 1287,
1286, 1285, 1284, 1283, 1282, 1281, 1280, 1279, 1278, 1277, 1276, 1275, 1274, 1273,
1272, 1271, 1270, 1269, 1268, 1267, 1266, 1265, 1264, 1263, 1262, 1261, 1260, 1259,
1258, 1257, 1256, 1255, 1254, 1253, 1252, 1251, 1250, 1249, 1248, 1247, 1246, 1245,
1244, 1243, 1242, 1241, 1240, 1239, 1238, 1237, 1236, 1235, 1234, 1233, 1232, 1231,
1230, 1229, 1228, 1227, 1226, 1225, 1224, 1223, 1222, 1221, 1220, 1219, 1218, 1217,
1216, 1215, 1214, 1213, 1212, 1211, 1210, 1209, 1208, 1207, 1206, 1205, 1204, 1203,
1202, 1201

M = 1440, N = 2048

1024, 1023, 1022, 1020, 1408, 1280, 1407, 1406, 1440, 1016, 1439, 1404,
1008, 1438, 1279, 1021, 1400, 992, 1278, 1019, 1436, 1392, 1018, 1015, 1276, 1405,
960, 1432, 1014, 1403, 1376, 1007, 1272, 1012, 1424, 1402, 1006, 896, 1399, 1437,
991, 1264, 1004, 1344, 1398, 1017, 1277, 990, 1435, 1391, 768, 1000, 1396, 1013,
959, 988, 1275, 1248, 1390, 1434, 958, 1431, 1011, 1274, 984, 1005, 1375, 1388,
1271, 1010, 1401, 956, 1430, 895, 1216, 1003, 1374, 976, 1384, 1270, 1423, 894,
1397, 989, 1002, 952, 1428, 1263, 999, 1372, 1343, 512, 1268, 1422, 987, 892, 1395,
998, 1262, 944, 767, 1342, 1389, 1368, 986, 957, 1394, 983, 996, 1420, 888, 1247,
766, 1260, 1433, 1340, 1387, 1009, 1273, 928, 982, 955, 1360, 1152, 1246, 764, 975,
880, 1416, 1386, 1256, 954, 1373, 980, 1336, 1001, 1383, 1269, 1429, 951, 893, 974,
1215, 1244, 760, 1371, 1382, 950, 864, 997, 1267, 891, 972, 1328, 1427, 1214, 943,
985, 511, 1240, 1261, 1370, 948, 1380, 1421, 752, 995, 890, 1341, 1266, 1367, 968,
942, 887, 1426, 1393, 1212, 510, 765, 981, 832, 1259, 994, 927, 1366, 1232, 1339,
940, 886, 1419, 1312, 736, 979, 953, 1258, 1359, 763, 508, 1245, 926, 879, 1208,
1385, 1151, 973, 1255, 1338, 1364, 884, 936, 978, 1418, 1335, 762, 1358, 949, 878,
924, 1243, 1415, 759, 971, 1254, 1150, 504, 1381, 704, 1200, 1334, 863, 1356, 947,
876, 1242, 970, 758, 920, 1414, 1213, 1327, 1369, 1252, 889, 941, 1148, 967, 1239,
1379, 862, 496, 946, 751, 1332, 1265, 872, 1352, 756, 1326, 966, 993, 939, 1238, 509,
912, 1211, 885, 831, 1378, 1184, 1365, 1412, 640, 750, 860, 1144, 1231, 925, 938,
964, 1425, 480, 1324, 1257, 1210, 735, 830, 1236, 1311, 935, 883, 507, 1363, 748,
977, 856, 1337, 1207, 877, 1230, 923, 1136, 761, 1357, 934, 882, 734, 506, 1310, 828,
1320, 1362, 1253, 1206, 1149, 503, 744, 922, 875, 848, 1228, 1333, 969, 1417, 448,
919, 932, 703, 757, 1355, 1199, 732, 1241, 1308, 824, 861, 874, 502, 945, 1120, 1251,
1204, 1147, 918, 871, 1331, 1224, 1354, 702, 965, 755, 1198, 495, 728, 911, 1413,
1351, 1325, 859, 1237, 1250, 1304, 500, 749, 1146, 870, 816, 916, 937, 1330, 754,
494, 1143, 963, 700, 1183, 1377, 384, 1196, 910, 858, 639, 1350, 829, 1088, 1323,
1235, 855, 747, 1209, 868, 720, 479, 1411, 1296, 962, 933, 1142, 1229, 1182, 492,
881, 800, 908, 638, 696, 1192, 733, 827, 854, 1322, 746, 1234, 505, 1348, 921, 1135,
1309, 478, 743, 1205, 1319, 847, 931, 1140, 1361, 1410, 1227, 1180, 488, 826, 904,
852, 636, 256, 731, 873, 1134, 823, 742, 917, 688, 501, 447, 1307, 846, 1318, 930,
476, 1203, 1226, 730, 1176, 1119, 701, 1197, 822, 1223, 869, 632, 727, 1353, 740,
1132, 446, 915, 1306, 499, 844, 1202, 1316, 472, 815, 1145, 1303, 857, 909, 753, 493,
672, 1249, 1118, 1222, 820, 699, 726, 1329, 1195, 914, 867, 498, 1168, 444, 840,
1128, 814, 624, 1349, 719, 1302, 383, 907, 491, 853, 464, 698, 1141, 1087, 1194, 866,
724, 1220, 745, 1116, 1181, 961, 799, 1295, 637, 695, 1191, 812, 718, 440, 1321, 906,
382, 1233, 477, 490, 1300, 1347, 825, 851, 1086, 903, 1139, 798, 487, 608, 694, 1179,
1294, 741, 845, 1112, 1190, 635, 716, 1133, 808, 475, 850, 380, 687, 929, 729, 902,
1346, 432, 1138, 486, 1317, 821, 796, 1084, 255, 1178, 692, 1225, 634, 739, 843,
1292, 1188, 474, 712, 1175, 1131, 686, 631, 445, 1104, 1409, 576, 1305, 900, 484,
471, 376, 1201, 819, 725, 254, 842, 738, 1315, 792, 671, 1080, 913, 497, 813, 1174,
1117, 1130, 416, 839, 1221, 630, 684, 1288, 443, 470, 818, 1127, 697, 723, 1167, 623,
1314, 1301, 670, 252, 368, 865, 463, 838, 1193, 811, 784, 717, 1172, 628, 1115, 442,
680, 1219, 468, 489, 1072, 1126, 722, 905, 1166, 439, 622, 381, 693, 668, 462, 797,
810, 836, 1299, 715, 1114, 248, 1085, 807, 1218, 1189, 607, 1124, 849, 352, 1111,
438, 1293, 485, 620, 1164, 901, 691, 460, 379, 795, 714, 664, 1298, 1137, 1056, 431,
806, 633, 1177, 473, 685, 711, 606, 1083, 1110, 240, 436, 1187, 690, 483, 794, 378,
1291, 616, 1345, 841, 456, 899, 1160, 430, 1103, 737, 804, 791, 710, 375, 656, 320,
575, 683, 1082, 629, 253, 469, 604, 1108, 1129, 482, 1173, 1186, 817, 415, 1290,
1079, 898, 790, 428, 1102, 669, 682, 374, 708, 224, 837, 574, 1287, 627, 441, 467,
679, 783, 251, 600, 721, 414, 367, 1171, 1078, 1125, 621, 461, 788, 809, 667, 1313,
1100, 424, 372, 1165, 835, 626, 572, 466, 678, 1286, 1071, 782, 250, 1113, 366, 437,
1170, 412, 666, 592, 1076, 247, 619, 459, 192, 1123, 713, 834, 676, 805, 663, 1096,
351, 1163, 1070, 780, 568, 1284, 1217, 364, 435, 605, 689, 618, 408, 458, 246, 1109,
793, 1122, 377, 429, 662, 615, 455, 1297, 1055, 350, 709, 803, 1162, 239, 434, 1068,
776, 655, 603, 360, 560, 244, 1159, 481, 128, 1081, 1107, 614, 454, 400, 660, 427,
789, 681, 319, 802, 1054, 373, 348, 238, 707, 1101, 654, 602, 1185, 573, 1064, 1158,
897, 413, 1289, 612, 1106, 426, 599, 452, 223, 318, 787, 706, 423, 371, 1077, 677,
544, 236, 1052, 625, 465, 344, 652, 1099, 781, 571, 598, 365, 249, 411, 665, 1156,
222, 786, 422, 316, 370, 591, 675, 1075, 1285, 232, 1169, 648, 1098, 570, 1048, 410,
336, 596, 779, 363, 617, 457, 191, 1069, 833, 420, 567, 1095, 407, 245, 220, 661, 590,
674, 312, 1074, 433, 349, 362, 778, 1121, 406, 566, 190, 1283, 359, 1094, 613, 453,
1040, 775, 1067, 243, 588, 659, 1161, 216, 399, 559, 347, 304, 601, 237, 653, 358,
404, 801, 564, 425, 188, 774, 242, 1053, 658, 611, 1066, 1092, 451, 1282, 127, 584,
398, 346, 558, 317, 1063, 208, 1105, 356, 235, 651, 1157, 343, 597, 705, 610, 450,
772, 543, 288, 421, 369, 126, 184, 396, 1051, 556, 221, 1062, 315, 234, 342, 650, 785,
409, 569, 595, 231, 542, 647, 1155, 335, 419, 1050, 124, 392, 1097, 589, 314, 552,
340, 219, 361, 1060, 176, 1047, 594, 673, 311, 230, 405, 646, 334, 418, 540, 565,
1073, 1154, 777, 587, 218, 120, 189, 1046, 310, 1093, 228, 357, 215, 644, 403, 332,
563, 160, 536, 303, 1039, 586, 241, 345, 397, 657, 308, 557, 187, 773, 583, 214, 1044,

TABLE 2-continued 402, 1065, 355, 112, 328, 562, 1091, 302, 1038, 207, 609, 395, 186, 528, 341, 582,
449, 212, 354, 555, 233, 287, 125, 771, 183, 649, 300, 206, 1090, 1281, 1061, 394,
1036, 96, 541, 580, 554, 313, 339, 286, 391, 182, 229, 551, 123, 770, 333, 1049, 204,
593, 296, 175, 417, 338, 645, 390, 1059, 217, 539, 284, 1032, 309, 180, 550, 122, 227,
331, 64, 200, 174, 119, 538, 388, 1045, 1058, 585, 643, 307, 213, 280, 548, 226, 535,
330, 159, 1153, 401, 118, 301, 172, 327, 561, 642, 306, 1043, 534, 111, 185, 158, 211,
581, 353, 272, 326, 299, 205, 116, 168, 527, 1037, 393, 210, 110, 532, 1042, 156, 553,
181, 285, 324, 298, 579, 526, 203, 95, 295, 1035, 1089, 337, 108, 389, 152, 578, 179,
283, 202, 94, 121, 173, 104, 199, 294, 769, 178, 92, 282, 63, 144, 524, 117, 171, 198,
279, 225, 292, 387, 549, 329, 62, 157, 537, 88, 170, 278, 115, 196, 305, 386, 520, 167,
1034, 547, 109, 271, 1031, 60, 325, 155, 114, 209, 276, 533, 166, 546, 641, 80, 270,
107, 1030, 297, 154, 1057, 323, 56, 151, 531, 164, 93, 106, 201, 268, 525, 1028, 322,
103, 293, 150, 530, 177, 91, 281, 48, 1041, 143, 523, 102, 197, 264, 577, 291, 148, 90,
61, 142, 522, 87, 169, 277, 100, 195, 290, 385, 519, 1033, 32, 59, 86, 140, 113, 194,
275, 518, 165, 545, 79, 269, 1029, 58, 153, 84, 274, 55, 136, 516, 163, 78, 105, 267,
1027, 321, 54, 149, 529, 162, 76, 266, 47, 1026, 101, 263, 52, 147, 89, 46, 141, 521,
72, 262, 99, 289, 146, 31, 44, 85, 139, 98, 193, 260, 517, 30, 57, 138, 83, 273, 40, 135,
515, 77, 28, 82, 53, 134, 514, 161, 75, 265, 1025, 24, 51, 132, 74, 45, 71, 261, 50, 145,
16, 43, 70, 97, 259, 29, 42, 137, 68, 258, 39, 27, 81, 38, 133, 513, 26, 23, 36, 131, 73,
22, 49, 130, 15, 69, 20, 14, 41, 67, 257, 12, 66, 37, 25, 8, 35, 21, 34, 129, 19, 13, 18,
11, 65, 10, 7, 6, 33, 4, 17, 9, 5, 3, 2, 1, 2048, 2047, 2046, 2045, 2044, 2043, 2042,
2041, 2040, 2039, 2038, 2037, 2036, 2035, 2034, 2033, 2032, 2031, 2030, 2029, 2028,
2027, 2026, 2025, 2024, 2023, 2022, 2021, 2020, 2019, 2018, 2017, 2016, 2015, 2014,
2013, 2012, 2011, 2010, 2009, 2008, 2007, 2006, 2005, 2004, 2003, 2002, 2001, 2000,
1999, 1998, 1997, 1996, 1995, 1994, 1993, 1992, 1991, 1990, 1989, 1988, 1987, 1986,
1985, 1984, 1983, 1982, 1981, 1980, 1979, 1978, 1977, 1976, 1975, 1974, 1973, 1972,
1971, 1970, 1969, 1968, 1967, 1966, 1965, 1964, 1963, 1962, 1961, 1960, 1959, 1958,
1957, 1956, 1955, 1954, 1953, 1952, 1951, 1950, 1949, 1948, 1947, 1946, 1945, 1944,
1943, 1942, 1941, 1940, 1939, 1938, 1937, 1936, 1935, 1934, 1933, 1932, 1931, 1930,
1929, 1928, 1927, 1926, 1925, 1924, 1923, 1922, 1921, 1920, 1919, 1918, 1917, 1916,
1915, 1914, 1913, 1912, 1911, 1910, 1909, 1908, 1907, 1906, 1905, 1904, 1903, 1902,
1901, 1900, 1899, 1898, 1897, 1896, 1895, 1894, 1893, 1892, 1891, 1890, 1889, 1888,
1887, 1886, 1885, 1884, 1883, 1882, 1881, 1880, 1879, 1878, 1877, 1876, 1875, 1874,
1873, 1872, 1871, 1870, 1869, 1868, 1867, 1866, 1865, 1864, 1863, 1862, 1861, 1860,
1859, 1858, 1857, 1856, 1855, 1854, 1853, 1852, 1851, 1850, 1849, 1848, 1847, 1846,
1845, 1844, 1843, 1842, 1841, 1840, 1839, 1838, 1837, 1836, 1835, 1834, 1833, 1832,
1831, 1830, 1829, 1828, 1827, 1826, 1825, 1824, 1823, 1822, 1821, 1820, 1819, 1818,
1817, 1816, 1815, 1814, 1813, 1812, 1811, 1810, 1809, 1808, 1807, 1806, 1805, 1804,
1803, 1802, 1801, 1800, 1799, 1798, 1797, 1796, 1795, 1794, 1793, 1792, 1791, 1790,
1789, 1788, 1787, 1786, 1785, 1784, 1783, 1782, 1781, 1780, 1779, 1778, 1777, 1776,
1775, 1774, 1773, 1772, 1771, 1770, 1769, 1768, 1767, 1766, 1765, 1764, 1763, 1762,
1761, 1760, 1759, 1758, 1757, 1756, 1755, 1754, 1753, 1752, 1751, 1750, 1749, 1748,
1747, 1746, 1745, 1744, 1743, 1742, 1741, 1740, 1739, 1738, 1737, 1736, 1735, 1734,
1733, 1732, 1731, 1730, 1729, 1728, 1727, 1726, 1725, 1724, 1723, 1722, 1721, 1720,
1719, 1718, 1717, 1716, 1715, 1714, 1713, 1712, 1711, 1710, 1709, 1708, 1707, 1706,
1705, 1704, 1703, 1702, 1701, 1700, 1699, 1698, 1697, 1696, 1695, 1694, 1693, 1692,
1691, 1690, 1689, 1688, 1687, 1686, 1685, 1684, 1683, 1682, 1681, 1680, 1679, 1678,
1677, 1676, 1675, 1674, 1673, 1672, 1671, 1670, 1669, 1668, 1667, 1666, 1665, 1664,
1663, 1662, 1661, 1660, 1659, 1658, 1657, 1656, 1655, 1654, 1653, 1652, 1651, 1650,
1649, 1648, 1647, 1646, 1645, 1644, 1643, 1642, 1641, 1640, 1639, 1638, 1637, 1636,
1635, 1634, 1633, 1632, 1631, 1630, 1629, 1628, 1627, 1626, 1625, 1624, 1623, 1622,
1621, 1620, 1619, 1618, 1617, 1616, 1615, 1614, 1613, 1612, 1611, 1610, 1609, 1608,
1607, 1606, 1605, 1604, 1603, 1602, 1601, 1600, 1599, 1598, 1597, 1596, 1595, 1594,
1593, 1592, 1591, 1590, 1589, 1588, 1587, 1586, 1585, 1584, 1583, 1582, 1581, 1580,
1579, 1578, 1577, 1576, 1575, 1574, 1573, 1572, 1571, 1570, 1569, 1568, 1567, 1566,
1565, 1564, 1563, 1562, 1561, 1560, 1559, 1558, 1557, 1556, 1555, 1554, 1553, 1552,
1551, 1550, 1549, 1548, 1547, 1546, 1545, 1544, 1543, 1542, 1541, 1540, 1539, 1538,
1537, 1536, 1535, 1534, 1533, 1532, 1531, 1530, 1529, 1528, 1527, 1526, 1525, 1524,
1523, 1522, 1521, 1520, 1519, 1518, 1517, 1516, 1515, 1514, 1513, 1512, 1511, 1510,
1509, 1508, 1507, 1506, 1505, 1504, 1503, 1502, 1501, 1500, 1499, 1498, 1497, 1496,
1495, 1494, 1493, 1492, 1491, 1490, 1489, 1488, 1487, 1486, 1485, 1484, 1483, 1482,
1481, 1480, 1479, 1478, 1477, 1476, 1475, 1474, 1473, 1472, 1471, 1470, 1469, 1468,
1467, 1466, 1465, 1464, 1463, 1462, 1461, 1460, 1459, 1458, 1457, 1456, 1455, 1454,
1453, 1452, 1451, 1450, 1449, 1448, 1447, 1446, 1445, 1444, 1443, 1442, 1441

M = 2400, N = 4096

2048, 2047, 2046, 2044, 2040, 2032, 2304, 2400, 2368, 2045, 2016, 2043,
2042, 2303, 1984, 2039, 2038, 2399, 2302, 2031, 2036, 1920, 2030, 2300, 2015,
2028, 2041, 2014, 1792, 2024, 2396, 1983, 2037, 2012, 2296, 2367, 1982, 2035, 2008,
2392, 2029, 1536, 2288, 2034, 1980, 1919, 2366, 2000, 2027, 2301, 1918, 1976, 2013,
2026, 2384, 2023, 2364, 2272, 1024, 1916, 2011, 2299, 1791, 1968, 2022, 2397, 2010,
1912, 1981, 1790, 2020, 2007, 2298, 2360, 1952, 2033, 2295, 1979, 2006, 2240, 1788,
1904, 2395, 1999, 1978, 1535, 2004, 2025, 1917, 1975, 2294, 1998, 1784, 2394, 2352,
1888, 1534, 2287, 1974, 2391, 2021, 1915, 1996, 2292, 1967, 2009, 1776, 2365, 1972,
1914, 1532, 2286, 2019, 1992, 2390, 1966, 1911, 1856, 1789, 1023, 2176, 2005, 2018,
1951, 2271, 2383, 1760, 1528, 1910, 1964, 2284, 2363, 1787, 1022, 1977, 2388, 2003,
1903, 1950, 2297, 1908, 1997, 1960, 2270, 2382, 1786, 2002, 1520, 1902, 2362, 2280,
1948, 1973, 1728, 1783, 1020, 2336, 1995, 2359, 1887, 1533, 2239, 2293, 1900, 2268,
1782, 1971, 1944, 1994, 2380, 1913, 1504, 1016, 1886, 1965, 1991, 1775, 1970, 2358,
1531, 1896, 2393, 1664, 1780, 2238, 2017, 2291, 1936, 1990, 1855, 1963, 1884, 1909,
1774, 2264, 2351, 1530, 2285, 2376, 1008, 1949, 1472, 1759, 1962, 1988, 1527, 1854,

TABLE 2-continued 2290, 2356, 1907, 1772, 1959, 1880, 2236, 2001, 2389, 1901, 1785, 1021, 1947, 1758,
1526, 2350, 1852, 2256, 1906, 2283, 1958, 1768, 992, 1519, 1872, 2175, 1946, 1899,
2232, 1727, 1993, 1408, 1524, 1756, 1781, 1019, 1956, 1943, 1848, 2282, 2269, 2387,
2348, 1518, 1885, 1898, 1969, 2279, 1726, 2174, 1942, 2381, 1895, 1018, 1779, 1752,
1989, 2361, 1503, 960, 1840, 1935, 1015, 2386, 1516, 1883, 2224, 1773, 2267, 1894,
2335, 1940, 1724, 2278, 1961, 1778, 1663, 1529, 1280, 2344, 1987, 1502, 1934, 1882,
1853, 2172, 1744, 1014, 2379, 1892, 1771, 1512, 1879, 2266, 2237, 1824, 1662, 1720,
1986, 1007, 2357, 1957, 1471, 1905, 2276, 2334, 1932, 1500, 1525, 2263, 1757, 1851,
896, 1770, 1878, 1012, 1945, 2208, 2289, 1767, 2378, 2168, 1871, 1660, 1006, 1470,
1955, 1928, 1850, 1712, 1876, 2235, 1496, 1523, 1755, 2262, 1897, 2375, 2332, 1847,
2355, 1766, 991, 1870, 1941, 1954, 1517, 1004, 2255, 1468, 1656, 1407, 1754, 1522,
2349, 1725, 768, 1846, 2234, 2260, 1764, 1893, 1017, 1751, 2281, 1868, 2160, 1488,
990, 1939, 1696, 2374, 2354, 1839, 1515, 2328, 1777, 2231, 1881, 1933, 1000, 1406,
2254, 1464, 1844, 1723, 1648, 1750, 1938, 1891, 959, 1864, 1501, 988, 1838, 1514,
2347, 1743, 1013, 2173, 2372, 2230, 1722, 1511, 2277, 1931, 1985, 1404, 1877, 1748,
1890, 1823, 1661, 1769, 2252, 1719, 1456, 958, 1279, 1836, 1742, 2320, 1499, 2223,
1632, 2385, 984, 1930, 2144, 2346, 1510, 1011, 512, 2265, 1849, 1822, 1875, 1927,
2228, 1718, 2171, 1400, 1659, 1005, 2343, 2275, 1498, 1740, 1765, 1469, 1832, 1278,
1869, 956, 2248, 895, 1010, 1711, 1508, 1953, 1874, 1495, 2222, 1440, 1926, 1753,
1820, 2333, 1716, 1845, 976, 1658, 1600, 1521, 2170, 1763, 1867, 1736, 1003, 2274,
1276, 1710, 1655, 1467, 2261, 1392, 1494, 2342, 894, 952, 1924, 2207, 2167, 2112,
2377, 1816, 2220, 1843, 1749, 1762, 1487, 1866, 1695, 989, 1002, 1937, 1654, 1466,
1708, 2331, 1837, 1492, 1863, 1405, 999, 1513, 892, 1272, 2233, 1842, 1463, 2259,
2340, 1647, 2206, 1486, 1721, 1694, 2166, 1747, 944, 1376, 767, 1889, 1808, 1652,
987, 1862, 2216, 1704, 2253, 1835, 1741, 998, 2330, 2159, 1462, 2353, 1929, 1646,
1746, 1403, 2373, 2258, 1692, 1484, 1509, 888, 1264, 2327, 766, 1821, 1860, 1717,
986, 2204, 957, 1455, 1834, 2164, 1631, 2229, 1739, 996, 1497, 928, 983, 1831, 1460,
1402, 1644, 1873, 1344, 2251, 2158, 1688, 1480, 1507, 1925, 1454, 1009, 1399, 1715,
1819, 2326, 764, 1738, 1630, 1277, 880, 1657, 2371, 955, 1830, 982, 2200, 1709,
1735, 1248, 2227, 1640, 1493, 1506, 1439, 2345, 2250, 1714, 1818, 2319, 975, 1398,
2143, 2156, 1452, 1923, 1865, 511, 1680, 1599, 1761, 1828, 1628, 954, 2247, 1815,
2221, 1734, 980, 1275, 2324, 760, 1391, 893, 1653, 1707, 2370, 1001, 1438, 1465,
951, 1841, 1491, 2226, 1922, 974, 864, 2169, 1396, 2273, 1598, 1814, 1448, 2142,
2318, 2192, 1693, 1485, 1732, 510, 1706, 1861, 1216, 1274, 1624, 2246, 1390, 2152,
1490, 1651, 1807, 1436, 950, 2341, 1703, 2219, 891, 1745, 1271, 972, 997, 1461,
1812, 752, 1596, 1645, 1375, 943, 1833, 1691, 1483, 2111, 1650, 1859, 2140, 1806,
508, 1388, 2316, 1702, 832, 2244, 948, 890, 1270, 985, 1432, 942, 1459, 1374, 887,
968, 1401, 1482, 1616, 995, 1263, 1453, 1643, 1384, 1690, 1479, 765, 1268, 927,
1458, 1592, 1687, 886, 940, 981, 1372, 1700, 1629, 994, 1262, 1343, 1424, 1642,
1737, 1804, 1397, 1451, 1478, 879, 1858, 736, 1505, 1639, 926, 1829, 763, 1686, 953,
504, 1713, 884, 1152, 979, 1247, 1342, 1437, 1627, 936, 1260, 1817, 1368, 1450,
1584, 1679, 878, 1395, 973, 1476, 1638, 1733, 1800, 762, 1447, 924, 1827, 1684,
1389, 978, 1246, 759, 1626, 949, 1273, 1340, 1435, 1597, 1678, 863, 1394, 496, 1489,
1623, 1705, 876, 1256, 1813, 971, 1446, 1636, 1731, 1826, 704, 1921, 1360, 758,
1387, 920, 1244, 1434, 1568, 947, 1215, 862, 509, 1595, 1622, 1676, 889, 1269, 1336,
970, 1431, 1649, 751, 1730, 1811, 941, 1444, 1373, 1701, 872, 967, 1386, 1481, 1615,
756, 1805, 946, 1214, 480, 1594, 1383, 1689, 860, 1240, 507, 1430, 1620, 750, 831,
1267, 1810, 912, 1457, 1591, 1672, 885, 939, 966, 1371, 1699, 1614, 993, 1261, 1328,
1423, 1641, 1803, 1382, 1212, 1477, 506, 640, 1857, 735, 830, 1266, 925, 1428, 1590,
748, 1685, 856, 938, 503, 1370, 1698, 883, 1151, 964, 1232, 1341, 1422, 1612, 935,
1259, 1802, 1367, 1449, 1583, 877, 1380, 734, 1475, 1637, 448, 1799, 761, 828, 1208,
923, 502, 1588, 1683, 882, 1150, 977, 1245, 1312, 744, 1625, 934, 1258, 1339, 1366,
1420, 1582, 1677, 848, 1393, 495, 1474, 1608, 875, 1255, 1798, 732, 1445, 1635, 922,
1825, 703, 1682, 1359, 500, 757, 824, 1148, 919, 1243, 1338, 1433, 1567, 932, 1200,
861, 1364, 494, 1580, 1621, 1675, 874, 1254, 1335, 969, 1416, 1634, 1729, 1796, 702,
1443, 1358, 871, 728, 1385, 918, 1242, 755, 1566, 945, 1213, 384, 479, 1593, 1144,
1674, 859, 1239, 1334, 492, 1429, 1619, 749, 816, 1252, 1809, 911, 1442, 1576, 1671,
870, 700, 965, 1356, 1613, 754, 1327, 916, 1184, 478, 1564, 1381, 1211, 858, 1238,
505, 639, 1618, 720, 829, 1265, 1332, 910, 1427, 1589, 747, 1670, 855, 937, 488,
1369, 1697, 868, 1136, 963, 1231, 1326, 1421, 1611, 696, 1801, 1352, 1210, 476, 638,
1379, 733, 800, 1236, 447, 1426, 1560, 746, 827, 1207, 854, 908, 501, 1587, 1668,
881, 1149, 962, 1230, 1311, 743, 1610, 933, 1257, 1324, 1365, 1419, 1581, 847, 1378,
256, 1473, 1607, 446, 636, 1797, 731, 826, 1206, 921, 472, 1586, 688, 1681, 852,
1120, 499, 1310, 742, 823, 1147, 904, 1228, 1337, 1418, 1552, 931, 1199, 846, 1363,
493, 1579, 1606, 873, 1253, 1320, 730, 1415, 1633, 444, 1795, 701, 1204, 1357, 498,
632, 727, 822, 1146, 917, 1241, 1308, 740, 1565, 930, 1198, 383, 1362, 464, 1578,
1143, 1673, 844, 1224, 1333, 491, 1414, 1604, 815, 1251, 1794, 672, 1441, 1575, 869,
699, 726, 1355, 2165, 440, 753, 820, 1088, 915, 1183, 382, 477, 1563, 1142, 1196,
857, 1237, 1304, 490, 624, 1617, 719, 814, 1250, 1331, 909, 1412, 1574, 2110, 1669,
840, 2205, 698, 487, 1354, 2136, 867, 2218, 1135, 724, 1325, 2163, 914, 1182, 695,
1562, 1351, 1209, 380, 2215, 475, 637, 1140, 718, 799, 1235, 1330, 2157, 432, 1425,
1559, 745, 812, 1192, 853, 907, 486, 1572, 2108, 1667, 866, 2203, 1134, 961, 1229,
1296, 2162, 1609, 2257, 694, 1323, 1350, 1180, 2214, 474, 608, 1377, 255, 798, 1234,
2128, 445, 635, 1558, 716, 825, 1205, 376, 2155, 906, 471, 1585, 687, 1666, 851,
2202, 1119, 484, 1309, 741, 808, 1132, 903, 1227, 1322, 2104, 1417, 1551, 2199, 692,
845, 1348, 254, 2212, 1605, 2141, 416, 634, 1319, 729, 796, 1176, 2154, 443, 470,
1556, 2249, 686, 1203, 850, 1118, 497, 631, 712, 821, 1145, 2151, 902, 1226, 1307,
739, 1550, 2198, 929, 1197, 368, 1361, 463, 1577, 2225, 1128, 843, 1223, 1318, 252,
1413, 1603, 2139, 442, 576, 1793, 2329, 671, 1202, 2096, 468, 630, 2191, 684, 725,
792, 1116, 2150, 439, 1306, 2245, 2312, 738, 819, 1087, 900, 1168, 381, 2339, 462, TABLE 2-continued 1548, 2196, 1141, 1195, 842, 1222, 1303, 489, 623, 1602, 2138, 813, 1249, 1316, 670,
1411, 1573, 2109, 839, 2190, 697, 248, 1353, 2135, 438, 628, 2217, 2325, 723, 818,
1086, 2148, 913, 1181, 352, 2243, 2338, 680, 1561, 1112, 1194, 379, 1302, 460, 622,
1139, 717, 784, 1220, 1329, 431, 1410, 1544, 2080, 811, 1191, 838, 668, 485, 1571,
2107, 2134, 865, 2188, 1133, 722, 1295, 2161, 436, 2242, 2323, 693, 1084, 1349,
1179, 378, 2213, 473, 607, 1138, 240, 797, 1233, 1300, 2127, 430, 620, 1557, 2317,
715, 810, 1190, 375, 905, 456, 1570, 2106, 1665, 836, 2201, 1104, 483, 1294, 2132,
807, 1131, 2322, 664, 1321, 2103, 1178, 2184, 691, 606, 1347, 253, 320, 2211, 2126,
415, 633, 1080, 714, 795, 1175, 374, 2153, 428, 469, 1555, 2315, 685, 1188, 849,
1117, 482, 616, 2369, 711, 806, 1130, 901, 1225, 1292, 2102, 1549, 2197, 690, 367,
1346, 224, 2210, 1127, 414, 604, 1317, 251, 794, 1174, 2124, 441, 575, 1554, 2314,
656, 1201, 372, 2095, 467, 629, 683, 710, 791, 1115, 2149, 424, 1305, 2311, 737, 804,
1072, 899, 1167, 366, 2100, 461, 1547, 2195, 1126, 841, 1221, 1288, 250, 1601, 2137,
412, 574, 1315, 669, 1172, 2094, 466, 600, 2189, 682, 247, 790, 1114, 2120, 437, 627,
2310, 708, 817, 1085, 2147, 898, 1166, 351, 2337, 679, 1546, 2194, 1111, 1193, 364,
1301, 459, 621, 1124, 783, 1219, 1314, 192, 1409, 1543, 2079, 572, 837, 667, 246,
2092, 2133, 408, 626, 2187, 721, 788, 1056, 2146, 435, 350, 2241, 2308, 678, 1083,
1110, 1164, 377, 458, 592, 1137, 239, 782, 1218, 1299, 429, 619, 1542, 2078, 809,
1189, 360, 666, 455, 1569, 2105, 835, 2186, 1103, 244, 1293, 2131, 434, 568, 2321,
663, 1082, 2088, 1177, 348, 2183, 676, 605, 1108, 238, 319, 1298, 2125, 400, 618,
1079, 713, 780, 1160, 373, 427, 454, 1540, 2076, 1187, 834, 1102, 481, 615, 2130,
805, 1129, 662, 1291, 2101, 2182, 689, 128, 1345, 223, 318, 2209, 413, 603, 1078,
236, 793, 1173, 344, 2123, 426, 560, 1553, 2313, 655, 1186, 371, 452, 614, 709, 776,
1100, 423, 1290, 2072, 803, 1071, 660, 365, 2099, 222, 2180, 1125, 602, 1287, 249,
316, 2122, 411, 573, 1076, 654, 1171, 370, 2093, 465, 599, 681, 232, 789, 1113, 2119,
422, 612, 2309, 707, 802, 1070, 897, 1165, 336, 2098, 1545, 2193, 1096, 363, 1286,
220, 1123, 410, 544, 1313, 191, 1170, 2064, 571, 598, 652, 245, 312, 2091, 2118, 407,
625, 706, 787, 1055, 2145, 420, 349, 2307, 677, 1068, 1109, 1163, 362, 457, 591,
1122, 781, 1217, 1284, 190, 1541, 2077, 570, 359, 665, 216, 2090, 406, 596, 2185,
243, 786, 1054, 2116, 433, 567, 2306, 648, 1081, 2087, 1162, 347, 675, 590, 1107,
237, 304, 1297, 399, 617, 1064, 779, 1159, 358, 188, 453, 1539, 2075, 833, 1101, 242,
2129, 404, 566, 661, 1052, 2086, 346, 2181, 674, 127, 1106, 208, 317, 398, 588, 1077,
235, 778, 1158, 343, 425, 559, 1538, 2074, 1185, 356, 451, 613, 775, 1099, 184, 1289,
2071, 564, 659, 126, 2084, 221, 288, 2179, 601, 1048, 234, 315, 342, 2121, 396, 558,
1075, 653, 1156, 369, 450, 584, 231, 774, 1098, 421, 611, 2070, 801, 1069, 658, 335,
2097, 2178, 1095, 124, 1285, 219, 314, 409, 543, 1074, 176, 1169, 340, 2063, 556,
597, 651, 230, 311, 2117, 392, 610, 705, 772, 1040, 419, 334, 2068, 1067, 1094, 361,
218, 1121, 542, 1283, 189, 2062, 569, 120, 650, 215, 310, 2089, 405, 595, 228, 785,
1053, 2115, 418, 552, 2305, 647, 1066, 1161, 332, 589, 1092, 303, 1282, 160, 1063,
540, 357, 187, 214, 2060, 594, 241, 308, 2114, 403, 565, 646, 1051, 2085, 345, 673,
112, 1105, 207, 302, 397, 587, 1062, 777, 1157, 328, 186, 1537, 2073, 355, 212, 402,
536, 183, 1050, 2056, 563, 644, 125, 2083, 206, 287, 586, 1047, 233, 300, 341, 395,
557, 1060, 1155, 354, 449, 583, 773, 1097, 182, 2069, 562, 657, 96, 2082, 286, 2177,
123, 1046, 204, 313, 394, 528, 1073, 175, 1154, 339, 555, 582, 229, 296, 391, 609,
771, 1039, 180, 333, 2067, 1093, 122, 217, 284, 541, 1044, 174, 338, 2061, 554, 119,
649, 200, 309, 390, 580, 227, 770, 1038, 417, 551, 2066, 1065, 331, 1091, 64, 1281,
159, 539, 118, 172, 213, 280, 2059, 593, 226, 307, 2113, 388, 550, 645, 1036, 330,
111, 1090, 301, 158, 1061, 538, 327, 185, 2058, 116, 211, 306, 401, 535, 168, 1049,
2055, 548, 643, 110, 205, 272, 585, 1032, 299, 326, 156, 1059, 353, 210, 534, 181,
2054, 561, 642, 95, 2081, 285, 108, 1045, 203, 298, 393, 527, 1058, 1153, 324, 581,
295, 152, 532, 179, 94, 2052, 121, 202, 283, 526, 1043, 173, 337, 553, 104, 199, 294,
389, 579, 769, 1037, 178, 2065, 92, 282, 63, 1042, 144, 524, 117, 171, 198, 279, 578,
225, 292, 387, 549, 1035, 329, 1089, 62, 157, 537, 88, 170, 278, 2057, 115, 196, 305,
386, 520, 167, 1034, 547, 109, 271, 1031, 60, 325, 155, 114, 209, 276, 533, 166, 2053,
546, 641, 80, 270, 107, 1030, 297, 154, 1057, 323, 56, 151, 531, 164, 93, 2051, 106,
201, 268, 525, 1028, 322, 103, 293, 150, 530, 177, 2050, 91, 281, 48, 1041, 143, 523,
102, 197, 264, 577, 291, 148, 90, 61, 142, 522, 87, 169, 277, 100, 195, 290, 385, 519,
1033, 32, 59, 86, 140, 113, 194, 275, 518, 165, 545, 79, 269, 1029, 58, 153, 84, 274,
55, 136, 516, 163, 78, 105, 267, 1027, 321, 54, 149, 529, 162, 2049, 76, 266, 47, 1026,
101, 263, 52, 147, 89, 46, 141, 521, 72, 262, 99, 289, 146, 31, 44, 85, 139, 98, 193,
260, 517, 30, 57, 138, 83, 273, 40, 135, 515, 77, 28, 82, 53, 134, 514, 161, 75, 265,
1025, 24, 51, 132, 74, 45, 71, 261, 50, 145, 16, 43, 70, 97, 259, 29, 42, 137, 68, 258,
39, 27, 81, 38, 133, 513, 26, 23, 36, 131, 73, 22, 49, 130, 15, 69, 20, 14, 41, 67, 257,
12, 66, 37, 25, 8, 35, 21, 34, 129, 19, 13, 18, 11, 65, 10, 7, 6, 33, 4, 17, 9, 5, 3, 2, 1,
4096, 4095, 4094, 4093, 4092, 4091, 4090, 4089, 4088, 4087, 4086, 4085, 4084, 4083,
4082, 4081, 4080, 4079, 4078, 4077, 4076, 4075, 4074, 4073, 4072, 4071, 4070, 4069,
4068, 4067, 4066, 4065, 4064, 4063, 4062, 4061, 4060, 4059, 4058, 4057, 4056, 4055,
4054, 4053, 4052, 4051, 4050, 4049, 4048, 4047, 4046, 4045, 4044, 4043, 4042, 4041,
4040, 4039, 4038, 4037, 4036, 4035, 4034, 4033, 4032, 4031, 4030, 4029, 4028, 4027,
4026, 4025, 4024, 4023, 4022, 4021, 4020, 4019, 4018, 4017, 4016, 4015, 4014, 4013,
4012, 4011, 4010, 4009, 4008, 4007, 4006, 4005, 4004, 4003, 4002, 4001, 4000, 3999,
3998, 3997, 3996, 3995, 3994, 3993, 3992, 3991, 3990, 3989, 3988, 3987, 3986, 3985,
3984, 3983, 3982, 3981, 3980, 3979, 3978, 3977, 3976, 3975, 3974, 3973, 3972, 3971,
3970, 3969, 3968, 3967, 3966, 3965, 3964, 3963, 3962, 3961, 3960, 3959, 3958, 3957,
3956, 3955, 3954, 3953, 3952, 3951, 3950, 3949, 3948, 3947, 3946, 3945, 3944, 3943,
3942, 3941, 3940, 3939, 3938, 3937, 3936, 3935, 3934, 3933, 3932, 3931, 3930, 3929,
3928, 3927, 3926, 3925, 3924, 3923, 3922, 3921, 3920, 3919, 3918, 3917, 3916, 3915,
3914, 3913, 3912, 3911, 3910, 3909, 3908, 3907, 3906, 3905, 3904, 3903, 3902, 3901,
3900, 3899, 3898, 3897, 3896, 3895, 3894, 3893, 3892, 3891, 3890, 3889, 3888, 3887,
3886, 3885, 3884, 3883, 3882, 3881, 3880, 3879, 3878, 3877, 3876, 3875, 3874, 3873, TABLE 2-continued 3872, 3871, 3870, 3869, 3868, 3867, 3866, 3865, 3864, 3863, 3862, 3861, 3860, 3859, 3858, 3857, 3856, 3855, 3854, 3853, 3852, 3851, 3850, 3849, 3848, 3847, 3846, 3845, 3844, 3843, 3842, 3841, 3840, 3839, 3838, 3837, 3836, 3835, 3834, 3833, 3832, 3831, 3830, 3829, 3828, 3827, 3826, 3825, 3824, 3823, 3822, 3821, 3820, 3819, 3818, 3817, 3816, 3815, 3814, 3813, 3812, 3811, 3810, 3809, 3808, 3807, 3806, 3805, 3804, 3803, 3802, 3801, 3800, 3799, 3798, 3797, 3796, 3795, 3794, 3793, 3792, 3791, 3790, 3789, 3788, 3787, 3786, 3785, 3784, 3783, 3782, 3781, 3780, 3779, 3778, 3777, 3776, 3775, 3774, 3773, 3772, 3771, 3770, 3769, 3768, 3767, 3766, 3765, 3764, 3763, 3762, 3761, 3760, 3759, 3758, 3757, 3756, 3755, 3754, 3753, 3752, 3751, 3750, 3749, 3748, 3747, 3746, 3745, 3744, 3743, 3742, 3741, 3740, 3739, 3738, 3737, 3736, 3735, 3734, 3733, 3732, 3731, 3730, 3729, 3728, 3727, 3726, 3725, 3724, 3723, 3722, 3721, 3720, 3719, 3718, 3717, 3716, 3715, 3714, 3713, 3712, 3711, 3710, 3709, 3708, 3707, 3706, 3705, 3704, 3703, 3702, 3701, 3700, 3699, 3698, 3697, 3696, 3695, 3694, 3693, 3692, 3691, 3690, 3689, 3688, 3687, 3686, 3685, 3684, 3683, 3682, 3681, 3680, 3679, 3678, 3677, 3676, 3675, 3674, 3673, 3672, 3671, 3670, 3669, 3668, 3667, 3666, 3665, 3664, 3663, 3662, 3661, 3660, 3659, 3658, 3657, 3656, 3655, 3654, 3653, 3652, 3651, 3650, 3649, 3648, 3647, 3646, 3645, 3644, 3643, 3642, 3641, 3640, 3639, 3638, 3637, 3636, 3635, 3634, 3633, 3632, 3631, 3630, 3629, 3628, 3627, 3626, 3625, 3624, 3623, 3622, 3621, 3620, 3619, 3618, 3617, 3616, 3615, 3614, 3613, 3612, 3611, 3610, 3609, 3608, 3607, 3606, 3605, 3604, 3603, 3602, 3601, 3600, 3599, 3598, 3597, 3596, 3595, 3594, 3593, 3592, 3591, 3590, 3589, 3588, 3587, 3586, 3585, 3584, 3583, 3582, 3581, 3580, 3579, 3578, 3577, 3576, 3575, 3574, 3573, 3572, 3571, 3570, 3569, 3568, 3567, 3566, 3565, 3564, 3563, 3562, 3561, 3560, 3559, 3558, 3557, 3556, 3555, 3554, 3553, 3552, 3551, 3550, 3549, 3548, 3547, 3546, 3545, 3544, 3543, 3542, 3541, 3540, 3539, 3538, 3537, 3536, 3535, 3534, 3533, 3532, 3531, 3530, 3529, 3528, 3527, 3526, 3525, 3524, 3523, 3522, 3521, 3520, 3519, 3518, 3517, 3516, 3515, 3514, 3513, 3512, 3511, 3510, 3509, 3508, 3507, 3506, 3505, 3504, 3503, 3502, 3501, 3500, 3499, 3498, 3497, 3496, 3495, 3494, 3493, 3492, 3491, 3490, 3489, 3488, 3487, 3486, 3485, 3484, 3483, 3482, 3481, 3480, 3479, 3478, 3477, 3476, 3475, 3474, 3473, 3472, 3471, 3470, 3469, 3468, 3467, 3466, 3465, 3464, 3463, 3462, 3461, 3460, 3459, 3458, 3457, 3456, 3455, 3454, 3453, 3452, 3451, 3450, 3449, 3448, 3447, 3446, 3445, 3444, 3443, 3442, 3441, 3440, 3439, 3438, 3437, 3436, 3435, 3434, 3433, 3432, 3431, 3430, 3429, 3428, 3427, 3426, 3425, 3424, 3423, 3422, 3421, 3420, 3419, 3418, 3417, 3416, 3415, 3414, 3413, 3412, 3411, 3410, 3409, 3408, 3407, 3406, 3405, 3404, 3403, 3402, 3401, 3400, 3399, 3398, 3397, 3396, 3395, 3394, 3393, 3392, 3391, 3390, 3389, 3388, 3387, 3386, 3385, 3384, 3383, 3382, 3381, 3380, 3379, 3378, 3377, 3376, 3375, 3374, 3373, 3372, 3371, 3370, 3369, 3368, 3367, 3366, 3365, 3364, 3363, 3362, 3361, 3360, 3359, 3358, 3357, 3356, 3355, 3354, 3353, 3352, 3351, 3350, 3349, 3348, 3347, 3346, 3345, 3344, 3343, 3342, 3341, 3340, 3339, 3338, 3337, 3336, 3335, 3334, 3333, 3332, 3331, 3330, 3329, 3328, 3327, 3326, 3325, 3324, 3323, 3322, 3321, 3320, 3319, 3318, 3317, 3316, 3315, 3314, 3313, 3312, 3311, 3310, 3309, 3308, 3307, 3306, 3305, 3304, 3303, 3302, 3301, 3300, 3299, 3298, 3297, 3296, 3295, 3294, 3293, 3292, 3291, 3290, 3289, 3288, 3287, 3286, 3285, 3284, 3283, 3282, 3281, 3280, 3279, 3278, 3277, 3276, 3275, 3274, 3273, 3272, 3271, 3270, 3269, 3268, 3267, 3266, 3265, 3264, 3263, 3262, 3261, 3260, 3259, 3258, 3257, 3256, 3255, 3254, 3253, 3252, 3251, 3250, 3249, 3248, 3247, 3246, 3245, 3244, 3243, 3242, 3241, 3240, 3239, 3238, 3237, 3236, 3235, 3234, 3233, 3232, 3231, 3230, 3229, 3228, 3227, 3226, 3225, 3224, 3223, 3222, 3221, 3220, 3219, 3218, 3217, 3216, 3215, 3214, 3213, 3212, 3211, 3210, 3209, 3208, 3207, 3206, 3205, 3204, 3203, 3202, 3201, 3200, 3199, 3198, 3197, 3196, 3195, 3194, 3193, 3192, 3191, 3190, 3189, 3188, 3187, 3186, 3185, 3184, 3183, 3182, 3181, 3180, 3179, 3178, 3177, 3176, 3175, 3174, 3173, 3172, 3171, 3170, 3169, 3168, 3167, 3166, 3165, 3164, 3163, 3162, 3161, 3160, 3159, 3158, 3157, 3156, 3155, 3154, 3153, 3152, 3151, 3150, 3149, 3148, 3147, 3146, 3145, 3144, 3143, 3142, 3141, 3140, 3139, 3138, 3137, 3136, 3135, 3134, 3133, 3132, 3131, 3130, 3129, 3128, 3127, 3126, 3125, 3124, 3123, 3122, 3121, 3120, 3119, 3118, 3117, 3116, 3115, 3114, 3113, 3112, 3111, 3110, 3109, 3108, 3107, 3106, 3105, 3104, 3103, 3102, 3101, 3100, 3099, 3098, 3097, 3096, 3095, 3094, 3093, 3092, 3091, 3090, 3089, 3088, 3087, 3086, 3085, 3084, 3083, 3082, 3081, 3080, 3079, 3078, 3077, 3076, 3075, 3074, 3073, 3072, 3071, 3070, 3069, 3068, 3067, 3066, 3065, 3064, 3063, 3062, 3061, 3060, 3059, 3058, 3057, 3056, 3055, 3054, 3053, 3052, 3051, 3050, 3049, 3048, 3047, 3046, 3045, 3044, 3043, 3042, 3041, 3040, 3039, 3038, 3037, 3036, 3035, 3034, 3033, 3032, 3031, 3030, 3029, 3028, 3027, 3026, 3025, 3024, 3023, 3022, 3021, 3020, 3019, 3018, 3017, 3016, 3015, 3014, 3013, 3012, 3011, 3010, 3009, 3008, 3007, 3006, 3005, 3004, 3003, 3002, 3001, 3000, 2999, 2998, 2997, 2996, 2995, 2994, 2993, 2992, 2991, 2990, 2989, 2988, 2987, 2986, 2985, 2984, 2983, 2982, 2981, 2980, 2979, 2978, 2977, 2976, 2975, 2974, 2973, 2972, 2971, 2970, 2969, 2968, 2967, 2966, 2965, 2964, 2963, 2962, 2961, 2960, 2959, 2958, 2957, 2956, 2955, 2954, 2953, 2952, 2951, 2950, 2949, 2948, 2947, 2946, 2945, 2944, 2943, 2942, 2941, 2940, 2939, 2938, 2937, 2936, 2935, 2934, 2933, 2932, 2931, 2930, 2929, 2928, 2927, 2926, 2925, 2924, 2923, 2922, 2921, 2920, 2919, 2918, 2917, 2916, 2915, 2914, 2913, 2912, 2911, 2910, 2909, 2908, 2907, 2906, 2905, 2904, 2903, 2902, 2901, 2900, 2899, 2898, 2897, 2896, 2895, 2894, 2893, 2892, 2891, 2890, 2889, 2888, 2887, 2886, 2885, 2884, 2883, 2882, 2881, 2880, 2879, 2878, 2877, 2876, 2875, 2874, 2873, 2872, 2871, 2870, 2869, 2868, 2867, 2866, 2865, 2864, 2863, 2862, 2861, 2860, 2859, 2858, 2857, 2856, 2855, 2854, 2853, 2852, 2851, 2850, 2849, 2848, 2847, 2846, 2845, 2844, 2843, 2842, 2841, 2840, 2839, 2838, 2837, 2836, 2835, 2834, 2833, 2832, 2831, 2830, 2829, 2828, 2827, 2826, 2825, 2824, 2823, 2822, 2821, 2820, 2819, 2818, 2817, 2816, 2815, 2814, 2813, 2812, 2811, 2810, 2809, 2808, 2807, 2806, 2805, 2804, 2803, 2802, 2801, 2800, 2799, 2798, 2797, 2796, 2795, 2794, 2793, 2792, 2791, 2790, 2789, 2788, 2787, 2786, 2785, 2784, 2783, 2782, 2781, 2780, 2779, 2778, 2777, 2776, 2775, 2774, 2773, 2772, 2771, 2770, 2769, 2768, 2767, 2766, 2765, 2764, 2763, 2762, 2761, 2760, 2759, 2758, 2757, 2756, 2755, 2754, 2753, TABLE 2-continued 2752, 2751, 2750, 2749, 2748, 2747, 2746, 2745, 2744, 2743, 2742, 2741, 2740, 2739,
2738, 2737, 2736, 2735, 2734, 2733, 2732, 2731, 2730, 2729, 2728, 2727, 2726, 2725,
2724, 2723, 2722, 2721, 2720, 2719, 2718, 2717, 2716, 2715, 2714, 2713, 2712, 2711,
2710, 2709, 2708, 2707, 2706, 2705, 2704, 2703, 2702, 2701, 2700, 2699, 2698, 2697,
2696, 2695, 2694, 2693, 2692, 2691, 2690, 2689, 2688, 2687, 2686, 2685, 2684, 2683,
2682, 2681, 2680, 2679, 2678, 2677, 2676, 2675, 2674, 2673, 2672, 2671, 2670, 2669,
2668, 2667, 2666, 2665, 2664, 2663, 2662, 2661, 2660, 2659, 2658, 2657, 2656, 2655,
2654, 2653, 2652, 2651, 2650, 2649, 2648, 2647, 2646, 2645, 2644, 2643, 2642, 2641,
2640, 2639, 2638, 2637, 2636, 2635, 2634, 2633, 2632, 2631, 2630, 2629, 2628, 2627,
2626, 2625, 2624, 2623, 2622, 2621, 2620, 2619, 2618, 2617, 2616, 2615, 2614, 2613,
2612, 2611, 2610, 2609, 2608, 2607, 2606, 2605, 2604, 2603, 2602, 2601, 2600, 2599,
2598, 2597, 2596, 2595, 2594, 2593, 2592, 2591, 2590, 2589, 2588, 2587, 2586, 2585,
2584, 2583, 2582, 2581, 2580, 2579, 2578, 2577, 2576, 2575, 2574, 2573, 2572, 2571,
2570, 2569, 2568, 2567, 2566, 2565, 2564, 2563, 2562, 2561, 2560, 2559, 2558, 2557,
2556, 2555, 2554, 2553, 2552, 2551, 2550, 2549, 2548, 2547, 2546, 2545, 2544, 2543,
2542, 2541, 2540, 2539, 2538, 2537, 2536, 2535, 2534, 2533, 2532, 2531, 2530, 2529,
2528, 2527, 2526, 2525, 2524, 2523, 2522, 2521, 2520, 2519, 2518, 2517, 2516, 2515,
2514, 2513, 2512, 2511, 2510, 2509, 2508, 2507, 2506, 2505, 2504, 2503, 2502, 2501,
2500, 2499, 2498, 2497, 2496, 2495, 2494, 2493, 2492, 2491, 2490, 2489, 2488, 2487,
2486, 2485, 2484, 2483, 2482, 2481, 2480, 2479, 2478, 2477, 2476, 2475, 2474, 2473,
2472, 2471, 2470, 2469, 2468, 2467, 2466, 2465, 2464, 2463, 2462, 2461, 2460, 2459,
2458, 2457, 2456, 2455, 2454, 2453, 2452, 2451, 2450, 2449, 2448, 2447, 2446, 2445,
2444, 2443, 2442, 2441, 2440, 2439, 2438, 2437, 2436, 2435, 2434, 2433, 2432, 2431,
2430, 2429, 2428, 2427, 2426, 2425, 2424, 2423, 2422, 2421, 2420, 2419, 2418, 2417,
2416, 2415, 2414, 2413, 2412, 2411, 2410, 2409, 2408, 2407, 2406, 2405, 2404, 2403,
2402, 2401

TABLE 3

M = 48, N = 64
48, 32, 47, 46, 31, 44, 30, 40, 28, 45, 24, 43, 42, 39, 29, 16, 38, 27, 36, 26,
23, 22, 41, 20, 15, 37, 14, 25, 35, 12, 34, 21, 8, 19, 18, 13, 11, 10, 7, 33, 6, 4, 17, 9, 5,
3, 2, 1, 64, 63, 62, 61, 60, 59, 58, 57, 56, 55, 54, 53, 52, 51, 50, 49
M = 72, N = 128
64, 63, 62, 60, 56, 48, 61, 72, 71, 32, 59, 70, 58, 55, 68, 54, 47, 52, 46, 31,
44, 57, 30, 40, 53, 28, 69, 51, 24, 45, 67, 50, 43, 16, 66, 29, 42, 39, 27, 38, 26, 36, 23,
49, 22, 15, 20, 41, 14, 65, 37, 12, 25, 35, 8, 21, 34, 19, 13, 18, 11, 10, 7, 33, 6, 4, 17, 9,
5, 3, 2, 1, 128, 127, 126, 125, 124, 123, 122, 121, 120, 119, 118, 117, 116, 115, 114,
113, 112, 111, 110, 109, 108, 107, 106, 105, 104, 103, 102, 101, 100, 99, 98, 97, 96,
95, 94, 93, 92, 91, 90, 89, 88, 87, 86, 85, 84, 83, 82, 81, 80, 79, 78, 77, 76, 75, 74, 73
M = 96, N = 128
96, 64, 95, 94, 92, 63, 62, 88, 80, 60, 93, 56, 91, 90, 48, 87, 61, 86, 79, 59,
84, 78, 58, 32, 55, 76, 54, 89, 47, 72, 52, 85, 46, 83, 44, 77, 57, 82, 31, 40, 75, 53, 30,
74, 51, 71, 28, 45, 50, 70, 24, 43, 68, 42, 16, 81, 39, 29, 38, 27, 73, 36, 26, 23, 49, 69,
22, 67, 41, 15, 20, 14, 66, 37, 12, 35, 25, 8, 34, 21, 19, 13, 18, 65, 11, 10, 7, 33, 6, 4,
17, 9, 5, 3, 2, 1, 128, 127, 126, 125, 124, 123, 122, 121, 120, 119, 118, 117, 116, 115,
114, 113, 112, 111, 110, 109, 108, 107, 106, 105, 104, 103, 102, 101, 100, 99, 98, 97
M = 120, N = 128
120, 112, 96, 119, 64, 118, 111, 116, 110, 108, 95, 94, 117, 104, 92, 115,
63, 109, 114, 62, 88, 107, 60, 106, 80, 93, 103, 56, 91, 102, 90, 48, 61, 100, 87, 113,
86, 59, 32, 79, 58, 84, 105, 55, 78, 54, 101, 76, 89, 47, 52, 99, 46, 72, 85, 98, 31, 44,
83, 57, 30, 77, 82, 40, 53, 28, 75, 51, 74, 24, 45, 71, 50, 70, 43, 16, 97, 42, 29, 68, 39,
27, 81, 38, 26, 23, 36, 73, 22, 49, 69, 15, 20, 41, 14, 67, 12, 37, 66, 25, 35, 8, 21, 34,
19, 13, 18, 11, 65, 10, 7, 6, 33, 4, 17, 9, 5, 3, 2, 1, 128, 127, 126, 125, 124, 123, 122,
121
M = 144, N = 256
128, 127, 126, 124, 120, 112, 125, 144, 143, 96, 123, 142, 122, 119, 64,
140, 118, 111, 116, 136, 110, 95, 108, 121, 94, 104, 63, 117, 92, 141, 62, 115, 88, 109,
139, 114, 60, 107, 80, 138, 56, 93, 106, 135, 103, 91, 134, 48, 102, 90, 61, 100, 87,
132, 113, 32, 86, 59, 79, 58, 84, 105, 55, 78, 137, 54, 101, 76, 47, 89, 52, 99, 72, 46,
133, 85, 98, 31, 44, 57, 83, 30, 131, 77, 40, 82, 53, 28, 130, 75, 51, 24, 74, 71, 45, 50,
97, 70, 16, 43, 68, 29, 42, 81, 39, 27, 38, 26, 73, 36, 23, 49, 129, 22, 69, 15, 20, 41, 67,
14, 66, 12, 37, 25, 8, 35, 34, 21, 19, 13, 18, 11, 65, 10, 7, 6, 33, 4, 17, 9, 5, 3, 2, 1, 256,
255, 254, 253, 252, 251, 250, 249, 248, 247, 246, 245, 244, 243, 242, 241, 240, 239,
238, 237, 236, 235, 234, 233, 232, 231, 230, 229, 228, 227, 226, 225, 224, 223, 222,
221, 220, 219, 218, 217, 216, 215, 214, 213, 212, 211, 210, 209, 208, 207, 206, 205,
204, 203, 202, 201, 200, 199, 198, 197, 196, 195, 194, 193, 192, 191, 190, 189, 188,
187, 186, 185, 184, 183, 182, 181, 180, 179, 178, 177, 176, 175, 174, 173, 172, 171,
170, 169, 168, 167, 166, 165, 164, 163, 162, 161, 160, 159, 158, 157, 156, 155, 154,
153, 152, 151, 150, 149, 148, 147, 146, 145
M = 160, N = 256
128, 127, 126, 124, 120, 160, 159, 158, 156, 112, 125, 152, 96, 123, 144,
122, 119, 157, 64, 118, 155, 111, 116, 154, 110, 151, 95, 108, 121, 150, 94, 104, 143,
117, 148, 92, 63, 142, 115, 62, 109, 88, 140, 114, 153, 60, 107, 80, 136, 106, 93, 56,
149, 103, 91, 102, 48, 147, 90, 141, 100, 61, 87, 146, 113, 86, 139, 59, 32, 79, 105, 84,
58, 138, 55, 78, 135, 101, 54, 76, 134, 47, 89, 99, 52, 72, 46, 132, 98, 85, 145, 44, 31,
83, 57, 77, 30, 40, 82, 137, 53, 75, 28, 51, 74, 133, 24, 71, 45, 50, 97, 70, 131, 43, 16,

TABLE 3-continued 68, 42, 130, 29, 39, 81, 27, 38, 73, 26, 36, 23, 49, 69, 22, 15, 41, 20, 67, 14, 66, 37,
129, 12, 25, 35, 8, 34, 21, 19, 13, 18, 11, 65, 10, 7, 6, 33, 4, 17, 9, 5, 3, 2, 1, 256, 255,
254, 253, 252, 251, 250, 249, 248, 247, 246, 245, 244, 243, 242, 241, 240, 239, 238,
237, 236, 235, 234, 233, 232, 231, 230, 229, 228, 227, 226, 225, 224, 223, 222, 221,
220, 219, 218, 217, 216, 215, 214, 213, 212, 211, 210, 209, 208, 207, 206, 205, 204,
203, 202, 201, 200, 199, 198, 197, 196, 195, 194, 193, 192, 191, 190, 189, 188, 187,
186, 185, 184, 183, 182, 181, 180, 179, 178, 177, 176, 175, 174, 173, 172, 171, 170,
169, 168, 167, 166, 165, 164, 163, 162, 161

$M = 180, N = 256$ 128, 127, 126, 124, 176, 160, 175, 180, 174, 120, 179, 172, 159, 112, 125,
178, 158, 168, 96, 123, 156, 122, 119, 173, 152, 118, 64, 171, 111, 116, 110, 170, 157,
144, 167, 95, 108, 121, 177, 166, 155, 94, 104, 117, 154, 92, 164, 151, 63, 115, 88,
150, 109, 114, 62, 169, 143, 107, 148, 80, 60, 93, 106, 142, 165, 103, 56, 91, 140, 102,
153, 163, 90, 48, 87, 100, 136, 149, 162, 61, 113, 86, 32, 79, 59, 147, 84, 105, 141, 78,
58, 146, 55, 101, 76, 139, 54, 89, 99, 47, 138, 72, 52, 135, 85, 98, 46, 161, 134, 31, 83,
44, 77, 57, 30, 82, 132, 40, 145, 75, 53, 28, 74, 51, 71, 24, 45, 137, 50, 70, 97, 43, 16,
133, 68, 29, 42, 81, 39, 131, 27, 38, 73, 26, 130, 23, 36, 49, 69, 22, 15, 67, 20, 41, 14,
66, 37, 12, 25, 35, 8, 21, 129, 34, 19, 13, 18, 11, 65, 10, 7, 6, 33, 4, 17, 9, 5, 3, 2, 1,
256, 255, 254, 253, 252, 251, 250, 249, 248, 247, 246, 245, 244, 243, 242, 241, 240,
239, 238, 237, 236, 235, 234, 233, 232, 231, 230, 229, 228, 227, 226, 225, 224, 223,
222, 221, 220, 219, 218, 217, 216, 215, 214, 213, 212, 211, 210, 209, 208, 207, 206,
205, 204, 203, 202, 201, 200, 199, 198, 197, 196, 195, 194, 193, 192, 191, 190, 189,
188, 187, 186, 185, 184, 183, 182, 181

$M = 192, N = 256$ 192, 128, 191, 190, 188, 127, 184, 126, 176, 124, 189, 160, 187, 120, 186,
183, 112, 182, 125, 175, 96, 180, 123, 174, 122, 159, 119, 172, 185, 158, 118, 168,
111, 181, 156, 116, 64, 110, 179, 152, 173, 95, 108, 178, 121, 171, 94, 144, 104, 157,
170, 117, 92, 167, 155, 115, 166, 88, 109, 63, 154, 114, 151, 164, 62, 107, 80, 177,
150, 93, 106, 60, 143, 103, 148, 169, 91, 142, 102, 56, 90, 165, 87, 140, 100, 48, 153,
113, 86, 61, 163, 136, 79, 149, 32, 84, 59, 162, 105, 78, 58, 147, 55, 101, 141, 76, 146,
89, 54, 99, 139, 72, 47, 85, 52, 98, 138, 46, 135, 83, 31, 44, 77, 134, 57, 82, 161, 30,
75, 40, 132, 53, 28, 74, 145, 71, 51, 24, 45, 70, 50, 97, 137, 43, 16, 68, 29, 42, 133, 81,
39, 27, 38, 131, 73, 26, 23, 36, 130, 69, 49, 22, 15, 67, 20, 41, 14, 66, 37, 12, 25, 35, 8,
21, 34, 129, 19, 13, 18, 65, 11, 10, 7, 6, 33, 4, 17, 9, 5, 3, 2, 1, 256, 255, 254, 253, 252,
251, 250, 249, 248, 247, 246, 245, 244, 243, 242, 241, 240, 239, 238, 237, 236, 235,
234, 233, 232, 231, 230, 229, 228, 227, 226, 225, 224, 223, 222, 221, 220, 219, 218,
217, 216, 215, 214, 213, 212, 211, 210, 209, 208, 207, 206, 205, 204, 203, 202, 201,
200, 199, 198, 197, 196, 195, 194, 193

$M = 240, N = 256$ 240, 224, 192, 239, 238, 128, 223, 236, 232, 222, 220, 191, 237, 216, 190,
235, 188, 234, 127, 231, 221, 208, 184, 230, 126, 219, 218, 228, 124, 215, 176, 189,
214, 120, 187, 212, 233, 160, 207, 186, 183, 112, 206, 125, 229, 182, 204, 217, 123,
227, 180, 175, 96, 122, 226, 200, 213, 174, 119, 211, 118, 159, 172, 64, 185, 158, 210,
205, 111, 116, 168, 181, 110, 203, 156, 179, 202, 95, 108, 152, 199, 173, 178, 121, 94,
198, 104, 171, 225, 117, 92, 144, 63, 170, 157, 196, 115, 167, 62, 88, 209, 109, 155,
166, 114, 60, 154, 107, 151, 164, 80, 201, 106, 93, 56, 150, 103, 177, 197, 91, 143,
102, 148, 169, 48, 90, 142, 195, 87, 100, 61, 165, 140, 86, 194, 113, 59, 32, 153, 79,
163, 58, 84, 136, 55, 78, 105, 149, 162, 54, 76, 101, 147, 47, 52, 89, 141, 99, 146, 46,
72, 139, 85, 98, 31, 44, 138, 83, 57, 30, 135, 77, 193, 40, 82, 53, 134, 28, 75, 161, 51,
74, 132, 24, 45, 71, 50, 145, 70, 43, 16, 97, 42, 29, 68, 39, 137, 27, 38, 81, 133, 26, 23,
36, 73, 131, 22, 49, 69, 130, 15, 20, 41, 14, 67, 12, 66, 37, 25, 8, 35, 21, 34, 129, 19,
13, 18, 11, 65, 10, 7, 6, 33, 4, 17, 9, 5, 3, 2, 1, 256, 255, 254, 253, 252, 251, 250, 249,
248, 247, 246, 245, 244, 243, 242, 241

$M = 288, N = 512$ 256, 255, 254, 252, 248, 240, 253, 288, 287, 224, 251, 286, 250, 247, 192,
284, 246, 239, 244, 128, 280, 238, 223, 236, 249, 272, 222, 232, 191, 245, 220, 285,
190, 243, 216, 237, 283, 242, 188, 127, 208, 235, 282, 126, 184, 279, 221, 234, 231,
124, 278, 219, 176, 230, 271, 218, 120, 189, 228, 215, 276, 241, 160, 187, 214, 270,
112, 207, 186, 212, 233, 125, 183, 206, 268, 96, 281, 182, 229, 123, 204, 175, 217,
264, 180, 227, 122, 200, 174, 119, 64, 277, 213, 226, 159, 172, 118, 185, 211, 111,
275, 158, 205, 116, 168, 269, 210, 110, 181, 156, 274, 203, 95, 108, 267, 179, 152,
202, 121, 94, 173, 199, 178, 104, 266, 225, 198, 144, 63, 171, 92, 117, 263, 196, 170,
157, 62, 115, 88, 167, 209, 262, 109, 155, 60, 114, 166, 80, 260, 107, 154, 201, 164,
151, 56, 273, 106, 93, 177, 103, 150, 197, 48, 143, 91, 102, 148, 169, 195, 142, 265,
90, 61, 100, 87, 194, 32, 165, 113, 140, 59, 86, 153, 261, 79, 163, 136, 58, 84, 105, 55,
78, 162, 149, 259, 54, 101, 76, 147, 47, 258, 89, 141, 52, 146, 99, 72, 46, 193, 139, 98,
85, 31, 44, 138, 30, 57, 135, 83, 40, 77, 161, 82, 134, 28, 53, 75, 132, 24, 51, 74, 145,
71, 45, 16, 50, 97, 257, 70, 43, 137, 68, 29, 42, 39, 27, 81, 38, 133, 26, 23, 36, 131, 73,
22, 49, 130, 15, 69, 20, 14, 41, 67, 12, 66, 37, 25, 8, 35, 21, 34, 129, 19, 13, 18, 11, 65,
10, 7, 6, 33, 4, 17, 9, 5, 3, 2, 1, 512, 511, 510, 509, 508, 507, 506, 505, 504, 503, 502,
501, 500, 499, 498, 497, 496, 495, 494, 493, 492, 491, 490, 489, 488, 487, 486, 485,
484, 483, 482, 481, 480, 479, 478, 477, 476, 475, 474, 473, 472, 471, 470, 469, 468,
467, 466, 465, 464, 463, 462, 461, 460, 459, 458, 457, 456, 455, 454, 453, 452, 451,
450, 449, 448, 447, 446, 445, 444, 443, 442, 441, 440, 439, 438, 437, 436, 435, 434,
433, 432, 431, 430, 429, 428, 427, 426, 425, 424, 423, 422, 421, 420, 419, 418, 417,
416, 415, 414, 413, 412, 411, 410, 409, 408, 407, 406, 405, 404, 403, 402, 401, 400,
399, 398, 397, 396, 395, 394, 393, 392, 391, 390, 389, 388, 387, 386, 385, 384, 383,
382, 381, 380, 379, 378, 377, 376, 375, 374, 373, 372, 371, 370, 369, 368, 367, 366,
365, 364, 363, 362, 361, 360, 359, 358, 357, 356, 355, 354, 353, 352, 351, 350, 349,
348, 347, 346, 345, 344, 343, 342, 341, 340, 339, 338, 337, 336, 335, 334, 333, 332,

TABLE 3-continued 331, 330, 329, 328, 327, 326, 325, 324, 323, 322, 321, 320, 319, 318, 317, 316, 315,
314, 313, 312, 311, 310, 309, 308, 307, 306, 305, 304, 303, 302, 301, 300, 299, 298,
297, 296, 295, 294, 293, 292, 291, 290, 289

M = 300, N = 512
256, 255, 254, 252, 248, 240, 288, 300, 296, 253, 224, 251, 250, 287, 247,
192, 246, 286, 239, 299, 244, 128, 238, 284, 223, 298, 236, 249, 222, 232, 280, 295,
245, 191, 220, 294, 190, 243, 216, 237, 242, 272, 188, 127, 285, 235, 208, 126, 184,
221, 234, 292, 231, 283, 124, 219, 176, 230, 282, 297, 218, 189, 120, 228, 215, 279,
241, 160, 214, 187, 278, 112, 207, 212, 186, 233, 293, 125, 183, 206, 271, 276, 96,
229, 182, 204, 123, 270, 175, 217, 291, 180, 227, 122, 200, 174, 119, 213, 64, 226,
281, 268, 159, 290, 172, 118, 211, 185, 111, 158, 205, 264, 116, 168, 277, 210, 110,
181, 156, 203, 95, 275, 108, 179, 202, 152, 121, 199, 173, 94, 269, 178, 104, 274, 225,
198, 144, 171, 92, 117, 63, 196, 157, 170, 267, 62, 115, 209, 167, 88, 109, 289, 155,
266, 114, 166, 60, 263, 80, 201, 154, 107, 164, 151, 56, 93, 177, 106, 262, 150, 103,
197, 143, 91, 48, 102, 148, 260, 169, 195, 273, 142, 90, 61, 100, 87, 194, 165, 113, 32,
140, 86, 59, 153, 79, 163, 136, 265, 84, 58, 105, 55, 149, 78, 162, 54, 76, 101, 261,
147, 47, 89, 141, 52, 146, 99, 72, 46, 193, 259, 139, 98, 85, 31, 44, 138, 258, 83, 135,
57, 30, 77, 40, 161, 82, 134, 28, 53, 75, 132, 24, 74, 51, 145, 71, 45, 50, 97, 16, 70, 43,
137, 68, 29, 42, 81, 39, 133, 257, 27, 38, 131, 26, 73, 23, 36, 22, 49, 130, 15, 69, 20,
14, 41, 67, 12, 66, 37, 25, 8, 35, 21, 34, 129, 19, 13, 18, 11, 65, 10, 7, 6, 33, 4, 17, 9, 5,
3, 2, 1, 512, 511, 510, 509, 508, 507, 506, 505, 504, 503, 502, 501, 500, 499, 498, 497,
496, 495, 494, 493, 492, 491, 490, 489, 488, 487, 486, 485, 484, 483, 482, 481, 480,
479, 478, 477, 476, 475, 474, 473, 472, 471, 470, 469, 468, 467, 466, 465, 464, 463,
462, 461, 460, 459, 458, 457, 456, 455, 454, 453, 452, 451, 450, 449, 448, 447, 446,
445, 444, 443, 442, 441, 440, 439, 438, 437, 436, 435, 434, 433, 432, 431, 430, 429,
428, 427, 426, 425, 424, 423, 422, 421, 420, 419, 418, 417, 416, 415, 414, 413, 412,
411, 410, 409, 408, 407, 406, 405, 404, 403, 402, 401, 400, 399, 398, 397, 396, 395,
394, 393, 392, 391, 390, 389, 388, 387, 386, 385, 384, 383, 382, 381, 380, 379, 378,
377, 376, 375, 374, 373, 372, 371, 370, 369, 368, 367, 366, 365, 364, 363, 362, 361,
360, 359, 358, 357, 356, 355, 354, 353, 352, 351, 350, 349, 348, 347, 346, 345, 344,
343, 342, 341, 340, 339, 338, 337, 336, 335, 334, 333, 332, 331, 330, 329, 328, 327,
326, 325, 324, 323, 322, 321, 320, 319, 318, 317, 316, 315, 314, 313, 312, 311, 310,
309, 308, 307, 306, 305, 304, 303, 302, 301

M = 360, N = 512
256, 255, 254, 252, 352, 320, 351, 350, 360, 248, 359, 348, 240, 319, 358,
253, 344, 318, 224, 251, 356, 316, 250, 336, 247, 349, 192, 246, 312, 347, 239, 244,
346, 238, 304, 343, 317, 223, 357, 236, 128, 249, 342, 222, 315, 232, 335, 355, 245,
191, 340, 220, 314, 288, 334, 311, 243, 190, 354, 216, 237, 332, 242, 310, 345, 188,
235, 303, 208, 308, 234, 221, 184, 127, 328, 341, 231, 302, 219, 126, 230, 339, 176,
300, 313, 218, 287, 333, 189, 124, 228, 215, 338, 241, 286, 296, 160, 214, 187, 331,
309, 120, 207, 353, 284, 186, 212, 233, 330, 307, 183, 206, 112, 327, 301, 280, 306,
182, 229, 125, 204, 326, 175, 217, 299, 180, 227, 96, 123, 272, 200, 174, 324, 298,
213, 226, 122, 285, 337, 295, 159, 119, 172, 211, 185, 64, 294, 283, 158, 118, 205,
168, 329, 210, 111, 181, 282, 292, 156, 116, 203, 279, 305, 110, 179, 325, 202, 152,
278, 173, 199, 95, 108, 178, 271, 121, 297, 323, 198, 225, 171, 276, 94, 144, 104, 270,
157, 170, 117, 322, 196, 63, 92, 293, 167, 209, 268, 155, 115, 62, 281, 166, 88, 109,
291, 154, 114, 201, 264, 60, 151, 164, 107, 290, 277, 80, 177, 150, 197, 106, 56, 93,
143, 275, 103, 148, 169, 269, 91, 195, 102, 142, 48, 274, 90, 194, 61, 165, 267, 321,
100, 87, 140, 153, 113, 32, 86, 59, 266, 163, 136, 263, 79, 149, 58, 162, 84, 105, 289,
55, 78, 262, 147, 54, 101, 141, 76, 260, 47, 146, 89, 52, 99, 273, 139, 72, 46, 193, 85,
98, 138, 31, 44, 135, 265, 57, 83, 30, 161, 77, 134, 40, 82, 53, 28, 261, 75, 132, 145,
51, 74, 24, 45, 71, 259, 50, 97, 70, 258, 16, 137, 43, 29, 68, 42, 39, 133, 81, 27, 38,
131, 26, 73, 36, 23, 22, 49, 130, 15, 69, 20, 14, 41, 67, 257, 12, 66, 37, 25, 8, 35, 21,
34, 129, 19, 13, 18, 11, 65, 10, 7, 6, 33, 4, 17, 9, 5, 3, 2, 1, 512, 511, 510, 509, 508,
507, 506, 505, 504, 503, 502, 501, 500, 499, 498, 497, 496, 495, 494, 493, 492, 491,
490, 489, 488, 487, 486, 485, 484, 483, 482, 481, 480, 479, 478, 477, 476, 475, 474,
473, 472, 471, 470, 469, 468, 467, 466, 465, 464, 463, 462, 461, 460, 459, 458, 457,
456, 455, 454, 453, 452, 451, 450, 449, 448, 447, 446, 445, 444, 443, 442, 441, 440,
439, 438, 437, 436, 435, 434, 433, 432, 431, 430, 429, 428, 427, 426, 425, 424, 423,
422, 421, 420, 419, 418, 417, 416, 415, 414, 413, 412, 411, 410, 409, 408, 407, 406,
405, 404, 403, 402, 401, 400, 399, 398, 397, 396, 395, 394, 393, 392, 391, 390, 389,
388, 387, 386, 385, 384, 383, 382, 381, 380, 379, 378, 377, 376, 375, 374, 373, 372,
371, 370, 369, 368, 367, 366, 365, 364, 363, 362, 361

M = 384, N = 512
384, 256, 383, 382, 380, 255, 376, 254, 368, 381, 252, 352, 379, 248, 378,
375, 320, 240, 374, 253, 367, 372, 224, 366, 251, 351, 250, 364, 247, 377, 350, 192,
360, 246, 373, 319, 348, 239, 244, 318, 371, 238, 344, 365, 370, 316, 223, 236, 363,
336, 249, 222, 349, 362, 312, 232, 359, 128, 245, 191, 220, 347, 358, 304, 190, 243,
346, 317, 216, 343, 237, 356, 242, 188, 369, 288, 342, 315, 235, 208, 335, 314, 340,
221, 234, 184, 361, 311, 231, 334, 127, 219, 310, 230, 357, 332, 176, 303, 126, 218,
345, 189, 308, 215, 228, 355, 302, 328, 124, 241, 341, 160, 214, 187, 354, 287, 300,
207, 186, 339, 313, 120, 212, 233, 286, 183, 333, 206, 296, 338, 309, 182, 112, 284,
229, 331, 204, 175, 125, 217, 307, 180, 330, 227, 280, 200, 301, 174, 327, 96, 123,
213, 306, 226, 159, 326, 299, 172, 122, 353, 272, 211, 185, 119, 158, 64, 205, 285,
298, 324, 168, 210, 118, 295, 181, 156, 337, 203, 283, 111, 294, 116, 179, 202, 282,
110, 152, 173, 199, 329, 279, 292, 178, 95, 108, 305, 198, 171, 278, 225, 121, 144, 94,
325, 271, 157, 170, 104, 196, 276, 167, 297, 117, 63, 92, 323, 270, 209, 155, 166, 62,
115, 293, 322, 88, 154, 109, 268, 201, 151, 114, 164, 281, 60, 291, 107, 177, 80, 150,
264, 197, 277, 93, 56, 106, 143, 290, 103, 148, 169, 195, 91, 142, 275, 102, 48, 269,
165, 90, 194, 61, 140, 274, 87, 100, 153, 267, 113, 32, 163, 86, 59, 136, 321, 79, 149,

TABLE 3-continued 266, 162, 58, 84, 105, 263, 55, 78, 147, 262, 54, 141, 289, 101, 76, 146, 47, 89, 52,
139, 99, 260, 72, 46, 193, 85, 273, 138, 98, 31, 135, 44, 57, 83, 30, 77, 134, 161, 265,
40, 82, 53, 28, 75, 132, 261, 145, 51, 74, 24, 45, 71, 50, 259, 137, 97, 70, 16, 43, 258,
29, 42, 68, 133, 39, 81, 27, 38, 26, 23, 36, 131, 73, 22, 49, 130, 15, 69, 20, 14, 41, 67,
257, 12, 66, 37, 25, 8, 35, 21, 34, 129, 19, 13, 18, 11, 65, 10, 7, 6, 33, 4, 17, 9, 5, 3, 2,
1, 512, 511, 510, 509, 508, 507, 506, 505, 504, 503, 502, 501, 500, 499, 498, 497, 496,
495, 494, 493, 492, 491, 490, 489, 488, 487, 486, 485, 484, 483, 482, 481, 480, 479,
478, 477, 476, 475, 474, 473, 472, 471, 470, 469, 468, 467, 466, 465, 464, 463, 462,
461, 460, 459, 458, 457, 456, 455, 454, 453, 452, 451, 450, 449, 448, 447, 446, 445,
444, 443, 442, 441, 440, 439, 438, 437, 436, 435, 434, 433, 432, 431, 430, 429, 428,
427, 426, 425, 424, 423, 422, 421, 420, 419, 418, 417, 416, 415, 414, 413, 412, 411,
410, 409, 408, 407, 406, 405, 404, 403, 402, 401, 400, 399, 398, 397, 396, 395, 394,
393, 392, 391, 390, 389, 388, 387, 386, 385
M = 400, N = 512
384, 256, 383, 382, 380, 255, 376, 254, 400, 368, 252, 381, 399, 352, 379,
248, 378, 398, 375, 320, 240, 374, 253, 396, 367, 372, 224, 251, 366, 351, 250, 392,
364, 247, 377, 350, 192, 360, 246, 373, 319, 348, 239, 244, 371, 397, 318, 238, 344,
365, 370, 223, 316, 236, 395, 363, 249, 336, 222, 349, 362, 128, 312, 232, 359, 394,
245, 191, 220, 347, 391, 358, 243, 304, 190, 346, 216, 237, 317, 343, 356, 242, 390,
188, 369, 342, 235, 315, 288, 208, 335, 388, 234, 221, 314, 340, 184, 361, 231, 311,
334, 127, 219, 230, 310, 357, 126, 176, 332, 218, 303, 345, 189, 215, 228, 308, 355,
124, 393, 328, 302, 241, 214, 187, 341, 160, 354, 287, 207, 120, 300, 186, 212, 339,
233, 313, 183, 389, 206, 286, 333, 338, 296, 112, 182, 309, 229, 204, 284, 125, 331,
387, 175, 217, 180, 307, 227, 330, 96, 123, 200, 174, 280, 301, 327, 213, 306, 386,
226, 122, 159, 172, 119, 326, 299, 211, 185, 353, 272, 64, 158, 205, 118, 298, 285,
168, 210, 324, 295, 181, 111, 156, 203, 337, 116, 283, 294, 110, 179, 202, 152, 282,
173, 199, 95, 329, 178, 279, 292, 108, 121, 198, 171, 305, 94, 225, 278, 144, 104, 325,
157, 170, 117, 271, 196, 63, 92, 167, 276, 297, 209, 323, 155, 270, 115, 62, 166, 385,
88, 109, 154, 293, 114, 322, 268, 201, 151, 60, 164, 107, 281, 80, 177, 291, 150, 93,
106, 264, 197, 56, 103, 143, 277, 290, 148, 169, 91, 195, 102, 142, 48, 275, 90, 61,
165, 269, 87, 194, 100, 140, 274, 153, 113, 86, 32, 59, 163, 267, 136, 79, 149, 58, 84,
321, 162, 105, 266, 55, 78, 263, 147, 54, 101, 141, 76, 262, 289, 47, 146, 89, 52, 99,
139, 72, 46, 260, 85, 193, 98, 138, 31, 273, 44, 135, 83, 57, 30, 77, 134, 40, 82, 161,
53, 265, 28, 75, 132, 51, 74, 145, 24, 261, 45, 71, 50, 70, 43, 259, 97, 16, 137, 29, 42,
258, 68, 39, 133, 81, 27, 38, 131, 26, 73, 36, 23, 22, 49, 130, 15, 69, 20, 14, 41, 67,
257, 12, 66, 37, 25, 8, 35, 21, 34, 129, 19, 13, 18, 11, 65, 10, 7, 6, 33, 4, 17, 9, 5, 3, 2,
1, 512, 511, 510, 509, 508, 507, 506, 505, 504, 503, 502, 501, 500, 499, 498, 497, 496,
495, 494, 493, 492, 491, 490, 489, 488, 487, 486, 485, 484, 483, 482, 481, 480, 479,
478, 477, 476, 475, 474, 473, 472, 471, 470, 469, 468, 467, 466, 465, 464, 463, 462,
461, 460, 459, 458, 457, 456, 455, 454, 453, 452, 451, 450, 449, 448, 447, 446, 445,
444, 443, 442, 441, 440, 439, 438, 437, 436, 435, 434, 433, 432, 431, 430, 429, 428,
427, 426, 425, 424, 423, 422, 421, 420, 419, 418, 417, 416, 415, 414, 413, 412, 411,
410, 409, 408, 407, 406, 405, 404, 403, 402, 401
M = 480, N = 512
480, 448, 384, 479, 478, 476, 447, 256, 472, 446, 464, 444, 477, 383, 440,
475, 382, 474, 432, 471, 380, 445, 470, 255, 463, 376, 443, 468, 254, 462, 442, 439,
416, 368, 252, 460, 381, 438, 473, 431, 379, 456, 436, 248, 469, 430, 352, 378, 375,
467, 240, 428, 461, 374, 253, 441, 415, 466, 320, 367, 424, 459, 372, 251, 414, 437,
366, 224, 458, 250, 412, 435, 455, 247, 364, 429, 351, 434, 454, 246, 408, 377, 192,
427, 360, 350, 239, 244, 373, 452, 426, 400, 238, 348, 423, 319, 413, 371, 465, 422,
365, 128, 236, 318, 344, 411, 223, 370, 249, 363, 420, 457, 410, 316, 222, 232, 407,
336, 362, 245, 433, 359, 349, 220, 453, 406, 312, 191, 243, 358, 399, 347, 190, 425,
404, 237, 451, 216, 242, 398, 304, 346, 356, 343, 235, 188, 317, 450, 421, 127, 396,
208, 342, 369, 234, 315, 221, 419, 231, 409, 288, 126, 184, 335, 340, 314, 392, 361,
219, 230, 311, 334, 418, 405, 124, 176, 218, 310, 357, 228, 332, 215, 189, 403, 303,
120, 397, 345, 308, 214, 355, 241, 187, 402, 302, 328, 160, 207, 395, 354, 341, 212,
186, 112, 233, 300, 183, 206, 287, 394, 125, 339, 449, 313, 391, 182, 286, 333, 204,
229, 296, 123, 338, 175, 96, 390, 309, 180, 217, 284, 331, 227, 122, 174, 200, 417,
119, 307, 388, 330, 213, 226, 280, 301, 327, 172, 159, 118, 64, 306, 211, 185, 326,
111, 158, 299, 401, 205, 116, 168, 272, 210, 110, 353, 298, 181, 156, 285, 324, 203,
295, 393, 108, 179, 95, 202, 283, 294, 152, 173, 199, 337, 121, 389, 94, 178, 282, 104,
198, 292, 279, 171, 117, 329, 144, 92, 387, 63, 225, 170, 278, 157, 196, 305, 167, 115,
62, 271, 325, 88, 386, 109, 155, 276, 166, 114, 209, 270, 297, 60, 107, 154, 323, 80,
151, 164, 268, 106, 201, 93, 293, 56, 322, 150, 103, 177, 281, 91, 143, 102, 291, 197,
264, 148, 48, 90, 142, 277, 169, 290, 87, 100, 61, 195, 275, 140, 86, 165, 194, 59, 32,
113, 269, 79, 153, 274, 58, 84, 163, 136, 55, 78, 267, 105, 385, 149, 162, 54, 266, 76,
101, 147, 47, 263, 52, 321, 89, 141, 99, 46, 72, 146, 262, 139, 85, 98, 31, 44, 289, 260,
138, 83, 57, 30, 135, 77, 40, 193, 82, 273, 53, 134, 28, 75, 51, 74, 132, 24, 161, 45, 71,
265, 50, 70, 43, 145, 261, 16, 97, 42, 29, 68, 137, 39, 27, 259, 38, 81, 26, 133, 258, 23,
36, 73, 131, 22, 49, 69, 15, 130, 20, 41, 14, 67, 257, 12, 66, 37, 25, 8, 35, 21, 34, 129,
19, 13, 18, 11, 65, 10, 7, 6, 33, 4, 17, 9, 5, 3, 2, 1, 512, 511, 510, 509, 508, 507, 506,
505, 504, 503, 502, 501, 500, 499, 498, 497, 496, 495, 494, 493, 492, 491, 490, 489,
488, 487, 486, 485, 484, 483, 482, 481
M = 576, N = 1024
512, 511, 510, 508, 504, 496, 509, 576, 575, 480, 507, 574, 506, 503, 448,
572, 502, 495, 500, 384, 568, 494, 479, 492, 560, 505, 478, 256, 488, 447, 501, 476,
573, 446, 499, 544, 472, 493, 571, 498, 444, 383, 464, 491, 570, 382, 440, 477, 567,
490, 487, 380, 566, 475, 432, 255, 486, 559, 474, 376, 445, 254, 484, 471, 564, 416,
497, 558, 470, 443, 252, 368, 463, 543, 442, 468, 489, 381, 439, 462, 556, 248, 352,
569, 438, 485, 542, 460, 379, 431, 473, 240, 552, 436, 378, 483, 456, 430, 375, 540, TABLE 3-continued 565, 320, 253, 469, 482, 415, 224, 374, 428, 251, 467, 441, 367, 563, 414, 536, 461,
372, 424, 557, 466, 250, 366, 412, 437, 562, 247, 192, 459, 351, 528, 364, 555, 246,
408, 435, 458, 377, 350, 455, 429, 239, 541, 434, 360, 128, 244, 554, 481, 400, 454,
348, 319, 427, 238, 373, 551, 452, 223, 413, 426, 539, 318, 236, 344, 371, 423, 465,
550, 365, 249, 222, 411, 316, 370, 422, 538, 232, 336, 548, 535, 410, 363, 457, 220,
191, 420, 245, 407, 312, 561, 349, 433, 362, 534, 190, 406, 359, 453, 216, 243, 399,
304, 527, 347, 237, 358, 404, 188, 425, 242, 532, 451, 127, 398, 553, 346, 208, 317,
356, 526, 343, 235, 450, 288, 126, 184, 396, 421, 369, 221, 234, 342, 315, 409, 524,
231, 549, 335, 124, 419, 392, 340, 176, 314, 219, 361, 537, 230, 311, 334, 405, 418,
120, 520, 218, 547, 189, 310, 228, 332, 215, 357, 160, 403, 303, 241, 345, 546, 533,
397, 308, 214, 112, 187, 402, 328, 355, 302, 207, 449, 395, 212, 186, 354, 341, 287,
233, 531, 125, 183, 206, 300, 96, 394, 525, 286, 339, 391, 313, 182, 530, 204, 123,
229, 296, 333, 417, 175, 338, 390, 284, 217, 180, 122, 523, 64, 309, 200, 227, 331,
174, 119, 388, 280, 226, 213, 330, 159, 307, 401, 522, 118, 172, 327, 301, 519, 306,
111, 158, 272, 211, 353, 185, 326, 116, 168, 205, 299, 545, 393, 110, 210, 518, 156,
324, 285, 298, 181, 95, 203, 108, 295, 337, 152, 389, 516, 94, 202, 283, 179, 294, 121,
199, 104, 173, 529, 387, 282, 178, 144, 329, 225, 92, 292, 198, 63, 279, 117, 171, 386,
305, 278, 62, 196, 88, 157, 325, 170, 271, 115, 167, 209, 521, 276, 60, 109, 297, 323,
155, 270, 114, 80, 166, 322, 154, 107, 56, 201, 268, 164, 151, 293, 517, 93, 106, 177,
281, 150, 264, 103, 48, 197, 291, 143, 91, 515, 102, 148, 290, 385, 277, 195, 142, 169,
32, 90, 61, 514, 100, 87, 194, 275, 140, 113, 165, 269, 86, 59, 274, 153, 79, 136, 321,
163, 58, 84, 267, 55, 78, 105, 162, 149, 266, 54, 263, 76, 47, 101, 147, 289, 262, 52,
141, 72, 89, 46, 146, 99, 260, 193, 31, 139, 44, 98, 85, 273, 30, 513, 138, 40, 135, 83,
57, 77, 28, 82, 53, 134, 161, 75, 265, 24, 51, 132, 74, 45, 71, 261, 50, 145, 16, 43, 70,
97, 259, 29, 42, 137, 68, 258, 39, 27, 81, 38, 133, 26, 23, 36, 131, 73, 22, 49, 130, 15,
69, 20, 14, 41, 67, 257, 12, 66, 37, 25, 8, 35, 21, 34, 129, 19, 13, 18, 11, 65, 10, 7, 6,
33, 4, 17, 9, 5, 3, 2, 1, 1024, 1023, 1022, 1021, 1020, 1019, 1018, 1017, 1016, 1015,
1014, 1013, 1012, 1011, 1010, 1009, 1008, 1007, 1006, 1005, 1004, 1003, 1002, 1001,
1000, 999, 998, 997, 996, 995, 994, 993, 992, 991, 990, 989, 988, 987, 986, 985, 984,
983, 982, 981, 980, 979, 978, 977, 976, 975, 974, 973, 972, 971, 970, 969, 968, 967,
966, 965, 964, 963, 962, 961, 960, 959, 958, 957, 956, 955, 954, 953, 952, 951, 950,
949, 948, 947, 946, 945, 944, 943, 942, 941, 940, 939, 938, 937, 936, 935, 934, 933,
932, 931, 930, 929, 928, 927, 926, 925, 924, 923, 922, 921, 920, 919, 918, 917, 916,
915, 914, 913, 912, 911, 910, 909, 908, 907, 906, 905, 904, 903, 902, 901, 900, 899,
898, 897, 896, 895, 894, 893, 892, 891, 890, 889, 888, 887, 886, 885, 884, 883, 882,
881, 880, 879, 878, 877, 876, 875, 874, 873, 872, 871, 870, 869, 868, 867, 866, 865,
864, 863, 862, 861, 860, 859, 858, 857, 856, 855, 854, 853, 852, 851, 850, 849, 848,
847, 846, 845, 844, 843, 842, 841, 840, 839, 838, 837, 836, 835, 834, 833, 832, 831,
830, 829, 828, 827, 826, 825, 824, 823, 822, 821, 820, 819, 818, 817, 816, 815, 814,
813, 812, 811, 810, 809, 808, 807, 806, 805, 804, 803, 802, 801, 800, 799, 798, 797,
796, 795, 794, 793, 792, 791, 790, 789, 788, 787, 786, 785, 784, 783, 782, 781, 780,
779, 778, 777, 776, 775, 774, 773, 772, 771, 770, 769, 768, 767, 766, 765, 764, 763,
762, 761, 760, 759, 758, 757, 756, 755, 754, 753, 752, 751, 750, 749, 748, 747, 746,
745, 744, 743, 742, 741, 740, 739, 738, 737, 736, 735, 734, 733, 732, 731, 730, 729,
728, 727, 726, 725, 724, 723, 722, 721, 720, 719, 718, 717, 716, 715, 714, 713, 712,
711, 710, 709, 708, 707, 706, 705, 704, 703, 702, 701, 700, 699, 698, 697, 696, 695,
694, 693, 692, 691, 690, 689, 688, 687, 686, 685, 684, 683, 682, 681, 680, 679, 678,
677, 676, 675, 674, 673, 672, 671, 670, 669, 668, 667, 666, 665, 664, 663, 662, 661,
660, 659, 658, 657, 656, 655, 654, 653, 652, 651, 650, 649, 648, 647, 646, 645, 644,
643, 642, 641, 640, 639, 638, 637, 636, 635, 634, 633, 632, 631, 630, 629, 628, 627,
626, 625, 624, 623, 622, 621, 620, 619, 618, 617, 616, 615, 614, 613, 612, 611, 610,
609, 608, 607, 606, 605, 604, 603, 602, 601, 600, 599, 598, 597, 596, 595, 594, 593,
592, 591, 590, 589, 588, 587, 586, 585, 584, 583, 582, 581, 580, 579, 578, 577
M = 600, N = 1024
512, 511, 510, 508, 504, 496, 576, 600, 592, 509, 480, 507, 506, 575, 503,
448, 502, 574, 495, 599, 500, 384, 494, 572, 598, 479, 492, 505, 478, 256, 488, 568,
596, 501, 476, 447, 591, 446, 499, 472, 590, 493, 560, 498, 444, 383, 464, 491, 573,
588, 440, 382, 477, 490, 487, 571, 380, 544, 475, 432, 255, 486, 597, 570, 474, 445,
376, 484, 471, 254, 567, 416, 497, 584, 443, 470, 595, 252, 368, 463, 566, 442, 468,
489, 439, 381, 462, 559, 248, 594, 589, 352, 564, 438, 485, 460, 379, 431, 473, 558,
240, 436, 483, 378, 587, 456, 430, 375, 320, 253, 469, 556, 482, 415, 543, 569, 428,
374, 224, 586, 441, 467, 251, 414, 367, 461, 552, 372, 424, 542, 466, 250, 583, 366,
437, 412, 565, 192, 247, 459, 351, 540, 364, 435, 582, 408, 458, 246, 377, 563, 429,
455, 350, 239, 434, 593, 360, 557, 481, 244, 400, 454, 536, 427, 580, 319, 373, 348,
128, 562, 238, 413, 452, 426, 318, 223, 555, 423, 371, 465, 344, 236, 365, 528, 411,
249, 222, 422, 316, 370, 554, 585, 232, 336, 410, 541, 457, 363, 551, 420, 407, 191,
220, 245, 312, 433, 349, 362, 406, 550, 190, 359, 453, 539, 216, 243, 399, 304, 347,
581, 237, 404, 358, 425, 188, 451, 242, 548, 538, 398, 346, 127, 317, 208, 356, 561,
343, 235, 535, 450, 288, 421, 396, 184, 369, 579, 126, 221, 315, 342, 234, 409, 534,
231, 335, 419, 392, 578, 124, 314, 340, 176, 527, 361, 219, 553, 311, 405, 230, 418,
334, 532, 218, 189, 120, 526, 310, 228, 357, 332, 403, 215, 160, 303, 549, 241, 397,
345, 308, 402, 187, 214, 355, 524, 328, 112, 302, 207, 449, 395, 537, 186, 212, 354,
341, 547, 287, 233, 183, 300, 125, 206, 394, 520, 96, 391, 286, 313, 339, 546, 182,
204, 229, 296, 333, 533, 123, 417, 175, 338, 390, 284, 217, 180, 309, 122, 227, 200,
331, 64, 174, 388, 119, 531, 280, 577, 307, 226, 213, 330, 401, 159, 172, 525, 327,
301, 118, 530, 306, 158, 185, 211, 353, 111, 272, 326, 168, 116, 299, 205, 393, 523,
210, 156, 110, 324, 285, 298, 181, 203, 95, 295, 522, 337, 108, 389, 152, 519, 283,
179, 202, 294, 94, 121, 545, 199, 173, 387, 104, 178, 282, 329, 144, 225, 292, 518,
279, 198, 92, 63, 171, 386, 117, 305, 278, 196, 157, 62, 325, 170, 516, 88, 271, 167,
115, 209, 276, 529, 60, 297, 109, 155, 323, 270, 166, 114, 80, 154, 322, 201, 268, 107, TABLE 3-continued 164, 56, 293, 151, 521, 93, 177, 281, 106, 150, 264, 103, 291, 197, 48, 143, 91, 148,
102, 290, 277, 385, 169, 142, 195, 517, 90, 32, 61, 100, 87, 194, 275, 140, 165, 113,
269, 59, 86, 274, 515, 153, 136, 79, 321, 163, 58, 267, 84, 514, 55, 105, 162, 149, 78,
266, 54, 263, 76, 101, 147, 47, 289, 262, 52, 141, 89, 72, 146, 46, 99, 260, 193, 31,
139, 44, 98, 85, 273, 30, 138, 135, 40, 57, 83, 28, 134, 161, 77, 82, 265, 513, 24, 53,
132, 75, 16, 261, 74, 51, 145, 71, 45, 50, 43, 70, 97, 259, 29, 42, 137, 68, 258, 39, 27,
81, 38, 133, 26, 23, 36, 131, 73, 22, 49, 130, 15, 69, 20, 14, 41, 67, 257, 12, 66, 37, 25,
8, 35, 21, 34, 129, 19, 13, 18, 11, 65, 10, 7, 6, 33, 4, 17, 9, 5, 3, 2, 1, 1024, 1023, 1022,
1021, 1020, 1019, 1018, 1017, 1016, 1015, 1014, 1013, 1012, 1011, 1010, 1009, 1008,
1007, 1006, 1005, 1004, 1003, 1002, 1001, 1000, 999, 998, 997, 996, 995, 994, 993,
992, 991, 990, 989, 988, 987, 986, 985, 984, 983, 982, 981, 980, 979, 978, 977, 976,
975, 974, 973, 972, 971, 970, 969, 968, 967, 966, 965, 964, 963, 962, 961, 960, 959,
958, 957, 956, 955, 954, 953, 952, 951, 950, 949, 948, 947, 946, 945, 944, 943, 942,
941, 940, 939, 938, 937, 936, 935, 934, 933, 932, 931, 930, 929, 928, 927, 926, 925,
924, 923, 922, 921, 920, 919, 918, 917, 916, 915, 914, 913, 912, 911, 910, 909, 908,
907, 906, 905, 904, 903, 902, 901, 900, 899, 898, 897, 896, 895, 894, 893, 892, 891,
890, 889, 888, 887, 886, 885, 884, 883, 882, 881, 880, 879, 878, 877, 876, 875, 874,
873, 872, 871, 870, 869, 868, 867, 866, 865, 864, 863, 862, 861, 860, 859, 858, 857,
856, 855, 854, 853, 852, 851, 850, 849, 848, 847, 846, 845, 844, 843, 842, 841, 840,
839, 838, 837, 836, 835, 834, 833, 832, 831, 830, 829, 828, 827, 826, 825, 824, 823,
822, 821, 820, 819, 818, 817, 816, 815, 814, 813, 812, 811, 810, 809, 808, 807, 806,
805, 804, 803, 802, 801, 800, 799, 798, 797, 796, 795, 794, 793, 792, 791, 790, 789,
788, 787, 786, 785, 784, 783, 782, 781, 780, 779, 778, 777, 776, 775, 774, 773, 772,
771, 770, 769, 768, 767, 766, 765, 764, 763, 762, 761, 760, 759, 758, 757, 756, 755,
754, 753, 752, 751, 750, 749, 748, 747, 746, 745, 744, 743, 742, 741, 740, 739, 738,
737, 736, 735, 734, 733, 732, 731, 730, 729, 728, 727, 726, 725, 724, 723, 722, 721,
720, 719, 718, 717, 716, 715, 714, 713, 712, 711, 710, 709, 708, 707, 706, 705, 704,
703, 702, 701, 700, 699, 698, 697, 696, 695, 694, 693, 692, 691, 690, 689, 688, 687,
686, 685, 684, 683, 682, 681, 680, 679, 678, 677, 676, 675, 674, 673, 672, 671, 670,
669, 668, 667, 666, 665, 664, 663, 662, 661, 660, 659, 658, 657, 656, 655, 654, 653,
652, 651, 650, 649, 648, 647, 646, 645, 644, 643, 642, 641, 640, 639, 638, 637, 636,
635, 634, 633, 632, 631, 630, 629, 628, 627, 626, 625, 624, 623, 622, 621, 620, 619,
618, 617, 616, 615, 614, 613, 612, 611, 610, 609, 608, 607, 606, 605, 604, 603, 602,
601
M = 720, N = 1024
512, 511, 510, 508, 704, 640, 703, 702, 720, 504, 719, 700, 496, 639, 718,
509, 696, 480, 638, 507, 716, 688, 506, 636, 503, 701, 448, 712, 502, 632, 699, 495,
672, 500, 698, 494, 384, 695, 624, 479, 717, 492, 637, 694, 505, 478, 715, 488, 687,
635, 692, 608, 501, 447, 476, 686, 714, 634, 499, 446, 256, 711, 631, 472, 493, 671,
684, 498, 697, 444, 383, 630, 710, 491, 464, 670, 680, 623, 382, 477, 490, 576, 693,
440, 628, 487, 668, 708, 622, 475, 380, 691, 486, 432, 474, 607, 664, 685, 620, 445,
690, 471, 484, 376, 633, 497, 255, 606, 416, 470, 683, 443, 713, 616, 463, 629, 368,
656, 254, 682, 442, 468, 669, 604, 489, 381, 439, 679, 462, 709, 627, 575, 252, 667,
438, 352, 485, 600, 678, 379, 621, 460, 626, 431, 473, 574, 707, 666, 248, 436, 483,
378, 676, 663, 619, 456, 430, 375, 689, 469, 592, 572, 320, 482, 706, 415, 662, 618,
605, 374, 240, 428, 615, 467, 441, 367, 568, 253, 414, 655, 461, 660, 603, 681, 372,
424, 466, 614, 366, 437, 224, 412, 654, 251, 459, 602, 560, 351, 677, 612, 599, 435,
364, 250, 458, 625, 573, 652, 408, 377, 429, 455, 247, 665, 350, 598, 434, 675, 192,
360, 544, 454, 571, 246, 481, 427, 591, 648, 400, 373, 319, 348, 596, 661, 617, 674,
239, 413, 426, 570, 452, 244, 590, 318, 371, 423, 567, 465, 344, 238, 659, 128, 365,
613, 705, 411, 370, 422, 588, 566, 223, 316, 653, 601, 658, 236, 410, 363, 336, 457,
611, 249, 559, 407, 420, 222, 564, 584, 651, 349, 312, 362, 433, 232, 597, 558, 610,
406, 359, 453, 245, 220, 191, 650, 347, 399, 543, 358, 304, 595, 647, 404, 556, 425,
243, 451, 190, 569, 346, 398, 216, 589, 317, 542, 237, 673, 483, 356, 594, 646, 242,
450, 552, 421, 369, 188, 288, 396, 127, 342, 315, 565, 587, 235, 409, 208, 540, 644,
335, 419, 126, 314, 392, 221, 184, 340, 234, 586, 657, 361, 563, 311, 231, 405, 334,
583, 536, 418, 557, 219, 124, 562, 310, 230, 357, 609, 176, 582, 403, 332, 303, 649,
218, 345, 555, 397, 528, 189, 308, 215, 228, 120, 355, 402, 580, 328, 302, 241, 541,
554, 160, 395, 341, 214, 593, 187, 354, 551, 449, 645, 287, 112, 207, 300, 394, 539,
212, 186, 339, 313, 233, 550, 391, 286, 125, 183, 206, 333, 643, 585, 296, 538, 338,
417, 96, 390, 548, 535, 309, 182, 229, 284, 123, 204, 331, 642, 561, 217, 175, 581,
388, 534, 180, 307, 227, 122, 330, 280, 200, 401, 174, 119, 301, 327, 527, 213, 64,
306, 226, 532, 553, 159, 579, 353, 118, 326, 172, 272, 299, 526, 211, 185, 393, 111,
158, 205, 578, 285, 298, 116, 324, 168, 549, 210, 295, 524, 110, 337, 181, 156, 537,
203, 389, 283, 95, 294, 547, 108, 179, 520, 202, 152, 282, 121, 329, 387, 199, 173, 94,
533, 292, 279, 546, 178, 104, 305, 641, 225, 198, 386, 144, 171, 278, 63, 117, 92, 325,
531, 271, 157, 196, 525, 170, 62, 276, 297, 115, 167, 88, 209, 530, 323, 270, 109, 155,
114, 60, 166, 523, 577, 322, 293, 268, 80, 107, 154, 201, 151, 164, 281, 522, 56, 93,
106, 291, 177, 519, 264, 150, 103, 197, 277, 290, 545, 143, 91, 48, 102, 518, 148, 169,
195, 385, 90, 142, 275, 61, 100, 87, 516, 269, 194, 32, 165, 113, 140, 274, 86, 59, 529,
153, 267, 79, 163, 321, 136, 58, 84, 105, 55, 266, 149, 78, 162, 263, 521, 54, 101, 76,
147, 289, 47, 262, 89, 141, 52, 517, 146, 99, 72, 46, 260, 193, 139, 85, 98, 31, 273,
515, 44, 138, 30, 57, 83, 40, 135, 77, 28, 82, 53, 134, 514, 161, 75, 265, 24, 51, 132,
74, 45, 71, 261, 50, 145, 16, 43, 70, 97, 259, 29, 42, 137, 68, 258, 39, 27, 81, 38, 133,
513, 26, 23, 36, 131, 73, 22, 49, 130, 15, 69, 20, 14, 41, 67, 257, 12, 66, 37, 25, 8, 35,
21, 34, 129, 19, 13, 18, 11, 65, 10, 7, 6, 33, 4, 17, 9, 5, 3, 2, 1, 1024, 1023, 1022, 1021,
1020, 1019, 1018, 1017, 1016, 1015, 1014, 1013, 1012, 1011, 1010, 1009, 1008, 1007,
1006, 1005, 1004, 1003, 1002, 1001, 1000, 999, 998, 997, 996, 995, 994, 993, 992,
991, 990, 989, 988, 987, 986, 985, 984, 983, 982, 981, 980, 979, 978, 977, 976, 975,
974, 973, 972, 971, 970, 969, 968, 967, 966, 965, 964, 963, 962, 961, 960, 959, 958, TABLE 3-continued 957, 956, 955, 954, 953, 952, 951, 950, 949, 948, 947, 946, 945, 944, 943, 942, 941,
940, 939, 938, 937, 936, 935, 934, 933, 932, 931, 930, 929, 928, 927, 926, 925, 924,
923, 922, 921, 920, 919, 918, 917, 916, 915, 914, 913, 912, 911, 910, 909, 908, 907,
906, 905, 904, 903, 902, 901, 900, 899, 898, 897, 896, 895, 894, 893, 892, 891, 890,
889, 888, 887, 886, 885, 884, 883, 882, 881, 880, 879, 878, 877, 876, 875, 874, 873,
872, 871, 870, 869, 868, 867, 866, 865, 864, 863, 862, 861, 860, 859, 858, 857, 856,
855, 854, 853, 852, 851, 850, 849, 848, 847, 846, 845, 844, 843, 842, 841, 840, 839,
838, 837, 836, 835, 834, 833, 832, 831, 830, 829, 828, 827, 826, 825, 824, 823, 822,
821, 820, 819, 818, 817, 816, 815, 814, 813, 812, 811, 810, 809, 808, 807, 806, 805,
804, 803, 802, 801, 800, 799, 798, 797, 796, 795, 794, 793, 792, 791, 790, 789, 788,
787, 786, 785, 784, 783, 782, 781, 780, 779, 778, 777, 776, 775, 774, 773, 772, 771,
770, 769, 768, 767, 766, 765, 764, 763, 762, 761, 760, 759, 758, 757, 756, 755, 754,
753, 752, 751, 750, 749, 748, 747, 746, 745, 744, 743, 742, 741, 740, 739, 738, 737,
736, 735, 734, 733, 732, 731, 730, 729, 728, 727, 726, 725, 724, 723, 722, 721

M = 768, N = 1024

768, 512, 767, 766, 764, 760, 511, 510, 752, 765, 508, 736, 763, 504, 762,
759, 704, 496, 758, 509, 751, 756, 640, 750, 480, 507, 735, 748, 506, 761, 734, 503,
744, 448, 757, 703, 502, 732, 495, 702, 755, 500, 728, 749, 494, 384, 754, 700, 639,
747, 479, 720, 492, 638, 733, 746, 505, 696, 478, 743, 488, 731, 636, 501, 742, 447,
688, 476, 730, 701, 727, 632, 740, 446, 499, 472, 493, 753, 672, 726, 699, 498, 444,
719, 383, 624, 491, 698, 724, 464, 745, 256, 695, 637, 718, 382, 477, 490, 440, 487,
694, 741, 608, 635, 716, 475, 687, 380, 729, 486, 692, 432, 634, 739, 474, 686, 712,
631, 445, 471, 725, 484, 376, 576, 738, 671, 630, 684, 497, 416, 470, 443, 723, 697,
623, 670, 463, 717, 368, 628, 680, 442, 722, 468, 255, 489, 622, 693, 439, 381, 668,
462, 715, 254, 607, 438, 352, 691, 620, 485, 379, 714, 460, 664, 633, 685, 431, 711,
473, 606, 252, 690, 436, 378, 483, 616, 456, 430, 710, 683, 375, 629, 737, 656, 575,
604, 469, 320, 482, 248, 415, 669, 682, 374, 428, 708, 574, 627, 679, 467, 441, 600,
367, 414, 621, 721, 667, 461, 240, 372, 626, 678, 424, 466, 572, 366, 437, 253, 619,
666, 412, 459, 592, 713, 663, 676, 351, 224, 605, 618, 568, 435, 364, 251, 458, 689,
408, 615, 662, 377, 429, 455, 350, 709, 434, 250, 603, 655, 360, 614, 247, 560, 660,
454, 427, 681, 481, 373, 319, 400, 192, 602, 348, 707, 654, 573, 246, 599, 612, 413,
426, 452, 318, 371, 423, 677, 239, 706, 625, 652, 544, 344, 598, 571, 365, 465, 244,
411, 665, 370, 422, 128, 238, 591, 316, 675, 570, 596, 363, 648, 410, 617, 336, 567,
223, 457, 407, 661, 590, 420, 236, 674, 349, 362, 312, 249, 433, 566, 222, 359, 406,
613, 588, 659, 453, 232, 559, 347, 399, 601, 653, 358, 245, 191, 304, 564, 404, 220,
425, 611, 658, 346, 451, 584, 558, 398, 317, 343, 190, 356, 651, 597, 243, 610, 216,
543, 421, 237, 450, 369, 288, 396, 556, 705, 342, 315, 242, 650, 409, 595, 188, 569,
127, 542, 647, 335, 235, 419, 589, 208, 314, 340, 392, 552, 361, 594, 311, 126, 405,
334, 221, 234, 184, 565, 646, 418, 540, 673, 587, 231, 310, 357, 124, 219, 332, 403,
563, 644, 230, 586, 303, 176, 345, 536, 397, 557, 308, 583, 218, 355, 657, 402, 189,
562, 328, 302, 120, 215, 228, 395, 341, 582, 555, 609, 354, 241, 528, 160, 287, 214,
187, 449, 300, 649, 394, 112, 541, 313, 339, 554, 207, 580, 286, 391, 186, 212, 551,
333, 233, 125, 183, 296, 593, 206, 338, 539, 390, 309, 645, 417, 284, 550, 331, 96,
182, 229, 123, 204, 538, 175, 307, 217, 388, 585, 330, 535, 548, 643, 280, 180, 122,
227, 301, 327, 401, 200, 174, 119, 306, 561, 64, 534, 213, 642, 226, 326, 581, 159,
299, 353, 272, 118, 172, 527, 211, 185, 393, 532, 285, 111, 298, 158, 553, 324, 205,
579, 116, 295, 526, 168, 210, 337, 110, 181, 283, 156, 389, 203, 294, 549, 578, 524,
95, 282, 108, 179, 537, 202, 329, 152, 387, 279, 121, 292, 173, 199, 94, 547, 178, 520,
305, 104, 278, 386, 198, 533, 225, 171, 325, 63, 144, 117, 546, 92, 271, 157, 276, 170,
297, 196, 62, 115, 531, 323, 167, 641, 270, 88, 209, 109, 525, 155, 114, 60, 166, 293,
530, 322, 268, 107, 154, 80, 281, 201, 523, 151, 164, 56, 291, 577, 93, 106, 264, 177,
103, 150, 522, 277, 197, 290, 91, 519, 143, 48, 102, 148, 169, 385, 275, 195, 90, 545,
142, 518, 87, 61, 100, 269, 274, 165, 194, 113, 32, 140, 59, 86, 516, 153, 267, 79, 321,
529, 163, 58, 136, 84, 105, 266, 55, 149, 78, 162, 263, 54, 521, 101, 289, 76, 262, 147,
47, 89, 141, 52, 46, 72, 99, 146, 31, 44, 85, 139, 98, 193, 260, 517, 30, 57, 138, 83,
273, 40, 135, 515, 77, 28, 82, 53, 134, 514, 161, 75, 265, 24, 51, 132, 74, 45, 71, 261,
50, 145, 16, 43, 70, 97, 259, 29, 42, 137, 68, 258, 39, 27, 81, 38, 133, 513, 26, 23, 36,
131, 73, 22, 49, 130, 15, 69, 20, 14, 41, 67, 257, 12, 66, 37, 25, 8, 35, 21, 34, 129, 19,
13, 18, 11, 65, 10, 7, 6, 33, 4, 17, 9, 5, 3, 2, 1, 1024, 1023, 1022, 1021, 1020, 1019,
1018, 1017, 1016, 1015, 1014, 1013, 1012, 1011, 1010, 1009, 1008, 1007, 1006, 1005,
1004, 1003, 1002, 1001, 1000, 999, 998, 997, 996, 995, 994, 993, 992, 991, 990, 989,
988, 987, 986, 985, 984, 983, 982, 981, 980, 979, 978, 977, 976, 975, 974, 973, 972,
971, 970, 969, 968, 967, 966, 965, 964, 963, 962, 961, 960, 959, 958, 957, 956, 955,
954, 953, 952, 951, 950, 949, 948, 947, 946, 945, 944, 943, 942, 941, 940, 939, 938,
937, 936, 935, 934, 933, 932, 931, 930, 929, 928, 927, 926, 925, 924, 923, 922, 921,
920, 919, 918, 917, 916, 915, 914, 913, 912, 911, 910, 909, 908, 907, 906, 905, 904,
903, 902, 901, 900, 899, 898, 897, 896, 895, 894, 893, 892, 891, 890, 889, 888, 887,
886, 885, 884, 883, 882, 881, 880, 879, 878, 877, 876, 875, 874, 873, 872, 871, 870,
869, 868, 867, 866, 865, 864, 863, 862, 861, 860, 859, 858, 857, 856, 855, 854, 853,
852, 851, 850, 849, 848, 847, 846, 845, 844, 843, 842, 841, 840, 839, 838, 837, 836,
835, 834, 833, 832, 831, 830, 829, 828, 827, 826, 825, 824, 823, 822, 821, 820, 819,
818, 817, 816, 815, 814, 813, 812, 811, 810, 809, 808, 807, 806, 805, 804, 803, 802,
801, 800, 799, 798, 797, 796, 795, 794, 793, 792, 791, 790, 789, 788, 787, 786, 785,
784, 783, 782, 781, 780, 779, 778, 777, 776, 775, 774, 773, 772, 771, 770, 769

M = 960, N = 1024

960, 896, 959, 768, 958, 956, 895, 952, 512, 894, 944, 892, 957, 928, 955,
767, 888, 954, 766, 951, 880, 950, 764, 893, 943, 948, 864, 891, 511, 942, 760, 890,
927, 940, 887, 510, 953, 752, 926, 886, 936, 765, 508, 879, 949, 924, 884, 763, 736,
832, 878, 947, 504, 920, 941, 762, 863, 876, 946, 759, 889, 939, 862, 496, 758, 912,
872, 509, 938, 925, 751, 885, 860, 704, 935, 756, 507, 923, 750, 480, 883, 934, 856,

TABLE 3-continued 831, 877, 922, 506, 735, 882, 748, 919, 932, 503, 830, 875, 640, 761, 734, 848, 918,
502, 744, 874, 945, 828, 861, 448, 871, 911, 757, 732, 495, 916, 500, 859, 870, 910,
824, 937, 703, 494, 755, 728, 858, 749, 855, 702, 868, 754, 908, 479, 933, 492, 384,
816, 747, 854, 921, 829, 720, 505, 478, 700, 881, 931, 904, 746, 847, 639, 733, 488,
852, 827, 743, 800, 917, 501, 476, 930, 846, 873, 696, 638, 731, 826, 742, 447, 256,
823, 915, 499, 730, 844, 869, 472, 636, 446, 909, 493, 727, 740, 822, 688, 498, 914,
857, 701, 867, 815, 726, 491, 840, 907, 444, 632, 820, 753, 464, 853, 383, 719, 699,
814, 672, 866, 490, 724, 477, 906, 487, 718, 698, 382, 440, 903, 745, 851, 799, 812,
624, 695, 475, 845, 486, 637, 902, 825, 716, 798, 850, 741, 694, 380, 474, 808, 432,
843, 471, 729, 635, 484, 687, 608, 255, 821, 796, 929, 445, 692, 739, 712, 900, 842,
470, 376, 634, 686, 725, 254, 839, 819, 631, 497, 443, 738, 416, 792, 463, 813, 671,
468, 684, 913, 723, 630, 838, 818, 442, 252, 576, 462, 368, 489, 717, 439, 670, 811,
697, 623, 722, 784, 381, 680, 628, 865, 836, 905, 438, 460, 715, 810, 622, 797, 485,
668, 693, 248, 807, 379, 352, 431, 473, 714, 436, 849, 795, 607, 901, 691, 620, 483,
456, 806, 711, 378, 430, 664, 685, 240, 375, 469, 794, 633, 606, 690, 482, 710, 899,
791, 841, 616, 804, 253, 415, 428, 683, 374, 320, 467, 656, 629, 604, 737, 790, 441,
414, 708, 461, 575, 367, 682, 251, 669, 224, 898, 372, 424, 466, 837, 817, 679, 627,
783, 366, 574, 600, 459, 412, 788, 437, 250, 667, 621, 678, 721, 626, 247, 782, 835,
809, 458, 351, 364, 666, 435, 572, 619, 408, 455, 663, 246, 592, 676, 429, 192, 780,
713, 350, 834, 377, 434, 618, 805, 605, 239, 454, 360, 662, 568, 615, 427, 244, 793,
689, 400, 348, 373, 709, 603, 655, 238, 803, 776, 319, 614, 426, 660, 452, 413, 481,
423, 371, 602, 789, 654, 128, 560, 318, 681, 707, 344, 223, 802, 236, 599, 612, 411,
365, 573, 422, 370, 465, 787, 652, 222, 249, 598, 706, 316, 410, 677, 363, 571, 781,
544, 232, 336, 407, 420, 625, 591, 665, 786, 457, 362, 220, 596, 245, 349, 570, 675,
648, 897, 191, 406, 359, 312, 590, 779, 567, 617, 433, 661, 347, 243, 399, 453, 674,
190, 358, 216, 404, 566, 778, 237, 588, 346, 304, 613, 398, 242, 659, 775, 425, 559,
451, 833, 343, 188, 356, 317, 601, 653, 235, 564, 127, 208, 658, 611, 584, 396, 558,
774, 342, 421, 450, 234, 315, 221, 288, 651, 369, 597, 126, 184, 231, 335, 409, 610,
543, 556, 340, 314, 419, 392, 801, 772, 219, 650, 230, 334, 311, 595, 124, 361, 542,
569, 647, 405, 176, 589, 218, 418, 705, 552, 310, 594, 215, 332, 228, 189, 357, 646,
785, 540, 565, 403, 120, 303, 587, 214, 308, 345, 397, 187, 160, 355, 241, 402, 328,
302, 563, 673, 586, 644, 207, 536, 212, 777, 186, 395, 583, 557, 341, 112, 354, 183,
562, 206, 287, 300, 233, 125, 394, 582, 555, 339, 657, 182, 286, 313, 391, 773, 528,
204, 333, 229, 449, 296, 123, 96, 554, 338, 175, 541, 580, 180, 609, 390, 284, 217,
309, 551, 331, 122, 649, 227, 174, 200, 771, 539, 119, 550, 307, 213, 330, 388, 417,
280, 226, 593, 159, 172, 327, 301, 118, 64, 538, 645, 770, 306, 211, 535, 548, 158,
111, 185, 326, 299, 205, 116, 168, 401, 585, 272, 210, 534, 643, 110, 156, 181, 298,
285, 203, 561, 353, 324, 527, 295, 581, 108, 532, 95, 393, 642, 179, 202, 283, 152,
294, 526, 173, 199, 553, 94, 337, 121, 178, 579, 282, 389, 104, 198, 279, 171, 292,
524, 549, 117, 144, 92, 63, 329, 578, 278, 170, 387, 157, 196, 225, 537, 167, 115, 62,
305, 271, 88, 547, 520, 325, 109, 155, 386, 276, 166, 114, 533, 209, 270, 154, 60, 107,
297, 546, 80, 323, 151, 164, 531, 106, 268, 769, 93, 201, 56, 293, 150, 103, 322, 525,
177, 281, 530, 91, 143, 197, 102, 291, 264, 148, 48, 523, 90, 142, 277, 169, 641, 87,
100, 61, 290, 195, 522, 140, 86, 275, 519, 165, 59, 194, 32, 577, 113, 269, 153, 79,
274, 518, 58, 84, 163, 385, 136, 55, 105, 267, 78, 545, 149, 162, 516, 54, 266, 101,
321, 76, 147, 263, 529, 47, 89, 141, 52, 99, 46, 521, 72, 262, 289, 146, 31, 44, 85, 139,
98, 193, 260, 517, 30, 57, 138, 83, 273, 40, 135, 515, 77, 28, 82, 53, 134, 514, 161, 75,
265, 24, 51, 132, 74, 45, 71, 261, 50, 145, 16, 43, 70, 97, 259, 29, 42, 137, 68, 258, 39,
27, 81, 38, 133, 513, 26, 23, 36, 131, 73, 22, 49, 130, 15, 69, 20, 14, 41, 67, 257, 12,
66, 37, 25, 8, 35, 21, 34, 129, 19, 13, 18, 11, 65, 10, 7, 6, 33, 4, 17, 9, 5, 3, 2, 1, 1024,
1023, 1022, 1021, 1020, 1019, 1018, 1017, 1016, 1015, 1014, 1013, 1012, 1011, 1010,
1009, 1008, 1007, 1006, 1005, 1004, 1003, 1002, 1001, 1000, 999, 998, 997, 996, 995,
994, 993, 992, 991, 990, 989, 988, 987, 986, 985, 984, 983, 982, 981, 980, 979, 978,
977, 976, 975, 974, 973, 972, 971, 970, 969, 968, 967, 966, 965, 964, 963, 962, 961
M = 1200, N = 2048
1024, 1023, 1022, 1020, 1016, 1008, 1152, 1200, 1184, 1021, 992, 1019,
1018, 1151, 1015, 960, 1014, 1150, 1199, 1007, 1012, 896, 1006, 1148, 1198, 991,
1004, 1017, 990, 768, 1000, 1144, 1196, 959, 1013, 988, 1183, 958, 1011, 984, 1192,
1005, 512, 1136, 1010, 956, 1182, 895, 976, 1003, 1149, 894, 952, 989, 1002, 1180,
999, 1120, 892, 1147, 987, 944, 767, 998, 1197, 986, 1176, 888, 957, 1146, 996, 983,
766, 928, 1009, 1143, 955, 982, 1195, 880, 764, 975, 1142, 954, 511, 980, 1088, 1001,
893, 951, 974, 760, 1194, 1135, 864, 510, 950, 1191, 997, 1140, 891, 972, 1181, 943,
985, 1168, 752, 948, 1134, 890, 508, 995, 968, 942, 887, 832, 1190, 765, 981, 1119,
1179, 994, 927, 1132, 504, 886, 940, 736, 1145, 953, 979, 763, 879, 926, 1188, 1118,
1178, 973, 884, 936, 978, 1128, 496, 762, 878, 1175, 924, 949, 704, 759, 971, 1141,
863, 1116, 509, 876, 947, 920, 1174, 758, 970, 889, 1087, 480, 862, 941, 967, 751,
1139, 946, 507, 872, 1193, 1112, 756, 640, 993, 912, 966, 831, 939, 860, 885, 1133,
750, 1172, 1086, 506, 1138, 925, 448, 964, 938, 1167, 830, 503, 735, 883, 856, 935,
748, 977, 1104, 877, 1131, 1189, 1084, 761, 923, 502, 828, 734, 882, 934, 1166, 744,
495, 848, 922, 1117, 875, 969, 1130, 703, 500, 384, 932, 919, 732, 757, 824, 1080,
1177, 1187, 1127, 861, 494, 945, 874, 1164, 918, 871, 702, 965, 1115, 755, 479, 728,
911, 816, 1126, 859, 492, 1186, 749, 870, 916, 937, 700, 1173, 754, 505, 963, 639,
1160, 478, 910, 858, 1114, 1072, 829, 256, 720, 868, 855, 488, 1124, 747, 1111, 800,
962, 933, 881, 638, 696, 908, 447, 1085, 476, 1137, 501, 827, 854, 733, 746, 921,
1171, 1110, 847, 743, 931, 446, 1056, 636, 904, 826, 852, 472, 688, 873, 499, 731,
1083, 823, 1103, 846, 742, 917, 1170, 930, 493, 1108, 1165, 444, 1129, 632, 498, 383,
730, 701, 822, 869, 1082, 844, 740, 464, 1102, 727, 915, 672, 815, 491, 857, 1079,
753, 909, 820, 382, 440, 699, 1163, 914, 726, 624, 867, 840, 1125, 814, 477, 490,
1100, 719, 961, 1078, 907, 487, 853, 698, 866, 380, 799, 724, 1113, 745, 637, 432,
812, 1162, 695, 475, 718, 906, 608, 1185, 255, 1071, 486, 1123, 825, 798, 851, 1159, TABLE 3-continued 1096, 903, 1076, 376, 694, 808, 474, 845, 635, 741, 716, 445, 929, 850, 484, 254, 687,
471, 902, 1109, 796, 1122, 416, 729, 1070, 821, 692, 1158, 634, 497, 843, 576, 739,
712, 443, 686, 470, 368, 631, 900, 252, 1055, 792, 819, 1068, 842, 463, 1107, 725,
738, 913, 671, 1156, 442, 813, 839, 630, 468, 684, 1169, 1081, 489, 381, 818, 1101,
439, 1054, 462, 623, 248, 784, 865, 670, 697, 352, 723, 1106, 838, 628, 1064, 811,
680, 717, 905, 438, 379, 622, 722, 460, 485, 668, 1052, 836, 797, 1099, 810, 1077,
431, 693, 240, 607, 473, 715, 807, 436, 849, 320, 378, 620, 901, 456, 483, 664, 1098,
430, 795, 375, 1161, 691, 714, 806, 1048, 606, 633, 1075, 1095, 253, 711, 685, 482,
415, 469, 224, 616, 794, 899, 374, 690, 428, 841, 804, 656, 791, 737, 1069, 575, 1121,
604, 710, 1074, 367, 1094, 414, 683, 629, 441, 817, 251, 467, 898, 372, 1157, 790,
1040, 424, 574, 461, 837, 708, 669, 682, 366, 600, 192, 466, 783, 1067, 412, 250, 627,
1092, 679, 721, 788, 437, 247, 572, 351, 809, 621, 459, 835, 782, 667, 364, 1053,
1105, 626, 1155, 1066, 678, 408, 592, 246, 1063, 435, 458, 350, 834, 666, 377, 780,
619, 568, 713, 128, 805, 455, 676, 239, 429, 663, 360, 1154, 434, 1051, 244, 605, 400,
793, 618, 319, 689, 481, 348, 1062, 454, 776, 662, 238, 615, 803, 427, 373, 1097, 560,
709, 1050, 655, 318, 603, 223, 452, 1060, 344, 413, 614, 802, 660, 789, 426, 1047,
236, 897, 681, 371, 707, 654, 423, 465, 602, 573, 1073, 544, 316, 222, 612, 365, 1093,
599, 249, 411, 787, 370, 706, 1046, 422, 336, 652, 232, 625, 677, 781, 571, 598, 191,
220, 410, 786, 312, 1039, 363, 457, 665, 420, 407, 591, 1044, 1091, 648, 245, 833,
570, 675, 349, 779, 596, 1065, 362, 190, 433, 1038, 567, 216, 617, 406, 590, 359, 304,
674, 453, 661, 778, 1090, 243, 399, 347, 566, 188, 775, 358, 404, 127, 588, 237, 1036,
208, 613, 559, 242, 425, 1061, 398, 659, 451, 801, 288, 317, 346, 774, 564, 601, 653,
356, 343, 126, 184, 584, 658, 235, 1153, 450, 558, 1049, 611, 396, 369, 421, 1032,
772, 705, 315, 1059, 342, 221, 543, 651, 234, 610, 597, 124, 409, 556, 335, 785, 231,
176, 392, 314, 419, 650, 340, 542, 1058, 1045, 311, 219, 569, 647, 361, 334, 595, 230,
552, 120, 418, 405, 589, 673, 540, 218, 310, 160, 189, 594, 646, 777, 332, 228, 215,
1043, 357, 303, 565, 403, 112, 587, 308, 644, 536, 241, 1037, 345, 397, 187, 214, 328,
402, 302, 1042, 355, 563, 773, 586, 657, 207, 1089, 449, 583, 186, 287, 557, 395, 96,
212, 528, 354, 300, 562, 125, 341, 183, 1035, 206, 233, 609, 771, 582, 394, 286, 555,
313, 391, 649, 182, 339, 296, 123, 770, 204, 1034, 580, 64, 541, 175, 333, 284, 554,
229, 417, 1031, 390, 338, 551, 180, 122, 593, 217, 200, 309, 174, 645, 119, 1057, 539,
280, 331, 1030, 227, 388, 550, 159, 118, 172, 538, 307, 330, 643, 226, 401, 1028, 213,
548, 272, 535, 327, 111, 585, 301, 158, 306, 116, 642, 168, 534, 326, 353, 185, 561,
110, 211, 1041, 156, 299, 527, 205, 581, 393, 95, 324, 532, 210, 108, 285, 298, 152,
526, 181, 295, 94, 203, 579, 769, 553, 104, 337, 283, 389, 1033, 144, 524, 294, 63,
202, 92, 578, 179, 121, 282, 199, 173, 520, 292, 387, 62, 549, 178, 279, 88, 198, 1029,
329, 386, 537, 225, 117, 278, 60, 171, 80, 547, 196, 157, 170, 115, 305, 167, 109, 271,
325, 155, 114, 209, 276, 533, 166, 546, 641, 270, 107, 297, 154, 323, 56, 151, 531,
164, 93, 106, 201, 268, 525, 322, 103, 293, 150, 530, 177, 91, 281, 48, 143, 523, 102,
197, 264, 577, 291, 148, 90, 61, 142, 522, 87, 169, 277, 100, 195, 290, 385, 519, 32,
59, 86, 140, 113, 194, 275, 518, 165, 545, 79, 269, 58, 153, 84, 274, 55, 136, 516, 163,
78, 105, 267, 1027, 321, 54, 149, 529, 162, 76, 266, 47, 1026, 101, 263, 52, 147, 89,
46, 141, 521, 72, 262, 99, 289, 146, 31, 44, 85, 139, 98, 193, 260, 517, 30, 57, 138, 83,
273, 40, 135, 515, 77, 28, 82, 53, 134, 514, 161, 75, 265, 1025, 24, 51, 132, 74, 45, 71,
261, 50, 145, 16, 43, 70, 97, 259, 29, 42, 137, 68, 258, 39, 27, 81, 38, 133, 513, 26, 23,
36, 131, 73, 22, 49, 130, 15, 69, 20, 14, 41, 67, 257, 12, 66, 37, 25, 8, 35, 21, 34, 129,
19, 13, 18, 11, 65, 10, 7, 6, 33, 4, 17, 9, 5, 3, 2, 1, 2048, 2047, 2046, 2045, 2044, 2043,
2042, 2041, 2040, 2039, 2038, 2037, 2036, 2035, 2034, 2033, 2032, 2031, 2030, 2029,
2028, 2027, 2026, 2025, 2024, 2023, 2022, 2021, 2020, 2019, 2018, 2017, 2016, 2015,
2014, 2013, 2012, 2011, 2010, 2009, 2008, 2007, 2006, 2005, 2004, 2003, 2002, 2001,
2000, 1999, 1998, 1997, 1996, 1995, 1994, 1993, 1992, 1991, 1990, 1989, 1988, 1987,
1986, 1985, 1984, 1983, 1982, 1981, 1980, 1979, 1978, 1977, 1976, 1975, 1974, 1973,
1972, 1971, 1970, 1969, 1968, 1967, 1966, 1965, 1964, 1963, 1962, 1961, 1960, 1959,
1958, 1957, 1956, 1955, 1954, 1953, 1952, 1951, 1950, 1949, 1948, 1947, 1946, 1945,
1944, 1943, 1942, 1941, 1940, 1939, 1938, 1937, 1936, 1935, 1934, 1933, 1932, 1931,
1930, 1929, 1928, 1927, 1926, 1925, 1924, 1923, 1922, 1921, 1920, 1919, 1918, 1917,
1916, 1915, 1914, 1913, 1912, 1911, 1910, 1909, 1908, 1907, 1906, 1905, 1904, 1903,
1902, 1901, 1900, 1899, 1898, 1897, 1896, 1895, 1894, 1893, 1892, 1891, 1890, 1889,
1888, 1887, 1886, 1885, 1884, 1883, 1882, 1881, 1880, 1879, 1878, 1877, 1876, 1875,
1874, 1873, 1872, 1871, 1870, 1869, 1868, 1867, 1866, 1865, 1864, 1863, 1862, 1861,
1860, 1859, 1858, 1857, 1856, 1855, 1854, 1853, 1852, 1851, 1850, 1849, 1848, 1847,
1846, 1845, 1844, 1843, 1842, 1841, 1840, 1839, 1838, 1837, 1836, 1835, 1834, 1833,
1832, 1831, 1830, 1829, 1828, 1827, 1826, 1825, 1824, 1823, 1822, 1821, 1820, 1819,
1818, 1817, 1816, 1815, 1814, 1813, 1812, 1811, 1810, 1809, 1808, 1807, 1806, 1805,
1804, 1803, 1802, 1801, 1800, 1799, 1798, 1797, 1796, 1795, 1794, 1793, 1792, 1791,
1790, 1789, 1788, 1787, 1786, 1785, 1784, 1783, 1782, 1781, 1780, 1779, 1778, 1777,
1776, 1775, 1774, 1773, 1772, 1771, 1770, 1769, 1768, 1767, 1766, 1765, 1764, 1763,
1762, 1761, 1760, 1759, 1758, 1757, 1756, 1755, 1754, 1753, 1752, 1751, 1750, 1749,
1748, 1747, 1746, 1745, 1744, 1743, 1742, 1741, 1740, 1739, 1738, 1737, 1736, 1735,
1734, 1733, 1732, 1731, 1730, 1729, 1728, 1727, 1726, 1725, 1724, 1723, 1722, 1721,
1720, 1719, 1718, 1717, 1716, 1715, 1714, 1713, 1712, 1711, 1710, 1709, 1708, 1707,
1706, 1705, 1704, 1703, 1702, 1701, 1700, 1699, 1698, 1697, 1696, 1695, 1694, 1693,
1692, 1691, 1690, 1689, 1688, 1687, 1686, 1685, 1684, 1683, 1682, 1681, 1680, 1679,
1678, 1677, 1676, 1675, 1674, 1673, 1672, 1671, 1670, 1669, 1668, 1667, 1666, 1665,
1664, 1663, 1662, 1661, 1660, 1659, 1658, 1657, 1656, 1655, 1654, 1653, 1652, 1651,
1650, 1649, 1648, 1647, 1646, 1645, 1644, 1643, 1642, 1641, 1640, 1639, 1638, 1637,
1636, 1635, 1634, 1633, 1632, 1631, 1630, 1629, 1628, 1627, 1626, 1625, 1624, 1623,
1622, 1621, 1620, 1619, 1618, 1617, 1616, 1615, 1614, 1613, 1612, 1611, 1610, 1609,
1608, 1607, 1606, 1605, 1604, 1603, 1602, 1601, 1600, 1599, 1598, 1597, 1596, 1595,
1594, 1593, 1592, 1591, 1590, 1589, 1588, 1587, 1586, 1585, 1584, 1583, 1582, 1581, TABLE 3-continued 1580, 1579, 1578, 1577, 1576, 1575, 1574, 1573, 1572, 1571, 1570, 1569, 1568, 1567,
1566, 1565, 1564, 1563, 1562, 1561, 1560, 1559, 1558, 1557, 1556, 1555, 1554, 1553,
1552, 1551, 1550, 1549, 1548, 1547, 1546, 1545, 1544, 1543, 1542, 1541, 1540, 1539,
1538, 1537, 1536, 1535, 1534, 1533, 1532, 1531, 1530, 1529, 1528, 1527, 1526, 1525,
1524, 1523, 1522, 1521, 1520, 1519, 1518, 1517, 1516, 1515, 1514, 1513, 1512, 1511,
1510, 1509, 1508, 1507, 1506, 1505, 1504, 1503, 1502, 1501, 1500, 1499, 1498, 1497,
1496, 1495, 1494, 1493, 1492, 1491, 1490, 1489, 1488, 1487, 1486, 1485, 1484, 1483,
1482, 1481, 1480, 1479, 1478, 1477, 1476, 1475, 1474, 1473, 1472, 1471, 1470, 1469,
1468, 1467, 1466, 1465, 1464, 1463, 1462, 1461, 1460, 1459, 1458, 1457, 1456, 1455,
1454, 1453, 1452, 1451, 1450, 1449, 1448, 1447, 1446, 1445, 1444, 1443, 1442, 1441,
1440, 1439, 1438, 1437, 1436, 1435, 1434, 1433, 1432, 1431, 1430, 1429, 1428, 1427,
1426, 1425, 1424, 1423, 1422, 1421, 1420, 1419, 1418, 1417, 1416, 1415, 1414, 1413,
1412, 1411, 1410, 1409, 1408, 1407, 1406, 1405, 1404, 1403, 1402, 1401, 1400, 1399,
1398, 1397, 1396, 1395, 1394, 1393, 1392, 1391, 1390, 1389, 1388, 1387, 1386, 1385,
1384, 1383, 1382, 1381, 1380, 1379, 1378, 1377, 1376, 1375, 1374, 1373, 1372, 1371,
1370, 1369, 1368, 1367, 1366, 1365, 1364, 1363, 1362, 1361, 1360, 1359, 1358, 1357,
1356, 1355, 1354, 1353, 1352, 1351, 1350, 1349, 1348, 1347, 1346, 1345, 1344, 1343,
1342, 1341, 1340, 1339, 1338, 1337, 1336, 1335, 1334, 1333, 1332, 1331, 1330, 1329,
1328, 1327, 1326, 1325, 1324, 1323, 1322, 1321, 1320, 1319, 1318, 1317, 1316, 1315,
1314, 1313, 1312, 1311, 1310, 1309, 1308, 1307, 1306, 1305, 1304, 1303, 1302, 1301,
1300, 1299, 1298, 1297, 1296, 1295, 1294, 1293, 1292, 1291, 1290, 1289, 1288, 1287,
1286, 1285, 1284, 1283, 1282, 1281, 1280, 1279, 1278, 1277, 1276, 1275, 1274, 1273,
1272, 1271, 1270, 1269, 1268, 1267, 1266, 1265, 1264, 1263, 1262, 1261, 1260, 1259,
1258, 1257, 1256, 1255, 1254, 1253, 1252, 1251, 1250, 1249, 1248, 1247, 1246, 1245,
1244, 1243, 1242, 1241, 1240, 1239, 1238, 1237, 1236, 1235, 1234, 1233, 1232, 1231,
1230, 1229, 1228, 1227, 1226, 1225, 1224, 1223, 1222, 1221, 1220, 1219, 1218, 1217,
1216, 1215, 1214, 1213, 1212, 1211, 1210, 1209, 1208, 1207, 1206, 1205, 1204, 1203,
1202, 1201

M = 1440, N = 2048

1024, 1023, 1022, 1020, 1408, 1280, 1407, 1406, 1440, 1016, 1439, 1404,
1008, 1438, 1279, 1021, 1400, 992, 1278, 1019, 1436, 1392, 1018, 1015, 1276, 1405,
960, 1432, 1014, 1403, 1376, 1007, 1272, 1012, 1424, 1402, 1006, 896, 1399, 1437,
991, 1264, 1004, 1344, 1398, 1017, 1277, 990, 1435, 1391, 768, 1000, 1396, 1013,
959, 988, 1275, 1248, 1390, 1434, 958, 1431, 1011, 1274, 984, 1005, 1375, 1388,
1271, 1010, 1401, 956, 1430, 895, 1216, 1003, 1374, 976, 1384, 1270, 1423, 894,
1397, 989, 1002, 952, 1428, 1263, 999, 1372, 1343, 512, 1268, 1422, 987, 892, 1395,
998, 1262, 944, 767, 1342, 1389, 1368, 986, 957, 1394, 983, 996, 1420, 888, 1247,
766, 1260, 1433, 1340, 1387, 1009, 1273, 928, 982, 955, 1360, 1152, 1246, 764, 975,
880, 1416, 1386, 1256, 954, 1373, 980, 1336, 1001, 1383, 1269, 1429, 951, 893, 974,
1215, 1244, 760, 1371, 1382, 950, 864, 997, 1267, 891, 972, 1328, 1427, 1214, 943,
985, 511, 1240, 1261, 1370, 948, 1380, 1421, 752, 995, 890, 1341, 1266, 1367, 968,
942, 887, 1426, 1393, 1212, 510, 765, 981, 832, 1259, 994, 927, 1366, 1232, 1339,
940, 886, 1419, 1312, 736, 979, 953, 1258, 1359, 763, 508, 1245, 926, 879, 1208,
1385, 1151, 973, 1255, 1338, 1364, 884, 936, 978, 1418, 1335, 762, 1358, 949, 878,
924, 1243, 1415, 759, 971, 1254, 1150, 504, 1381, 704, 1200, 1334, 863, 1356, 947,
876, 1242, 970, 758, 920, 1414, 1213, 1327, 1369, 1252, 889, 941, 1148, 967, 1239,
1379, 862, 496, 946, 751, 1332, 1265, 872, 1352, 756, 1326, 966, 993, 939, 1238, 509,
912, 1211, 885, 831, 1378, 1184, 1365, 1412, 640, 750, 860, 1144, 1231, 925, 938,
964, 1425, 480, 1324, 1257, 1210, 735, 830, 1236, 1311, 935, 883, 507, 1363, 748,
977, 856, 1337, 1207, 877, 1230, 923, 1136, 761, 1357, 934, 882, 734, 506, 1310, 828,
1320, 1362, 1253, 1206, 1149, 503, 744, 922, 875, 848, 1228, 1333, 969, 1417, 448,
919, 932, 703, 757, 1355, 1199, 732, 1241, 1308, 824, 861, 874, 502, 945, 1120, 1251,
1204, 1147, 918, 871, 1331, 1224, 1354, 702, 965, 755, 1198, 495, 728, 911, 1413,
1351, 1325, 859, 1237, 1250, 1304, 500, 749, 1146, 870, 816, 1377, 1330, 754,
494, 1143, 963, 700, 1183, 1377, 384, 1196, 910, 858, 639, 1350, 829, 1088, 1323,
1235, 855, 747, 1209, 868, 720, 479, 1411, 1296, 962, 933, 1142, 1229, 1182, 492,
881, 800, 908, 638, 696, 1192, 733, 827, 854, 1322, 746, 1234, 505, 1348, 921, 1135,
1309, 478, 743, 1205, 1319, 847, 931, 1140, 1361, 1410, 1227, 1180, 488, 826, 904,
852, 636, 256, 731, 873, 1134, 823, 742, 917, 688, 501, 447, 1307, 846, 1318, 930,
476, 1203, 1226, 730, 1176, 1119, 701, 1197, 822, 1223, 869, 632, 727, 1353, 740,
1132, 446, 915, 1306, 499, 844, 1202, 1316, 472, 815, 1145, 1303, 857, 909, 753, 493,
672, 1249, 1118, 1222, 820, 699, 726, 1329, 1195, 914, 867, 498, 1168, 444, 840,
1128, 814, 624, 1349, 719, 1302, 383, 907, 491, 853, 464, 698, 1141, 1087, 1194, 866,
724, 1220, 745, 1116, 1181, 961, 799, 1295, 637, 695, 1191, 812, 718, 440, 1321, 906,
382, 1233, 477, 490, 1300, 1347, 825, 851, 1086, 903, 1139, 798, 487, 608, 694, 1179,
1294, 741, 845, 1112, 1190, 635, 716, 1133, 808, 475, 850, 380, 687, 929, 729, 902,
1346, 432, 1138, 486, 1317, 821, 796, 1084, 255, 1178, 692, 1225, 634, 739, 843,
1292, 1188, 474, 712, 1175, 1131, 686, 631, 445, 1104, 1409, 576, 1305, 900, 484,
471, 376, 1201, 819, 725, 254, 842, 738, 1315, 792, 671, 1080, 913, 497, 813, 1174,
1117, 1130, 416, 839, 1221, 630, 684, 1288, 443, 470, 818, 1127, 697, 723, 1167, 623,
1314, 1301, 670, 252, 368, 865, 463, 838, 1193, 811, 784, 717, 1172, 628, 1115, 442,
680, 1219, 468, 489, 1072, 1126, 722, 905, 1166, 439, 622, 381, 693, 668, 462, 797,
810, 836, 1299, 715, 1114, 248, 1085, 807, 1218, 1189, 607, 1124, 849, 352, 1111,
438, 1293, 485, 620, 1164, 901, 691, 460, 379, 795, 714, 664, 1298, 1137, 1056, 431,
806, 633, 1177, 473, 685, 711, 606, 1083, 1110, 240, 436, 1187, 690, 483, 794, 378,
1291, 616, 1345, 841, 456, 899, 1160, 430, 1103, 737, 804, 791, 710, 375, 656, 320,
575, 683, 1082, 629, 253, 469, 604, 1108, 1129, 482, 1173, 1186, 817, 415, 1290,
1079, 898, 790, 428, 1102, 669, 682, 374, 708, 224, 837, 574, 1287, 627, 441, 467,
679, 783, 251, 600, 721, 414, 367, 1171, 1078, 1125, 621, 461, 788, 809, 667, 1313,
1100, 424, 372, 1165, 835, 626, 572, 466, 678, 1286, 1071, 782, 250, 1113, 366, 437,

TABLE 3-continued 1170, 412, 666, 592, 1076, 247, 619, 459, 192, 1123, 713, 834, 676, 805, 663, 1096,
351, 1163, 1070, 780, 568, 1284, 1217, 364, 435, 605, 689, 618, 408, 458, 246, 1109,
793, 1122, 377, 429, 662, 615, 455, 1297, 1055, 350, 709, 803, 1162, 239, 434, 1068,
776, 655, 603, 360, 560, 244, 1159, 481, 128, 1081, 1107, 614, 454, 400, 660, 427,
789, 681, 319, 802, 1054, 373, 348, 238, 707, 1101, 654, 602, 1185, 573, 1064, 1158,
897, 413, 1289, 612, 1106, 426, 599, 452, 223, 318, 787, 706, 423, 371, 1077, 677,
544, 236, 1052, 625, 465, 344, 652, 1099, 781, 571, 598, 365, 249, 411, 665, 1156,
222, 786, 422, 316, 370, 591, 675, 1075, 1285, 232, 1169, 648, 1098, 570, 1048, 410,
336, 596, 779, 363, 617, 457, 191, 1069, 833, 420, 567, 1095, 407, 245, 220, 661, 590,
674, 312, 1074, 433, 349, 362, 778, 1121, 406, 566, 190, 1283, 359, 1094, 613, 453,
1040, 775, 1067, 243, 588, 659, 1161, 216, 399, 559, 347, 304, 601, 237, 653, 358,
404, 801, 564, 425, 188, 774, 242, 1053, 658, 611, 1066, 1092, 451, 1282, 127, 584,
398, 346, 558, 317, 1063, 208, 1105, 356, 235, 651, 1157, 343, 597, 705, 610, 450,
772, 543, 288, 421, 369, 126, 184, 396, 1051, 556, 221, 1062, 315, 234, 342, 650, 785,
409, 569, 595, 231, 542, 647, 1155, 335, 419, 1050, 124, 392, 1097, 589, 314, 552,
340, 219, 361, 1060, 176, 1047, 594, 673, 311, 230, 405, 646, 334, 418, 540, 565,
1073, 1154, 777, 587, 218, 120, 189, 1046, 310, 1093, 228, 357, 215, 644, 403, 332,
563, 160, 536, 303, 1039, 586, 241, 345, 397, 657, 308, 557, 187, 773, 583, 214, 1044,
402, 1065, 355, 112, 328, 562, 1091, 302, 1038, 207, 609, 395, 186, 528, 341, 582,
449, 212, 354, 555, 233, 287, 125, 771, 183, 649, 300, 206, 1090, 1281, 1061, 394,
1036, 96, 541, 580, 554, 313, 339, 286, 391, 182, 229, 551, 123, 770, 333, 1049, 204,
593, 296, 175, 417, 338, 645, 390, 1059, 217, 539, 284, 1032, 309, 180, 550, 122, 227,
331, 64, 200, 174, 119, 538, 388, 1045, 1058, 585, 643, 307, 213, 280, 548, 226, 535,
330, 159, 1153, 401, 118, 301, 172, 327, 561, 642, 306, 1043, 534, 111, 185, 158, 211,
581, 353, 272, 326, 299, 205, 116, 168, 527, 1037, 393, 210, 110, 532, 1042, 156, 553,
181, 285, 324, 298, 579, 526, 203, 95, 295, 1035, 1089, 337, 108, 389, 152, 578, 179,
283, 202, 94, 121, 173, 104, 199, 294, 769, 178, 92, 282, 63, 144, 524, 117, 171, 198,
279, 225, 292, 387, 549, 329, 62, 157, 537, 88, 170, 278, 115, 196, 305, 386, 520, 167,
1034, 547, 109, 271, 1031, 60, 325, 155, 114, 209, 276, 533, 166, 546, 641, 80, 270,
107, 1030, 297, 154, 1057, 323, 56, 151, 531, 164, 93, 106, 201, 268, 525, 1028, 322,
103, 293, 150, 530, 177, 91, 281, 48, 1041, 143, 523, 102, 197, 264, 577, 291, 148, 90,
61, 142, 522, 87, 169, 277, 100, 195, 290, 385, 519, 1033, 32, 59, 86, 140, 113, 194,
275, 518, 165, 545, 79, 269, 1029, 58, 153, 84, 274, 55, 136, 516, 163, 78, 105, 267,
1027, 321, 54, 149, 529, 162, 76, 266, 47, 1026, 101, 263, 52, 147, 89, 46, 141, 521,
72, 262, 99, 289, 146, 31, 44, 85, 139, 98, 193, 260, 517, 30, 57, 138, 83, 273, 40, 135,
515, 77, 28, 82, 53, 134, 514, 161, 75, 265, 1025, 24, 51, 132, 74, 45, 71, 261, 50, 145,
16, 43, 70, 97, 259, 29, 42, 137, 68, 258, 39, 27, 81, 38, 133, 513, 26, 23, 36, 131, 73,
22, 49, 130, 15, 69, 20, 14, 41, 67, 257, 12, 66, 37, 25, 8, 35, 21, 34, 129, 19, 13, 18,
11, 65, 10, 7, 6, 33, 4, 17, 9, 5, 3, 2, 1, 2048, 2047, 2046, 2045, 2044, 2043, 2042,
2041, 2040, 2039, 2038, 2037, 2036, 2035, 2034, 2033, 2032, 2031, 2030, 2029, 2028,
2027, 2026, 2025, 2024, 2023, 2022, 2021, 2020, 2019, 2018, 2017, 2016, 2015, 2014,
2013, 2012, 2011, 2010, 2009, 2008, 2007, 2006, 2005, 2004, 2003, 2002, 2001, 2000,
1999, 1998, 1997, 1996, 1995, 1994, 1993, 1992, 1991, 1990, 1989, 1988, 1987, 1986,
1985, 1984, 1983, 1982, 1981, 1980, 1979, 1978, 1977, 1976, 1975, 1974, 1973, 1972,
1971, 1970, 1969, 1968, 1967, 1966, 1965, 1964, 1963, 1962, 1961, 1960, 1959, 1958,
1957, 1956, 1955, 1954, 1953, 1952, 1951, 1950, 1949, 1948, 1947, 1946, 1945, 1944,
1943, 1942, 1941, 1940, 1939, 1938, 1937, 1936, 1935, 1934, 1933, 1932, 1931, 1930,
1929, 1928, 1927, 1926, 1925, 1924, 1923, 1922, 1921, 1920, 1919, 1918, 1917, 1916,
1915, 1914, 1913, 1912, 1911, 1910, 1909, 1908, 1907, 1906, 1905, 1904, 1903, 1902,
1901, 1900, 1899, 1898, 1897, 1896, 1895, 1894, 1893, 1892, 1891, 1890, 1889, 1888,
1887, 1886, 1885, 1884, 1883, 1882, 1881, 1880, 1879, 1878, 1877, 1876, 1875, 1874,
1873, 1872, 1871, 1870, 1869, 1868, 1867, 1866, 1865, 1864, 1863, 1862, 1861, 1860,
1859, 1858, 1857, 1856, 1855, 1854, 1853, 1852, 1851, 1850, 1849, 1848, 1847, 1846,
1845, 1844, 1843, 1842, 1841, 1840, 1839, 1838, 1837, 1836, 1835, 1834, 1833, 1832,
1831, 1830, 1829, 1828, 1827, 1826, 1825, 1824, 1823, 1822, 1821, 1820, 1819, 1818,
1817, 1816, 1815, 1814, 1813, 1812, 1811, 1810, 1809, 1808, 1807, 1806, 1805, 1804,
1803, 1802, 1801, 1800, 1799, 1798, 1797, 1796, 1795, 1794, 1793, 1792, 1791, 1790,
1789, 1788, 1787, 1786, 1785, 1784, 1783, 1782, 1781, 1780, 1779, 1778, 1777, 1776,
1775, 1774, 1773, 1772, 1771, 1770, 1769, 1768, 1767, 1766, 1765, 1764, 1763, 1762,
1761, 1760, 1759, 1758, 1757, 1756, 1755, 1754, 1753, 1752, 1751, 1750, 1749, 1748,
1747, 1746, 1745, 1744, 1743, 1742, 1741, 1740, 1739, 1738, 1737, 1736, 1735, 1734,
1733, 1732, 1731, 1730, 1729, 1728, 1727, 1726, 1725, 1724, 1723, 1722, 1721, 1720,
1719, 1718, 1717, 1716, 1715, 1714, 1713, 1712, 1711, 1710, 1709, 1708, 1707, 1706,
1705, 1704, 1703, 1702, 1701, 1700, 1699, 1698, 1697, 1696, 1695, 1694, 1693, 1692,
1691, 1690, 1689, 1688, 1687, 1686, 1685, 1684, 1683, 1682, 1681, 1680, 1679, 1678,
1677, 1676, 1675, 1674, 1673, 1672, 1671, 1670, 1669, 1668, 1667, 1666, 1665, 1664,
1663, 1662, 1661, 1660, 1659, 1658, 1657, 1656, 1655, 1654, 1653, 1652, 1651, 1650,
1649, 1648, 1647, 1646, 1645, 1644, 1643, 1642, 1641, 1640, 1639, 1638, 1637, 1636,
1635, 1634, 1633, 1632, 1631, 1630, 1629, 1628, 1627, 1626, 1625, 1624, 1623, 1622,
1621, 1620, 1619, 1618, 1617, 1616, 1615, 1614, 1613, 1612, 1611, 1610, 1609, 1608,
1607, 1606, 1605, 1604, 1603, 1602, 1601, 1600, 1599, 1598, 1597, 1596, 1595, 1594,
1593, 1592, 1591, 1590, 1589, 1588, 1587, 1586, 1585, 1584, 1583, 1582, 1581, 1580,
1579, 1578, 1577, 1576, 1575, 1574, 1573, 1572, 1571, 1570, 1569, 1568, 1567, 1566,
1565, 1564, 1563, 1562, 1561, 1560, 1559, 1558, 1557, 1556, 1555, 1554, 1553, 1552,
1551, 1550, 1549, 1548, 1547, 1546, 1545, 1544, 1543, 1542, 1541, 1540, 1539, 1538,
1537, 1536, 1535, 1534, 1533, 1532, 1531, 1530, 1529, 1528, 1527, 1526, 1525, 1524,
1523, 1522, 1521, 1520, 1519, 1518, 1517, 1516, 1515, 1514, 1513, 1512, 1511, 1510,
1509, 1508, 1507, 1506, 1505, 1504, 1503, 1502, 1501, 1500, 1499, 1498, 1497, 1496,
1495, 1494, 1493, 1492, 1491, 1490, 1489, 1488, 1487, 1486, 1485, 1484, 1483, 1482,
1481, 1480, 1479, 1478, 1477, 1476, 1475, 1474, 1473, 1472, 1471, 1470, 1469, 1468, TABLE 3-continued 1467, 1466, 1465, 1464, 1463, 1462, 1461, 1460, 1459, 1458, 1457, 1456, 1455, 1454,
1453, 1452, 1451, 1450, 1449, 1448, 1447, 1446, 1445, 1444, 1443, 1442, 1441
M = 2400, N = 4096
2048, 2047, 2046, 2044, 2040, 2032, 2304, 2400, 2368, 2045, 2016, 2043,
2042, 2303, 1984, 2039, 2038, 2399, 2302, 2031, 2036, 1920, 2030, 2398, 2300, 2015,
2028, 2041, 2014, 1792, 2024, 2396, 1983, 2037, 2012, 2296, 2367, 1982, 2035, 2008,
2392, 2029, 1536, 2288, 2034, 1980, 1919, 2366, 2000, 2027, 2301, 1918, 1976, 2013,
2026, 2384, 2023, 2364, 2272, 1024, 1916, 2011, 2299, 1791, 1968, 2022, 2397, 2010,
1912, 1981, 1790, 2020, 2007, 2298, 2360, 1952, 2033, 2295, 1979, 2006, 2240, 1788,
1904, 2395, 1999, 1978, 1535, 2004, 2025, 1917, 1975, 2294, 1998, 1784, 2394, 2352,
1888, 1534, 2287, 1974, 2391, 2021, 1915, 1996, 2292, 1967, 2009, 1776, 2365, 1972,
1914, 1532, 2286, 2019, 1992, 2390, 1966, 1911, 1856, 1789, 1023, 2176, 2005, 2018,
1951, 2271, 2383, 1760, 1528, 1910, 1964, 2284, 2363, 1787, 1022, 1977, 2388, 2003,
1903, 1950, 2297, 1908, 1997, 1960, 2270, 2382, 1786, 2002, 1520, 1902, 2362, 2280,
1948, 1973, 1728, 1783, 1020, 2336, 1995, 2359, 1887, 1533, 2239, 2293, 1900, 2268,
1782, 1971, 1944, 1994, 2380, 1913, 1504, 1016, 1886, 1965, 1991, 1775, 1970, 2358,
1531, 1896, 2393, 1664, 1780, 2238, 2017, 2291, 1936, 1990, 1855, 1963, 1884, 1909,
1774, 2264, 2351, 1530, 2285, 2376, 1008, 1949, 1472, 1759, 1962, 1988, 1527, 1854,
2290, 2356, 1907, 1772, 1959, 1880, 2236, 2001, 2389, 1901, 1785, 1021, 1947, 1758,
1526, 2350, 1852, 2256, 1906, 2283, 1958, 1768, 992, 1519, 1872, 2175, 1946, 1899,
2232, 1727, 1993, 1408, 1524, 1756, 1781, 1019, 1956, 1943, 1848, 2282, 2269, 2387,
2348, 1518, 1885, 1898, 1969, 2279, 1726, 2174, 1942, 2381, 1895, 1018, 1779, 1752,
1989, 2361, 1503, 960, 1840, 1935, 1015, 2386, 1516, 1883, 2224, 1773, 2267, 1894,
2335, 1940, 1724, 2278, 1961, 1778, 1663, 1529, 1280, 2344, 1987, 1502, 1934, 1882,
1853, 2172, 1744, 1014, 2379, 1892, 1771, 1512, 1879, 2266, 2237, 1824, 1662, 1720,
1986, 1007, 2357, 1957, 1471, 1905, 2276, 2334, 1932, 1500, 1525, 2263, 1757, 1851,
896, 1770, 1878, 1012, 1945, 2208, 2289, 1767, 2378, 2168, 1871, 1660, 1006, 1470,
1955, 1928, 1850, 1712, 1876, 2235, 1496, 1523, 1755, 2262, 1897, 2375, 2332, 1847,
2355, 1766, 991, 1870, 1941, 1954, 1517, 1004, 2255, 1468, 1656, 1407, 1754, 1522,
2349, 1725, 768, 1846, 2234, 2260, 1764, 1893, 1017, 1751, 2281, 1868, 2160, 1488,
990, 1939, 1696, 2374, 2354, 1839, 1515, 2328, 1777, 2231, 1881, 1933, 1000, 1406,
2254, 1464, 1844, 1723, 1648, 1750, 1938, 1891, 959, 1864, 1501, 988, 1838, 1514,
2347, 1743, 1013, 2173, 2372, 2230, 1722, 1511, 2277, 1931, 1985, 1404, 1877, 1748,
1890, 1823, 1661, 1769, 2252, 1719, 1456, 958, 1279, 1836, 1742, 2320, 1499, 2223,
1632, 2385, 984, 1930, 2144, 2346, 1510, 1011, 512, 2265, 1849, 1822, 1875, 1927,
2228, 1718, 2171, 1400, 1659, 1005, 2343, 2275, 1498, 1740, 1765, 1469, 1832, 1278,
1869, 956, 2248, 895, 1010, 1711, 1508, 1953, 1874, 1495, 2222, 1440, 1926, 1753,
1820, 2333, 1716, 1845, 976, 1658, 1600, 1521, 2170, 1763, 1867, 1736, 1003, 2274,
1276, 1710, 1655, 1467, 2261, 1392, 1494, 2342, 894, 952, 1924, 2207, 2167, 2112,
2377, 1816, 2220, 1843, 1749, 1762, 1487, 1866, 1695, 989, 1002, 1937, 1654, 1466,
1708, 2331, 1837, 1492, 1863, 1405, 999, 1513, 892, 1272, 2233, 1842, 1463, 2259,
2340, 1647, 2206, 1486, 1721, 1694, 2166, 1747, 944, 1376, 767, 1889, 1808, 1652,
987, 1862, 2216, 1704, 2253, 1835, 1741, 998, 2330, 2159, 1462, 2353, 1929, 1646,
1746, 1403, 2373, 2258, 1692, 1484, 1509, 888, 1264, 2327, 766, 1821, 1860, 1717,
986, 2204, 957, 1455, 1834, 2164, 1631, 2229, 1739, 996, 1497, 928, 983, 1831, 1460,
1402, 1644, 1873, 1344, 2251, 2158, 1688, 1480, 1507, 1925, 1454, 1009, 1399, 1715,
1819, 2326, 764, 1738, 1630, 1277, 880, 1657, 2371, 955, 1830, 982, 2200, 1709,
1735, 1248, 2227, 1640, 1493, 1506, 1439, 2345, 2250, 1714, 1818, 2319, 975, 1398,
2143, 2156, 1452, 1923, 1865, 511, 1680, 1599, 1761, 1828, 1628, 954, 2247, 1815,
2221, 1734, 980, 1275, 2324, 760, 1391, 893, 1653, 1707, 2370, 1001, 1438, 1465,
951, 1841, 1491, 2226, 1922, 974, 864, 2169, 1396, 2273, 1598, 1814, 1448, 2142,
2318, 2192, 1693, 1485, 1732, 510, 1706, 1861, 1216, 1274, 1624, 2246, 1390, 2152,
1490, 1651, 1807, 1436, 950, 2341, 1703, 2219, 891, 1745, 1271, 972, 997, 1461,
1812, 752, 1596, 1645, 1375, 943, 1833, 1691, 1483, 2111, 1650, 1859, 2140, 1806,
508, 1388, 2316, 1702, 832, 2244, 948, 890, 1270, 985, 1432, 942, 1459, 1374, 887,
968, 1401, 1482, 1616, 995, 1263, 1453, 1643, 1384, 1690, 1479, 765, 1268, 927,
1458, 1592, 1687, 886, 940, 981, 1372, 1700, 1629, 994, 1262, 1343, 1424, 1642,
1737, 1804, 1397, 1451, 1478, 879, 1858, 736, 1505, 1639, 926, 1829, 763, 1686, 953,
504, 1713, 884, 1152, 979, 1247, 1342, 1437, 1627, 936, 1260, 1817, 1368, 1450,
1584, 1679, 878, 1395, 973, 1476, 1638, 1733, 1800, 762, 1447, 924, 1827, 1684,
1389, 978, 1246, 759, 1626, 949, 1273, 1340, 1435, 1597, 1678, 863, 1394, 496, 1489,
1623, 1705, 876, 1256, 1813, 971, 1446, 1636, 1731, 1826, 704, 1921, 1360, 758,
1387, 920, 1244, 1434, 1568, 947, 1215, 862, 509, 1595, 1622, 1676, 889, 1269, 1336,
970, 1431, 1649, 751, 1730, 1811, 941, 1444, 1373, 1701, 872, 967, 1386, 1481, 1615,
756, 1805, 946, 1214, 480, 1594, 1383, 1689, 860, 1240, 507, 1430, 1620, 750, 831,
1267, 1810, 912, 1457, 1591, 1672, 885, 939, 966, 1371, 1699, 1614, 993, 1261, 1328,
1423, 1641, 1803, 1382, 1212, 1477, 506, 640, 1857, 735, 830, 1266, 925, 1428, 1590,
748, 1685, 856, 938, 503, 1370, 1698, 883, 1151, 964, 1232, 1341, 1422, 1612, 935,
1259, 1802, 1367, 1449, 1583, 877, 1380, 734, 1475, 1637, 448, 1799, 761, 828, 1208,
923, 502, 1588, 1683, 882, 1150, 977, 1245, 1312, 744, 1625, 934, 1258, 1339, 1366,
1420, 1582, 1677, 848, 1393, 495, 1474, 1608, 875, 1255, 1798, 732, 1445, 1635, 922,
1825, 703, 1682, 1359, 500, 757, 824, 1148, 919, 1243, 1338, 1433, 1567, 932, 1200,
861, 1364, 494, 1580, 1621, 1675, 874, 1254, 1335, 969, 1416, 1634, 1729, 1796, 702,
1443, 1358, 871, 728, 1385, 918, 1242, 755, 1566, 945, 1213, 384, 479, 1593, 1144,
1674, 859, 1239, 1334, 492, 1429, 1619, 749, 816, 1252, 1809, 911, 1442, 1576, 1671,
870, 700, 965, 1356, 1613, 754, 1327, 916, 1184, 478, 1564, 1381, 1211, 858, 1238,
505, 639, 1618, 720, 829, 1265, 1332, 910, 1427, 1589, 747, 1670, 855, 937, 488,
1369, 1697, 868, 1136, 963, 1231, 1326, 1421, 1611, 696, 1801, 1352, 1210, 476, 638,
1379, 733, 800, 1236, 447, 1426, 1560, 746, 827, 1207, 854, 908, 501, 1587, 1668,
881, 1149, 962, 1230, 1311, 743, 1610, 933, 1257, 1324, 1365, 1419, 1581, 847, 1378, TABLE 3-continued 256, 1473, 1607, 446, 636, 1797, 731, 826, 1206, 921, 472, 1586, 688, 1681, 852,
1120, 499, 1310, 742, 823, 1147, 904, 1228, 1337, 1418, 1552, 931, 1199, 846, 1363,
493, 1579, 1606, 873, 1253, 1320, 730, 1415, 1633, 444, 1795, 701, 1204, 1357, 498,
632, 727, 822, 1146, 917, 1241, 1308, 740, 1565, 930, 1198, 383, 1362, 464, 1578,
1143, 1673, 844, 1224, 1333, 491, 1414, 1604, 815, 1251, 1794, 672, 1441, 1575, 869,
699, 726, 1355, 2165, 440, 753, 820, 1088, 915, 1183, 382, 477, 1563, 1142, 1196,
857, 1237, 1304, 490, 624, 1617, 719, 814, 1250, 1331, 909, 1412, 1574, 2110, 1669,
840, 2205, 698, 487, 1354, 2136, 867, 2218, 1135, 724, 1325, 2163, 914, 1182, 695,
1562, 1351, 1209, 380, 2215, 475, 637, 1140, 718, 799, 1235, 1330, 2157, 432, 1425,
1559, 745, 812, 1192, 853, 907, 486, 1572, 2108, 1667, 866, 2203, 1134, 961, 1229,
1296, 2162, 1609, 2257, 694, 1323, 1350, 1180, 2214, 474, 608, 1377, 255, 798, 1234,
2128, 445, 635, 1558, 716, 825, 1205, 376, 2155, 906, 471, 1585, 687, 1666, 851,
2202, 1119, 484, 1309, 741, 808, 1132, 903, 1227, 1322, 2104, 1417, 1551, 2199, 692,
845, 1348, 254, 2212, 1605, 2141, 416, 634, 1319, 729, 796, 1176, 2154, 443, 470,
1556, 2249, 686, 1203, 850, 1118, 497, 631, 712, 821, 1145, 2151, 902, 1226, 1307,
739, 1550, 2198, 929, 1197, 368, 1361, 463, 1577, 2225, 1128, 843, 1223, 1318, 252,
1413, 1603, 2139, 442, 576, 1793, 2329, 671, 1202, 2096, 468, 630, 2191, 684, 725,
792, 1116, 2150, 439, 1306, 2245, 2312, 738, 819, 1087, 900, 1168, 381, 2339, 462,
1548, 2196, 1141, 1195, 842, 1222, 1303, 489, 623, 1602, 2138, 813, 1249, 1316, 670,
1411, 1573, 2109, 839, 2190, 697, 248, 1353, 2135, 438, 628, 2217, 2325, 723, 818,
1086, 2148, 913, 1181, 352, 2243, 2338, 680, 1561, 1112, 1194, 379, 1302, 460, 622,
1139, 717, 784, 1220, 1329, 431, 1410, 1544, 2080, 811, 1191, 838, 668, 485, 1571,
2107, 2134, 865, 2188, 1133, 722, 1295, 2161, 436, 2242, 2323, 693, 1084, 1349,
1179, 378, 2213, 473, 607, 1138, 240, 797, 1233, 1300, 2127, 430, 620, 1557, 2317,
715, 810, 1190, 375, 905, 456, 1570, 2106, 1665, 836, 2201, 1104, 483, 1294, 2132,
807, 1131, 2322, 664, 1321, 2103, 1178, 2184, 691, 606, 1347, 253, 320, 2211, 2126,
415, 633, 1080, 714, 795, 1175, 374, 2153, 428, 469, 1555, 2315, 685, 1188, 849,
1117, 482, 616, 2369, 711, 806, 1130, 901, 1225, 1292, 2102, 1549, 2197, 690, 367,
1346, 224, 2210, 1127, 414, 604, 1317, 251, 794, 1174, 2124, 441, 575, 1554, 2314,
656, 1201, 372, 2095, 467, 629, 683, 710, 791, 1115, 2149, 424, 1305, 2311, 737, 804,
1072, 899, 1167, 366, 2100, 461, 1547, 2195, 1126, 841, 1221, 1288, 250, 1601, 2137,
412, 574, 1315, 669, 1172, 2094, 466, 600, 2189, 682, 247, 790, 1114, 2120, 437, 627,
2310, 708, 817, 1085, 2147, 898, 1166, 351, 2337, 679, 1546, 2194, 1111, 1193, 364,
1301, 459, 621, 1124, 783, 1219, 1314, 192, 1409, 1543, 2079, 572, 837, 667, 246,
2092, 2133, 408, 626, 2187, 721, 788, 1056, 2146, 435, 350, 2241, 2308, 678, 1083,
1110, 1164, 377, 458, 592, 1137, 239, 782, 1218, 1299, 429, 619, 1542, 2078, 809,
1189, 360, 666, 455, 1569, 2105, 835, 2186, 1103, 244, 1293, 2131, 434, 568, 2321,
663, 1082, 2088, 1177, 348, 2183, 676, 605, 1108, 238, 319, 1298, 2125, 400, 618,
1079, 713, 780, 1160, 373, 427, 454, 1540, 2076, 1187, 834, 1102, 481, 615, 2130,
805, 1129, 662, 1291, 2101, 2182, 689, 128, 1345, 223, 318, 2209, 413, 603, 1078,
236, 793, 1173, 344, 2123, 426, 560, 1553, 2313, 655, 1186, 371, 452, 614, 709, 776,
1100, 423, 1290, 2072, 803, 1071, 660, 365, 2099, 222, 2180, 1125, 602, 1287, 249,
316, 2122, 411, 573, 1076, 654, 1171, 370, 2093, 465, 599, 681, 232, 789, 1113, 2119,
422, 612, 2309, 707, 802, 1070, 897, 1165, 336, 2098, 1545, 2193, 1096, 363, 1286,
220, 1123, 410, 544, 1313, 191, 1170, 2064, 571, 598, 652, 245, 312, 2091, 2118, 407,
625, 706, 787, 1055, 2145, 420, 349, 2307, 677, 1068, 1109, 1163, 362, 457, 591,
1122, 781, 1217, 1284, 190, 1541, 2077, 570, 359, 665, 216, 2090, 406, 596, 2185,
243, 786, 1054, 2116, 433, 567, 2306, 648, 1081, 2087, 1162, 347, 675, 590, 1107,
237, 304, 1297, 399, 617, 1064, 779, 1159, 358, 188, 453, 1539, 2075, 833, 1101, 242,
2129, 404, 566, 661, 1052, 2086, 346, 2181, 674, 127, 1106, 208, 317, 398, 588, 1077,
235, 778, 1158, 343, 425, 559, 1538, 2074, 1185, 356, 451, 613, 775, 1099, 184, 1289,
2071, 564, 659, 126, 2084, 221, 288, 2179, 601, 1048, 234, 315, 342, 2121, 396, 558,
1075, 653, 1156, 369, 450, 584, 231, 774, 1098, 421, 611, 2070, 801, 1069, 658, 335,
2097, 2178, 1095, 124, 1285, 219, 314, 409, 543, 1074, 176, 1169, 340, 2063, 556,
597, 651, 230, 311, 2117, 392, 610, 705, 772, 1040, 419, 334, 2068, 1067, 1094, 361,
218, 1121, 542, 1283, 189, 2062, 569, 120, 650, 215, 310, 2089, 405, 595, 228, 785,
1053, 2115, 418, 552, 2305, 647, 1066, 1161, 332, 589, 1092, 303, 1282, 160, 1063,
540, 357, 187, 214, 2060, 594, 241, 308, 2114, 403, 565, 646, 1051, 2085, 345, 673,
112, 1105, 207, 302, 397, 587, 1062, 777, 1157, 328, 186, 1537, 2073, 355, 212, 402,
536, 183, 1050, 2056, 563, 644, 125, 2083, 206, 287, 586, 1047, 233, 300, 341, 395,
557, 1060, 1155, 354, 449, 583, 773, 1097, 182, 2069, 562, 657, 96, 2082, 286, 2177,
123, 1046, 204, 313, 394, 528, 1073, 175, 1154, 339, 555, 582, 229, 296, 391, 609,
771, 1039, 180, 333, 2067, 1093, 122, 217, 284, 541, 1044, 174, 338, 2061, 554, 119,
649, 200, 309, 390, 580, 227, 770, 1038, 417, 551, 2066, 1065, 331, 1091, 64, 1281,
159, 539, 118, 172, 213, 280, 2059, 593, 226, 307, 2113, 388, 550, 645, 1036, 330,
111, 1090, 301, 158, 1061, 538, 327, 185, 2058, 116, 211, 306, 401, 535, 168, 1049,
2055, 548, 643, 110, 205, 272, 585, 1032, 299, 326, 156, 1059, 353, 210, 534, 181,
2054, 561, 642, 95, 2081, 285, 108, 1045, 203, 298, 393, 527, 1058, 1153, 324, 581,
295, 152, 532, 179, 94, 2052, 121, 202, 283, 526, 1043, 173, 337, 553, 104, 199, 294,
389, 579, 769, 1037, 178, 2065, 92, 282, 63, 1042, 144, 524, 117, 171, 198, 279, 578,
225, 292, 387, 549, 1035, 329, 1089, 62, 157, 537, 88, 170, 278, 2057, 115, 196, 305,
386, 520, 167, 1034, 547, 109, 271, 1031, 60, 325, 155, 114, 209, 276, 533, 166, 2053,
546, 641, 80, 270, 107, 1030, 297, 154, 1057, 323, 56, 151, 531, 164, 93, 2051, 106,
201, 268, 525, 1028, 322, 103, 293, 150, 530, 177, 2050, 91, 281, 48, 1041, 143, 523,
102, 197, 264, 577, 291, 148, 90, 61, 142, 522, 87, 169, 277, 100, 195, 290, 385, 519,
1033, 32, 59, 86, 140, 113, 194, 275, 518, 165, 545, 79, 269, 1029, 58, 153, 84, 274,
55, 136, 516, 163, 78, 105, 267, 1027, 321, 54, 149, 529, 162, 2049, 76, 266, 47, 1026,
101, 263, 52, 147, 89, 46, 141, 521, 72, 262, 99, 289, 146, 31, 44, 85, 139, 98, 193,
260, 517, 30, 57, 138, 83, 273, 40, 135, 515, 77, 28, 82, 53, 134, 514, 161, 75, 265,
1025, 24, 51, 132, 74, 45, 71, 261, 50, 145, 16, 43, 70, 97, 259, 29, 42, 137, 68, 258, TABLE 3-continued 39, 27, 81, 38, 133, 513, 26, 23, 36, 131, 73, 22, 49, 130, 15, 69, 20, 14, 41, 67, 257,
12, 66, 37, 25, 8, 35, 21, 34, 129, 19, 13, 18, 11, 65, 10, 7, 6, 33, 4, 17, 9, 5, 3, 2, 1,
4096, 4095, 4094, 4093, 4092, 4091, 4090, 4089, 4088, 4087, 4086, 4085, 4084, 4083,
4082, 4081, 4080, 4079, 4078, 4077, 4076, 4075, 4074, 4073, 4072, 4071, 4070, 4069,
4068, 4067, 4066, 4065, 4064, 4063, 4062, 4061, 4060, 4059, 4058, 4057, 4056, 4055,
4054, 4053, 4052, 4051, 4050, 4049, 4048, 4047, 4046, 4045, 4044, 4043, 4042, 4041,
4040, 4039, 4038, 4037, 4036, 4035, 4034, 4033, 4032, 4031, 4030, 4029, 4028, 4027,
4026, 4025, 4024, 4023, 4022, 4021, 4020, 4019, 4018, 4017, 4016, 4015, 4014, 4013,
4012, 4011, 4010, 4009, 4008, 4007, 4006, 4005, 4004, 4003, 4002, 4001, 4000, 3999,
3998, 3997, 3996, 3995, 3994, 3993, 3992, 3991, 3990, 3989, 3988, 3987, 3986, 3985,
3984, 3983, 3982, 3981, 3980, 3979, 3978, 3977, 3976, 3975, 3974, 3973, 3972, 3971,
3970, 3969, 3968, 3967, 3966, 3965, 3964, 3963, 3962, 3961, 3960, 3959, 3958, 3957,
3956, 3955, 3954, 3953, 3952, 3951, 3950, 3949, 3948, 3947, 3946, 3945, 3944, 3943,
3942, 3941, 3940, 3939, 3938, 3937, 3936, 3935, 3934, 3933, 3932, 3931, 3930, 3929,
3928, 3927, 3926, 3925, 3924, 3923, 3922, 3921, 3920, 3919, 3918, 3917, 3916, 3915,
3914, 3913, 3912, 3911, 3910, 3909, 3908, 3907, 3906, 3905, 3904, 3903, 3902, 3901,
3900, 3899, 3898, 3897, 3896, 3895, 3894, 3893, 3892, 3891, 3890, 3889, 3888, 3887,
3886, 3885, 3884, 3883, 3882, 3881, 3880, 3879, 3878, 3877, 3876, 3875, 3874, 3873,
3872, 3871, 3870, 3869, 3868, 3867, 3866, 3865, 3864, 3863, 3862, 3861, 3860, 3859,
3858, 3857, 3856, 3855, 3854, 3853, 3852, 3851, 3850, 3849, 3848, 3847, 3846, 3845,
3844, 3843, 3842, 3841, 3840, 3839, 3838, 3837, 3836, 3835, 3834, 3833, 3832, 3831,
3830, 3829, 3828, 3827, 3826, 3825, 3824, 3823, 3822, 3821, 3820, 3819, 3818, 3817,
3816, 3815, 3814, 3813, 3812, 3811, 3810, 3809, 3808, 3807, 3806, 3805, 3804, 3803,
3802, 3801, 3800, 3799, 3798, 3797, 3796, 3795, 3794, 3793, 3792, 3791, 3790, 3789,
3788, 3787, 3786, 3785, 3784, 3783, 3782, 3781, 3780, 3779, 3778, 3777, 3776, 3775,
3774, 3773, 3772, 3771, 3770, 3769, 3768, 3767, 3766, 3765, 3764, 3763, 3762, 3761,
3760, 3759, 3758, 3757, 3756, 3755, 3754, 3753, 3752, 3751, 3750, 3749, 3748, 3747,
3746, 3745, 3744, 3743, 3742, 3741, 3740, 3739, 3738, 3737, 3736, 3735, 3734, 3733,
3732, 3731, 3730, 3729, 3728, 3727, 3726, 3725, 3724, 3723, 3722, 3721, 3720, 3719,
3718, 3717, 3716, 3715, 3714, 3713, 3712, 3711, 3710, 3709, 3708, 3707, 3706, 3705,
3704, 3703, 3702, 3701, 3700, 3699, 3698, 3697, 3696, 3695, 3694, 3693, 3692, 3691,
3690, 3689, 3688, 3687, 3686, 3685, 3684, 3683, 3682, 3681, 3680, 3679, 3678, 3677,
3676, 3675, 3674, 3673, 3672, 3671, 3670, 3669, 3668, 3667, 3666, 3665, 3664, 3663,
3662, 3661, 3660, 3659, 3658, 3657, 3656, 3655, 3654, 3653, 3652, 3651, 3650, 3649,
3648, 3647, 3646, 3645, 3644, 3643, 3642, 3641, 3640, 3639, 3638, 3637, 3636, 3635,
3634, 3633, 3632, 3631, 3630, 3629, 3628, 3627, 3626, 3625, 3624, 3623, 3622, 3621,
3620, 3619, 3618, 3617, 3616, 3615, 3614, 3613, 3612, 3611, 3610, 3609, 3608, 3607,
3606, 3605, 3604, 3603, 3602, 3601, 3600, 3599, 3598, 3597, 3596, 3595, 3594, 3593,
3592, 3591, 3590, 3589, 3588, 3587, 3586, 3585, 3584, 3583, 3582, 3581, 3580, 3579,
3578, 3577, 3576, 3575, 3574, 3573, 3572, 3571, 3570, 3569, 3568, 3567, 3566, 3565,
3564, 3563, 3562, 3561, 3560, 3559, 3558, 3557, 3556, 3555, 3554, 3553, 3552, 3551,
3550, 3549, 3548, 3547, 3546, 3545, 3544, 3543, 3542, 3541, 3540, 3539, 3538, 3537,
3536, 3535, 3534, 3533, 3532, 3531, 3530, 3529, 3528, 3527, 3526, 3525, 3524, 3523,
3522, 3521, 3520, 3519, 3518, 3517, 3516, 3515, 3514, 3513, 3512, 3511, 3510, 3509,
3508, 3507, 3506, 3505, 3504, 3503, 3502, 3501, 3500, 3499, 3498, 3497, 3496, 3495,
3494, 3493, 3492, 3491, 3490, 3489, 3488, 3487, 3486, 3485, 3484, 3483, 3482, 3481,
3480, 3479, 3478, 3477, 3476, 3475, 3474, 3473, 3472, 3471, 3470, 3469, 3468, 3467,
3466, 3465, 3464, 3463, 3462, 3461, 3460, 3459, 3458, 3457, 3456, 3455, 3454, 3453,
3452, 3451, 3450, 3449, 3448, 3447, 3446, 3445, 3444, 3443, 3442, 3441, 3440, 3439,
3438, 3437, 3436, 3435, 3434, 3433, 3432, 3431, 3430, 3429, 3428, 3427, 3426, 3425,
3424, 3423, 3422, 3421, 3420, 3419, 3418, 3417, 3416, 3415, 3414, 3413, 3412, 3411,
3410, 3409, 3408, 3407, 3406, 3405, 3404, 3403, 3402, 3401, 3400, 3399, 3398, 3397,
3396, 3395, 3394, 3393, 3392, 3391, 3390, 3389, 3388, 3387, 3386, 3385, 3384, 3383,
3382, 3381, 3380, 3379, 3378, 3377, 3376, 3375, 3374, 3373, 3372, 3371, 3370, 3369,
3368, 3367, 3366, 3365, 3364, 3363, 3362, 3361, 3360, 3359, 3358, 3357, 3356, 3355,
3354, 3353, 3352, 3351, 3350, 3349, 3348, 3347, 3346, 3345, 3344, 3343, 3342, 3341,
3340, 3339, 3338, 3337, 3336, 3335, 3334, 3333, 3332, 3331, 3330, 3329, 3328, 3327,
3326, 3325, 3324, 3323, 3322, 3321, 3320, 3319, 3318, 3317, 3316, 3315, 3314, 3313,
3312, 3311, 3310, 3309, 3308, 3307, 3306, 3305, 3304, 3303, 3302, 3301, 3300, 3299,
3298, 3297, 3296, 3295, 3294, 3293, 3292, 3291, 3290, 3289, 3288, 3287, 3286, 3285,
3284, 3283, 3282, 3281, 3280, 3279, 3278, 3277, 3276, 3275, 3274, 3273, 3272, 3271,
3270, 3269, 3268, 3267, 3266, 3265, 3264, 3263, 3262, 3261, 3260, 3259, 3258, 3257,
3256, 3255, 3254, 3253, 3252, 3251, 3250, 3249, 3248, 3247, 3246, 3245, 3244, 3243,
3242, 3241, 3240, 3239, 3238, 3237, 3236, 3235, 3234, 3233, 3232, 3231, 3230, 3229,
3228, 3227, 3226, 3225, 3224, 3223, 3222, 3221, 3220, 3219, 3218, 3217, 3216, 3215,
3214, 3213, 3212, 3211, 3210, 3209, 3208, 3207, 3206, 3205, 3204, 3203, 3202, 3201,
3200, 3199, 3198, 3197, 3196, 3195, 3194, 3193, 3192, 3191, 3190, 3189, 3188, 3187,
3186, 3185, 3184, 3183, 3182, 3181, 3180, 3179, 3178, 3177, 3176, 3175, 3174, 3173,
3172, 3171, 3170, 3169, 3168, 3167, 3166, 3165, 3164, 3163, 3162, 3161, 3160, 3159,
3158, 3157, 3156, 3155, 3154, 3153, 3152, 3151, 3150, 3149, 3148, 3147, 3146, 3145,
3144, 3143, 3142, 3141, 3140, 3139, 3138, 3137, 3136, 3135, 3134, 3133, 3132, 3131,
3130, 3129, 3128, 3127, 3126, 3125, 3124, 3123, 3122, 3121, 3120, 3119, 3118, 3117,
3116, 3115, 3114, 3113, 3112, 3111, 3110, 3109, 3108, 3107, 3106, 3105, 3104, 3103,
3102, 3101, 3100, 3099, 3098, 3097, 3096, 3095, 3094, 3093, 3092, 3091, 3090, 3089,
3088, 3087, 3086, 3085, 3084, 3083, 3082, 3081, 3080, 3079, 3078, 3077, 3076, 3075,
3074, 3073, 3072, 3071, 3070, 3069, 3068, 3067, 3066, 3065, 3064, 3063, 3062, 3061,
3060, 3059, 3058, 3057, 3056, 3055, 3054, 3053, 3052, 3051, 3050, 3049, 3048, 3047,
3046, 3045, 3044, 3043, 3042, 3041, 3040, 3039, 3038, 3037, 3036, 3035, 3034, 3033,
3032, 3031, 3030, 3029, 3028, 3027, 3026, 3025, 3024, 3023, 3022, 3021, 3020, 3019,
3018, 3017, 3016, 3015, 3014, 3013, 3012, 3011, 3010, 3009, 3008, 3007, 3006, 3005, TABLE 3-continued 3004, 3003, 3002, 3001, 3000, 2999, 2998, 2997, 2996, 2995, 2994, 2993, 2992, 2991,
2990, 2989, 2988, 2987, 2986, 2985, 2984, 2983, 2982, 2981, 2980, 2979, 2978, 2977,
2976, 2975, 2974, 2973, 2972, 2971, 2970, 2969, 2968, 2967, 2966, 2965, 2964, 2963,
2962, 2961, 2960, 2959, 2958, 2957, 2956, 2955, 2954, 2953, 2952, 2951, 2950, 2949,
2948, 2947, 2946, 2945, 2944, 2943, 2942, 2941, 2940, 2939, 2938, 2937, 2936, 2935,
2934, 2933, 2932, 2931, 2930, 2929, 2928, 2927, 2926, 2925, 2924, 2923, 2922, 2921,
2920, 2919, 2918, 2917, 2916, 2915, 2914, 2913, 2912, 2911, 2910, 2909, 2908, 2907,
2906, 2905, 2904, 2903, 2902, 2901, 2900, 2899, 2898, 2897, 2896, 2895, 2894, 2893,
2892, 2891, 2890, 2889, 2888, 2887, 2886, 2885, 2884, 2883, 2882, 2881, 2880, 2879,
2878, 2877, 2876, 2875, 2874, 2873, 2872, 2871, 2870, 2869, 2868, 2867, 2866, 2865,
2864, 2863, 2862, 2861, 2860, 2859, 2858, 2857, 2856, 2855, 2854, 2853, 2852, 2851,
2850, 2849, 2848, 2847, 2846, 2845, 2844, 2843, 2842, 2841, 2840, 2839, 2838, 2837,
2836, 2835, 2834, 2833, 2832, 2831, 2830, 2829, 2828, 2827, 2826, 2825, 2824, 2823,
2822, 2821, 2820, 2819, 2818, 2817, 2816, 2815, 2814, 2813, 2812, 2811, 2810, 2809,
2808, 2807, 2806, 2805, 2804, 2803, 2802, 2801, 2800, 2799, 2798, 2797, 2796, 2795,
2794, 2793, 2792, 2791, 2790, 2789, 2788, 2787, 2786, 2785, 2784, 2783, 2782, 2781,
2780, 2779, 2778, 2777, 2776, 2775, 2774, 2773, 2772, 2771, 2770, 2769, 2768, 2767,
2766, 2765, 2764, 2763, 2762, 2761, 2760, 2759, 2758, 2757, 2756, 2755, 2754, 2753,
2752, 2751, 2750, 2749, 2748, 2747, 2746, 2745, 2744, 2743, 2742, 2741, 2740, 2739,
2738, 2737, 2736, 2735, 2734, 2733, 2732, 2731, 2730, 2729, 2728, 2727, 2726, 2725,
2724, 2723, 2722, 2721, 2720, 2719, 2718, 2717, 2716, 2715, 2714, 2713, 2712, 2711,
2710, 2709, 2708, 2707, 2706, 2705, 2704, 2703, 2702, 2701, 2700, 2699, 2698, 2697,
2696, 2695, 2694, 2693, 2692, 2691, 2690, 2689, 2688, 2687, 2686, 2685, 2684, 2683,
2682, 2681, 2680, 2679, 2678, 2677, 2676, 2675, 2674, 2673, 2672, 2671, 2670, 2669,
2668, 2667, 2666, 2665, 2664, 2663, 2662, 2661, 2660, 2659, 2658, 2657, 2656, 2655,
2654, 2653, 2652, 2651, 2650, 2649, 2648, 2647, 2646, 2645, 2644, 2643, 2642, 2641,
2640, 2639, 2638, 2637, 2636, 2635, 2634, 2633, 2632, 2631, 2630, 2629, 2628, 2627,
2626, 2625, 2624, 2623, 2622, 2621, 2620, 2619, 2618, 2617, 2616, 2615, 2614, 2613,
2612, 2611, 2610, 2609, 2608, 2607, 2606, 2605, 2604, 2603, 2602, 2601, 2600, 2599,
2598, 2597, 2596, 2595, 2594, 2593, 2592, 2591, 2590, 2589, 2588, 2587, 2586, 2585,
2584, 2583, 2582, 2581, 2580, 2579, 2578, 2577, 2576, 2575, 2574, 2573, 2572, 2571,
2570, 2569, 2568, 2567, 2566, 2565, 2564, 2563, 2562, 2561, 2560, 2559, 2558, 2557,
2556, 2555, 2554, 2553, 2552, 2551, 2550, 2549, 2548, 2547, 2546, 2545, 2544, 2543,
2542, 2541, 2540, 2539, 2538, 2537, 2536, 2535, 2534, 2533, 2532, 2531, 2530, 2529,
2528, 2527, 2526, 2525, 2524, 2523, 2522, 2521, 2520, 2519, 2518, 2517, 2516, 2515,
2514, 2513, 2512, 2511, 2510, 2509, 2508, 2507, 2506, 2505, 2504, 2503, 2502, 2501,
2500, 2499, 2498, 2497, 2496, 2495, 2494, 2493, 2492, 2491, 2490, 2489, 2488, 2487,
2486, 2485, 2484, 2483, 2482, 2481, 2480, 2479, 2478, 2477, 2476, 2475, 2474, 2473,
2472, 2471, 2470, 2469, 2468, 2467, 2466, 2465, 2464, 2463, 2462, 2461, 2460, 2459,
2458, 2457, 2456, 2455, 2454, 2453, 2452, 2451, 2450, 2449, 2448, 2447, 2446, 2445,
2444, 2443, 2442, 2441, 2440, 2439, 2438, 2437, 2436, 2435, 2434, 2433, 2432, 2431,
2430, 2429, 2428, 2427, 2426, 2425, 2424, 2423, 2422, 2421, 2420, 2419, 2418, 2417,
2416, 2415, 2414, 2413, 2412, 2411, 2410, 2409, 2408, 2407, 2406, 2405, 2404, 2403,
2402, 2401

TABLE 4

M = 48, N = 64
63, 62, 61, 59, 58, 55, 54, 47, 46, 31, 30, 57, 53, 51, 50, 45, 43, 42, 39, 29,
27, 38, 26, 23, 22, 15, 14, 49, 41, 37, 25, 35, 21, 34, 19, 13, 18, 11, 10, 7, 6, 33, 17, 9,
5, 3, 2, 1, 4, 8, 12, 16, 20, 24, 28, 32, 36, 40, 44, 48, 52, 56, 60, 64
M = 72, N = 128
127, 125, 123, 119, 111, 95, 63, 121, 114, 117, 115, 109, 107, 93, 103, 91,
61, 87, 59, 113, 79, 55, 105, 47, 101, 89, 99, 31, 85, 98, 57, 83, 77, 82, 53, 75, 51, 45,
71, 50, 43, 97, 29, 39, 27, 81, 23, 73, 49, 15, 69, 41, 67, 66, 37, 25, 35, 21, 34, 19, 13,
18, 11, 65, 7, 33, 17, 9, 5, 3, 2, 1, 4, 6, 8, 10, 12, 14, 16, 20, 22, 24, 26, 28, 30, 32, 36,
38, 40, 42, 44, 46, 48, 52, 54, 56, 58, 60, 62, 64, 68, 70, 72, 74, 76, 78, 80, 84, 86, 88,
90, 92, 94, 96, 100, 102, 104, 106, 108, 110, 112, 116, 118, 120, 122, 124, 126, 128
M = 96, N = 128
127, 126, 125, 123, 122, 119, 118, 111, 110, 95, 94, 63, 121, 62, 117, 115,
114, 109, 107, 106, 103, 93, 91, 102, 90, 87, 86, 61, 59, 79, 58, 78, 55, 54, 113, 47, 46,
105, 101, 31, 99, 89, 30, 98, 85, 83, 82, 57, 77, 75, 53, 51, 74, 71, 50, 45, 70, 43, 42,
39, 97, 29, 27, 81, 38, 26, 23, 73, 22, 49, 15, 69, 14, 41, 67, 66, 37, 25, 35, 21, 34, 19,
13, 18, 11, 65, 10, 7, 6, 33, 17, 9, 5, 3, 2, 1, 4, 8, 12, 16, 20, 24, 28, 32, 36, 40, 44, 48,
52, 56, 60, 64, 68, 72, 76, 80, 84, 88, 92, 96, 100, 104, 108, 112, 116, 120, 124, 128
M = 120, N = 128
127, 126, 124, 120, 125, 123, 122, 119, 111, 118, 110, 116, 95, 108, 94,
104, 121, 63, 92, 117, 62, 88, 115, 109, 60, 114, 107, 56, 106, 93, 103, 91, 102, 90, 61,
87, 100, 79, 86, 59, 113, 78, 58, 84, 55, 105, 47, 76, 54, 101, 46, 52, 72, 89, 31, 99, 44,
85, 30, 98, 83, 40, 77, 57, 28, 82, 75, 53, 24, 74, 51, 45, 71, 50, 43, 70, 42, 29, 68, 39,
97, 27, 38, 26, 81, 23, 36, 15, 22, 73, 14, 20, 49, 69, 41, 12, 67, 37, 66, 25, 8, 35, 21,
34, 19, 13, 18, 11, 65, 10, 7, 6, 33, 4, 17, 9, 5, 3, 2, 1, 16, 32, 48, 64, 80, 96, 112, 128
M = 144, N = 256
223, 239, 191, 247, 251, 127, 253, 255, 249, 242, 245, 243, 237, 235, 231,
221, 219, 215, 189, 187, 241, 207, 183, 125, 233, 123, 175, 229, 217, 119, 227, 159,
213, 226, 111, 185, 211, 205, 210, 181, 95, 203, 179, 121, 173, 199, 178, 63, 117, 171,
225, 157, 115, 167, 109, 155, 114, 209, 107, 151, 93, 201, 103, 177, 91, 143, 197, 61,

TABLE 4-continued 87, 169, 195, 59, 113, 194, 165, 79, 153, 55, 163, 105, 149, 162, 47, 101, 147, 89, 141,
99, 146, 31, 85, 139, 98, 193, 57, 83, 135, 77, 82, 53, 161, 75, 51, 45, 71, 50, 145, 43,
97, 29, 137, 39, 27, 81, 133, 23, 131, 73, 49, 130, 15, 69, 41, 67, 66, 37, 25, 35, 21, 34,
129, 19, 13, 18, 11, 65, 7, 33, 17, 9, 5, 3, 2, 1, 4, 6, 8, 10, 12, 14, 16, 20, 22, 24, 26, 28,
30, 32, 36, 38, 40, 42, 44, 46, 48, 52, 54, 56, 58, 60, 62, 64, 68, 70, 72, 74, 76, 78, 80,
84, 86, 88, 90, 92, 94, 96, 100, 102, 104, 106, 108, 110, 112, 116, 118, 120, 122, 124,
126, 128, 132, 134, 136, 138, 140, 142, 144, 148, 150, 152, 154, 156, 158, 160, 164,
166, 168, 170, 172, 174, 176, 180, 182, 184, 186, 188, 190, 192, 196, 198, 200, 202,
204, 206, 208, 212, 214, 216, 218, 220, 222, 224, 228, 230, 232, 234, 236, 238, 240,
244, 246, 248, 250, 252, 254, 256
M = 160, N = 256
247, 250, 251, 239, 253, 255, 223, 191, 127, 249, 245, 242, 243, 237, 234,
235, 231, 221, 218, 219, 215, 189, 207, 186, 187, 183, 175, 125, 122, 123, 119, 159,
111, 241, 233, 95, 229, 226, 227, 217, 213, 210, 211, 205, 185, 202, 203, 181, 179,
121, 173, 199, 178, 63, 117, 171, 225, 157, 170, 115, 167, 109, 155, 114, 209, 107,
154, 151, 93, 106, 201, 103, 177, 91, 143, 197, 90, 61, 87, 169, 195, 59, 113, 194, 165,
79, 58, 153, 55, 163, 105, 149, 162, 47, 101, 147, 89, 141, 99, 146, 31, 85, 139, 98,
193, 57, 138, 83, 135, 77, 82, 53, 161, 75, 51, 74, 45, 71, 50, 145, 43, 97, 29, 42, 137,
39, 27, 81, 133, 26, 23, 131, 73, 49, 130, 15, 69, 41, 67, 66, 37, 25, 35, 21, 34, 129, 19,
13, 18, 11, 65, 10, 7, 33, 17, 9, 5, 3, 2, 1, 4, 6, 8, 12, 14, 16, 20, 22, 24, 28, 30, 32, 36,
38, 40, 44, 46, 48, 52, 54, 56, 60, 62, 64, 68, 70, 72, 76, 78, 80, 84, 86, 88, 92, 94, 96,
100, 102, 104, 108, 110, 112, 116, 118, 120, 124, 126, 128, 132, 134, 136, 140, 142,
144, 148, 150, 152, 156, 158, 160, 164, 166, 168, 172, 174, 176, 180, 182, 184, 188,
190, 192, 196, 198, 200, 204, 206, 208, 212, 214, 216, 220, 222, 224, 228, 230, 232,
236, 238, 240, 244, 246, 248, 252, 254, 256
M = 180, N = 256
255, 253, 250, 251, 247, 246, 239, 223, 191, 249, 245, 127, 243, 242, 237,
234, 235, 231, 230, 221, 218, 219, 215, 214, 189, 206, 186, 187, 207, 183, 182, 175,
125, 122, 123, 119, 118, 241, 159, 233, 111, 229, 227, 217, 226, 213, 211, 95, 210,
205, 185, 203, 202, 181, 179, 199, 178, 173, 198, 63, 170, 171, 121, 167, 166, 157,
117, 115, 154, 155, 114, 109, 106, 107, 151, 150, 103, 102, 93, 142, 143, 90, 91, 87,
86, 61, 78, 58, 225, 209, 201, 177, 197, 169, 195, 59, 113, 194, 165, 79, 153, 55, 163,
105, 54, 149, 162, 47, 101, 147, 89, 141, 99, 146, 31, 85, 139, 98, 193, 57, 138, 83,
135, 77, 82, 53, 134, 161, 75, 51, 74, 45, 71, 50, 145, 43, 70, 97, 29, 42, 137, 39, 27,
81, 38, 133, 26, 23, 131, 73, 22, 49, 130, 15, 69, 14, 41, 67, 66, 37, 25, 35, 21, 34, 129,
19, 13, 18, 11, 65, 10, 7, 6, 33, 17, 9, 5, 3, 2, 1, 4, 8, 12, 16, 20, 24, 28, 30, 32, 36, 40,
44, 46, 48, 52, 56, 60, 62, 64, 68, 72, 76, 80, 84, 88, 92, 94, 96, 100, 104, 108, 110,
112, 116, 120, 124, 126, 128, 132, 136, 140, 144, 148, 152, 156, 158, 160, 164, 168,
172, 174, 176, 180, 184, 188, 190, 192, 196, 200, 204, 208, 212, 216, 220, 222, 224,
228, 232, 236, 238, 240, 244, 248, 252, 254, 256
M = 192, N = 256
254, 255, 253, 251, 250, 247, 246, 239, 238, 223, 222, 191, 190, 249, 245,
243, 127, 242, 126, 237, 235, 234, 231, 221, 230, 219, 218, 215, 214, 189, 187, 207,
186, 206, 183, 182, 175, 125, 123, 174, 241, 122, 119, 233, 159, 118, 229, 158, 227,
111, 217, 110, 226, 213, 211, 210, 95, 205, 185, 203, 94, 181, 179, 202, 199, 178, 173,
63, 198, 171, 62, 121, 170, 167, 117, 115, 157, 155, 166, 114, 154, 109, 107, 151, 106,
150, 103, 93, 91, 143, 102, 225, 90, 142, 87, 86, 209, 61, 59, 79, 201, 58, 78, 55, 177,
197, 54, 195, 47, 169, 194, 46, 165, 163, 153, 113, 105, 149, 162, 101, 147, 89, 141,
99, 146, 31, 85, 139, 98, 193, 30, 57, 138, 83, 135, 77, 82, 53, 134, 161, 75, 51, 74, 45,
71, 50, 145, 43, 70, 97, 29, 42, 137, 39, 27, 81, 38, 133, 26, 23, 131, 73, 22, 49, 130,
15, 69, 14, 41, 67, 66, 37, 25, 35, 21, 34, 129, 19, 13, 18, 11, 65, 10, 7, 6, 33, 17, 9, 5,
3, 2, 1, 4, 8, 12, 16, 20, 24, 28, 32, 36, 40, 44, 48, 52, 56, 60, 64, 68, 72, 76, 80, 84, 88,
92, 96, 100, 104, 108, 112, 116, 120, 124, 128, 132, 136, 140, 144, 148, 152, 156, 160,
164, 168, 172, 176, 180, 184, 188, 192, 196, 200, 204, 208, 212, 216, 220, 224, 228,
232, 236, 240, 244, 248, 252, 256
M = 240, N = 256
255, 254, 252, 248, 253, 251, 250, 247, 246, 239, 244, 238, 223, 236, 222,
232, 220, 191, 249, 190, 245, 216, 243, 237, 188, 127, 242, 235, 126, 184, 234, 221,
231, 124, 219, 230, 218, 215, 189, 228, 120, 207, 214, 187, 206, 186, 212, 241, 183,
125, 204, 175, 182, 233, 123, 174, 229, 180, 200, 122, 217, 159, 119, 227, 172, 213,
118, 111, 158, 226, 211, 168, 110, 116, 205, 185, 156, 210, 95, 203, 108, 181, 152, 94,
202, 179, 173, 199, 104, 121, 178, 63, 92, 171, 198, 117, 62, 170, 157, 196, 88, 167,
115, 109, 155, 225, 60, 166, 114, 154, 107, 151, 164, 209, 56, 106, 93, 143, 150, 103,
201, 91, 102, 142, 148, 177, 90, 197, 87, 61, 100, 140, 169, 79, 86, 195, 59, 165, 78,
194, 58, 84, 136, 113, 153, 55, 163, 76, 47, 54, 105, 149, 162, 46, 101, 52, 147, 72,
141, 89, 31, 99, 44, 146, 139, 85, 30, 98, 138, 40, 83, 135, 77, 28, 57, 82, 134, 75, 53,
24, 74, 193, 51, 132, 45, 71, 50, 43, 70, 161, 42, 29, 145, 68, 39, 27, 97, 137, 81, 38,
133, 26, 23, 36, 131, 73, 22, 49, 130, 15, 69, 20, 14, 41, 67, 12, 66, 37, 25, 8, 35, 21,
34, 129, 19, 13, 18, 11, 65, 10, 7, 6, 33, 4, 17, 9, 5, 3, 2, 1, 16, 32, 48, 64, 80, 96, 112,
128, 144, 160, 176, 192, 208, 224, 240, 256
M = 288, N = 512
383, 255, 447, 443, 445, 439, 463, 431, 471, 381, 379, 475, 477, 375, 415,
367, 479, 487, 491, 493, 495, 498, 499, 501, 351, 511, 509, 507, 503, 505, 497, 489,
485, 473, 483, 253, 469, 482, 251, 441, 467, 461, 466, 247, 437, 459, 435, 377, 239,
429, 455, 434, 319, 373, 427, 481, 223, 413, 371, 423, 365, 249, 411, 370, 465, 363,
191, 245, 407, 349, 457, 359, 243, 433, 347, 237, 399, 453, 242, 127, 317, 235, 343,
425, 451, 221, 315, 369, 450, 231, 421, 335, 219, 409, 311, 419, 361, 189, 215, 405,
418, 303, 357, 187, 241, 403, 345, 207, 397, 355, 402, 183, 125, 287, 233, 341, 395,
354, 449, 123, 313, 175, 339, 229, 391, 333, 217, 338, 119, 309, 227, 417, 331, 159,
213, 226, 307, 111, 301, 327, 185, 211, 306, 401, 205, 299, 353, 210, 181, 95, 285, TABLE 4-continued 203, 393, 295, 179, 121, 283, 173, 337, 199, 389, 178, 63, 117, 171, 279, 225, 387,
329, 157, 115, 305, 386, 167, 109, 271, 325, 155, 114, 209, 107, 297, 323, 151, 93,
201, 322, 103, 293, 177, 91, 281, 143, 197, 291, 61, 87, 169, 277, 195, 290, 385, 59,
113, 194, 275, 165, 79, 269, 153, 274, 55, 163, 105, 267, 321, 149, 162, 47, 101, 263,
147, 89, 141, 99, 289, 146, 31, 85, 139, 98, 193, 57, 83, 273, 135, 77, 82, 53, 161, 75,
265, 51, 45, 71, 261, 50, 145, 43, 97, 259, 29, 137, 258, 39, 27, 81, 133, 23, 131, 73,
49, 130, 15, 69, 41, 67, 257, 66, 37, 25, 35, 21, 34, 129, 19, 13, 18, 11, 65, 7, 33, 17, 9,
5, 3, 2, 1, 4, 6, 8, 10, 12, 14, 16, 20, 22, 24, 26, 28, 30, 32, 36, 38, 40, 42, 44, 46, 48,
52, 54, 56, 58, 60, 62, 64, 68, 70, 72, 74, 76, 78, 80, 84, 86, 88, 90, 92, 94, 96, 100,
102, 104, 106, 108, 110, 112, 116, 118, 120, 122, 124, 126, 128, 132, 134, 136, 138,
140, 142, 144, 148, 150, 152, 154, 156, 158, 160, 164, 166, 168, 170, 172, 174, 176,
180, 182, 184, 186, 188, 190, 192, 196, 198, 200, 202, 204, 206, 208, 212, 214, 216,
218, 220, 222, 224, 228, 230, 232, 234, 236, 238, 240, 244, 246, 248, 250, 252, 254,
256, 260, 262, 264, 266, 268, 270, 272, 276, 278, 280, 282, 284, 286, 288, 292, 294,
296, 298, 300, 302, 304, 308, 310, 312, 314, 316, 318, 320, 324, 326, 328, 330, 332,
334, 336, 340, 342, 344, 346, 348, 350, 352, 356, 358, 360, 362, 364, 366, 368, 372,
374, 376, 378, 380, 382, 384, 388, 390, 392, 394, 396, 398, 400, 404, 406, 408, 410,
412, 414, 416, 420, 422, 424, 426, 428, 430, 432, 436, 438, 440, 442, 444, 446, 448,
452, 454, 456, 458, 460, 462, 464, 468, 470, 472, 474, 476, 478, 480, 484, 486, 488,
490, 492, 494, 496, 500, 502, 504, 506, 508, 510, 512

M = 300, N = 512

383, 255, 447, 471, 475, 445, 463, 477, 443, 479, 439, 487, 491, 431, 493,
495, 379, 381, 415, 375, 498, 499, 501, 367, 503, 505, 507, 351, 253, 509, 251, 247,
511, 239, 319, 497, 223, 489, 482, 485, 473, 483, 466, 469, 458, 467, 461, 441, 191,
459, 434, 437, 435, 377, 429, 455, 373, 427, 481, 413, 426, 371, 423, 365, 249, 411,
370, 465, 363, 245, 407, 349, 457, 359, 243, 433, 347, 237, 399, 453, 242, 127, 317,
235, 343, 425, 451, 221, 315, 369, 450, 231, 421, 335, 219, 409, 311, 419, 361, 189,
215, 405, 418, 303, 357, 187, 241, 403, 345, 207, 397, 355, 402, 183, 125, 287, 233,
341, 395, 354, 449, 123, 313, 394, 175, 339, 229, 391, 333, 217, 338, 119, 309, 227,
417, 331, 159, 213, 226, 307, 330, 111, 301, 327, 185, 211, 306, 401, 205, 299, 353,
210, 181, 95, 285, 203, 298, 393, 295, 179, 121, 202, 283, 173, 337, 199, 389, 178, 63,
117, 171, 279, 225, 387, 329, 157, 170, 115, 305, 386, 167, 109, 271, 325, 155, 114,
209, 107, 297, 323, 151, 93, 201, 322, 103, 293, 177, 91, 281, 143, 197, 291, 61, 87,
169, 277, 195, 290, 385, 59, 113, 194, 275, 165, 79, 269, 153, 274, 55, 163, 105, 267,
321, 149, 162, 266, 47, 101, 263, 147, 89, 141, 99, 289, 146, 31, 85, 139, 98, 193, 57,
138, 83, 273, 135, 77, 82, 53, 161, 75, 265, 51, 74, 45, 71, 261, 50, 145, 43, 97, 259,
29, 42, 137, 258, 39, 27, 81, 133, 23, 131, 73, 49, 130, 15, 69, 41, 67, 257, 66, 37, 25,
35, 21, 34, 129, 19, 13, 18, 11, 65, 10, 7, 33, 17, 9, 5, 3, 2, 1, 4, 6, 8, 12, 14, 16, 20, 22,
24, 26, 28, 30, 32, 36, 38, 40, 44, 46, 48, 52, 54, 56, 58, 60, 62, 64, 68, 70, 72, 76, 78,
80, 84, 86, 88, 90, 92, 94, 96, 100, 102, 104, 106, 108, 110, 112, 116, 118, 120, 122,
124, 126, 128, 132, 134, 136, 140, 142, 144, 148, 150, 152, 154, 156, 158, 160, 164,
166, 168, 172, 174, 176, 180, 182, 184, 186, 188, 190, 192, 196, 198, 200, 204, 206,
208, 212, 214, 216, 218, 220, 222, 224, 228, 230, 232, 234, 236, 238, 240, 244, 246,
248, 250, 252, 254, 256, 260, 262, 264, 268, 270, 272, 276, 278, 280, 282, 284, 286,
288, 292, 294, 296, 300, 302, 304, 308, 310, 312, 314, 316, 318, 320, 324, 326, 328,
332, 334, 336, 340, 342, 344, 346, 348, 350, 352, 356, 358, 360, 362, 364, 366, 368,
372, 374, 376, 378, 380, 382, 384, 388, 390, 392, 396, 398, 400, 404, 406, 408, 410,
412, 414, 416, 420, 422, 424, 428, 430, 432, 436, 438, 440, 442, 444, 446, 448, 452,
454, 456, 460, 462, 464, 468, 470, 472, 474, 476, 478, 480, 484, 486, 488, 490, 492,
494, 496, 500, 502, 504, 506, 508, 510, 512

M = 360, N = 512

479, 447, 495, 502, 503, 506, 507, 509, 511, 383, 505, 501, 499, 498, 493,
490, 491, 487, 255, 486, 477, 474, 475, 471, 470, 462, 445, 463, 442, 443, 439, 438,
431, 381, 378, 379, 375, 374, 415, 367, 497, 253, 489, 250, 251, 351, 485, 247, 246,
483, 473, 482, 469, 467, 239, 466, 461, 441, 459, 319, 458, 437, 435, 455, 434, 429,
454, 223, 426, 427, 377, 423, 422, 413, 373, 410, 411, 371, 370, 365, 191, 407, 362,
363, 406, 359, 358, 349, 398, 399, 346, 347, 249, 245, 343, 243, 342, 127, 242, 237,
317, 234, 235, 334, 314, 315, 335, 231, 230, 221, 311, 310, 481, 218, 219, 465, 457,
214, 215, 303, 433, 189, 453, 206, 451, 425, 186, 187, 207, 450, 421, 183, 182, 287,
419, 409, 369, 418, 175, 405, 125, 361, 403, 122, 123, 402, 357, 397, 119, 118, 355,
345, 395, 159, 354, 394, 341, 339, 391, 111, 241, 338, 390, 333, 233, 313, 331, 330,
229, 309, 307, 227, 449, 217, 417, 213, 226, 301, 327, 185, 211, 306, 401, 205, 299,
326, 353, 210, 181, 95, 285, 203, 298, 393, 295, 179, 121, 202, 283, 173, 337, 199,
294, 389, 178, 282, 63, 117, 171, 198, 279, 225, 387, 329, 157, 170, 278, 115, 305,
386, 167, 109, 271, 325, 155, 114, 209, 166, 270, 107, 297, 154, 323, 151, 93, 106,
201, 322, 103, 293, 150, 177, 91, 281, 143, 102, 197, 291, 90, 61, 142, 87, 169, 277,
195, 290, 385, 59, 86, 113, 194, 275, 165, 79, 269, 58, 153, 274, 55, 163, 78, 105, 267,
321, 54, 149, 162, 266, 47, 101, 263, 147, 89, 141, 262, 99, 289, 146, 31, 85, 139, 98,
193, 57, 138, 83, 273, 135, 77, 82, 53, 134, 161, 75, 265, 51, 74, 45, 71, 261, 50, 145,
43, 70, 97, 259, 29, 42, 137, 258, 39, 27, 81, 38, 133, 26, 23, 131, 73, 22, 49, 130, 15,
69, 14, 41, 67, 257, 66, 37, 25, 35, 21, 34, 129, 19, 13, 18, 11, 65, 10, 7, 6, 33, 17, 9, 5,
3, 2, 1, 4, 8, 12, 16, 20, 24, 28, 30, 32, 36, 40, 44, 46, 48, 52, 56, 60, 62, 64, 68, 72, 76,
80, 84, 88, 92, 94, 96, 100, 104, 108, 110, 112, 116, 120, 124, 126, 128, 132, 136, 140,
144, 148, 152, 156, 158, 160, 164, 168, 172, 174, 176, 180, 184, 188, 190, 192, 196,
200, 204, 208, 212, 216, 220, 222, 224, 228, 232, 236, 238, 240, 244, 248, 252, 254,
256, 260, 264, 268, 272, 276, 280, 284, 286, 288, 292, 296, 300, 302, 304, 308, 312,
316, 318, 320, 324, 328, 332, 336, 340, 344, 348, 350, 352, 356, 360, 364, 366, 368,
372, 376, 380, 382, 384, 388, 392, 396, 400, 404, 408, 412, 414, 416, 420, 424, 428,
430, 432, 436, 440, 444, 446, 448, 452, 456, 460, 464, 468, 472, 476, 478, 480, 484,
488, 492, 494, 496, 500, 504, 508, 510, 512

TABLE 4-continued

M = 384, N = 512
495, 494, 502, 503, 506, 507, 509, 510, 479, 478, 511, 447, 446, 383, 382,
505, 501, 499, 498, 493, 491, 490, 487, 486, 477, 475, 255, 474, 254, 471, 470, 445,
463, 443, 462, 442, 439, 438, 431, 430, 381, 379, 378, 375, 415, 374, 414, 367, 497,
366, 489, 253, 251, 485, 483, 473, 250, 351, 482, 247, 350, 469, 467, 246, 466, 461,
441, 239, 459, 238, 437, 458, 435, 319, 455, 318, 434, 429, 454, 427, 223, 426, 222,
377, 423, 373, 413, 371, 422, 411, 370, 410, 365, 363, 407, 191, 362, 406, 190, 359,
349, 249, 399, 358, 347, 245, 398, 346, 243, 343, 242, 127, 342, 237, 235, 481, 126,
317, 315, 234, 335, 465, 231, 314, 334, 221, 311, 230, 219, 457, 310, 218, 433, 215,
453, 451, 303, 425, 214, 450, 302, 189, 187, 421, 207, 419, 409, 186, 369, 206, 183,
287, 418, 405, 182, 361, 403, 286, 357, 402, 355, 175, 125, 397, 123, 174, 345, 395,
354, 122, 341, 119, 394, 339, 241, 391, 159, 118, 338, 233, 333, 158, 390, 111, 313,
331, 229, 110, 309, 227, 330, 307, 217, 327, 226, 306, 213, 301, 95, 326, 211, 299, 94,
298, 210, 205, 185, 295, 203, 285, 181, 294, 283, 202, 179, 199, 449, 417, 401, 353,
393, 121, 173, 337, 389, 178, 282, 63, 117, 171, 198, 279, 225, 387, 329, 62, 157, 170,
278, 115, 305, 386, 167, 109, 271, 325, 155, 114, 209, 166, 270, 107, 297, 154, 323,
151, 93, 106, 201, 322, 103, 293, 150, 177, 91, 281, 143, 102, 197, 291, 90, 61, 142,
87, 169, 277, 195, 290, 385, 59, 86, 113, 194, 275, 165, 79, 269, 58, 153, 274, 55, 163,
78, 105, 267, 321, 54, 149, 162, 266, 47, 101, 263, 147, 89, 46, 141, 262, 99, 289, 146,
31, 85, 139, 98, 193, 30, 57, 138, 83, 273, 135, 77, 82, 53, 134, 161, 75, 265, 51, 74,
45, 71, 261, 50, 145, 43, 70, 97, 259, 29, 42, 137, 258, 39, 27, 81, 38, 133, 26, 23, 131,
73, 22, 49, 130, 15, 69, 14, 41, 67, 257, 66, 37, 25, 35, 21, 34, 129, 19, 13, 18, 11, 65,
10, 7, 6, 33, 17, 9, 5, 3, 2, 1, 4, 8, 12, 16, 20, 24, 28, 32, 36, 40, 44, 48, 52, 56, 60, 64,
68, 72, 76, 80, 84, 88, 92, 96, 100, 104, 108, 112, 116, 120, 124, 128, 132, 136, 140,
144, 148, 152, 156, 160, 164, 168, 172, 176, 180, 184, 188, 192, 196, 200, 204, 208,
212, 216, 220, 224, 228, 232, 236, 240, 244, 248, 252, 256, 260, 264, 268, 272, 276,
280, 284, 288, 292, 296, 300, 304, 308, 312, 316, 320, 324, 328, 332, 336, 340, 344,
348, 352, 356, 360, 364, 368, 372, 376, 380, 384, 388, 392, 396, 400, 404, 408, 412,
416, 420, 424, 428, 432, 436, 440, 444, 448, 452, 456, 460, 464, 468, 472, 476, 480,
484, 488, 492, 496, 500, 504, 508, 512
M = 400, N = 512
510, 509, 507, 511, 506, 503, 502, 495, 494, 479, 478, 447, 446, 383, 382,
505, 501, 499, 498, 493, 491, 490, 487, 484, 477, 486, 475, 474, 255, 471, 254, 470,
445, 463, 443, 462, 442, 439, 438, 431, 430, 381, 379, 378, 375, 415, 374, 414, 497,
367, 489, 366, 485, 483, 253, 251, 473, 482, 250, 469, 351, 467, 247, 350, 246, 466,
461, 441, 459, 239, 437, 458, 435, 238, 455, 319, 434, 452, 429, 454, 427, 318, 223,
426, 377, 423, 222, 373, 420, 413, 371, 422, 411, 370, 410, 365, 363, 407, 191, 362,
406, 359, 190, 249, 349, 356, 347, 399, 358, 245, 243, 398, 346, 343, 481, 242, 237,
127, 342, 235, 465, 317, 126, 315, 234, 335, 231, 457, 314, 334, 221, 228, 311, 219,
230, 433, 453, 310, 451, 218, 425, 215, 303, 450, 421, 214, 419, 189, 302, 187, 409,
369, 207, 418, 186, 405, 361, 183, 206, 287, 403, 182, 357, 286, 402, 355, 397, 345,
395, 175, 125, 123, 354, 341, 174, 394, 339, 241, 122, 391, 119, 338, 233, 388, 333,
313, 390, 118, 159, 331, 158, 229, 309, 111, 330, 307, 227, 217, 110, 327, 306, 226,
213, 324, 301, 211, 326, 299, 95, 210, 298, 205, 185, 94, 203, 295, 285, 292, 181, 294,
283, 202, 179, 199, 282, 178, 63, 196, 173, 279, 198, 171, 62, 278, 449, 170, 121, 167,
417, 117, 271, 115, 164, 157, 155, 166, 401, 270, 114, 154, 109, 107, 353, 393, 337,
389, 225, 387, 329, 305, 386, 325, 209, 297, 323, 151, 93, 106, 201, 322, 103, 293,
150, 177, 91, 281, 143, 102, 197, 291, 90, 61, 142, 87, 169, 277, 100, 195, 290, 385,
59, 86, 113, 194, 275, 165, 79, 269, 58, 153, 274, 55, 163, 78, 105, 267, 321, 54, 149,
162, 266, 47, 101, 263, 147, 89, 46, 141, 262, 99, 289, 146, 31, 85, 139, 98, 193, 260,
30, 57, 138, 83, 273, 135, 77, 82, 53, 134, 161, 75, 265, 51, 132, 74, 45, 71, 261, 50,
145, 43, 70, 97, 259, 29, 42, 137, 68, 258, 39, 27, 81, 38, 133, 26, 23, 36, 131, 73, 22,
49, 130, 15, 69, 14, 41, 67, 257, 66, 37, 25, 35, 21, 34, 129, 19, 13, 18, 11, 65, 10, 7, 6,
33, 4, 17, 9, 5, 3, 2, 1, 8, 12, 16, 20, 24, 28, 32, 40, 44, 48, 52, 56, 60, 64, 72, 76, 80,
84, 88, 92, 96, 104, 108, 112, 116, 120, 124, 128, 136, 140, 144, 148, 152, 156, 160,
168, 172, 176, 180, 184, 188, 192, 200, 204, 208, 212, 216, 220, 224, 232, 236, 240,
244, 248, 252, 256, 264, 268, 272, 276, 280, 284, 288, 296, 300, 304, 308, 312, 316,
320, 328, 332, 336, 340, 344, 348, 352, 360, 364, 368, 372, 376, 380, 384, 392, 396,
400, 404, 408, 412, 416, 424, 428, 432, 436, 440, 444, 448, 456, 460, 464, 468, 472,
476, 480, 488, 492, 496, 500, 504, 508, 512
M = 480, N = 512
511, 510, 508, 504, 509, 507, 506, 503, 502, 495, 500, 494, 492, 479, 478,
488, 476, 447, 505, 446, 472, 501, 444, 499, 493, 383, 498, 491, 440, 382, 490, 477,
487, 380, 475, 486, 255, 474, 471, 484, 376, 254, 445, 470, 463, 443, 252, 468, 462,
442, 439, 497, 460, 438, 248, 381, 431, 489, 379, 430, 436, 456, 485, 378, 375, 415,
428, 473, 483, 374, 414, 367, 253, 469, 482, 424, 366, 372, 251, 467, 412, 461, 441,
250, 466, 351, 364, 459, 247, 437, 408, 350, 458, 246, 435, 239, 429, 360, 455, 434,
348, 319, 377, 238, 244, 427, 454, 318, 373, 426, 223, 413, 236, 344, 452, 423, 371,
222, 365, 411, 316, 422, 370, 481, 232, 410, 363, 220, 249, 191, 407, 420, 312, 362,
465, 349, 406, 399, 359, 190, 245, 216, 347, 457, 358, 398, 243, 404, 237, 188, 346,
127, 433, 242, 343, 453, 356, 317, 235, 396, 425, 126, 342, 335, 184, 315, 234, 451,
221, 231, 421, 334, 314, 340, 392, 124, 450, 219, 311, 230, 369, 409, 419, 218, 332,
310, 303, 361, 215, 228, 405, 189, 120, 418, 302, 214, 308, 207, 357, 187, 403, 328,
397, 345, 287, 206, 186, 212, 300, 355, 402, 395, 183, 241, 341, 286, 125, 354, 204,
182, 175, 394, 233, 296, 339, 391, 333, 123, 284, 313, 174, 180, 229, 338, 200, 122,
390, 331, 309, 217, 159, 119, 172, 227, 280, 330, 449, 307, 118, 111, 158, 388, 213,
301, 327, 226, 306, 168, 110, 211, 116, 299, 326, 205, 156, 185, 417, 210, 95, 298,
285, 108, 203, 181, 324, 295, 401, 152, 94, 283, 202, 179, 294, 173, 353, 199, 104,
282, 393, 178, 92, 121, 63, 171, 198, 279, 292, 337, 62, 117, 170, 278, 389, 271, 157,
88, 196, 167, 115, 329, 109, 155, 270, 60, 276, 387, 166, 114, 225, 154, 305, 107, 325,

TABLE 4-continued 386, 151, 268, 164, 56, 106, 93, 297, 209, 150, 143, 103, 323, 91, 102, 264, 201, 293,
142, 148, 322, 90, 281, 177, 87, 100, 291, 197, 61, 140, 277, 86, 169, 79, 59, 290, 195,
78, 275, 84, 58, 136, 165, 269, 55, 194, 153, 113, 274, 76, 163, 54, 47, 267, 105, 149,
162, 266, 46, 52, 72, 147, 101, 263, 141, 44, 31, 89, 146, 99, 262, 139, 30, 385, 85, 98,
40, 138, 260, 28, 83, 77, 135, 57, 82, 134, 75, 24, 53, 321, 74, 51, 289, 132, 45, 71,
193, 50, 273, 161, 265, 261, 145, 43, 70, 97, 259, 29, 42, 137, 68, 258, 39, 27, 81, 38,
133, 26, 23, 36, 131, 73, 22, 49, 130, 15, 69, 20, 14, 41, 67, 257, 12, 66, 37, 25, 8, 35,
21, 34, 129, 19, 13, 18, 11, 65, 10, 7, 6, 33, 4, 17, 9, 5, 3, 2, 1, 16, 32, 48, 64, 80, 96,
112, 128, 144, 160, 176, 192, 208, 224, 240, 256, 272, 288, 304, 320, 336, 352, 368,
384, 400, 416, 432, 448, 464, 480, 496, 512

M = 576, N = 1024

511, 759, 763, 765, 767, 751, 735, 509, 831, 507, 503, 703, 495, 863, 879,
479, 887, 891, 893, 889, 895, 1023, 1021, 1019, 1015, 1007, 991, 1017, 959, 1013,
1011, 1005, 1010, 1003, 989, 999, 987, 957, 983, 955, 1009, 975, 951, 1001, 943, 997,
985, 995, 927, 981, 994, 953, 979, 973, 978, 949, 971, 947, 941, 967, 946, 885, 939,
993, 925, 883, 935, 877, 761, 923, 882, 977, 875, 757, 919, 861, 969, 871, 755, 945,
859, 749, 911, 965, 754, 505, 639, 829, 747, 855, 937, 963, 733, 447, 827, 501, 881,
962, 743, 933, 847, 731, 921, 499, 823, 931, 493, 873, 701, 498, 727, 917, 930, 383,
491, 815, 869, 699, 753, 915, 477, 857, 719, 909, 487, 867, 914, 695, 475, 637, 799,
745, 853, 907, 866, 961, 255, 445, 635, 825, 471, 687, 851, 741, 903, 845, 729, 443,
850, 497, 631, 821, 739, 929, 463, 843, 671, 725, 439, 738, 819, 381, 489, 623, 813,
839, 697, 723, 818, 913, 379, 717, 431, 811, 485, 865, 722, 693, 473, 607, 797, 715,
375, 905, 483, 807, 691, 253, 415, 633, 795, 469, 685, 849, 482, 711, 901, 690, 367,
251, 441, 575, 467, 629, 683, 791, 737, 899, 461, 841, 669, 466, 247, 437, 627, 817,
898, 351, 679, 459, 621, 783, 837, 667, 626, 721, 435, 377, 239, 429, 619, 809, 455,
835, 434, 663, 605, 319, 713, 373, 427, 834, 481, 615, 805, 689, 223, 413, 603, 793,
655, 371, 709, 423, 803, 365, 249, 411, 573, 370, 465, 599, 681, 789, 707, 802, 897,
363, 191, 571, 245, 407, 625, 706, 787, 349, 677, 457, 591, 781, 359, 665, 243, 786,
433, 567, 347, 675, 237, 399, 617, 779, 453, 833, 242, 661, 674, 127, 317, 235, 343,
425, 559, 451, 613, 775, 659, 221, 601, 315, 653, 369, 450, 231, 421, 611, 801, 658,
335, 219, 409, 543, 597, 651, 311, 610, 705, 419, 361, 189, 569, 215, 405, 595, 785,
418, 647, 589, 303, 357, 187, 594, 241, 403, 565, 345, 673, 207, 397, 587, 777, 355,
402, 183, 563, 125, 287, 233, 341, 395, 557, 354, 449, 583, 773, 562, 657, 123, 313,
175, 339, 555, 229, 391, 609, 771, 333, 217, 541, 338, 119, 649, 309, 227, 770, 417,
551, 331, 159, 539, 213, 593, 226, 307, 645, 111, 301, 327, 185, 211, 306, 401, 535,
643, 205, 585, 299, 353, 210, 181, 561, 642, 95, 285, 203, 393, 527, 581, 295, 179,
121, 283, 173, 337, 553, 199, 389, 579, 769, 178, 63, 117, 171, 279, 578, 225, 387,
549, 329, 157, 537, 115, 305, 386, 167, 547, 109, 271, 325, 155, 114, 209, 533, 546,
641, 107, 297, 323, 151, 531, 93, 201, 525, 322, 103, 293, 530, 177, 91, 281, 143, 523,
197, 577, 291, 61, 87, 169, 277, 195, 290, 385, 519, 59, 113, 194, 275, 165, 545, 79,
269, 153, 274, 55, 163, 105, 267, 321, 149, 529, 162, 47, 101, 263, 147, 89, 141, 521,
99, 289, 146, 31, 85, 139, 98, 193, 517, 57, 83, 273, 135, 515, 77, 82, 53, 514, 161, 75,
265, 51, 45, 71, 261, 50, 145, 43, 97, 259, 29, 137, 258, 39, 27, 81, 133, 513, 23, 131,
73, 49, 130, 15, 69, 41, 67, 257, 66, 37, 25, 35, 21, 34, 129, 19, 13, 18, 11, 65, 7, 33,
17, 9, 5, 3, 2, 1, 4, 6, 8, 10, 12, 14, 16, 20, 22, 24, 26, 28, 30, 32, 36, 38, 40, 42, 44, 46,
48, 52, 54, 56, 58, 60, 62, 64, 68, 70, 72, 74, 76, 78, 80, 84, 86, 88, 90, 92, 94, 96, 100,
102, 104, 106, 108, 110, 112, 116, 118, 120, 122, 124, 126, 128, 132, 134, 136, 138,
140, 142, 144, 148, 150, 152, 154, 156, 158, 160, 164, 166, 168, 170, 172, 174, 176,
180, 182, 184, 186, 188, 190, 192, 196, 198, 200, 202, 204, 206, 208, 212, 214, 216,
218, 220, 222, 224, 228, 230, 232, 234, 236, 238, 240, 244, 246, 248, 250, 252, 254,
256, 260, 262, 264, 266, 268, 270, 272, 276, 278, 280, 282, 284, 286, 288, 292, 294,
296, 298, 300, 302, 304, 308, 310, 312, 314, 316, 318, 320, 324, 326, 328, 330, 332,
334, 336, 340, 342, 344, 346, 348, 350, 352, 356, 358, 360, 362, 364, 366, 368, 372,
374, 376, 378, 380, 382, 384, 388, 390, 392, 394, 396, 398, 400, 404, 406, 408, 410,
412, 414, 416, 420, 422, 424, 426, 428, 430, 432, 436, 438, 440, 442, 444, 446, 448,
452, 454, 456, 458, 460, 462, 464, 468, 470, 472, 474, 476, 478, 480, 484, 486, 488,
490, 492, 494, 496, 500, 502, 504, 506, 508, 510, 512, 516, 518, 520, 522, 524, 526,
528, 532, 534, 536, 538, 540, 542, 544, 548, 550, 552, 554, 556, 558, 560, 564, 566,
568, 570, 572, 574, 576, 580, 582, 584, 586, 588, 590, 592, 596, 598, 600, 602, 604,
606, 608, 612, 614, 616, 618, 620, 622, 624, 628, 630, 632, 634, 636, 638, 640, 644,
646, 648, 650, 652, 654, 656, 660, 662, 664, 666, 668, 670, 672, 676, 678, 680, 682,
684, 686, 688, 692, 694, 696, 698, 700, 702, 704, 708, 710, 712, 714, 716, 718, 720,
724, 726, 728, 730, 732, 734, 736, 740, 742, 744, 746, 748, 750, 752, 756, 758, 760,
762, 764, 766, 768, 772, 774, 776, 778, 780, 782, 784, 788, 790, 792, 794, 796, 798,
800, 804, 806, 808, 810, 812, 814, 816, 820, 822, 824, 826, 828, 830, 832, 836, 838,
840, 842, 844, 846, 848, 852, 854, 856, 858, 860, 862, 864, 868, 870, 872, 874, 876,
878, 880, 884, 886, 888, 890, 892, 894, 896, 900, 902, 904, 906, 908, 910, 912, 916,
918, 920, 922, 924, 926, 928, 932, 934, 936, 938, 940, 942, 944, 948, 950, 952, 954,
956, 958, 960, 964, 966, 968, 970, 972, 974, 976, 980, 982, 984, 986, 988, 990, 992,
996, 998, 1000, 1002, 1004, 1006, 1008, 1012, 1014, 1016, 1018, 1020, 1022, 1024

M = 600, N = 1024

511, 767, 765, 763, 759, 751, 831, 735, 863, 879, 887, 509, 507, 891, 893,
895, 503, 703, 495, 927, 938, 941, 939, 943, 479, 639, 882, 885, 889, 923, 925, 883,
935, 946, 947, 949, 877, 919, 951, 953, 875, 447, 859, 861, 871, 911, 955, 957, 855,
959, 761, 967, 754, 757, 383, 747, 749, 755, 827, 829, 823, 847, 970, 743, 971, 733,
973, 975, 978, 731, 979, 727, 701, 815, 719, 981, 699, 983, 505, 985, 987, 799, 498,
501, 695, 989, 255, 475, 477, 487, 491, 493, 499, 635, 637, 687, 471, 991, 994, 671,
631, 995, 997, 999, 1001, 1003, 1005, 445, 1007, 463, 1009, 1010, 443, 623, 1011,
1013, 1015, 1017, 993, 439, 1019, 1021, 1023, 977, 969, 945, 965, 937, 963, 881, 962,
933, 921, 931, 873, 917, 930, 869, 753, 915, 857, 909, 867, 914, 745, 853, 907, 866,

TABLE 4-continued 961, 825, 906, 851, 741, 903, 845, 729, 850, 497, 821, 739, 929, 843, 725, 738, 819,
381, 842, 489, 813, 839, 697, 723, 818, 913, 379, 717, 431, 811, 485, 865, 722, 693,
473, 607, 797, 715, 810, 375, 905, 483, 807, 691, 253, 415, 633, 714, 795, 469, 685,
849, 482, 711, 901, 690, 367, 251, 441, 575, 467, 629, 683, 791, 737, 899, 461, 841,
669, 466, 682, 247, 437, 627, 817, 898, 351, 679, 459, 621, 783, 837, 667, 626, 721,
435, 377, 458, 239, 429, 619, 809, 455, 835, 434, 663, 605, 319, 713, 373, 427, 834,
481, 615, 805, 689, 223, 413, 603, 793, 426, 655, 371, 709, 423, 803, 365, 249, 411,
573, 370, 465, 599, 681, 789, 707, 802, 897, 363, 191, 571, 245, 407, 625, 706, 787,
349, 677, 457, 591, 781, 359, 665, 243, 786, 433, 567, 347, 675, 237, 399, 617, 779,
453, 833, 242, 661, 674, 127, 317, 235, 778, 343, 425, 559, 451, 613, 775, 659, 221,
601, 315, 653, 369, 450, 231, 421, 611, 801, 658, 335, 219, 409, 543, 597, 651, 311,
610, 705, 419, 361, 189, 569, 650, 215, 405, 595, 785, 418, 647, 589, 303, 357, 187,
594, 241, 403, 565, 345, 673, 207, 397, 587, 777, 355, 402, 183, 563, 125, 287, 586,
233, 341, 395, 557, 354, 449, 583, 773, 562, 657, 123, 313, 394, 175, 339, 555, 229,
391, 609, 771, 333, 217, 541, 338, 554, 119, 649, 309, 227, 770, 417, 551, 331, 159,
539, 213, 593, 226, 307, 645, 330, 111, 301, 327, 185, 211, 306, 401, 535, 643, 205,
585, 299, 353, 210, 181, 561, 642, 95, 285, 203, 298, 393, 527, 581, 295, 179, 121,
202, 283, 173, 337, 553, 199, 389, 579, 769, 178, 63, 117, 171, 279, 578, 225, 387,
549, 329, 157, 537, 170, 115, 305, 386, 167, 547, 109, 271, 325, 155, 114, 209, 533,
546, 641, 107, 297, 323, 151, 531, 93, 201, 525, 322, 103, 293, 530, 177, 91, 281, 143,
523, 197, 577, 291, 61, 522, 87, 169, 277, 195, 290, 385, 519, 59, 113, 194, 275, 165,
545, 79, 269, 153, 274, 55, 163, 105, 267, 321, 149, 529, 162, 266, 47, 101, 263, 147,
89, 141, 521, 99, 289, 146, 31, 85, 139, 98, 193, 517, 57, 138, 83, 273, 135, 515, 77,
82, 53, 514, 161, 75, 265, 51, 74, 45, 71, 261, 50, 145, 43, 97, 259, 29, 42, 137, 258,
39, 27, 81, 133, 513, 23, 131, 73, 49, 130, 15, 69, 41, 67, 257, 66, 37, 25, 35, 21, 34,
129, 19, 13, 18, 11, 65, 10, 7, 33, 17, 9, 5, 3, 2, 1, 4, 6, 8, 12, 14, 16, 20, 22, 24, 26, 28,
30, 32, 36, 38, 40, 44, 46, 48, 52, 54, 56, 58, 60, 62, 64, 68, 70, 72, 76, 78, 80, 84, 86,
88, 90, 92, 94, 96, 100, 102, 104, 106, 108, 110, 112, 116, 118, 120, 122, 124, 126,
128, 132, 134, 136, 140, 142, 144, 148, 150, 152, 154, 156, 158, 160, 164, 166, 168,
172, 174, 176, 180, 182, 184, 186, 188, 190, 192, 196, 198, 200, 204, 206, 208, 212,
214, 216, 218, 220, 222, 224, 228, 230, 232, 234, 236, 238, 240, 244, 246, 248, 250,
252, 254, 256, 260, 262, 264, 268, 270, 272, 276, 278, 280, 282, 284, 286, 288, 292,
294, 296, 300, 302, 304, 308, 310, 312, 314, 316, 318, 320, 324, 326, 328, 332, 334,
336, 340, 342, 344, 346, 348, 350, 352, 356, 358, 360, 362, 364, 366, 368, 372, 374,
376, 378, 380, 382, 384, 388, 390, 392, 396, 398, 400, 404, 406, 408, 410, 412, 414,
416, 420, 422, 424, 428, 430, 432, 436, 438, 440, 442, 444, 446, 448, 452, 454, 456,
460, 462, 464, 468, 470, 472, 474, 476, 478, 480, 484, 486, 488, 490, 492, 494, 496,
500, 502, 504, 506, 508, 510, 512, 516, 518, 520, 524, 526, 528, 532, 534, 536, 538,
540, 542, 544, 548, 550, 552, 556, 558, 560, 564, 566, 568, 570, 572, 574, 576, 580,
582, 584, 588, 590, 592, 596, 598, 600, 602, 604, 606, 608, 612, 614, 616, 618, 620,
622, 624, 628, 630, 632, 634, 636, 638, 640, 644, 646, 648, 652, 654, 656, 660, 662,
664, 666, 668, 670, 672, 676, 678, 680, 684, 686, 688, 692, 694, 696, 698, 700, 702,
704, 708, 710, 712, 716, 718, 720, 724, 726, 728, 730, 732, 734, 736, 740, 742, 744,
746, 748, 750, 752, 756, 758, 760, 762, 764, 766, 768, 772, 774, 776, 780, 782, 784,
788, 790, 792, 794, 796, 798, 800, 804, 806, 808, 812, 814, 816, 820, 822, 824, 826,
828, 830, 832, 836, 838, 840, 844, 846, 848, 852, 854, 856, 858, 860, 862, 864, 868,
870, 872, 874, 876, 878, 880, 884, 886, 888, 890, 892, 894, 896, 900, 902, 904, 908,
910, 912, 916, 918, 920, 922, 924, 926, 928, 932, 934, 936, 940, 942, 944, 948, 950,
952, 954, 956, 958, 960, 964, 966, 968, 972, 974, 976, 980, 982, 984, 986, 988, 990,
992, 996, 998, 1000, 1002, 1004, 1006, 1008, 1012, 1014, 1016, 1018, 1020, 1022,
1024
M = 720, N = 1024
767, 895, 950, 951, 954, 955, 957, 511, 959, 943, 974, 975, 982, 983, 986,
987, 893, 989, 890, 891, 991, 998, 999, 886, 887, 927, 1002, 1003, 1005, 1007, 879,
1010, 1011, 1013, 1014, 1015, 1017, 1018, 1019, 1021, 1023, 863, 765, 762, 763, 759,
758, 751, 831, 1009, 1001, 997, 735, 995, 985, 994, 981, 979, 509, 978, 973, 506, 507,
953, 971, 970, 503, 502, 949, 947, 967, 946, 966, 703, 941, 938, 495, 939, 935, 934,
889, 925, 885, 922, 923, 883, 882, 877, 479, 919, 918, 874, 875, 871, 870, 639, 910,
861, 911, 858, 859, 761, 855, 854, 757, 447, 755, 754, 749, 846, 829, 746, 847, 747,
826, 827, 743, 742, 823, 822, 733, 730, 731, 727, 726, 815, 383, 505, 701, 718, 501,
719, 698, 699, 499, 993, 498, 493, 977, 799, 695, 694, 490, 491, 969, 945, 965, 487,
486, 477, 687, 963, 937, 474, 475, 962, 637, 255, 933, 634, 635, 471, 931, 470, 921,
930, 881, 917, 631, 630, 445, 671, 462, 873, 915, 463, 442, 443, 914, 869, 909, 867,
623, 857, 439, 438, 907, 866, 906, 853, 851, 903, 850, 902, 431, 753, 845, 825, 745,
381, 607, 843, 842, 821, 378, 379, 741, 819, 739, 729, 839, 375, 818, 374, 813, 838,
738, 415, 725, 810, 811, 723, 722, 717, 367, 807, 697, 575, 806, 715, 797, 714, 693,
794, 795, 253, 497, 691, 711, 690, 250, 251, 685, 489, 710, 351, 791, 790, 682, 683,
246, 247, 485, 483, 473, 482, 633, 679, 678, 782, 669, 469, 239, 783, 629, 467, 666,
667, 627, 466, 319, 626, 461, 621, 441, 459, 663, 662, 618, 458, 619, 437, 223, 435,
455, 434, 615, 429, 454, 614, 654, 605, 655, 426, 427, 602, 603, 377, 423, 422, 961,
599, 598, 413, 373, 191, 410, 411, 929, 371, 370, 573, 365, 590, 591, 407, 406, 570,
571, 362, 363, 913, 567, 865, 566, 359, 358, 905, 398, 349, 399, 849, 346, 347, 901,
899, 249, 127, 841, 898, 737, 817, 837, 721, 809, 835, 713, 834, 481, 805, 689, 793,
709, 803, 465, 681, 789, 707, 802, 897, 245, 625, 706, 787, 677, 457, 781, 665, 243,
786, 433, 675, 237, 617, 779, 453, 833, 242, 661, 674, 317, 235, 778, 343, 425, 559,
451, 613, 775, 659, 221, 601, 234, 315, 342, 653, 369, 450, 231, 774, 421, 611, 801,
658, 335, 219, 314, 409, 543, 597, 651, 230, 311, 610, 705, 419, 334, 361, 218, 189,
569, 650, 215, 310, 405, 595, 785, 418, 647, 589, 303, 357, 187, 214, 594, 241, 403,
565, 646, 345, 673, 207, 397, 587, 777, 186, 355, 402, 183, 563, 125, 206, 287, 586,
233, 341, 395, 557, 354, 449, 583, 773, 182, 562, 657, 123, 313, 394, 175, 339, 555, TABLE 4-continued 582, 229, 391, 609, 771, 333, 122, 217, 541, 338, 554, 119, 649, 309, 390, 227, 770,
417, 551, 331, 159, 539, 118, 213, 593, 226, 307, 550, 645, 330, 111, 301, 538, 327,
185, 211, 306, 401, 535, 643, 205, 585, 299, 326, 353, 210, 534, 181, 561, 642, 95,
285, 203, 298, 393, 527, 581, 295, 179, 121, 202, 283, 526, 173, 337, 553, 199, 294,
389, 579, 769, 178, 282, 63, 117, 171, 198, 279, 578, 225, 387, 549, 329, 157, 537,
170, 278, 115, 305, 386, 167, 547, 109, 271, 325, 155, 114, 209, 533, 166, 546, 641,
270, 107, 297, 154, 323, 151, 531, 93, 106, 201, 525, 322, 103, 293, 150, 530, 177, 91,
281, 143, 523, 102, 197, 577, 291, 90, 61, 142, 522, 87, 169, 277, 195, 290, 385, 519,
59, 86, 113, 194, 275, 518, 165, 545, 79, 269, 58, 153, 274, 55, 163, 78, 105, 267, 321,
54, 149, 529, 162, 266, 47, 101, 263, 147, 89, 141, 521, 262, 99, 289, 146, 31, 85, 139,
98, 193, 517, 57, 138, 83, 273, 135, 515, 77, 82, 53, 134, 514, 161, 75, 265, 51, 74, 45,
71, 261, 50, 145, 43, 70, 97, 259, 29, 42, 137, 258, 39, 27, 81, 38, 133, 513, 26, 23,
131, 73, 22, 49, 130, 15, 69, 14, 41, 67, 257, 66, 37, 25, 35, 21, 34, 129, 19, 13, 18, 11,
65, 10, 7, 6, 33, 17, 9, 5, 3, 2, 1, 4, 8, 12, 16, 20, 24, 28, 30, 32, 36, 40, 44, 46, 48, 52,
56, 60, 62, 64, 68, 72, 76, 80, 84, 88, 92, 94, 96, 100, 104, 108, 110, 112, 116, 120,
124, 126, 128, 132, 136, 140, 144, 148, 152, 156, 158, 160, 164, 168, 172, 174, 176,
180, 184, 188, 190, 192, 196, 200, 204, 208, 212, 216, 220, 222, 224, 228, 232, 236,
238, 240, 244, 248, 252, 254, 256, 260, 264, 268, 272, 276, 280, 284, 286, 288, 292,
296, 300, 302, 304, 308, 312, 316, 318, 320, 324, 328, 332, 336, 340, 344, 348, 350,
352, 356, 360, 364, 366, 368, 372, 376, 380, 382, 384, 388, 392, 396, 400, 404, 408,
412, 414, 416, 420, 424, 428, 430, 432, 436, 440, 444, 446, 448, 452, 456, 460, 464,
468, 472, 476, 478, 480, 484, 488, 492, 494, 496, 500, 504, 508, 510, 512, 516, 520,
524, 528, 532, 536, 540, 542, 544, 548, 552, 556, 558, 560, 564, 568, 572, 574, 576,
580, 584, 588, 592, 596, 600, 604, 606, 608, 612, 616, 620, 622, 624, 628, 632, 636,
638, 640, 644, 648, 652, 656, 660, 664, 668, 670, 672, 676, 680, 684, 686, 688, 692,
696, 700, 702, 704, 708, 712, 716, 720, 724, 728, 732, 734, 736, 740, 744, 748, 750,
752, 756, 760, 764, 766, 768, 772, 776, 780, 784, 788, 792, 796, 798, 800, 804, 808,
812, 814, 816, 820, 824, 828, 830, 832, 836, 840, 844, 848, 852, 856, 860, 862, 864,
868, 872, 876, 878, 880, 884, 888, 892, 894, 896, 900, 904, 908, 912, 916, 920, 924,
926, 928, 932, 936, 940, 942, 944, 948, 952, 956, 958, 960, 964, 968, 972, 976, 980,
984, 988, 990, 992, 996, 1000, 1004, 1006, 1008, 1012, 1016, 1020, 1022, 1024

M = 768, N = 1024

894, 895, 958, 767, 959, 766, 990, 991, 999, 989, 987, 998, 1002, 1003,
986, 1005, 1006, 983, 1007, 982, 1010, 1011, 1013, 1014, 1015, 975, 957, 1017, 955,
1018, 974, 1019, 954, 1021, 951, 1022, 1023, 511, 950, 510, 943, 942, 893, 891, 890,
927, 887, 926, 886, 879, 878, 863, 765, 763, 862, 762, 759, 758, 1009, 751, 1001, 750,
997, 831, 995, 985, 830, 994, 981, 979, 735, 978, 973, 971, 734, 953, 509, 970, 949,
507, 947, 967, 506, 946, 503, 966, 941, 939, 502, 938, 935, 703, 889, 495, 702, 925,
934, 923, 494, 885, 883, 922, 882, 919, 877, 875, 918, 874, 479, 871, 478, 911, 861,
870, 859, 639, 910, 858, 761, 638, 855, 757, 755, 854, 754, 447, 749, 747, 829, 847,
827, 446, 746, 846, 826, 743, 823, 733, 742, 731, 822, 730, 993, 727, 815, 505, 726,
977, 814, 383, 501, 499, 969, 701, 382, 699, 719, 498, 945, 493, 718, 698, 965, 491,
963, 695, 799, 937, 490, 694, 798, 962, 487, 933, 931, 477, 486, 921, 475, 687, 881,
930, 474, 686, 917, 637, 915, 873, 471, 255, 635, 634, 254, 470, 869, 914, 867, 909,
631, 907, 671, 857, 445, 630, 443, 463, 866, 670, 853, 906, 442, 462, 851, 623, 903,
439, 753, 850, 438, 622, 845, 902, 843, 825, 745, 431, 821, 741, 842, 819, 739, 839,
430, 729, 607, 381, 379, 818, 738, 606, 813, 838, 725, 378, 811, 723, 375, 810, 722,
415, 374, 717, 807, 697, 715, 414, 497, 797, 367, 806, 693, 575, 795, 714, 691, 366,
711, 489, 574, 794, 690, 685, 791, 710, 485, 253, 683, 483, 251, 473, 790, 250, 351,
682, 482, 247, 633, 679, 469, 350, 467, 246, 629, 783, 669, 678, 627, 667, 466, 782,
461, 239, 441, 459, 626, 666, 621, 961, 663, 619, 238, 437, 458, 319, 435, 929, 662,
618, 318, 455, 615, 434, 429, 454, 427, 223, 605, 655, 614, 913, 603, 222, 426, 865,
654, 377, 602, 905, 423, 599, 373, 413, 422, 371, 411, 598, 849, 901, 899, 370, 410,
365, 191, 573, 841, 407, 363, 571, 190, 591, 406, 362, 570, 590, 898, 359, 567, 817,
837, 737, 835, 349, 399, 358, 566, 347, 809, 249, 398, 346, 721, 245, 559, 343, 834,
127, 243, 805, 803, 558, 713, 126, 342, 242, 793, 237, 689, 235, 709, 802, 317, 707,
789, 315, 335, 787, 234, 681, 231, 706, 314, 334, 543, 677, 786, 481, 311, 221, 465,
897, 625, 457, 781, 665, 433, 675, 617, 779, 453, 833, 661, 674, 778, 425, 451, 613,
775, 659, 601, 653, 369, 450, 774, 421, 611, 801, 658, 219, 409, 597, 651, 230, 610,
705, 419, 361, 218, 542, 189, 569, 650, 215, 310, 405, 595, 785, 418, 647, 589, 303,
357, 187, 214, 594, 241, 403, 565, 646, 345, 673, 207, 302, 397, 587, 777, 186, 355,
402, 183, 563, 125, 206, 287, 586, 233, 341, 395, 557, 354, 449, 583, 773, 182, 562,
657, 286, 123, 313, 394, 175, 339, 555, 582, 229, 391, 609, 771, 333, 122, 217, 541,
174, 338, 554, 119, 649, 309, 390, 227, 770, 417, 551, 331, 159, 539, 118, 213, 593,
226, 307, 550, 645, 330, 111, 301, 158, 538, 327, 185, 211, 306, 401, 535, 643, 110,
205, 585, 299, 326, 353, 210, 534, 181, 561, 642, 95, 285, 203, 298, 393, 527, 581,
295, 179, 94, 121, 202, 283, 526, 173, 337, 553, 199, 294, 389, 579, 769, 178, 282, 63,
117, 171, 198, 279, 578, 225, 387, 549, 329, 62, 157, 537, 170, 278, 115, 305, 386,
167, 547, 109, 271, 325, 155, 114, 209, 533, 166, 546, 641, 270, 107, 297, 154, 323,
151, 531, 93, 106, 201, 525, 322, 103, 293, 150, 530, 177, 91, 281, 143, 523, 102, 197,
577, 291, 90, 61, 142, 522, 87, 169, 277, 195, 290, 385, 519, 59, 86, 113, 194, 275,
518, 165, 545, 79, 269, 58, 153, 274, 55, 163, 78, 105, 267, 321, 54, 149, 529, 162,
266, 47, 101, 263, 147, 89, 46, 141, 521, 262, 99, 289, 146, 31, 85, 139, 98, 193, 517,
30, 57, 138, 83, 273, 135, 515, 77, 82, 53, 134, 514, 161, 75, 265, 51, 74, 45, 71, 261,
50, 145, 43, 70, 97, 259, 29, 42, 137, 258, 39, 27, 81, 38, 133, 513, 26, 23, 131, 73, 22,
49, 130, 15, 69, 14, 41, 67, 257, 66, 37, 25, 35, 21, 34, 129, 19, 13, 18, 11, 65, 10, 7, 6,
33, 17, 9, 5, 3, 2, 1, 4, 8, 12, 16, 20, 24, 28, 32, 36, 40, 44, 48, 52, 56, 60, 64, 68, 72,
76, 80, 84, 88, 92, 96, 100, 104, 108, 112, 116, 120, 124, 128, 132, 136, 140, 144, 148,
152, 156, 160, 164, 168, 172, 176, 180, 184, 188, 192, 196, 200, 204, 208, 212, 216,
220, 224, 228, 232, 236, 240, 244, 248, 252, 256, 260, 264, 268, 272, 276, 280, 284,

TABLE 4-continued 288, 292, 296, 300, 304, 308, 312, 316, 320, 324, 328, 332, 336, 340, 344, 348, 352,
356, 360, 364, 368, 372, 376, 380, 384, 388, 392, 396, 400, 404, 408, 412, 416, 420,
424, 428, 432, 436, 440, 444, 448, 452, 456, 460, 464, 468, 472, 476, 480, 484, 488,
492, 496, 500, 504, 508, 512, 516, 520, 524, 528, 532, 536, 540, 544, 548, 552, 556,
560, 564, 568, 572, 576, 580, 584, 588, 592, 596, 600, 604, 608, 612, 616, 620, 624,
628, 632, 636, 640, 644, 648, 652, 656, 660, 664, 668, 672, 676, 680, 684, 688, 692,
696, 700, 704, 708, 712, 716, 720, 724, 728, 732, 736, 740, 744, 748, 752, 756, 760,
764, 768, 772, 776, 780, 784, 788, 792, 796, 800, 804, 808, 812, 816, 820, 824, 828,
832, 836, 840, 844, 848, 852, 856, 860, 864, 868, 872, 876, 880, 884, 888, 892, 896,
900, 904, 908, 912, 916, 920, 924, 928, 932, 936, 940, 944, 948, 952, 956, 960, 964,
968, 972, 976, 980, 984, 988, 992, 996, 1000, 1004, 1008, 1012, 1016, 1020, 1024
M = 960, N = 1024
1022, 1020, 1023, 1016, 1021, 1019, 1018, 1015, 1014, 1007, 1012, 1006,
1004, 991, 990, 1000, 988, 959, 984, 958, 956, 1017, 1013, 952, 1011, 895, 1005,
1010, 894, 1003, 1002, 892, 999, 989, 998, 987, 888, 986, 767, 996, 983, 766, 982,
957, 975, 955, 764, 980, 974, 954, 951, 972, 950, 760, 511, 943, 893, 948, 510, 942,
891, 1009, 968, 1001, 890, 508, 940, 887, 927, 997, 886, 926, 985, 879, 995, 936, 504,
765, 981, 884, 878, 924, 994, 763, 979, 973, 876, 953, 762, 863, 978, 920, 759, 971,
949, 862, 758, 970, 872, 751, 947, 941, 967, 860, 509, 756, 750, 946, 831, 966, 939,
889, 507, 830, 856, 938, 748, 735, 885, 506, 925, 964, 935, 503, 734, 828, 883, 923,
877, 934, 744, 502, 882, 495, 922, 732, 875, 919, 932, 824, 703, 500, 494, 761, 993,
874, 861, 918, 871, 702, 911, 728, 757, 977, 859, 492, 479, 870, 916, 910, 755, 700,
969, 858, 749, 478, 639, 855, 868, 754, 945, 829, 488, 747, 908, 965, 854, 638, 696,
476, 847, 827, 746, 447, 937, 733, 505, 963, 743, 846, 852, 826, 904, 636, 446, 731,
933, 501, 823, 742, 472, 962, 921, 881, 844, 730, 822, 499, 931, 815, 444, 727, 740,
493, 632, 701, 873, 917, 383, 498, 814, 820, 930, 726, 491, 719, 840, 699, 869, 915,
382, 440, 909, 490, 718, 799, 724, 812, 698, 857, 477, 914, 487, 867, 695, 907, 380,
798, 753, 475, 853, 716, 486, 637, 694, 866, 687, 255, 808, 906, 474, 745, 851, 796,
635, 903, 845, 471, 686, 692, 484, 825, 376, 254, 445, 712, 741, 850, 634, 902, 470,
843, 463, 821, 671, 631, 443, 684, 729, 792, 739, 252, 842, 630, 462, 468, 442, 819,
670, 623, 900, 725, 813, 839, 439, 738, 961, 680, 497, 818, 622, 628, 723, 460, 381,
668, 438, 811, 838, 248, 431, 717, 697, 489, 929, 722, 607, 810, 379, 620, 797, 430,
436, 715, 693, 836, 807, 456, 664, 485, 378, 606, 714, 795, 913, 691, 375, 415, 806,
473, 428, 616, 685, 711, 483, 794, 374, 604, 865, 690, 414, 367, 575, 253, 633, 469,
905, 683, 710, 791, 804, 482, 424, 366, 372, 574, 251, 629, 467, 682, 790, 849, 412,
783, 669, 461, 600, 901, 441, 708, 679, 250, 466, 627, 351, 364, 667, 621, 572, 782,
459, 841, 788, 247, 678, 437, 899, 408, 626, 350, 666, 619, 458, 246, 737, 817, 435,
239, 837, 663, 429, 676, 360, 780, 455, 568, 898, 618, 348, 434, 605, 238, 319, 662,
244, 809, 377, 721, 615, 427, 655, 454, 835, 603, 318, 373, 614, 426, 776, 713, 223,
654, 660, 805, 236, 413, 344, 452, 834, 423, 602, 793, 371, 689, 222, 599, 411, 365,
612, 316, 803, 422, 573, 709, 652, 370, 232, 598, 789, 410, 481, 591, 681, 363, 571,
802, 220, 707, 191, 407, 420, 249, 312, 362, 590, 596, 787, 570, 648, 349, 677, 406,
465, 781, 359, 399, 190, 706, 245, 567, 216, 665, 625, 347, 786, 358, 588, 675, 398,
566, 457, 404, 243, 779, 559, 237, 188, 346, 617, 661, 127, 242, 343, 433, 674, 356,
558, 453, 564, 317, 778, 235, 396, 584, 613, 659, 126, 342, 775, 425, 184, 335, 653,
315, 234, 543, 451, 221, 601, 556, 231, 658, 611, 774, 334, 340, 897, 314, 392, 421,
124, 219, 542, 651, 311, 230, 450, 597, 610, 409, 369, 552, 218, 650, 332, 419, 310,
772, 303, 595, 215, 540, 228, 120, 647, 589, 189, 361, 405, 569, 833, 418, 302, 308,
214, 594, 207, 646, 328, 187, 587, 357, 403, 565, 536, 397, 206, 287, 212, 300, 186,
345, 801, 586, 402, 355, 563, 183, 644, 395, 286, 557, 583, 241, 341, 204, 182, 125,
354, 705, 562, 175, 296, 785, 394, 555, 582, 233, 339, 284, 123, 391, 333, 174, 313,
180, 200, 554, 122, 338, 541, 229, 673, 580, 777, 390, 551, 331, 119, 159, 309, 172,
280, 217, 539, 227, 550, 657, 330, 118, 773, 307, 158, 111, 388, 213, 301, 327, 168,
538, 226, 116, 110, 306, 535, 548, 156, 609, 449, 211, 299, 326, 649, 205, 771, 185,
534, 210, 95, 298, 527, 108, 593, 417, 285, 152, 181, 203, 94, 295, 324, 645, 532, 770,
526, 202, 283, 294, 179, 104, 585, 173, 199, 401, 643, 92, 282, 178, 63, 561, 524, 121,
171, 198, 353, 279, 62, 292, 581, 393, 88, 170, 278, 642, 117, 157, 271, 196, 167, 553,
579, 337, 389, 520, 115, 60, 155, 276, 270, 109, 166, 549, 329, 578, 114, 387, 154,
537, 107, 225, 305, 547, 151, 164, 268, 325, 56, 386, 106, 533, 93, 297, 150, 546, 209,
103, 143, 323, 531, 91, 769, 641, 201, 525, 322, 293, 530, 177, 281, 523, 102, 197,
264, 577, 291, 148, 90, 61, 142, 522, 87, 169, 277, 100, 195, 290, 385, 519, 59, 86,
140, 113, 194, 275, 518, 165, 545, 79, 269, 58, 153, 84, 274, 55, 136, 516, 163, 78,
105, 267, 321, 54, 149, 529, 162, 76, 266, 47, 101, 263, 52, 147, 89, 46, 141, 521, 72,
262, 99, 289, 146, 31, 44, 85, 139, 98, 193, 260, 517, 30, 57, 138, 83, 273, 40, 135,
515, 77, 28, 82, 53, 134, 514, 161, 75, 265, 24, 51, 132, 74, 45, 71, 261, 50, 145, 43,
70, 97, 259, 29, 42, 137, 68, 258, 39, 27, 81, 38, 133, 513, 26, 23, 36, 131, 73, 22, 49,
130, 15, 69, 20, 14, 41, 67, 257, 12, 66, 37, 25, 8, 35, 21, 34, 129, 19, 13, 18, 11, 65,
10, 7, 6, 33, 4, 17, 9, 5, 3, 2, 1, 16, 32, 48, 64, 80, 96, 112, 128, 144, 160, 176, 192,
208, 224, 240, 256, 272, 288, 304, 320, 336, 352, 368, 384, 400, 416, 432, 448, 464,
480, 496, 512, 528, 544, 560, 576, 592, 608, 624, 640, 656, 672, 688, 704, 720, 736,
752, 768, 784, 800, 816, 832, 848, 864, 880, 896, 912, 928, 944, 960, 976, 992, 1008,
1024
M = 1200, N = 2048
1023, 1021, 1019, 1015, 1007, 1471, 1407, 1503, 991, 1519, 1527, 1531,
1533, 1535, 959, 1529, 1522, 1525, 1279, 1517, 1523, 1515, 1663, 895, 1499, 1501,
1511, 1659, 1661, 1495, 1695, 1711, 1655, 1719, 1723, 1725, 1467, 1469, 1487, 1647,
1463, 1727, 1743, 1751, 1755, 1757, 1759, 1017, 1767, 1010, 1011, 1013, 1455, 767,
1631, 1005, 1771, 1405, 1773, 1775, 1778, 1003, 1779, 1403, 1781, 1783, 1785,1787,
1789, 987, 989, 999, 1391, 983, 1399, 1439, 1599, 1791, 1823, 955, 957, 975, 1375,
1839, 951, 1777, 1277, 1847, 1849, 1851, 1769, 1275, 1853, 1842, 1845, 1855, 511, TABLE 4-continued 1762, 893, 943, 1263, 1271, 1738, 1746, 1747, 1749, 1753, 1763, 891, 1343, 1765,
1834, 1835, 1837, 1741, 1843, 1863, 1831, 1866, 1867, 1721, 927, 1869, 887, 1821,
1739, 1871, 1874, 1714, 1875, 1717, 1877, 1819, 1879, 1881, 1883, 1706, 1885, 1715,
1247, 1887, 1735, 1890, 1891, 879, 1893, 1709, 1895, 1815, 1897, 1521, 1899, 1901,
1903, 1707, 1905, 1906, 1907, 1513, 1909, 1911, 1913, 1915, 1917, 1919, 1506, 1509,
1927, 1703, 1657, 1930, 1931, 1497, 1693, 1933, 1507, 1807, 863, 1935, 1650, 1653,
1938, 1939, 1490, 1493, 1691, 765, 1941, 1943, 1945, 1651, 1215, 763, 1482, 1491,
1947, 1949, 2047, 2045, 2043, 2039, 2031, 2015, 2041, 1983, 2037, 2035, 2029, 2034,
2027, 2013, 2023, 2011, 1981, 2007, 1979, 2033, 1999, 1975, 2025, 1967, 2021, 2009,
2019, 1951, 2005, 2018, 1977, 2003, 1997, 2002, 1973, 1995, 1971, 1994, 1965, 1991,
1970, 1963, 2017, 1962, 1959, 2001, 1993, 1969, 1989, 1961, 1987, 1986, 1957, 1955,
1954, 1985, 1953, 1937, 1889, 1929, 1009, 1873, 1925, 1465, 1001, 1761, 1923, 1485,
1865, 1461, 1841, 1922, 997, 1483, 1645, 1861, 985, 1745, 1459, 1401, 995, 1453,
1643, 1833, 1479, 1859, 1458, 1687, 981, 1629, 994, 1737, 1397, 1451, 1858, 1505,
1639, 1829, 953, 1713, 979, 1437, 1627, 1817, 1450, 1679, 1395, 973, 1733, 1447,
1827, 1389, 978, 759, 949, 1273, 1435, 1597, 1394, 1489, 1623, 1705, 1813, 971,
1731, 1826, 1921, 1387, 947, 509, 1595, 889, 1269, 970, 1431, 1649, 751, 1730, 1811,
941, 1373, 1701, 967, 1481, 1615, 1805, 946, 1383, 1689, 507, 831, 1267, 1810, 1457,
1591, 885, 939, 1371, 1699, 993, 1261, 1423, 1641, 1803, 1477, 1857, 735, 1266, 925,
1685, 938, 503, 1698, 883, 1151, 1341, 935, 1259, 1802, 1367, 1449, 1583, 877, 1475,
1637, 1799, 761, 923, 1683, 882, 977, 1245, 1625, 1339, 1677, 1393, 495, 1474, 875,
1255, 1445, 1635, 1825, 703, 1682, 1359, 757, 919, 1243, 1433, 1567, 861, 1621,
1675, 1335, 969, 1634, 1729, 1443, 871, 1385, 755, 945, 1213, 479, 1593, 1674, 859,
1239, 1429, 1619, 749, 1809, 911, 1442, 1671, 965, 1613, 754, 1327, 1381, 1211, 505,
639, 1618, 829, 1265, 1427, 1589, 747, 855, 937, 1369, 1697, 963, 1231, 1421, 1611,
1801, 1379, 733, 447, 1426, 827, 1207, 501, 1587, 881, 1149, 962, 1311, 743, 1610,
933, 1257, 1365, 1419, 1581, 847, 1378, 1473, 1607, 1797, 731, 921, 1586, 1681, 499,
823, 1147, 1337, 1418, 931, 1199, 1363, 493, 1579, 873, 1253, 1415, 1633, 1795, 701,
1357, 498, 727, 917, 1241, 1565, 930, 383, 1362, 1578, 1143, 1673, 1333, 491, 815,
1251, 1794, 1441, 1575, 869, 699, 1355, 753, 915, 1183, 477, 1563, 857, 1237, 1617,
719, 1250, 1331, 909, 1669, 487, 1354, 867, 1135, 1325, 914, 695, 1351, 1209, 475,
637, 799, 1235, 1330, 1425, 1559, 745, 853, 907, 1667, 866, 961, 1229, 1609, 1323,
1377, 255, 1234, 445, 635, 825, 1205, 906, 471, 1585, 687, 1666, 851, 1119, 1309,
741, 903, 1227, 1322, 1417, 1551, 845, 1605, 1319, 729, 443, 1203, 850, 497, 631,
821, 1145, 1226, 1307, 739, 929, 1197, 1361, 463, 1577, 843, 1223, 1413, 1603, 1793,
671, 1202, 725, 439, 738, 819, 1087, 381, 1141, 1195, 842, 1303, 489, 623, 1602, 813,
1249, 1411, 1573, 839, 697, 1353, 723, 818, 913, 1181, 1561, 1194, 379, 1139, 717,
1329, 431, 1410, 811, 1191, 485, 1571, 865, 1133, 722, 1295, 693, 1349, 1179, 473,
607, 1138, 797, 1233, 1557, 715, 810, 375, 905, 1570, 1665, 483, 807, 1131, 1321,
691, 1347, 253, 415, 633, 714, 795, 1175, 469, 1555, 685, 849, 1117, 482, 711, 901,
1225, 1549, 690, 367, 1346, 1127, 1317, 251, 441, 575, 1554, 1201, 467, 629, 683,
791, 1115, 1305, 737, 899, 1167, 461, 1547, 841, 1221, 1601, 1315, 669, 466, 682,
247, 437, 627, 817, 1085, 898, 351, 679, 1546, 1111, 1193, 1301, 459, 621, 783, 1219,
1314, 1409, 1543, 837, 667, 626, 721, 435, 1083, 377, 458, 1137, 239, 1218, 1299,
429, 619, 809, 1189, 455, 1569, 835, 1103, 1293, 434, 663, 1177, 605, 319, 1298,
1079, 713, 373, 427, 1187, 834, 481, 615, 805, 1129, 1291, 689, 1345, 223, 413, 603,
793, 1173, 426, 1553, 655, 1186, 371, 709, 423, 1290, 803, 1071, 365, 1125, 1287,
249, 411, 573, 1171, 370, 465, 599, 681, 789, 1113, 707, 802, 897, 1165, 1545, 363,
1123, 1313, 191, 1170, 571, 245, 407, 625, 706, 787, 1055, 349, 677, 1109, 1163, 457,
591, 1122, 781, 1217, 1541, 359, 665, 243, 786, 433, 567, 1081, 1162, 347, 675, 1107,
237, 1297, 399, 617, 779, 1159, 453, 1539, 833, 1101, 242, 661, 674, 127, 1106, 317,
1077, 235, 778, 343, 425, 559, 1538, 1185, 451, 613, 775, 1099, 1289, 659, 221, 601,
315, 1075, 653, 369, 450, 231, 1098, 421, 611, 801, 1069, 658, 335, 1095, 1285, 219,
409, 543, 1074, 1169, 597, 651, 311, 610, 705, 419, 1067, 361, 1121, 1283, 189, 569,
650, 215, 405, 595, 785, 1053, 418, 647, 1066, 1161, 589, 303, 1282, 1063, 357, 187,
594, 241, 403, 565, 1051, 345, 673, 1105, 207, 397, 587, 777, 1157, 1537, 355, 402,
183, 563, 125, 287, 586, 1047, 233, 341, 395, 557, 1155, 354, 449, 583, 773, 1097,
562, 657, 123, 313, 394, 1073, 175, 1154, 339, 555, 229, 391, 609, 771, 1039, 333,
1093, 217, 541, 338, 554, 119, 649, 309, 227, 770, 417, 551, 1065, 331, 1091, 1281,
159, 539, 213, 593, 226, 307, 645, 330, 111, 1090, 301, 1061, 327, 185, 211, 306, 401,
535, 1049, 643, 205, 585, 299, 1059, 353, 210, 181, 561, 642, 95, 285, 1045, 203, 298,
393, 527, 1058, 1153, 581, 295, 179, 121, 202, 283, 1043, 173, 337, 553, 199, 389,
579, 769, 1037, 178, 63, 1042, 117, 171, 279, 578, 225, 387, 549, 1035, 329, 1089,
157, 537, 170, 115, 305, 386, 167, 1034, 547, 109, 271, 1031, 325, 155, 114, 209, 533,
546, 641, 107, 297, 1057, 323, 151, 531, 93, 201, 525, 322, 103, 293, 530, 177, 91,
281, 1041, 143, 523, 197, 577, 291, 61, 522, 87, 169, 277, 195, 290, 385, 519, 1033,
59, 113, 194, 275, 165, 545, 79, 269, 1029, 153, 274, 55, 163, 105, 267, 1027, 321,
149, 529, 162, 266, 47, 1026, 101, 263, 147, 89, 141, 521, 99, 289, 146, 31, 85, 139,
98, 193, 517, 57, 138, 83, 273, 135, 515, 77, 82, 53, 514, 161, 75, 265, 1025, 51, 74,
45, 71, 261, 50, 145, 43, 97, 259, 29, 42, 137, 258, 39, 27, 81, 133, 513, 23, 131, 73,
49, 130, 15, 69, 41, 67, 257, 66, 37, 25, 35, 21, 34, 129, 19, 13, 18, 11, 65, 10, 7, 33,
17, 9, 5, 3, 2, 1, 4, 6, 8, 12, 14, 16, 20, 22, 24, 26, 28, 30, 32, 36, 38, 40, 44, 46, 48, 52,
54, 56, 58, 60, 62, 64, 68, 70, 72, 76, 78, 80, 84, 86, 88, 90, 92, 94, 96, 100, 102, 104,
106, 108, 110, 112, 116, 118, 120, 122, 124, 126, 128, 132, 134, 136, 140, 142, 144,
148, 150, 152, 154, 156, 158, 160, 164, 166, 168, 172, 174, 176, 180, 182, 184, 186,
188, 190, 192, 196, 198, 200, 204, 206, 208, 212, 214, 216, 218, 220, 222, 224, 228,
230, 232, 234, 236, 238, 240, 244, 246, 248, 250, 252, 254, 256, 260, 262, 264, 268,
270, 272, 276, 278, 280, 282, 284, 286, 288, 292, 294, 296, 300, 302, 304, 308, 310,
312, 314, 316, 318, 320, 324, 326, 328, 332, 334, 336, 340, 342, 344, 346, 348, 350,
352, 356, 358, 360, 362, 364, 366, 368, 372, 374, 376, 378, 380, 382, 384, 388, 390, TABLE 4-continued 392, 396, 398, 400, 404, 406, 408, 410, 412, 414, 416, 420, 422, 424, 428, 430, 432,
436, 438, 440, 442, 444, 446, 448, 452, 454, 456, 460, 462, 464, 468, 470, 472, 474,
476, 478, 480, 484, 486, 488, 490, 492, 494, 496, 500, 502, 504, 506, 508, 510, 512,
516, 518, 520, 524, 526, 528, 532, 534, 536, 538, 540, 542, 544, 548, 550, 552, 556,
558, 560, 564, 566, 568, 570, 572, 574, 576, 580, 582, 584, 588, 590, 592, 596, 598,
600, 602, 604, 606, 608, 612, 614, 616, 618, 620, 622, 624, 628, 630, 632, 634, 636,
638, 640, 644, 646, 648, 652, 654, 656, 660, 662, 664, 666, 668, 670, 672, 676, 678,
680, 684, 686, 688, 692, 694, 696, 698, 700, 702, 704, 708, 710, 712, 716, 718, 720,
724, 726, 728, 730, 732, 734, 736, 740, 742, 744, 746, 748, 750, 752, 756, 758, 760,
762, 764, 766, 768, 772, 774, 776, 780, 782, 784, 788, 790, 792, 794, 796, 798, 800,
804, 806, 808, 812, 814, 816, 820, 822, 824, 826, 828, 830, 832, 836, 838, 840, 844,
846, 848, 852, 854, 856, 858, 860, 862, 864, 868, 870, 872, 874, 876, 878, 880, 884,
886, 888, 890, 892, 894, 896, 900, 902, 904, 908, 910, 912, 916, 918, 920, 922, 924,
926, 928, 932, 934, 936, 940, 942, 944, 948, 950, 952, 954, 956, 958, 960, 964, 966,
968, 972, 974, 976, 980, 982, 984, 986, 988, 990, 992, 996, 998, 1000, 1002, 1004,
1006, 1008, 1012, 1014, 1016, 1018, 1020, 1022, 1024, 1028, 1030, 1032, 1036, 1038,
1040, 1044, 1046, 1048, 1050, 1052, 1054, 1056, 1060, 1062, 1064, 1068, 1070, 1072,
1076, 1078, 1080, 1082, 1084, 1086, 1088, 1092, 1094, 1096, 1100, 1102, 1104, 1108,
1110, 1112, 1114, 1116, 1118, 1120, 1124, 1126, 1128, 1130, 1132, 1134, 1136, 1140,
1142, 1144, 1146, 1148, 1150, 1152, 1156, 1158, 1160, 1164, 1166, 1168, 1172, 1174,
1176, 1178, 1180, 1182, 1184, 1188, 1190, 1192, 1196, 1198, 1200, 1204, 1206, 1208,
1210, 1212, 1214, 1216, 1220, 1222, 1224, 1228, 1230, 1232, 1236, 1238, 1240, 1242,
1244, 1246, 1248, 1252, 1254, 1256, 1258, 1260, 1262, 1264, 1268, 1270, 1272, 1274,
1276, 1278, 1280, 1284, 1286, 1288, 1292, 1294, 1296, 1300, 1302, 1304, 1306, 1308,
1310, 1312, 1316, 1318, 1320, 1324, 1326, 1328, 1332, 1334, 1336, 1338, 1340, 1342,
1344, 1348, 1350, 1352, 1356, 1358, 1360, 1364, 1366, 1368, 1370, 1372, 1374, 1376,
1380, 1382, 1384, 1386, 1388, 1390, 1392, 1396, 1398, 1400, 1402, 1404, 1406, 1408,
1412, 1414, 1416, 1420, 1422, 1424, 1428, 1430, 1432, 1434, 1436, 1438, 1440, 1444,
1446, 1448, 1452, 1454, 1456, 1460, 1462, 1464, 1466, 1468, 1470, 1472, 1476, 1478,
1480, 1484, 1486, 1488, 1492, 1494, 1496, 1498, 1500, 1502, 1504, 1508, 1510, 1512,
1514, 1516, 1518, 1520, 1524, 1526, 1528, 1530, 1532, 1534, 1536, 1540, 1542, 1544,
1548, 1550, 1552, 1556, 1558, 1560, 1562, 1564, 1566, 1568, 1572, 1574, 1576, 1580,
1582, 1584, 1588, 1590, 1592, 1594, 1596, 1598, 1600, 1604, 1606, 1608, 1612, 1614,
1616, 1620, 1622, 1624, 1626, 1628, 1630, 1632, 1636, 1638, 1640, 1642, 1644, 1646,
1648, 1652, 1654, 1656, 1658, 1660, 1662, 1664, 1668, 1670, 1672, 1676, 1678, 1680,
1684, 1686, 1688, 1690, 1692, 1694, 1696, 1700, 1702, 1704, 1708, 1710, 1712, 1716,
1718, 1720, 1722, 1724, 1726, 1728, 1732, 1734, 1736, 1740, 1742, 1744, 1748, 1750,
1752, 1754, 1756, 1758, 1760, 1764, 1766, 1768, 1770, 1772, 1774, 1776, 1780, 1782,
1784, 1786, 1788, 1790, 1792, 1796, 1798, 1800, 1804, 1806, 1808, 1812, 1814, 1816,
1818, 1820, 1822, 1824, 1828, 1830, 1832, 1836, 1838, 1840, 1844, 1846, 1848, 1850,
1852, 1854, 1856, 1860, 1862, 1864, 1868, 1870, 1872, 1876, 1878, 1880, 1882, 1884,
1886, 1888, 1892, 1894, 1896, 1898, 1900, 1902, 1904, 1908, 1910, 1912, 1914, 1916,
1918, 1920, 1924, 1926, 1928, 1932, 1934, 1936, 1940, 1942, 1944, 1946, 1948, 1950,
1952, 1956, 1958, 1960, 1964, 1966, 1968, 1972, 1974, 1976, 1978, 1980, 1982, 1984,
1988, 1990, 1992, 1996, 1998, 2000, 2004, 2006, 2008, 2010, 2012, 2014, 2016, 2020,
2022, 2024, 2026, 2028, 2030, 2032, 2036, 2038, 2040, 2042, 2044, 2046, 2048
M = 1440, N = 2048
1023, 1535, 1533, 1530, 1531, 1527, 1526, 1727, 1759, 1519, 1775, 1782,
1783, 1786, 1787, 1789, 1791, 1503, 1855, 1663, 1887, 1903, 1906, 1901, 1907, 1909,
1910, 1911, 1898, 1899, 1913, 1914, 1915, 1021, 1917, 1471, 1919, 1018, 1019, 1895,
1894, 1885, 1934, 1935, 1015, 1014, 1882, 1883, 1942, 1943, 1946, 1947, 1949, 1951,
1785, 1007, 1878, 1879, 1958, 1959, 1962, 1963, 1781, 1965, 1967, 1970, 1779, 1870,
1971, 1773, 1778, 1850, 1851, 1853, 1770, 1771, 1871, 1973, 1974, 1407, 1975, 1977,
1978, 991, 1979, 1847, 1846, 1757, 1766, 1767, 1981, 1983, 1990, 1754, 1755, 1991,
1994, 1995, 1997, 1998, 1999, 1839, 2002, 1751, 1750, 2003, 2005, 2006, 2007, 2009,
2010, 2011, 2013, 2015, 2018, 2019, 2021, 2022, 2023, 959, 1722, 1723, 1725, 1529,
1742, 1743, 2025, 1823, 2026, 2027, 2029, 1719, 1525, 1718, 2031, 2033, 2034, 1523,
2035, 2037, 1279, 2038, 1522, 2039, 1517, 1514, 1515, 1711, 2041, 2042, 2043, 2045,
2047, 1501, 1510, 1498, 1499, 1511, 1661, 1658, 895, 1659, 1495, 1494, 1695, 1654,
1655, 1486, 1469, 2017, 1487, 1466, 1467, 1647, 2001, 1463, 1462, 1993, 1969, 1989,
1017, 1987, 1961, 1986, 1013, 1455, 1957, 1011, 1631, 1955, 1010, 1945, 1005, 1954,
1905, 1002, 1003, 1941, 1405, 1897, 1939, 767, 1402, 1403, 999, 998, 1938, 1893,
989, 1933, 1399, 1439, 1398, 1891, 1881, 986, 987, 1931, 1890, 1930, 1877, 1875,
983, 982, 1927, 1874, 1926, 1391, 1599, 1869, 1777, 1849, 974, 1867, 957, 1866,
1769, 975, 1845, 954, 955, 1765, 1843, 1863, 1763, 1842, 1862, 1753, 1837, 951,
1762, 950, 1375, 1277, 1834, 1749, 1835, 1274, 1275, 1747, 1746, 1271, 511, 943,
1270, 1741, 1831, 1830, 1821, 1721, 1739, 1738, 1818, 1819, 1717, 893, 1715, 1735,
1263, 1714, 890, 891, 1734, 1709, 1521, 1815, 1814, 1343, 1706, 1707, 1513, 886,
887, 927, 1509, 1507, 1703, 1806, 1702, 1497, 1657, 1693, 1506, 1807, 1247, 879,
1493, 1653, 1690, 1691, 1491, 1651, 1490, 1650, 1645, 1485, 1687, 1686, 1465, 1483,
1642, 1643, 1482, 1461, 765, 1459, 863, 1639, 1479, 1638, 1678, 1458, 762, 763,
1629, 1478, 1453, 1679, 1626, 1627, 1450, 1451, 1215, 759, 758, 1623, 1447, 1622,
1446, 1009, 1401, 1437, 1001, 751, 1397, 1434, 1435, 1395, 997, 1614, 1597, 1394,
831, 1389, 995, 1615, 985, 1431, 1430, 1594, 1595, 994, 1386, 1387, 981, 979, 1985,
1591, 1590, 978, 1383, 735, 1382, 1422, 1151, 1373, 973, 1423, 953, 971, 509, 1370,
1371, 1953, 970, 949, 506, 507, 1937, 1273, 947, 1583, 967, 1367, 1366, 946, 1889,
966, 941, 1929, 1269, 502, 503, 1267, 938, 939, 1266, 1261, 1358, 1341, 703, 1873,
1925, 1258, 1359, 1259, 1923, 495, 1338, 1339, 935, 934, 889, 1865, 925, 1922, 1567,
885, 1841, 922, 923, 1254, 1255, 1334, 1245, 883, 1335, 1861, 882, 877, 1761, 1242,
1243, 1859, 1833, 919, 918, 874, 875, 479, 1858, 1745, 1829, 1239, 1238, 1327, 1737,

TABLE 4-continued 1827, 1817, 871, 870, 639, 861, 910, 911, 1826, 1230, 858, 859, 1213, 1713, 1733,
1813, 1231, 1731, 1210, 1211, 1705, 1811, 761, 1730, 855, 854, 1810, 1701, 757,
1805, 1311, 1207, 447, 1206, 755, 754, 749, 1699, 846, 829, 1689, 1505, 1803, 1698,
847, 746, 747, 1802, 1649, 826, 827, 1685, 1489, 1199, 1641, 1683, 1481, 1799, 743,
742, 823, 1682, 822, 733, 1149, 1798, 730, 731, 1637, 1146, 1147, 1677, 1457, 1477,
1635, 1625, 1675, 1475, 1634, 1449, 1674, 727, 383, 815, 726, 1143, 1142, 1621,
1474, 1183, 1445, 1619, 1671, 1443, 505, 701, 718, 719, 1618, 1135, 1433, 1670, 698,
699, 501, 1613, 1442, 1393, 499, 1593, 1429, 1611, 498, 799, 1385, 493, 1610, 695,
1427, 694, 1589, 1426, 490, 491, 1381, 1587, 1421, 993, 1607, 1921, 1857, 977, 1825,
969, 1729, 945, 1809, 965, 1265, 937, 1369, 1697, 963, 1801, 1379, 881, 962, 933,
1257, 1365, 1419, 1581, 1378, 1473, 1797, 921, 1586, 1681, 1337, 1418, 931, 1363,
1579, 1606, 873, 1253, 1415, 1633, 1795, 1357, 917, 1241, 1565, 930, 1362, 1578,
1673, 1333, 1414, 1251, 1794, 1441, 1575, 869, 1355, 753, 915, 477, 1563, 857, 1237,
1617, 1250, 1331, 909, 1574, 1669, 487, 1354, 867, 1325, 914, 1562, 1351, 1209, 475,
637, 1235, 1330, 1425, 1559, 745, 853, 907, 486, 1667, 866, 961, 1229, 1609, 1323,
1350, 474, 1377, 255, 1234, 445, 635, 1558, 825, 1205, 906, 471, 1585, 687, 1666,
851, 1119, 1309, 741, 903, 1227, 1322, 1417, 1551, 845, 1605, 634, 1319, 729, 443,
470, 1203, 850, 497, 631, 821, 1145, 902, 1226, 1307, 739, 1550, 929, 1197, 1361,
463, 1577, 843, 1223, 1318, 1413, 1603, 442, 1793, 671, 1202, 630, 725, 439, 1306,
738, 819, 1087, 381, 462, 1141, 1195, 842, 1222, 1303, 489, 623, 1602, 813, 1249,
1411, 1573, 839, 697, 1353, 438, 723, 818, 913, 1181, 1561, 1194, 379, 1302, 1139,
717, 1329, 431, 1410, 811, 1191, 838, 485, 1571, 865, 1133, 722, 1295, 693, 1349,
1179, 378, 473, 607, 1138, 797, 1233, 1557, 715, 810, 1190, 375, 905, 1570, 1665,
483, 1294, 807, 1131, 1321, 1178, 691, 1347, 253, 415, 633, 714, 795, 1175, 374, 469,
1555, 685, 849, 1117, 482, 711, 806, 1130, 901, 1225, 1549, 690, 367, 1346, 1127,
1317, 251, 794, 1174, 441, 575, 1554, 1201, 467, 629, 683, 710, 791, 1115, 1305, 737,
899, 1167, 461, 1547, 1126, 841, 1221, 250, 1601, 1315, 669, 466, 682, 247, 790,
1114, 437, 627, 817, 1085, 898, 1166, 351, 679, 1546, 1111, 1193, 1301, 459, 621,
783, 1219, 1314, 1409, 1543, 837, 667, 246, 626, 721, 435, 678, 1083, 1110, 377, 458,
1137, 239, 782, 1218, 1299, 429, 619, 1542, 809, 1189, 666, 455, 1569, 835, 1103,
1293, 434, 663, 1082, 1177, 605, 319, 1298, 618, 1079, 713, 373, 427, 454, 1187, 834,
1102, 481, 615, 805, 1129, 662, 1291, 689, 1345, 223, 413, 603, 1078, 793, 1173, 426,
1553, 655, 1186, 371, 614, 709, 423, 1290, 803, 1071, 365, 1125, 602, 1287, 249, 411,
573, 654, 1171, 370, 465, 599, 681, 789, 1113, 422, 707, 802, 897, 1165, 1545, 363,
1286, 1123, 410, 1313, 191, 1170, 571, 598, 245, 407, 625, 706, 787, 1055, 349, 677,
1109, 1163, 362, 457, 591, 1122, 781, 1217, 1541, 570, 359, 665, 406, 243, 786, 433,
567, 1081, 1162, 347, 675, 590, 1107, 237, 1297, 399, 617, 779, 1159, 358, 453, 1539,
833, 1101, 242, 566, 661, 346, 674, 127, 1106, 317, 398, 1077, 235, 778, 1158, 343,
425, 559, 1538, 1185, 451, 613, 775, 1099, 1289, 659, 221, 601, 234, 315, 342, 1075,
653, 369, 450, 231, 774, 1098, 421, 611, 801, 1069, 658, 335, 1095, 1285, 219, 314,
409, 543, 1074, 1169, 597, 651, 230, 311, 610, 705, 419, 334, 1067, 1094, 361, 218,
1121, 1283, 189, 569, 650, 215, 310, 405, 595, 785, 1053, 418, 647, 1066, 1161, 589,
303, 1282, 1063, 357, 187, 214, 594, 241, 403, 565, 646, 1051, 345, 673, 1105, 207,
397, 587, 1062, 777, 1157, 186, 1537, 355, 402, 183, 1050, 563, 125, 206, 287, 586,
1047, 233, 341, 395, 557, 1155, 354, 449, 583, 773, 1097, 182, 562, 657, 123, 1046,
313, 394, 1073, 175, 1154, 339, 555, 582, 229, 391, 609, 771, 1039, 333, 1093, 122,
217, 541, 338, 554, 119, 649, 309, 390, 227, 770, 1038, 417, 551, 1065, 331, 1091,
1281, 159, 539, 118, 213, 593, 226, 307, 550, 645, 330, 111, 1090, 301, 1061, 538,
327, 185, 211, 306, 401, 535, 1049, 643, 205, 585, 299, 326, 1059, 353, 210, 534, 181,
561, 642, 95, 285, 1045, 203, 298, 393, 527, 1058, 1153, 581, 295, 179, 121, 202, 283,
526, 1043, 173, 337, 553, 199, 294, 389, 579, 769, 1037, 178, 282, 63, 1042, 117, 171,
198, 279, 578, 225, 387, 549, 1035, 329, 1089, 157, 537, 170, 278, 115, 305, 386, 167,
1034, 547, 109, 271, 1031, 325, 155, 114, 209, 533, 166, 546, 641, 270, 107, 1030,
297, 154, 1057, 323, 151, 531, 93, 106, 201, 525, 322, 103, 293, 150, 530, 177, 91,
281, 1041, 143, 523, 102, 197, 577, 291, 90, 61, 142, 522, 87, 169, 277, 195, 290, 385,
519, 1033, 59, 86, 113, 194, 275, 518, 165, 545, 79, 269, 1029, 58, 153, 274, 55, 163,
78, 105, 267, 1027, 321, 54, 149, 529, 162, 266, 47, 1026, 101, 263, 147, 89, 141, 521,
262, 99, 289, 146, 31, 85, 139, 98, 193, 517, 57, 138, 83, 273, 135, 515, 77, 82, 53,
134, 514, 161, 75, 265, 1025, 51, 74, 45, 71, 261, 50, 145, 43, 70, 97, 259, 29, 42, 137,
258, 39, 27, 81, 38, 133, 513, 26, 23, 131, 73, 22, 49, 130, 15, 69, 14, 41, 67, 257, 66,
37, 25, 35, 21, 34, 129, 19, 13, 18, 11, 65, 10, 7, 6, 33, 17, 9, 5, 3, 2, 1, 4, 8, 12, 16, 20,
24, 28, 30, 32, 36, 40, 44, 46, 48, 52, 56, 60, 62, 64, 68, 72, 76, 80, 84, 88, 92, 94, 96,
100, 104, 108, 110, 112, 116, 120, 124, 126, 128, 132, 136, 140, 144, 148, 152, 156,
158, 160, 164, 168, 172, 174, 176, 180, 184, 188, 190, 192, 196, 200, 204, 208, 212,
216, 220, 222, 224, 228, 232, 236, 238, 240, 244, 248, 252, 254, 256, 260, 264, 268,
272, 276, 280, 284, 286, 288, 292, 296, 300, 302, 304, 308, 312, 316, 318, 320, 324,
328, 332, 336, 340, 344, 348, 350, 352, 356, 360, 364, 366, 368, 372, 376, 380, 382,
384, 388, 392, 396, 400, 404, 408, 412, 414, 416, 420, 424, 428, 430, 432, 436, 440,
444, 446, 448, 452, 456, 460, 464, 468, 472, 476, 478, 480, 484, 488, 492, 494, 496,
500, 504, 508, 510, 512, 516, 520, 524, 528, 532, 536, 540, 542, 544, 548, 552, 556,
558, 560, 564, 568, 572, 574, 576, 580, 584, 588, 592, 596, 600, 604, 606, 608, 612,
616, 620, 622, 624, 628, 632, 636, 638, 640, 644, 648, 652, 656, 660, 664, 668, 670,
672, 676, 680, 684, 686, 688, 692, 696, 700, 702, 704, 708, 712, 716, 720, 724, 728,
732, 734, 736, 740, 744, 748, 750, 752, 756, 760, 764, 766, 768, 772, 776, 780, 784,
788, 792, 796, 798, 800, 804, 808, 812, 814, 816, 820, 824, 828, 830, 832, 836, 840,
844, 848, 852, 856, 860, 862, 864, 868, 872, 876, 878, 880, 884, 888, 892, 894, 896,
900, 904, 908, 912, 916, 920, 924, 926, 928, 932, 936, 940, 942, 944, 948, 952, 956,
958, 960, 964, 968, 972, 976, 980, 984, 988, 990, 992, 996, 1000, 1004, 1006, 1008,
1012, 1016, 1020, 1022, 1024, 1028, 1032, 1036, 1040, 1044, 1048, 1052, 1054, 1056,
1060, 1064, 1068, 1070, 1072, 1076, 1080, 1084, 1086, 1088, 1092, 1096, 1100, 1104,

TABLE 4-continued 1108, 1112, 1116, 1118, 1120, 1124, 1128, 1132, 1134, 1136, 1140, 1144, 1148, 1150,
1152, 1156, 1160, 1164, 1168, 1172, 1176, 1180, 1182, 1184, 1188, 1192, 1196, 1198,
1200, 1204, 1208, 1212, 1214, 1216, 1220, 1224, 1228, 1232, 1236, 1240, 1244, 1246,
1248, 1252, 1256, 1260, 1262, 1264, 1268, 1272, 1276, 1278, 1280, 1284, 1288, 1292,
1296, 1300, 1304, 1308, 1310, 1312, 1316, 1320, 1324, 1326, 1328, 1332, 1336, 1340,
1342, 1344, 1348, 1352, 1356, 1360, 1364, 1368, 1372, 1374, 1376, 1380, 1384, 1388,
1390, 1392, 1396, 1400, 1404, 1406, 1408, 1412, 1416, 1420, 1424, 1428, 1432, 1436,
1438, 1440, 1444, 1448, 1452, 1454, 1456, 1460, 1464, 1468, 1470, 1472, 1476, 1480,
1484, 1488, 1492, 1496, 1500, 1502, 1504, 1508, 1512, 1516, 1518, 1520, 1524, 1528,
1532, 1534, 1536, 1540, 1544, 1548, 1552, 1556, 1560, 1564, 1566, 1568, 1572, 1576,
1580, 1582, 1584, 1588, 1592, 1596, 1598, 1600, 1604, 1608, 1612, 1616, 1620, 1624,
1628, 1630, 1632, 1636, 1640, 1644, 1646, 1648, 1652, 1656, 1660, 1662, 1664, 1668,
1672, 1676, 1680, 1684, 1688, 1692, 1694, 1696, 1700, 1704, 1708, 1710, 1712, 1716,
1720, 1724, 1726, 1728, 1732, 1736, 1740, 1744, 1748, 1752, 1756, 1758, 1760, 1764,
1768, 1772, 1774, 1776, 1780, 1784, 1788, 1790, 1792, 1796, 1800, 1804, 1808, 1812,
1816, 1820, 1822, 1824, 1828, 1832, 1836, 1838, 1840, 1844, 1848, 1852, 1854, 1856,
1860, 1864, 1868, 1872, 1876, 1880, 1884, 1886, 1888, 1892, 1896, 1900, 1902, 1904,
1908, 1912, 1916, 1918, 1920, 1924, 1928, 1932, 1936, 1940, 1944, 1948, 1950, 1952,
1956, 1960, 1964, 1966, 1968, 1972, 1976, 1980, 1982, 1984, 1988, 1992, 1996, 2000,
2004, 2008, 2012, 2014, 2016, 2020, 2024, 2028, 2030, 2032, 2036, 2040, 2044, 2046,
2048
M = 2400, N = 4096
2043, 2045, 2047, 2039, 2031, 2015, 1983, 1919, 2559, 2041, 2815, 2034,
2037, 2035, 1791, 2029, 2027, 2927, 2935, 2023, 2939, 2941, 2943, 2013, 2975, 2011,
2991, 2007, 2999, 3003, 2911, 3005, 3007, 3023, 3031, 2813, 3035, 3037, 3039, 1981,
3047, 2811, 1979, 1999, 2807, 3051, 3053, 3055, 1975, 3058, 3059, 3061, 3063, 3065,
3067, 3069, 3071, 1535, 2799, 1967, 2879, 1917, 1915, 2783, 1951, 3057, 3199, 1911,
3049, 3263, 3042, 1903, 2555, 2557, 3033, 3043, 3045, 3026, 3029, 3295, 2551, 2751,
3018, 3311, 3027, 3319, 3323, 3325, 1887, 2543, 3001, 3019, 3021, 3327, 2994, 3321,
2997, 1789, 1023, 2986, 3314, 3317, 2995, 1787, 3015, 1783, 2527, 2987, 2989, 3307,
3309, 3315, 3387, 3389, 3391, 3407, 2983, 2937, 3415, 1775, 3383, 2973, 3419, 3421,
3303, 3423, 2687, 2930, 1855, 2931, 2933, 2971, 3291, 3293, 3431, 2925, 3435, 3437,
2967, 3439, 3375, 3442, 3443, 3445, 3447, 2923, 3287, 3449, 3451, 3453, 3455, 1759,
2025, 2033, 2495, 2907, 2909, 2919, 2959, 3261, 3259, 3279, 2018, 2021, 1533, 3471,
3479, 3483, 3485, 3359, 3487, 2009, 1531, 2903, 2019, 2809, 3255, 3495, 1527, 2002,
1727, 1994, 2005, 2802, 2805, 2003, 2803, 3498, 3499, 3501, 3503, 3506, 2877, 3507,
3509, 1997, 2797, 2895, 3511, 3513, 3247, 3515, 1977, 3517, 2875, 3519, 1519, 1962,
1965, 1970, 1971, 1973, 1991, 1995, 2431, 2779, 2781, 2791, 2795, 2871, 3195, 3197,
1963, 3527, 3530, 3531, 3533, 3535, 3538, 1503, 3539, 3541, 2863, 3231, 3543, 3191,
3545, 1663, 1906, 1909, 1913, 1947, 1949, 1959, 1907, 2749, 2775, 2767, 3183, 3547,
3549, 3551, 3554, 3555, 2747, 1901, 3557, 3559, 1943, 2553, 3561, 3553, 3563, 3565,
3567, 3569, 3570, 1019, 1021, 1471, 1885, 1895, 1899, 1935, 2303, 2541, 2539, 1015,
2546, 2547, 1883, 2549, 2743, 2847, 3167, 2735, 3529, 3537, 3505, 3525, 3571, 3573,
3575, 3522, 3577, 3579, 3581, 3583, 1007, 1778, 1781, 1785, 1879, 2523, 2525, 2535,
1779, 2683, 2685, 3490, 3481, 3493, 3497, 3523, 1853, 2519, 3491, 1773, 1871, 3441,
2719, 3615, 2679, 1851, 3474, 3477, 991, 1407, 1757, 1767, 1771, 1847, 2491, 2493,
2511, 2671, 3135, 1755, 3417, 3426, 3429, 3427, 3433, 3466, 3469, 3475, 3626, 3041,
3467, 3629, 2487, 3631, 3634, 3410, 3635, 1839, 3413, 3637, 3639, 959, 1725, 1751,
1743, 2479, 2655, 2993, 3013, 3017, 3025, 3010, 3313, 3385, 3402, 1723, 3305, 3403,
3405, 3411, 3463, 1529, 3378, 3613, 3381, 3623, 3627, 3641, 3611, 2985, 3011, 3643,
1823, 2429, 1522, 3298, 3645, 1525, 1279, 1515, 1517, 1523, 1719, 2423, 2427, 1711,
2463, 2929, 2962, 2965, 2969, 2978, 2979, 2981, 3274, 3282, 2921, 3283, 3285, 3289,
3299, 3301, 3370, 3371, 3373, 3379, 3399, 3607, 1511, 2963, 3647, 3655, 1501, 2623,
895, 1495, 1499, 1655, 1659, 1661, 1695, 2415, 2890, 2898, 2899, 2901, 2905, 2914,
2915, 2399, 2917, 2951, 2954, 2955, 2957, 2893, 3242, 1469, 3245, 3250, 3251, 3253,
2801, 1487, 3243, 3257, 2873, 3271, 2301, 3275, 3277, 3351, 3355, 3357, 1463, 1467,
1647, 2001, 2017, 2295, 2299, 2777, 2786, 2787, 2789, 1017, 2793, 2858, 2770, 2861,
2866, 2773, 2867, 2869, 4095, 4093, 4091, 4087, 4079, 4063, 4089, 4031, 4085, 4083,
4077, 4082, 3967, 4075, 4061, 4071, 4059, 3839, 4029, 4055, 4027, 4081, 4047, 4023,
3965, 4073, 3963, 4015, 4069, 4057, 3959, 4067, 3837, 3999, 4053, 4066, 3951, 3835,
4025, 4051, 4045, 4050, 3831, 4021, 3935, 4043, 4019, 3961, 4042, 3823, 4013, 4039,
4018, 3903, 3957, 4011, 4065, 3807, 3997, 4010, 3955, 4007, 3949, 3833, 3995, 3954,
4049, 3947, 3775, 3829, 3991, 3933, 4041, 3943, 3827, 4017, 3931, 3821, 3983, 4037,
3826, 3711, 3901, 3819, 3927, 4009, 4035, 3805, 3899, 3953, 4034, 3815, 4005, 3919,
3803, 3993, 3895, 4003, 3945, 3773, 3799, 3989, 4002, 3887, 3941, 3771, 3825, 3987,
3929, 3791, 3981, 3939, 3986, 3767, 3709, 3871, 3817, 3925, 3979, 3938, 4033, 3707,
3897, 3978, 3759, 3923, 3813, 3975, 3917, 3801, 3922, 3703, 3893, 3811, 4001, 3915,
3743, 3797, 3810, 3891, 3914, 3695, 3885, 3911, 3769, 3795, 3890, 3985, 3789, 3883,
3937, 3794, 3765, 3679, 3869, 3787, 3882, 3977, 3879, 3763, 3705, 3786, 3867, 3757,
3921, 3783, 3973, 3762, 3701, 3755, 3863, 3809, 3971, 3913, 3741, 3754, 3699, 3889,
3970, 3751, 3693, 3855, 3909, 3739, 3698, 3793, 3691, 3881, 3907, 3735, 3677, 3785,
3906, 3687, 3877, 3761, 3675, 3865, 3727, 3781, 3875, 3671, 3753, 3861, 3779, 3874,
3969, 3697, 3778, 3859, 3749, 3663, 3853, 3737, 3858, 3747, 3689, 3851, 3905, 3733,
3746, 3850, 3685, 3847, 3731, 3673, 3725, 3683, 3873, 3730, 3669, 3723, 3682, 3777,
3722, 3667, 3857, 3719, 3661, 3666, 3745, 3659, 3849, 3658, 3521, 3845, 3729, 3681,
3843, 1993, 3721, 1969, 3842, 3489, 1989, 3665, 3717, 1961, 1987, 3473, 3715, 3009,
3657, 1905, 1986, 3425, 1957, 3633, 3714, 1945, 3465, 3599, 3653, 3367, 1955, 1897,
2545, 3193, 2977, 3409, 3625, 1941, 2891, 3461, 3651, 1954, 3841, 1893, 3189, 1777,
2537, 3650, 1939, 3297, 3459, 3621, 1881, 2887, 2745, 3401, 1933, 2771, 2961, 3229,
3609, 1891, 3187, 1938, 2765, 3377, 3458, 1013, 2859, 3239, 2533, 3619, 2913, 3181, TABLE 4-continued 3343, 1769, 1877, 1931, 2741, 3397, 1890, 3227, 1985, 2521, 3186, 2845, 3281, 3605,
2763, 2953, 3618, 1011, 3713, 2531, 1849, 2855, 3179, 1930, 3369, 1875, 1005, 2739,
3395, 1765, 1927, 2681, 2762, 2843, 3223, 1869, 2517, 3603, 1010, 2733, 2897, 3165,
2530, 1753, 2759, 2949, 3273, 1874, 3597, 1521, 2738, 3394, 1845, 1003, 3175, 3365,
1763, 1953, 2489, 3602, 3249, 1867, 2515, 2677, 2731, 2839, 3163, 3353, 2785, 989,
2947, 3215, 1749, 2509, 3595, 2889, 3269, 1762, 1843, 3649, 1405, 3363, 2717, 999,
1866, 2514, 1513, 2730, 1837, 2485, 2675, 2865, 3133, 2946, 1863, 1721, 2727, 3594,
987, 3159, 3241, 3349, 1747, 1842, 2507, 2669, 1937, 2831, 3267, 3362, 3457, 3591,
1403, 2885, 2715, 1741, 2674, 1455, 2769, 1835, 2483, 1509, 3131, 1889, 2425, 767,
1746, 2506, 957, 3185, 2287, 3266, 3347, 1717, 2477, 2667, 983, 2857, 3237, 1497,
1631, 2503, 3617, 1821, 2883, 3151, 3341, 1739, 1834, 2482, 1399, 1929, 2711, 3225,
1507, 2653, 1831, 2367, 3346, 955, 3127, 2761, 2421, 1715, 2475, 1009, 1277, 3235,
2882, 1439, 1657, 2529, 2663, 1738, 1819, 2853, 3177, 1493, 3339, 1709, 1873, 975,
1506, 2737, 3393, 1735, 2271, 1925, 2461, 2651, 2841, 3221, 1714, 2474, 1391, 3601,
2703, 3234, 2419, 951, 1275, 2757, 1465, 1599, 2471, 3338, 893, 2851, 3119, 1491,
1653, 2413, 1707, 1815, 1001, 3173, 3335, 1761, 2297, 1923, 2459, 2621, 1485, 3219,
2418, 1865, 2513, 2647, 2729, 2837, 3161, 1693, 2755, 2850, 511, 1490, 2945, 3213,
1706, 891, 1271, 3593, 1461, 1651, 2411, 1841, 943, 3171, 1922, 1375, 3361, 1703,
2239, 3218, 997, 2619, 1483, 1645, 2293, 1807, 2455, 2673, 2754, 2835, 3103, 1861,
2397, 1691, 2725, 985, 3157, 1650, 3211, 1745, 2505, 2639, 3170, 1459, 2829, 3265,
887, 3589, 1401, 2407, 1482, 2713, 995, 1263, 1453, 1643, 2291, 2834, 1833, 2481,
2615, 1479, 3129, 1859, 3210, 2395, 765, 2723, 927, 3155, 1458, 2285, 3345, 1687,
2447, 2665, 981, 2827, 3207, 1629, 2501, 3587, 994, 1343, 2881, 3149, 2290, 1737,
1397, 1451, 2709, 879, 1858, 1505, 2722, 1639, 2175, 3154, 1829, 2365, 763, 953,
3125, 2283, 2826, 2391, 1713, 2473, 2607, 3586, 979, 1247, 3233, 1437, 1627, 2499,
2661, 1817, 2823, 3147, 1450, 3337, 1679, 1395, 973, 2707, 1733, 2269, 1447, 2649,
1827, 2363, 1389, 3123, 978, 2701, 2417, 759, 2498, 949, 1273, 2279, 3146, 1435,
1597, 2469, 2659, 863, 1394, 2849, 3117, 1489, 2706, 1623, 2383, 1705, 1813, 971,
3143, 3333, 1731, 1826, 2267, 1921, 2457, 2591, 3122, 3217, 1387, 2645, 2699, 2359,
2658, 947, 1215, 2753, 509, 1595, 2467, 889, 1269, 3115, 970, 1431, 1649, 2409, 751,
1730, 1811, 941, 3169, 1373, 3331, 1701, 2237, 967, 2617, 1481, 2698, 1615, 2263,
1805, 2453, 2643, 946, 2833, 3101, 2466, 1383, 1689, 2695, 3114, 507, 3209, 831,
1267, 1810, 2637, 1457, 1591, 2351, 3330, 885, 939, 3111, 1371, 2405, 1699, 2235,
993, 1261, 2642, 1423, 1641, 2289, 1803, 2451, 2613, 1477, 3099, 1857, 2393, 735,
1266, 2721, 925, 3153, 2255, 1685, 2445, 2635, 938, 503, 2825, 3205, 1698, 883,
1151, 3585, 1341, 2403, 935, 1259, 1802, 2450, 1367, 1449, 1583, 2231, 877, 2611,
1475, 1637, 2173, 1799, 2335, 761, 2634, 923, 3095, 2281, 2389, 1683, 882, 2443,
2605, 977, 1245, 3203, 2402, 1625, 2497, 2631, 1339, 2821, 3145, 1677, 1393, 2610,
495, 1474, 2705, 875, 1255, 1445, 1635, 2171, 1825, 2361, 703, 1682, 2442, 1359,
3121, 2223, 3202, 2387, 757, 2603, 919, 1243, 2277, 1433, 1567, 2439, 2657, 861,
2819, 3087, 1621, 2381, 1675, 1335, 969, 3141, 1634, 1729, 2265, 1443, 2589, 871,
2386, 1385, 2602, 2167, 2697, 2357, 755, 945, 1213, 2275, 2818, 479, 1593, 2465,
2599, 1674, 859, 1239, 3113, 1429, 1619, 2379, 749, 1809, 911, 3139, 1442, 3329,
1671, 2207, 965, 2587, 1613, 2261, 754, 1327, 2641, 2274, 2355, 1381, 1211, 2693,
505, 639, 1618, 2378, 829, 1265, 2159, 3138, 1427, 1589, 2349, 747, 855, 937, 3109,
1369, 2375, 1697, 2233, 963, 1231, 1421, 1611, 2259, 2354, 1801, 2449, 2583, 3097,
1379, 733, 2691, 447, 1426, 2253, 827, 1207, 2633, 501, 1587, 2347, 881, 1149, 3107,
962, 1311, 2401, 743, 1610, 2258, 933, 1257, 1365, 1419, 1581, 2229, 847, 1378,
2609, 1473, 2690, 1607, 2143, 1797, 2333, 731, 921, 3093, 1586, 2251, 2346, 1681,
2441, 2575, 3106, 499, 3201, 823, 1147, 2629, 1337, 2343, 1418, 931, 1199, 1363,
493, 1579, 2227, 873, 1253, 1415, 1633, 2169, 1795, 2250, 2331, 701, 1357, 3091,
498, 2221, 2385, 727, 2601, 917, 1241, 2247, 1565, 2437, 2627, 930, 383, 1362, 2817,
3085, 1578, 2226, 1143, 1673, 1333, 491, 815, 1251, 1794, 1441, 1575, 2111, 3090,
869, 699, 1355, 2165, 2219, 2327, 753, 2626, 915, 1183, 2273, 477, 1563, 2435, 2597,
857, 1237, 3083, 1617, 2377, 719, 1250, 1331, 909, 3137, 1669, 2205, 487, 1354,
2585, 867, 2218, 1135, 1325, 2163, 914, 2353, 695, 2434, 1351, 1209, 2215, 3082,
475, 637, 2595, 799, 1235, 1330, 2157, 1425, 1559, 2319, 745, 853, 907, 3079, 2373,
1667, 866, 2203, 961, 1229, 2162, 1609, 2257, 1323, 2581, 1377, 2594, 255, 1234,
2689, 445, 635, 825, 1205, 2155, 906, 471, 1585, 2345, 687, 1666, 851, 1119, 3105,
1309, 2371, 741, 903, 1227, 1322, 1417, 1551, 2199, 845, 2579, 1605, 2141, 1319,
729, 443, 2249, 1203, 850, 2573, 497, 631, 2370, 821, 1145, 2151, 1226, 1307, 2341,
739, 929, 1197, 1361, 2578, 463, 1577, 2225, 843, 1223, 1413, 1603, 2139, 1793,
2329, 671, 1202, 3089, 2191, 725, 2571, 439, 2245, 738, 819, 1087, 2625, 381, 2339,
1141, 1195, 842, 1303, 489, 623, 1602, 813, 1249, 1411, 1573, 2109, 839, 697, 1353,
2570, 2135, 2217, 2325, 723, 818, 913, 1181, 2243, 2338, 1561, 2433, 2567, 1194,
379, 3081, 1139, 717, 1329, 431, 1410, 811, 1191, 485, 1571, 2107, 865, 1133, 722,
1295, 2161, 2242, 2323, 693, 1349, 1179, 2213, 473, 607, 1138, 2593, 797, 1233,
2127, 1557, 2317, 715, 810, 375, 905, 3077, 1570, 1665, 2201, 483, 807, 1131, 2322,
1321, 2103, 691, 1347, 253, 2211, 415, 633, 714, 795, 1175, 2153, 469, 1555, 2315,
685, 849, 1117, 3075, 482, 2369, 711, 901, 1225, 1549, 2197, 690, 367, 1346, 2577,
2210, 1127, 1317, 251, 441, 575, 1554, 2314, 1201, 2095, 3074, 467, 629, 683, 791,
1115, 2149, 1305, 2311, 737, 899, 1167, 461, 1547, 2195, 841, 1221, 1601, 2137,
1315, 669, 466, 2189, 682, 247, 2569, 437, 627, 817, 1085, 2147, 898, 351, 2337, 679,
1546, 2194, 1111, 1193, 1301, 459, 621, 783, 1219, 1314, 1409, 1543, 2079, 837, 667,
2133, 626, 2187, 721, 2146, 435, 2241, 1083, 2565, 377, 458, 1137, 239, 1218, 1299,
429, 619, 809, 1189, 455, 1569, 2105, 835, 2186, 1103, 1293, 2131, 434, 2321, 663,
1177, 2183, 605, 2563, 319, 1298, 2125, 1079, 713, 373, 427, 1187, 834, 481, 615,
2130, 805, 1129, 1291, 2101, 689, 1345, 2562, 223, 2209, 413, 603, 793, 1173, 2123,
426, 1553, 2313, 655, 1186, 371, 3073, 709, 423, 1290, 803, 1071, 365, 2099, 1125,
1287, 249, 2122, 411, 573, 1171, 370, 2093, 465, 599, 681, 789, 1113, 2119, 2309, TABLE 4-continued 707, 802, 897, 1165, 2098, 1545, 2193, 363, 1123, 1313, 191, 1170, 571, 245, 2091,
407, 625, 706, 787, 1055, 2145, 349, 2307, 677, 1109, 1163, 457, 591, 1122, 781,
1217, 1541, 2077, 359, 665, 2090, 2185, 243, 786, 433, 567, 2306, 1081, 2087, 1162,
347, 675, 1107, 237, 1297, 399, 617, 779, 1159, 453, 1539, 2075, 833, 1101, 242,
2129, 661, 2181, 674, 127, 1106, 2561, 317, 1077, 235, 778, 343, 425, 559, 1538,
1185, 451, 613, 775, 1099, 1289, 2071, 659, 221, 2179, 601, 315, 2121, 1075, 653,
369, 450, 231, 1098, 421, 611, 801, 1069, 658, 335, 2097, 2178, 1095, 1285, 219, 409,
543, 1074, 1169, 2063, 597, 651, 311, 2117, 610, 705, 419, 1067, 361, 1121, 1283,
189, 569, 650, 215, 2089, 405, 595, 785, 1053, 2115, 418, 2305, 647, 1066, 1161, 589,
303, 1282, 1063, 357, 187, 594, 241, 2114, 403, 565, 1051, 2085, 345, 673, 1105, 207,
397, 587, 777, 1157, 1537, 2073, 355, 402, 183, 563, 125, 2083, 287, 586, 1047, 233,
341, 395, 557, 1155, 354, 449, 583, 773, 1097, 2069, 562, 657, 2082, 2177, 123, 313,
394, 1073, 175, 1154, 339, 555, 229, 391, 609, 771, 1039, 333, 2067, 1093, 217, 541,
338, 2061, 554, 119, 649, 309, 227, 770, 417, 551, 2066, 1065, 331, 1091, 1281, 159,
539, 213, 2059, 593, 226, 307, 2113, 645, 330, 111, 1090, 301, 1061, 327, 185, 2058,
211, 306, 401, 535, 1049, 2055, 643, 205, 585, 299, 1059, 353, 210, 181, 561, 642, 95,
2081, 285, 1045, 203, 298, 393, 527, 1058, 1153, 581, 295, 179, 121, 202, 283, 1043,
173, 337, 553, 199, 389, 579, 769, 1037, 178, 2065, 63, 1042, 117, 171, 279, 578, 225,
387, 549, 1035, 329, 1089, 157, 537, 170, 2057, 115, 305, 386, 167, 1034, 547, 109,
271, 1031, 325, 155, 114, 209, 533, 2053, 546, 641, 107, 297, 1057, 323, 151, 531, 93,
2051, 201, 525, 322, 103, 293, 530, 177, 2050, 91, 281, 1041, 143, 523, 197, 577, 291,
61, 522, 87, 169, 277, 195, 290, 385, 519, 1033, 59, 113, 194, 275, 165, 545, 79, 269,
1029, 153, 274, 55, 163, 105, 267, 1027, 321, 149, 529, 162, 2049, 266, 47, 1026, 101,
263, 147, 89, 141, 521, 99, 289, 146, 31, 85, 139, 98, 193, 517, 57, 138, 83, 273, 135,
515, 77, 82, 53, 514, 161, 75, 265, 1025, 51, 74, 45, 71, 261, 50, 145, 43, 97, 259, 29,
42, 137, 258, 39, 27, 81, 133, 513, 23, 131, 73, 49, 130, 15, 69, 41, 67, 257, 66, 37, 25,
35, 21, 34, 129, 19, 13, 18, 11, 65, 10, 7, 33, 17, 9, 5, 3, 2, 1, 4, 6, 8, 12, 14, 16, 20, 22,
24, 26, 28, 30, 32, 36, 38, 40, 44, 46, 48, 52, 54, 56, 58, 60, 62, 64, 68, 70, 72, 76, 78,
80, 84, 86, 88, 90, 92, 94, 96, 100, 102, 104, 106, 108, 110, 112, 116, 118, 120, 122,
124, 126, 128, 132, 134, 136, 140, 142, 144, 148, 150, 152, 154, 156, 158, 160, 164,
166, 168, 172, 174, 176, 180, 182, 184, 186, 188, 190, 192, 196, 198, 200, 204, 206,
208, 212, 214, 216, 218, 220, 222, 224, 228, 230, 232, 234, 236, 238, 240, 244, 246,
248, 250, 252, 254, 256, 260, 262, 264, 268, 270, 272, 276, 278, 280, 282, 284, 286,
288, 292, 294, 296, 300, 302, 304, 308, 310, 312, 314, 316, 318, 320, 324, 326, 328,
332, 334, 336, 340, 342, 344, 346, 348, 350, 352, 356, 358, 360, 362, 364, 366, 368,
372, 374, 376, 378, 380, 382, 384, 388, 390, 392, 396, 398, 400, 404, 406, 408, 410,
412, 414, 416, 420, 422, 424, 428, 430, 432, 436, 438, 440, 442, 444, 446, 448, 452,
454, 456, 460, 462, 464, 468, 470, 472, 474, 476, 478, 480, 484, 486, 488, 490, 492,
494, 496, 500, 502, 504, 506, 508, 510, 512, 516, 518, 520, 524, 526, 528, 532, 534,
536, 538, 540, 542, 544, 548, 550, 552, 556, 558, 560, 564, 566, 568, 570, 572, 574,
576, 580, 582, 584, 588, 590, 592, 596, 598, 600, 602, 604, 606, 608, 612, 614, 616,
618, 620, 622, 624, 628, 630, 632, 634, 636, 638, 640, 644, 646, 648, 652, 654, 656,
660, 662, 664, 666, 668, 670, 672, 676, 678, 680, 684, 686, 688, 692, 694, 696, 698,
700, 702, 704, 708, 710, 712, 716, 718, 720, 724, 726, 728, 730, 732, 734, 736, 740,
742, 744, 746, 748, 750, 752, 756, 758, 760, 762, 764, 766, 768, 772, 774, 776, 780,
782, 784, 788, 790, 792, 794, 796, 798, 800, 804, 806, 808, 812, 814, 816, 820, 822,
824, 826, 828, 830, 832, 836, 838, 840, 844, 846, 848, 852, 854, 856, 858, 860, 862,
864, 868, 870, 872, 874, 876, 878, 880, 884, 886, 888, 890, 892, 894, 896, 900, 902,
904, 908, 910, 912, 916, 918, 920, 922, 924, 926, 928, 932, 934, 936, 940, 942, 944,
948, 950, 952, 954, 956, 958, 960, 964, 966, 968, 972, 974, 976, 980, 982, 984, 986,
988, 990, 992, 996, 998, 1000, 1002, 1004, 1006, 1008, 1012, 1014, 1016, 1018, 1020,
1022, 1024, 1028, 1030, 1032, 1036, 1038, 1040, 1044, 1046, 1048, 1050, 1052, 1054,
1056, 1060, 1062, 1064, 1068, 1070, 1072, 1076, 1078, 1080, 1082, 1084, 1086, 1088,
1092, 1094, 1096, 1100, 1102, 1104, 1108, 1110, 1112, 1114, 1116, 1118, 1120, 1124,
1126, 1128, 1130, 1132, 1134, 1136, 1140, 1142, 1144, 1146, 1148, 1150, 1152, 1156,
1158, 1160, 1164, 1166, 1168, 1172, 1174, 1176, 1178, 1180, 1182, 1184, 1188, 1190,
1192, 1196, 1198, 1200, 1204, 1206, 1208, 1210, 1212, 1214, 1216, 1220, 1222, 1224,
1228, 1230, 1232, 1236, 1238, 1240, 1242, 1244, 1246, 1248, 1252, 1254, 1256, 1258,
1260, 1262, 1264, 1268, 1270, 1272, 1274, 1276, 1278, 1280, 1284, 1286, 1288, 1292,
1294, 1296, 1300, 1302, 1304, 1306, 1308, 1310, 1312, 1316, 1318, 1320, 1324, 1326,
1328, 1332, 1334, 1336, 1338, 1340, 1342, 1344, 1348, 1350, 1352, 1356, 1358, 1360,
1364, 1366, 1368, 1370, 1372, 1374, 1376, 1380, 1382, 1384, 1386, 1388, 1390, 1392,
1396, 1398, 1400, 1402, 1404, 1406, 1408, 1412, 1414, 1416, 1420, 1422, 1424, 1428,
1430, 1432, 1434, 1436, 1438, 1440, 1444, 1446, 1448, 1452, 1454, 1456, 1460, 1462,
1464, 1466, 1468, 1470, 1472, 1476, 1478, 1480, 1484, 1486, 1488, 1492, 1494, 1496,
1498, 1500, 1502, 1504, 1508, 1510, 1512, 1514, 1516, 1518, 1520, 1524, 1526, 1528,
1530, 1532, 1534, 1536, 1540, 1542, 1544, 1548, 1550, 1552, 1556, 1558, 1560, 1562,
1564, 1566, 1568, 1572, 1574, 1576, 1580, 1582, 1584, 1588, 1590, 1592, 1594, 1596,
1598, 1600, 1604, 1606, 1608, 1612, 1614, 1616, 1620, 1622, 1624, 1626, 1628, 1630,
1632, 1636, 1638, 1640, 1642, 1644, 1646, 1648, 1652, 1654, 1656, 1658, 1660, 1662,
1664, 1668, 1670, 1672, 1676, 1678, 1680, 1684, 1686, 1688, 1690, 1692, 1694, 1696,
1700, 1702, 1704, 1708, 1710, 1712, 1716, 1718, 1720, 1722, 1724, 1726, 1728, 1732,
1734, 1736, 1740, 1742, 1744, 1748, 1750, 1752, 1754, 1756, 1758, 1760, 1764, 1766,
1768, 1770, 1772, 1774, 1776, 1780, 1782, 1784, 1786, 1788, 1790, 1792, 1796, 1798,
1800, 1804, 1806, 1808, 1812, 1814, 1816, 1818, 1820, 1822, 1824, 1828, 1830, 1832,
1836, 1838, 1840, 1844, 1846, 1848, 1850, 1852, 1854, 1856, 1860, 1862, 1864, 1868,
1870, 1872, 1876, 1878, 1880, 1882, 1884, 1886, 1888, 1892, 1894, 1896, 1898, 1900,
1902, 1904, 1908, 1910, 1912, 1914, 1916, 1918, 1920, 1924, 1926, 1928, 1932, 1934,
1936, 1940, 1942, 1944, 1946, 1948, 1950, 1952, 1956, 1958, 1960, 1964, 1966, 1968,
1972, 1974, 1976, 1978, 1980, 1982, 1984, 1988, 1990, 1992, 1996, 1998, 2000, 2004, TABLE 4-continued 2006, 2008, 2010, 2012, 2014, 2016, 2020, 2022, 2024, 2026, 2028, 2030, 2032, 2036, 2038, 2040, 2042, 2044, 2046, 2048, 2052, 2054, 2056, 2060, 2062, 2064, 2068, 2070, 2072, 2074, 2076, 2078, 2080, 2084, 2086, 2088, 2092, 2094, 2096, 2100, 2102, 2104, 2106, 2108, 2110, 2112, 2116, 2118, 2120, 2124, 2126, 2128, 2132, 2134, 2136, 2138, 2140, 2142, 2144, 2148, 2150, 2152, 2154, 2156, 2158, 2160, 2164, 2166, 2168, 2170, 2172, 2174, 2176, 2180, 2182, 2184, 2188, 2190, 2192, 2196, 2198, 2200, 2202, 2204, 2206, 2208, 2212, 2214, 2216, 2220, 2222, 2224, 2228, 2230, 2232, 2234, 2236, 2238, 2240, 2244, 2246, 2248, 2252, 2254, 2256, 2260, 2262, 2264, 2266, 2268, 2270, 2272, 2276, 2278, 2280, 2282, 2284, 2286, 2288, 2292, 2294, 2296, 2298, 2300, 2302, 2304, 2308, 2310, 2312, 2316, 2318, 2320, 2324, 2326, 2328, 2330, 2332, 2334, 2336, 2340, 2342, 2344, 2348, 2350, 2352, 2356, 2358, 2360, 2362, 2364, 2366, 2368, 2372, 2374, 2376, 2380, 2382, 2384, 2388, 2390, 2392, 2394, 2396, 2398, 2400, 2404, 2406, 2408, 2410, 2412, 2414, 2416, 2420, 2422, 2424, 2426, 2428, 2430, 2432, 2436, 2438, 2440, 2444, 2446, 2448, 2452, 2454, 2456, 2458, 2460, 2462, 2464, 2468, 2470, 2472, 2476, 2478, 2480, 2484, 2486, 2488, 2490, 2492, 2494, 2496, 2500, 2502, 2504, 2508, 2510, 2512, 2516, 2518, 2520, 2522, 2524, 2526, 2528, 2532, 2534, 2536, 2538, 2540, 2542, 2544, 2548, 2550, 2552, 2554, 2556, 2558, 2560, 2564, 2566, 2568, 2572, 2574, 2576, 2580, 2582, 2584, 2586, 2588, 2590, 2592, 2596, 2598, 2600, 2604, 2606, 2608, 2612, 2614, 2616, 2618, 2620, 2622, 2624, 2628, 2630, 2632, 2636, 2638, 2640, 2644, 2646, 2648, 2650, 2652, 2654, 2656, 2660, 2662, 2664, 2666, 2668, 2670, 2672, 2676, 2678, 2680, 2682, 2684, 2686, 2688, 2692, 2694, 2696, 2700, 2702, 2704, 2708, 2710, 2712, 2714, 2716, 2718, 2720, 2724, 2726, 2728, 2732, 2734, 2736, 2740, 2742, 2744, 2746, 2748, 2750, 2752, 2756, 2758, 2760, 2764, 2766, 2768, 2772, 2774, 2776, 2778, 2780, 2782, 2784, 2788, 2790, 2792, 2794, 2796, 2798, 2800, 2804, 2806, 2808, 2810, 2812, 2814, 2816, 2820, 2822, 2824, 2828, 2830, 2832, 2836, 2838, 2840, 2842, 2844, 2846, 2848, 2852, 2854, 2856, 2860, 2862, 2864, 2868, 2870, 2872, 2874, 2876, 2878, 2880, 2884, 2886, 2888, 2892, 2894, 2896, 2900, 2902, 2904, 2906, 2908, 2910, 2912, 2916, 2918, 2920, 2922, 2924, 2926, 2928, 2932, 2934, 2936, 2938, 2940, 2942, 2944, 2948, 2950, 2952, 2956, 2958, 2960, 2964, 2966, 2968, 2970, 2972, 2974, 2976, 2980, 2982, 2984, 2988, 2990, 2992, 2996, 2998, 3000, 3002, 3004, 3006, 3008, 3012, 3014, 3016, 3020, 3022, 3024, 3028, 3030, 3032, 3034, 3036, 3038, 3040, 3044, 3046, 3048, 3050, 3052, 3054, 3056, 3060, 3062, 3064, 3066, 3068, 3070, 3072, 3076, 3078, 3080, 3084, 3086, 3088, 3092, 3094, 3096, 3098, 3100, 3102, 3104, 3108, 3110, 3112, 3116, 3118, 3120, 3124, 3126, 3128, 3130, 3132, 3134, 3136, 3140, 3142, 3144, 3148, 3150, 3152, 3156, 3158, 3160, 3162, 3164, 3166, 3168, 3172, 3174, 3176, 3178, 3180, 3182, 3184, 3188, 3190, 3192, 3194, 3196, 3198, 3200, 3204, 3206, 3208, 3212, 3214, 3216, 3220, 3222, 3224, 3226, 3228, 3230, 3232, 3236, 3238, 3240, 3244, 3246, 3248, 3252, 3254, 3256, 3258, 3260, 3262, 3264, 3268, 3270, 3272, 3276, 3278, 3280, 3284, 3286, 3288, 3290, 3292, 3294, 3296, 3300, 3302, 3304, 3306, 3308, 3310, 3312, 3316, 3318, 3320, 3322, 3324, 3326, 3328, 3332, 3334, 3336, 3340, 3342, 3344, 3348, 3350, 3352, 3354, 3356, 3358, 3360, 3364, 3366, 3368, 3372, 3374, 3376, 3380, 3382, 3384, 3386, 3388, 3390, 3392, 3396, 3398, 3400, 3404, 3406, 3408, 3412, 3414, 3416, 3418, 3420, 3422, 3424, 3428, 3430, 3432, 3434, 3436, 3438, 3440, 3444, 3446, 3448, 3450, 3452, 3454, 3456, 3460, 3462, 3464, 3468, 3470, 3472, 3476, 3478, 3480, 3482, 3484, 3486, 3488, 3492, 3494, 3496, 3500, 3502, 3504, 3508, 3510, 3512, 3514, 3516, 3518, 3520, 3524, 3526, 3528, 3532, 3534, 3536, 3540, 3542, 3544, 3546, 3548, 3550, 3552, 3556, 3558, 3560, 3562, 3564, 3566, 3568, 3572, 3574, 3576, 3578, 3580, 3582, 3584, 3588, 3590, 3592, 3596, 3598, 3600, 3604, 3606, 3608, 3610, 3612, 3614, 3616, 3620, 3622, 3624, 3628, 3630, 3632, 3636, 3638, 3640, 3642, 3644, 3646, 3648, 3652, 3654, 3656, 3660, 3662, 3664, 3668, 3670, 3672, 3674, 3676, 3678, 3680, 3684, 3686, 3688, 3690, 3692, 3694, 3696, 3700, 3702, 3704, 3706, 3708, 3710, 3712, 3716, 3718, 3720, 3724, 3726, 3728, 3732, 3734, 3736, 3738, 3740, 3742, 3744, 3748, 3750, 3752, 3756, 3758, 3760, 3764, 3766, 3768, 3770, 3772, 3774, 3776, 3780, 3782, 3784, 3788, 3790, 3792, 3796, 3798, 3800, 3802, 3804, 3806, 3808, 3812, 3814, 3816, 3818, 3820, 3822, 3824, 3828, 3830, 3832, 3834, 3836, 3838, 3840, 3844, 3846, 3848, 3852, 3854, 3856, 3860, 3862, 3864, 3866, 3868, 3870, 3872, 3876, 3878, 3880, 3884, 3886, 3888, 3892, 3894, 3896, 3898, 3900, 3902, 3904, 3908, 3910, 3912, 3916, 3918, 3920, 3924, 3926, 3928, 3930, 3932, 3934, 3936, 3940, 3942, 3944, 3946, 3948, 3950, 3952, 3956, 3958, 3960, 3962, 3964, 3966, 3968, 3972, 3974, 3976, 3980, 3982, 3984, 3988, 3990, 3992, 3994, 3996, 3998, 4000, 4004, 4006, 4008, 4012, 4014, 4016, 4020, 4022, 4024, 4026, 4028, 4030, 4032, 4036, 4038, 4040, 4044, 4046, 4048, 4052, 4054, 4056, 4058, 4060, 4062, 4064, 4068, 4070, 4072, 4074, 4076, 4078, 4080, 4084, 4086, 4088, 4090, 4092, 4094, 4096

What is claimed is:

1. A coding method, comprising:
    determining N to-be-coded bits, wherein N is a positive integer,
        wherein the determining N to-be-coded bits comprises:
            determining N based on M, wherein N=M, M is an output target code length of a polar code, M is equal to a positive integral power of 2, and M is a positive integer;
    obtaining a first sequence that comprises N polar channel sequence numbers;
    determining a location of an information bit in the N to-be-coded bits based on the first sequence; and
    performing polar coding on the N to-be-coded bits to obtain coded bits.

2. The method according to claim 1, wherein obtaining the first sequence that comprises N polar channel sequence numbers comprises:
    obtaining, from a sequence in Table 1 in the appendix or an equivalent replacement sequence of a sequence in Table 1, the first sequence that comprises N polar channel sequences.

3. A coding method, comprising:
    determining N to-be-coded bits, wherein N is a positive integer, wherein determining N to-be-coded bits comprises:

determining N based on M, wherein $N=2^{\lfloor log_2(M-1) \rfloor +1}$, wherein the symbol $\lfloor \ \rfloor$ represents rounding down, M is an output target code length of a polar code, M is not equal to a positive integral power of 2, and M is a positive integer;

obtaining a first sequence that comprises N polar channel sequence numbers;

determining a location of an information bit in the N to-be-coded bits based on the first sequence; and performing polar coding on the N to-be-coded bits to obtain coded bits.

4. The method according to claim 3, wherein the N to-be-coded bits correspond to a mother code whose code length is N; and obtaining the first sequence that comprises N polar channel sequence numbers comprises:

determining, based on a maximum first sequence $S_{max}$ corresponding to a maximum mother code length $N_{max}$ supported by a communications system, a first sequence corresponding to the mother code length N, wherein the first sequence corresponding to the mother code length N is the first sequence that comprises N polar channel sequence numbers.

5. The method according to claim 4, wherein the maximum first sequence $S_{max}$ is a sequence in Table 1 in the appendix or an equivalent replacement sequence of a sequence in Table 1, and the N to-be-coded bits correspond to N coded bits; and obtaining the first sequence that comprises N polar channel sequence numbers comprises:

determining locations of NM to-be-deleted bits in the N coded bits;

sequentially reading polar channel sequence numbers in the maximum first sequence $S_{max}$, and sequentially reading polar channel sequence numbers in the maximum first sequence $S_{max}$, wherein the polar channel sequence numbers do not correspond to the locations of the N–M bits and are not greater than N; and when N polar channel sequence numbers are read, determining that a sequence comprising the N read polar channel sequence numbers is the first sequence corresponding to the mother code length N.

6. The method according to claim 3, wherein the N to-be-coded bits correspond to a mother code whose code length is N; and obtaining the first sequence that comprises N polar channel sequence numbers comprises:

determining, based on a fourth sequence that corresponds to the mother code length N when rate matching does not need to be performed, a first sequence that corresponds to the mother code length N when rate matching is to be performed, wherein the first sequence corresponding to the mother code length N is the first sequence that comprises N polar channel sequence numbers.

7. The method according to claim 6, wherein the fourth sequence is a sequence in Table 1 in the appendix or an equivalent replacement sequence of a sequence in Table 1, and the N to-be-coded bits correspond to N coded bits; and determining, based on a fourth sequence that corresponds to the mother code length N when rate matching does not need to be performed, a first sequence corresponding to the mother code length N comprises:

determining locations of N–M to-be-deleted bits in the N coded bits;

sequentially reading polar channel sequence numbers in the fourth sequence, and sequentially reading polar channel sequence numbers in the fourth sequence, wherein polar channel sequence numbers do not correspond to the locations of the N–M bits; and when N polar channel sequence numbers are read, determining that a sequence comprising the N read polar channel sequence numbers is the first sequence that corresponds to the mother code length N when rate matching needs to be performed.

8. The method according to claim 3, wherein obtaining the first sequence that comprises N polar channel sequence numbers comprises:

obtaining, from a sequence in Table 2, Table 3, or Table 4 in the appendix or an equivalent replacement sequence of a sequence in Table 2, Table 3, or Table 4, the first sequence that comprises N polar channel sequences.

9. A coding method, comprising:

determining N to-be-coded bits, wherein N is a positive integer;

determining a first sequence $S'_N$ based on N second sequences $S_1, S_2, \ldots,$ and $S_N$, wherein the first sequence comprises N polar channel sequence numbers, and the second sequence $S_i$ comprises i polar channel sequence numbers, $1 \le i \le N$, and i is a positive integer;

determining a location of an information bit in the N to-be-coded bits based on the first sequence; and performing polar coding on the N to-be-coded bits to obtain coded bits.

10. The method according to claim 9, wherein determining the first sequence $S'_N$ based on N second sequences $S_1, S_2, \ldots,$ and $S_N$ comprises:

determining the N second sequences $S_1, S_2, \ldots,$ and $S_N$;

initializing a first sequence $S'_1$ to $S_1$; and setting j to traverse from 2 to N, and calculating the first sequence $S'_N$ according to the following formula:

$$S'_j = S'_{j-1} + (S'_{j-1} \backslash S_j), \text{ wherein}$$

$2 \le j \le N$, j is a positive integer, "\" represents calculating a difference set of two sequences, and "+" represents connecting two sequences before and after "+" to form one sequence.

11. A coding apparatus implemented with hardware modules, comprising a determining module, a obtaining module, and a coding module, wherein the determining module is configured to determine N to-be-coded bits, wherein N is a positive integer, wherein the determining module is configured to:

determine N based on M, wherein N=M, M is an output target code length of a polar code, M is equal to a positive integral power of 2, and M is a positive integer;

the obtaining module is configured to obtain a first sequence that comprises N polar channel sequence numbers; and the coding module is configured to perform polar coding on the N to-be-coded bits to obtain coded bits; and, wherein the determining module is further configured to determine a location of an information bit in the N to-be-coded bits based on the first sequence.

12. The apparatus according to claim 11, wherein the obtaining module is configured to:

obtain, from a sequence in Table 1 in the appendix or an equivalent replacement sequence of a sequence in Table 1, the first sequence that comprises N polar channel sequences.

13. A coding apparatus implemented with hardware modules, comprising a determining module, a obtaining module, and a coding module, wherein
the determining module is configured to determine N to-be-coded bits, wherein N is a positive integer,
wherein the determining module is specifically configured to:
determine N based on M, wherein $N=2^{\lfloor \log_2(M-1) \rfloor+1}$, wherein the symbol $\lfloor \ \rfloor$ represents rounding down, M is an output target code length of a polar code, M is not equal to a positive integral power of 2, and M is a positive integer;
the obtaining module is configured to obtain a first sequence that comprises N polar channel sequence numbers; and
the coding module is configured to perform polar coding on the N to-be-coded bits to obtain coded bits; and, wherein
the determining module is further configured to determine a location of an information bit in the N to-be-coded bits based on the first sequence.

14. The apparatus according to claim 13, wherein the N to-be-coded bits correspond to a mother code whose code length is N; and
the obtaining module is configured to:
determine, based on a maximum first sequence $S_{max}$ corresponding to a maximum mother code length $N_{max}$ supported by a communications system, a first sequence corresponding to the mother code length N, wherein the first sequence corresponding to the mother code length N is the first sequence that comprises N polar channel sequence numbers.

15. The apparatus according to claim 14, wherein the maximum first sequence $S_{max}$ is a sequence in Table 1 in the appendix or an equivalent replacement sequence of a sequence in Table 1, and the N to-be-coded bits correspond to N coded bits; and, wherein
the obtaining module is configured to:
determine locations of N−M to-be-deleted bits in the N coded bits;
sequentially read polar channel sequence numbers in the maximum first sequence $S_{max}$, and sequentially read polar channel sequence numbers in the maximum first sequence $S_{max}$, wherein the polar channel sequence numbers do not correspond to the locations of the N−M bits and are not greater than N; and
when N polar channel sequence numbers are read, determine that a sequence comprising the N read polar channel sequence numbers is the first sequence corresponding to the mother code length N.

16. The apparatus according to claim 13, wherein the N to-be-coded bits correspond to a mother code whose code length is N; and
the obtaining module is configured to:
determine, based on a fourth sequence that corresponds to the mother code length N when rate matching does not need to be performed, a first sequence that corresponds to the mother code length N when rate matching needs to be performed, wherein the first sequence corresponding to the mother code length N is the first sequence that comprises N polar channel sequence numbers.

17. The apparatus according to claim 16, wherein the fourth sequence is a sequence in Table 1 in the appendix or an equivalent replacement sequence of a sequence in Table 1, and the N to-be-coded bits correspond to N coded bits; and
the obtaining module is configured to:
determine locations of N−M to-be-deleted bits in the N coded bits;
sequentially read polar channel sequence numbers in the fourth sequence, and sequentially read polar channel sequence numbers in the fourth sequence, wherein the polar channel sequence numbers do not correspond to the locations of the N−M bits; and
when N polar channel sequence numbers are read, determine that a sequence comprising the N read polar channel sequence numbers is the first sequence that corresponds to the mother code length N when rate matching needs to be performed.

18. The apparatus according to claim 13, wherein the obtaining module is specifically configured to:
obtain, from a sequence in Table 2, Table 3, or Table 4 in the appendix or an equivalent replacement sequence of a sequence in Table 2, Table 3, or Table 4, the first sequence that comprises N polar channel sequences.

* * * * *